US012633354B2

(12) United States Patent
Hara et al.

(10) Patent No.: US 12,633,354 B2
(45) Date of Patent: May 19, 2026

(54) SEMICONDUCTOR MEMORY AND NONVOLATILE MEMORY

(71) Applicant: Kioxia Corporation, Tokyo (JP)

(72) Inventors: Tokumasa Hara, Kawasaki (JP);
Noboru Shibata, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 106 days.

(21) Appl. No.: 18/746,964

(22) Filed: Jun. 18, 2024

(65) Prior Publication Data

US 2024/0339160 A1    Oct. 10, 2024

Related U.S. Application Data

(62) Division of application No. 17/471,810, filed on Sep. 10, 2021, now abandoned.

(30) Foreign Application Priority Data

| Nov. 19, 2020 | (JP) | ................................. 2020-192523 |
| Dec. 24, 2020 | (JP) | ................................. 2020-214800 |
| Aug. 26, 2021 | (JP) | ................................. 2021-138120 |

(51) Int. Cl.
| *G11C 7/00* | (2006.01) |
| *G11C 16/08* | (2006.01) |
| *G11C 16/10* | (2006.01) |
| *G11C 16/26* | (2006.01) |
| *G11C 16/30* | (2006.01) |
| *G11C 16/34* | (2006.01) |

(52) U.S. Cl.
CPC .............. *G11C 16/26* (2013.01); *G11C 16/08* (2013.01); *G11C 16/102* (2013.01); *G11C 16/30* (2013.01); *G11C 16/3404* (2013.01)

(58) Field of Classification Search
CPC ....... G11C 7/1051; G11C 7/22; G11C 7/1072; G11C 7/1006; G11C 7/1066
USPC ......................................... 365/189.15, 185.18
See application file for complete search history.

(56) References Cited

U.S. PATENT DOCUMENTS

| 5,510,749 A | 4/1996 | Arimoto |
| 5,708,790 A | 1/1998 | White et al. |
| 5,949,731 A | 9/1999 | Tsukude |
| 8,180,954 B2 | 5/2012 | Kilzer et al. |
| 9,076,536 B2 * | 7/2015 | Nagadomi ............. G11C 16/26 |
| 10,255,971 B2 | 4/2019 | Hara et al. |
| 2012/0265927 A1 * | 10/2012 | Cho ....................... G11C 29/44 |
| | | 711/E12.008 |
| 2018/0024738 A1 | 1/2018 | Ngu |

(Continued)

FOREIGN PATENT DOCUMENTS

| JP | 2015-195071 A | 11/2015 |

*Primary Examiner* — Son T Dinh

(74) *Attorney, Agent, or Firm* — Oblon, McClelland, Maier & Neustadt, L.L.P.

(57) ABSTRACT

According to one embodiment, a semiconductor memory includes: a memory group including a plurality of memory cells configured to store a plurality of bits of data in three or more plurality of states; a word line coupled to the plurality of memory cells; and a first circuit configured to convert one external address received from an external controller into a plurality of internal addresses, wherein a first page size of page data of the memory group is smaller than a second page size of input data corresponding to the external address.

18 Claims, 75 Drawing Sheets

(56) References Cited

U.S. PATENT DOCUMENTS

2019/0259458 A1    8/2019  Shibata et al.
2020/0242021 A1    7/2020  Gholamipour et al.

* cited by examiner

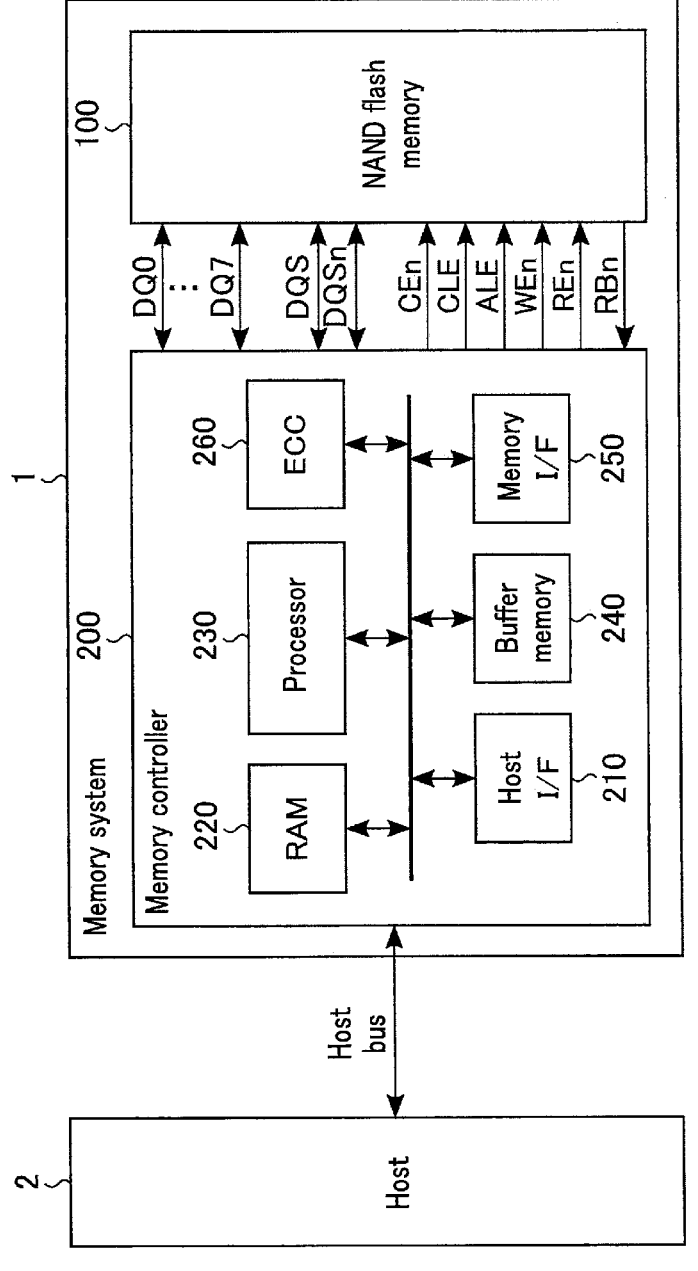
F I G. 1

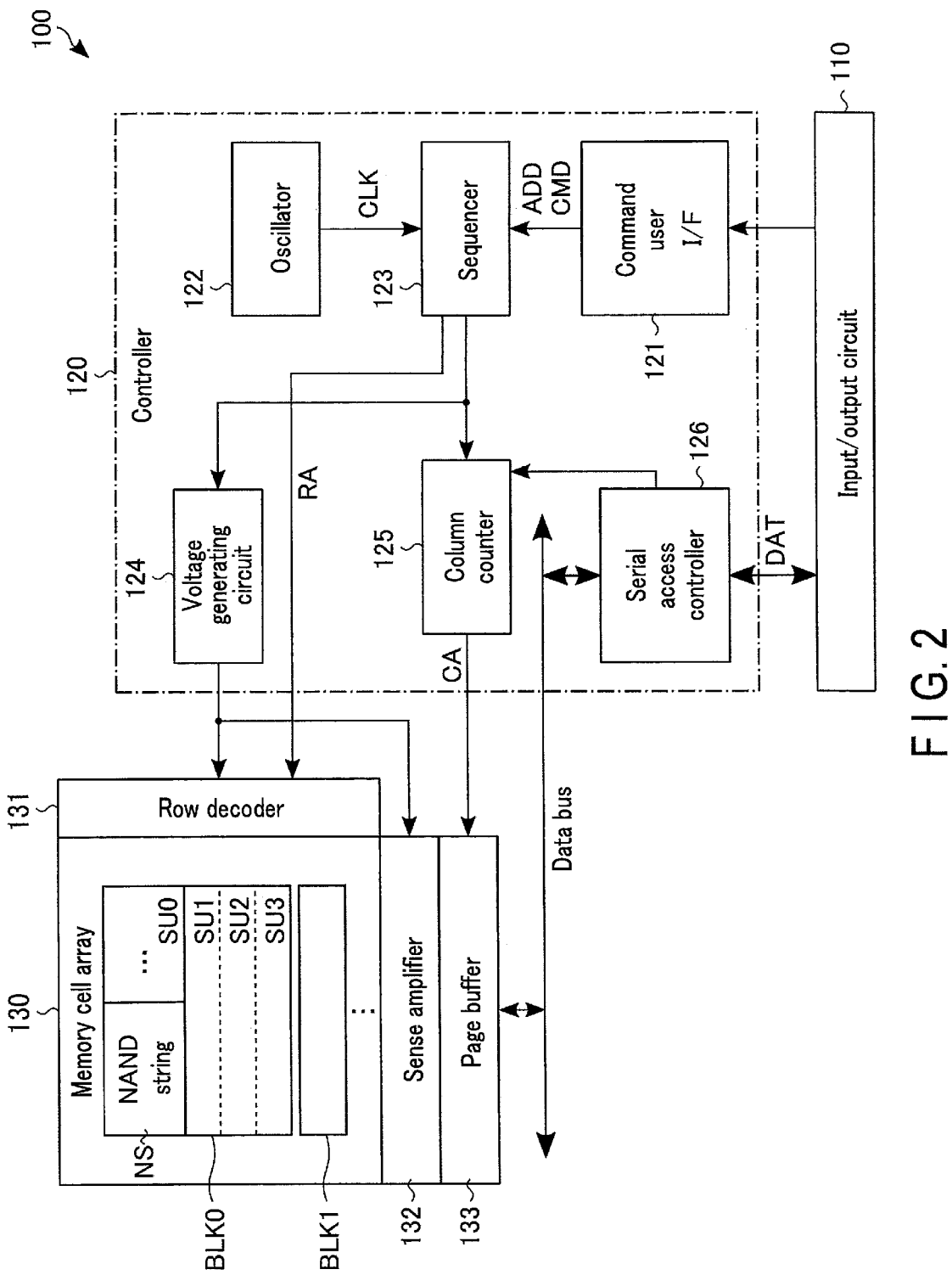
F I G. 2

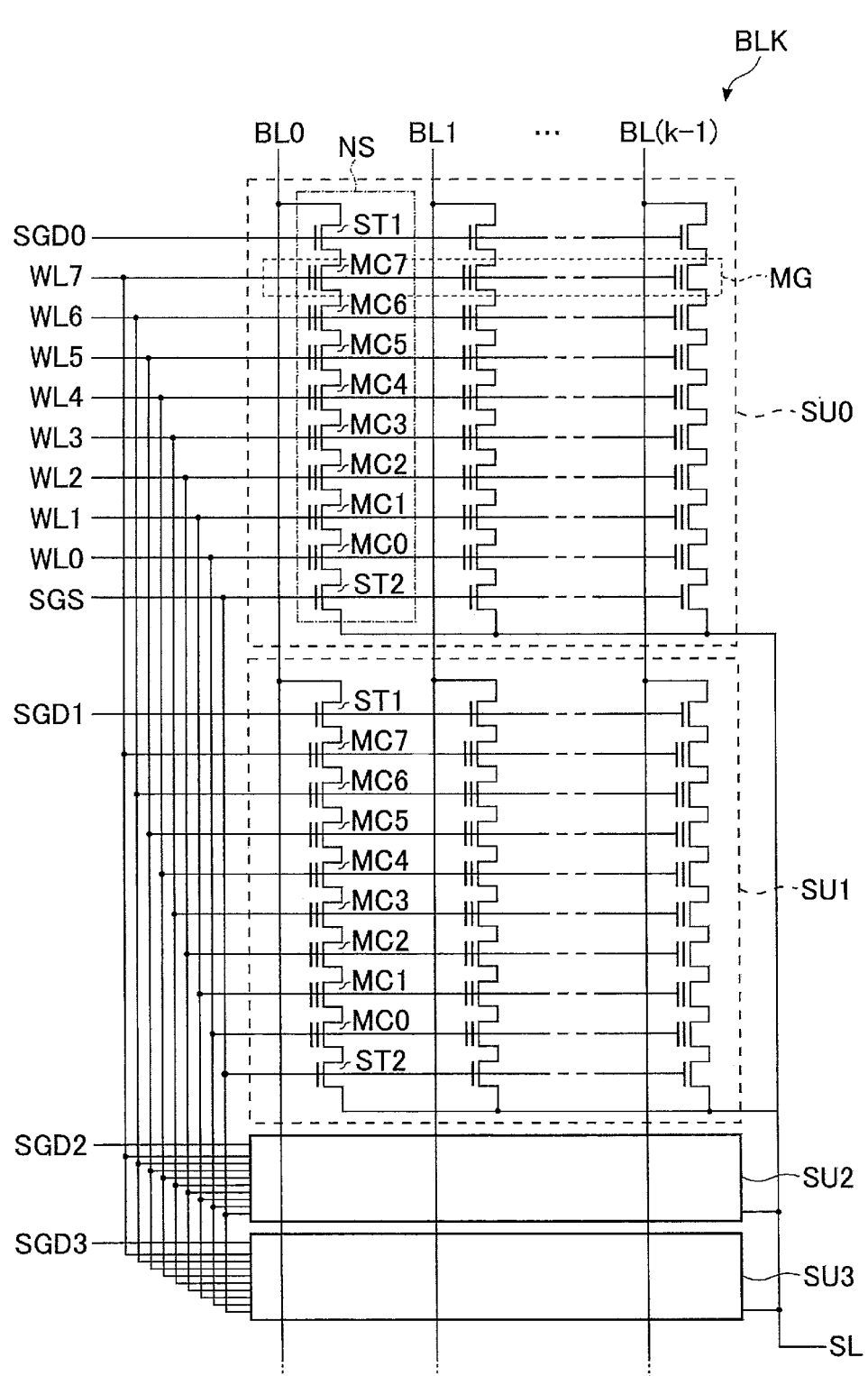
F I G. 3

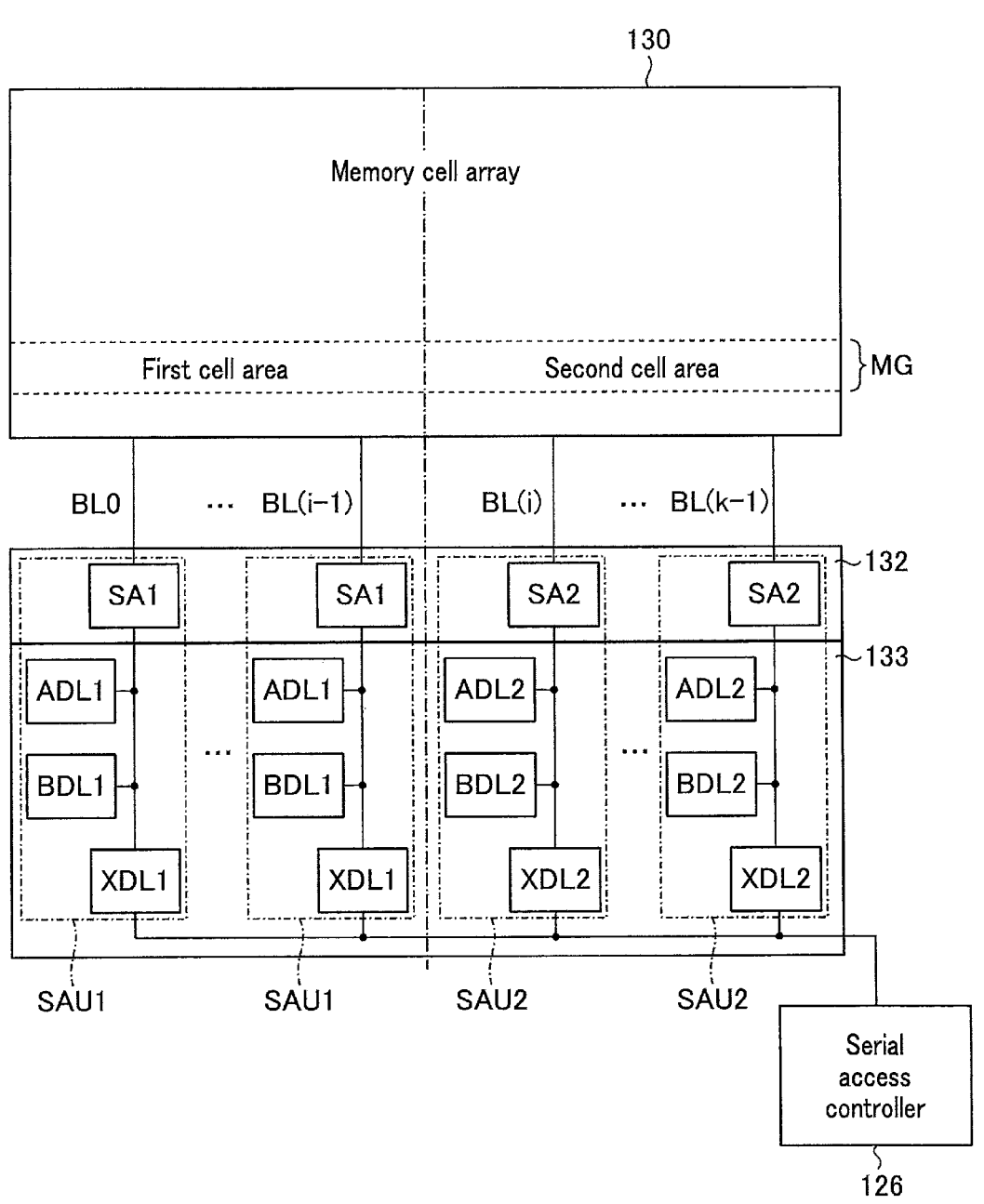
F I G. 5

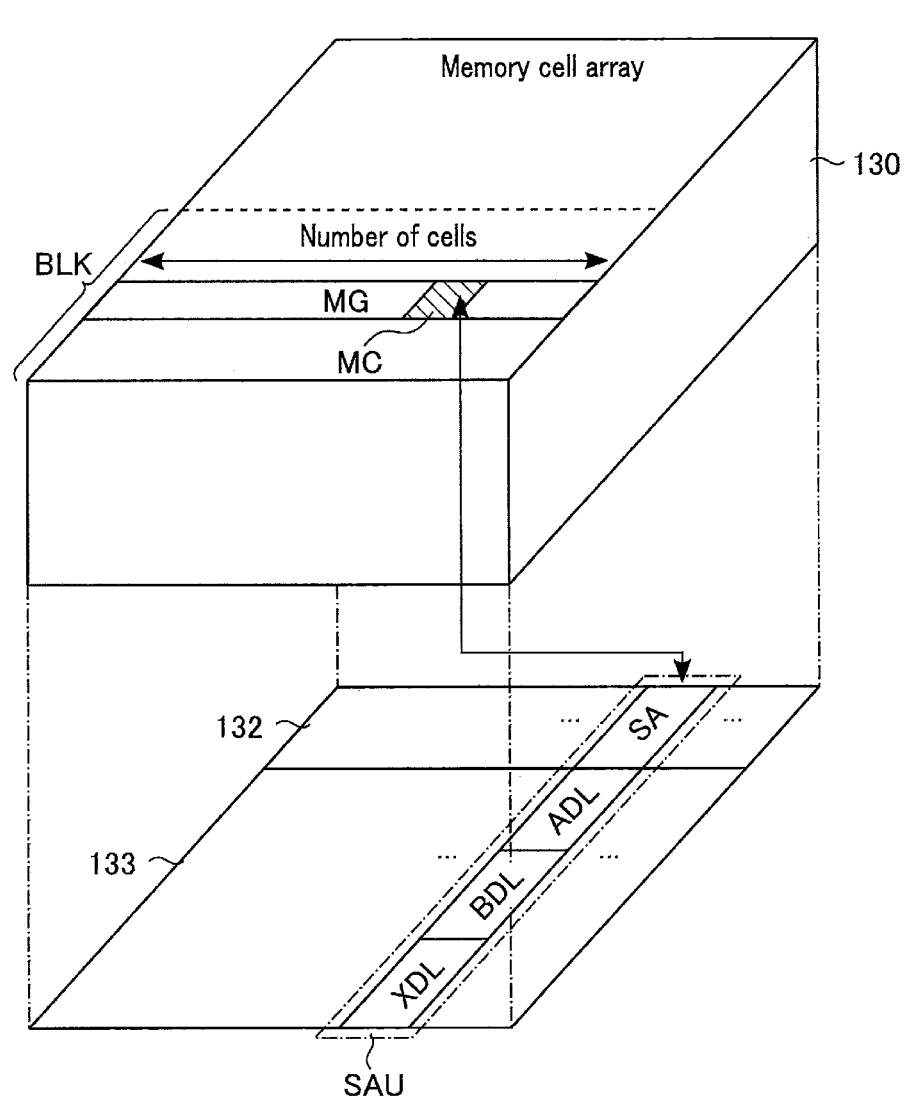
F I G. 6

1-3-3 coding
|  | S0 | S1 | S2 | S3 | S4 | S5 | S6 | S7 |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |
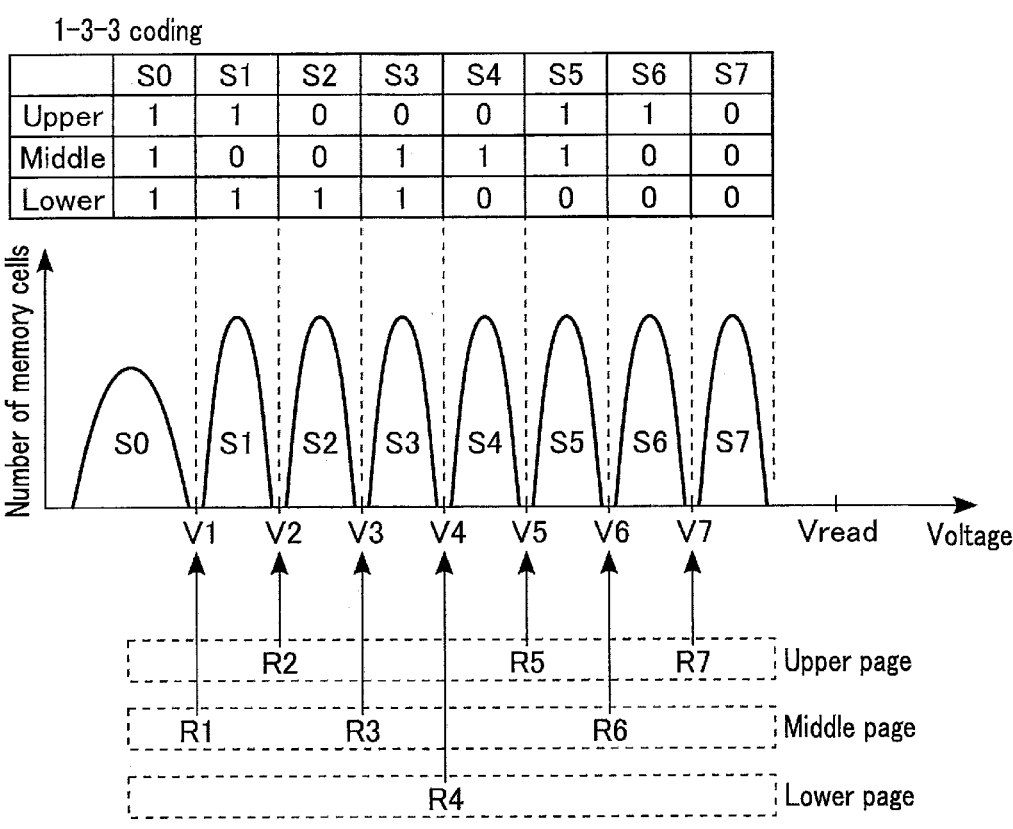
F I G. 7

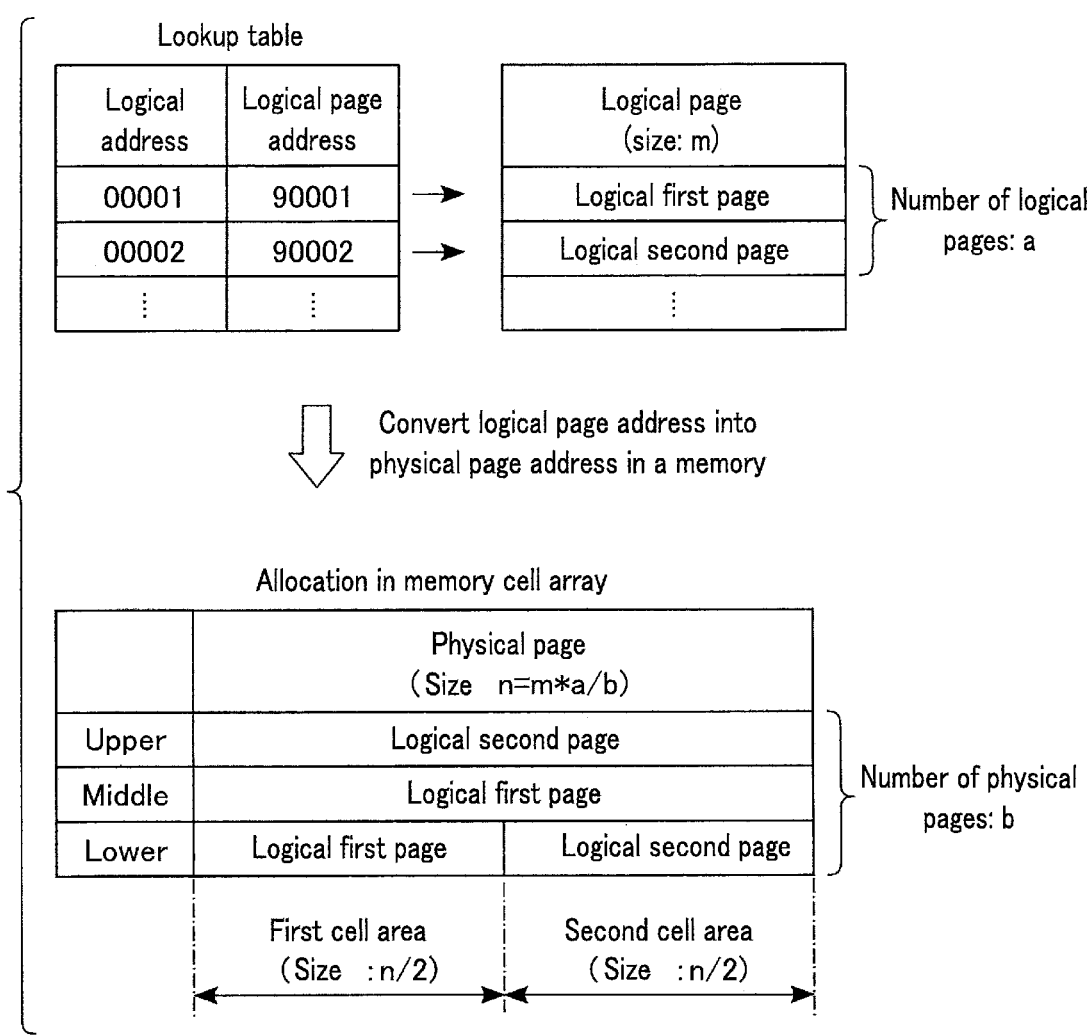
F I G. 8

| Logical first page | First cluster | Second cluster | Third cluster |
| Logical second page | First cluster | Second cluster | Third cluster |

| Physical page | Cluster allocation | |
| | First cell area | Second cell area |
| Upper | Logical second page Second cluster | Logical second page Third cluster |
| Middle | Logical first page Third cluster | Logical first page Second cluster |
| Lower | Logical first page First cluster | Logical second page First cluster |

FIG. 9

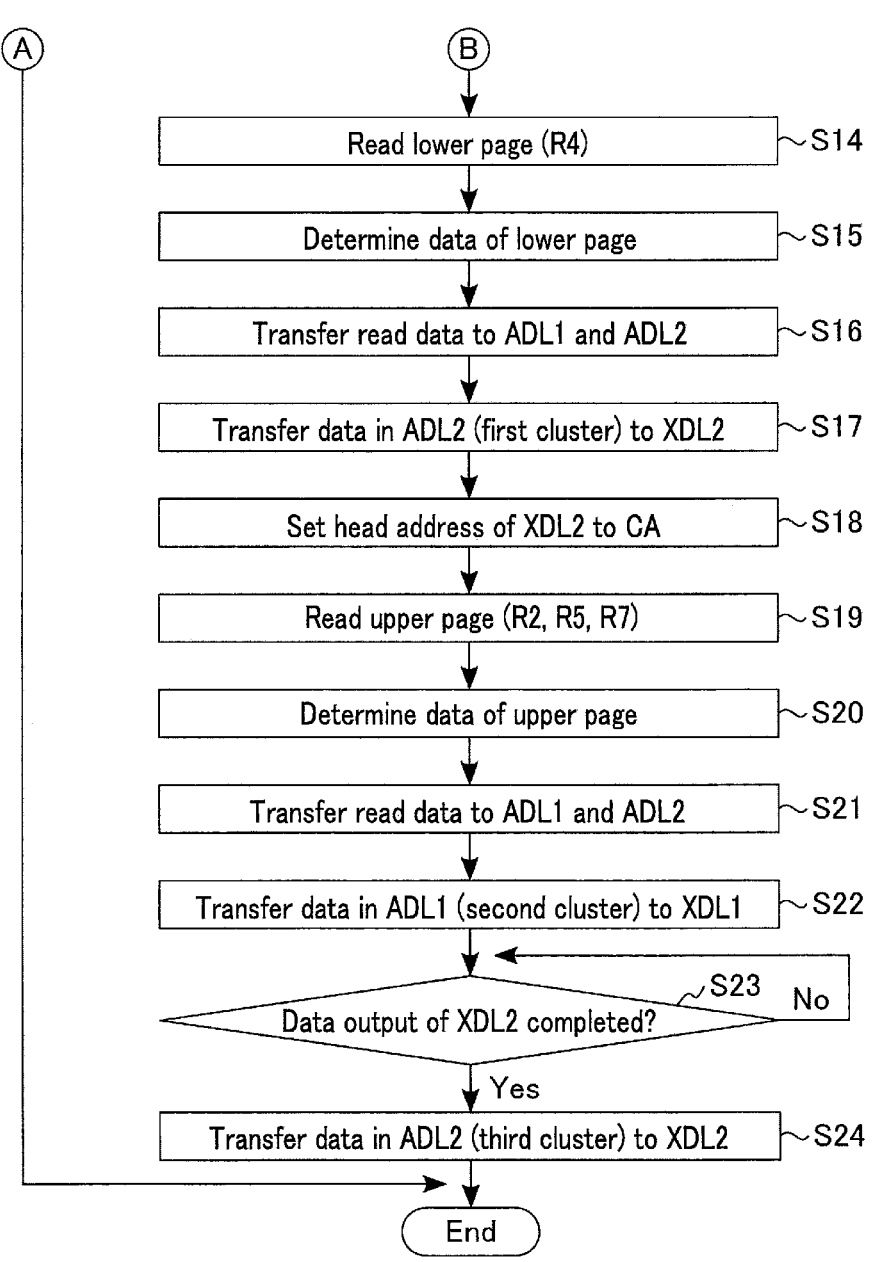
F I G. 11

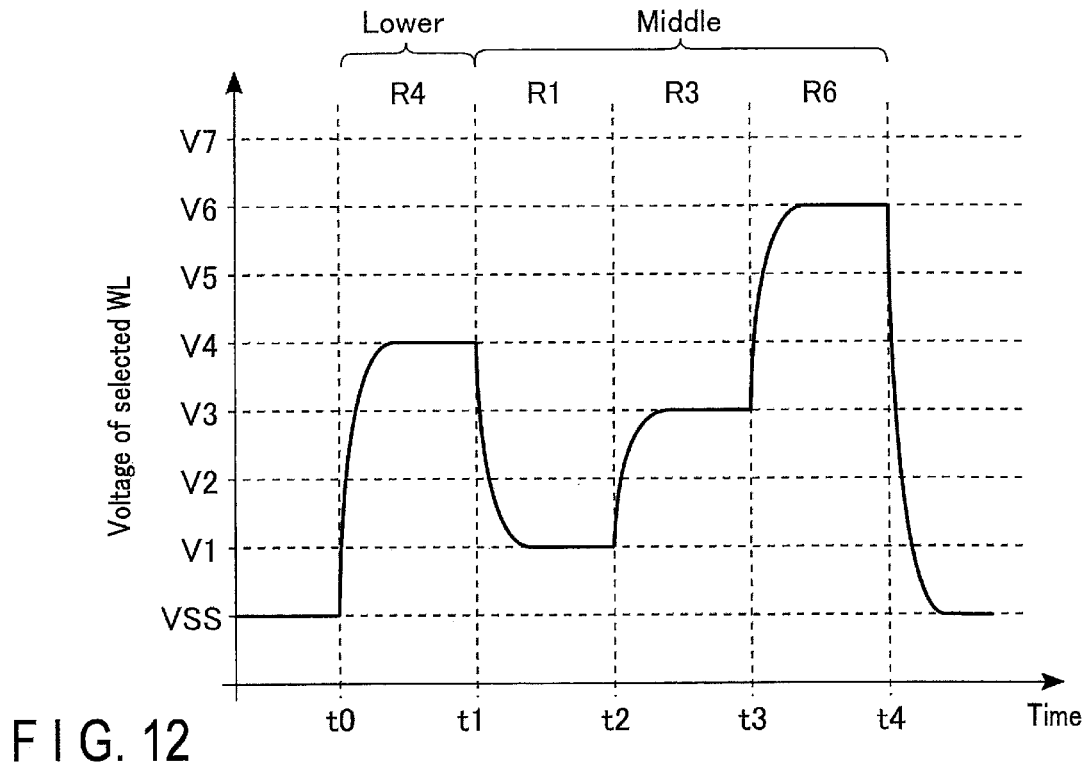
F I G. 12
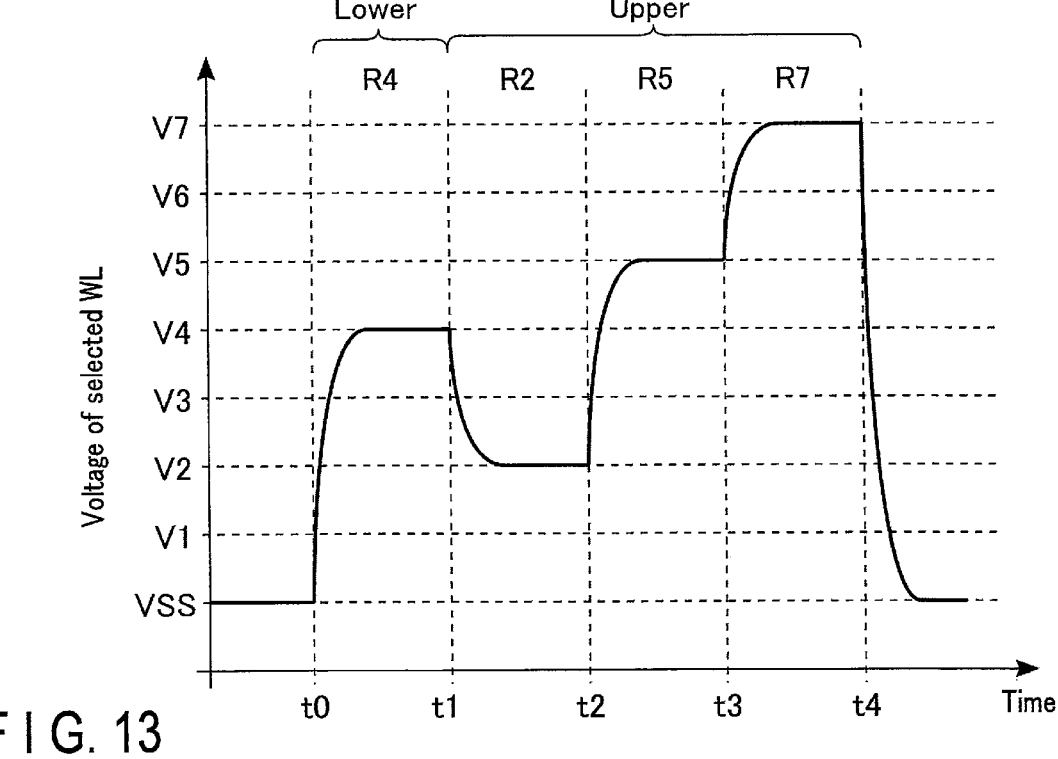
F I G. 13

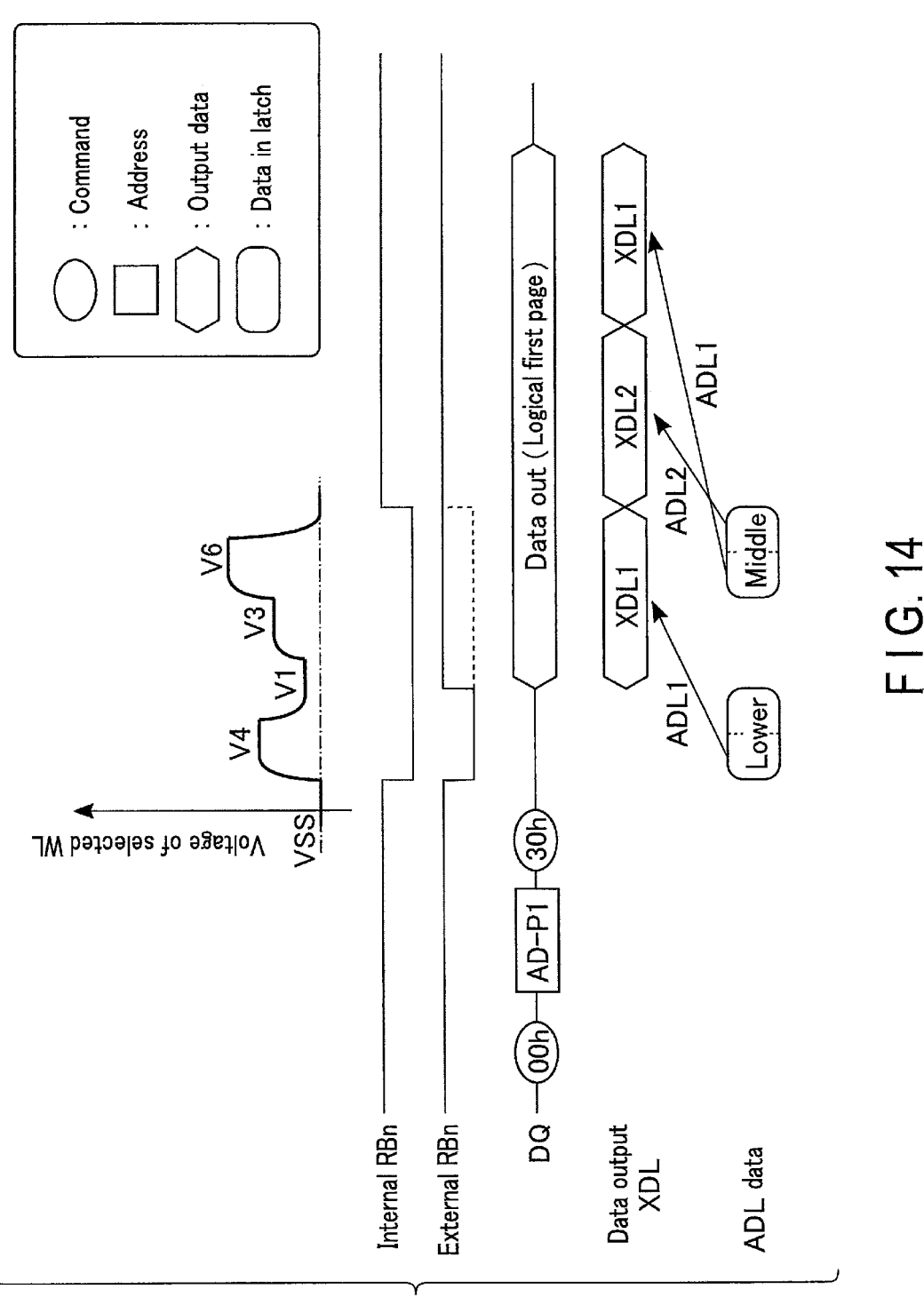
F I G. 14

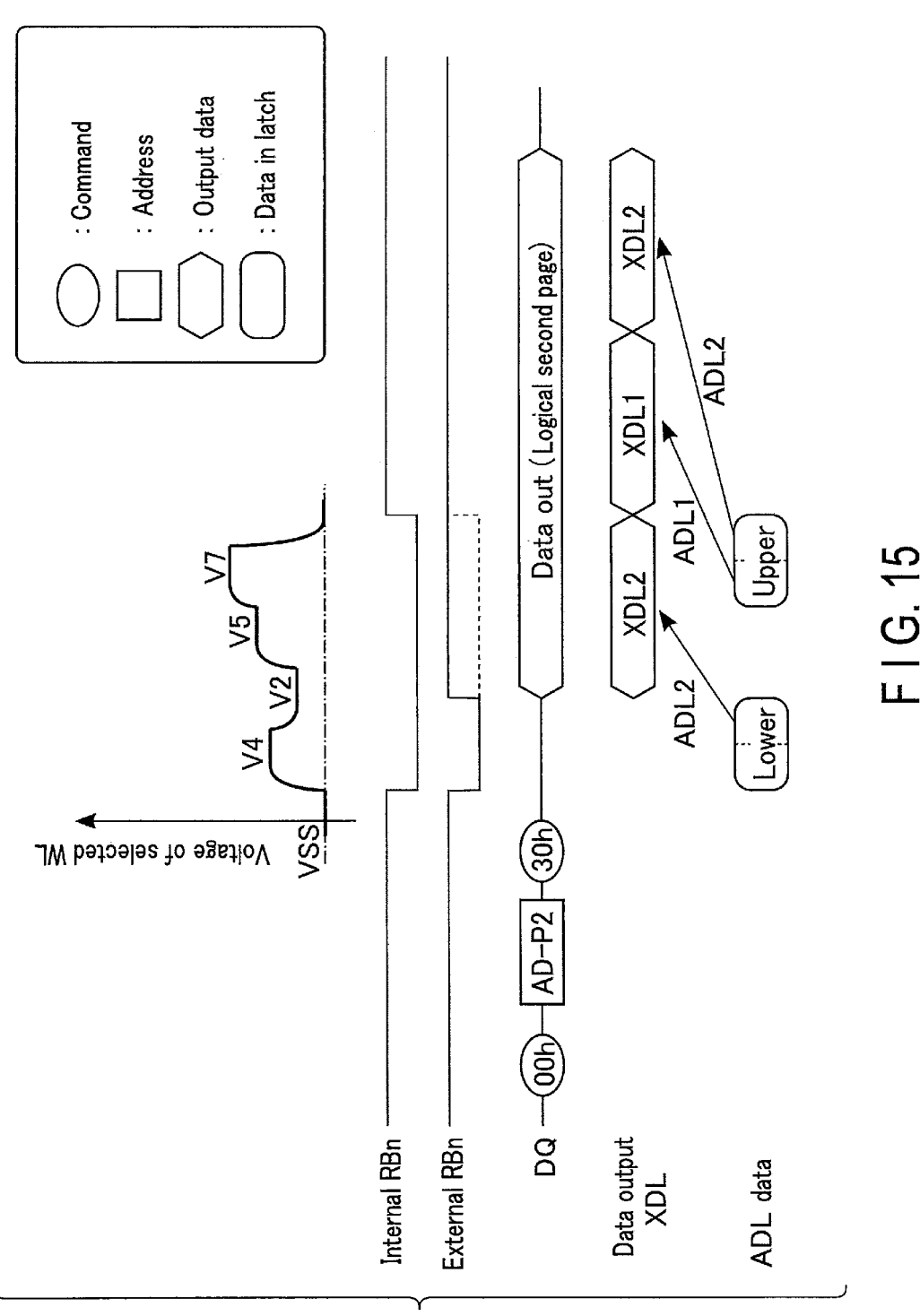
F I G. 15

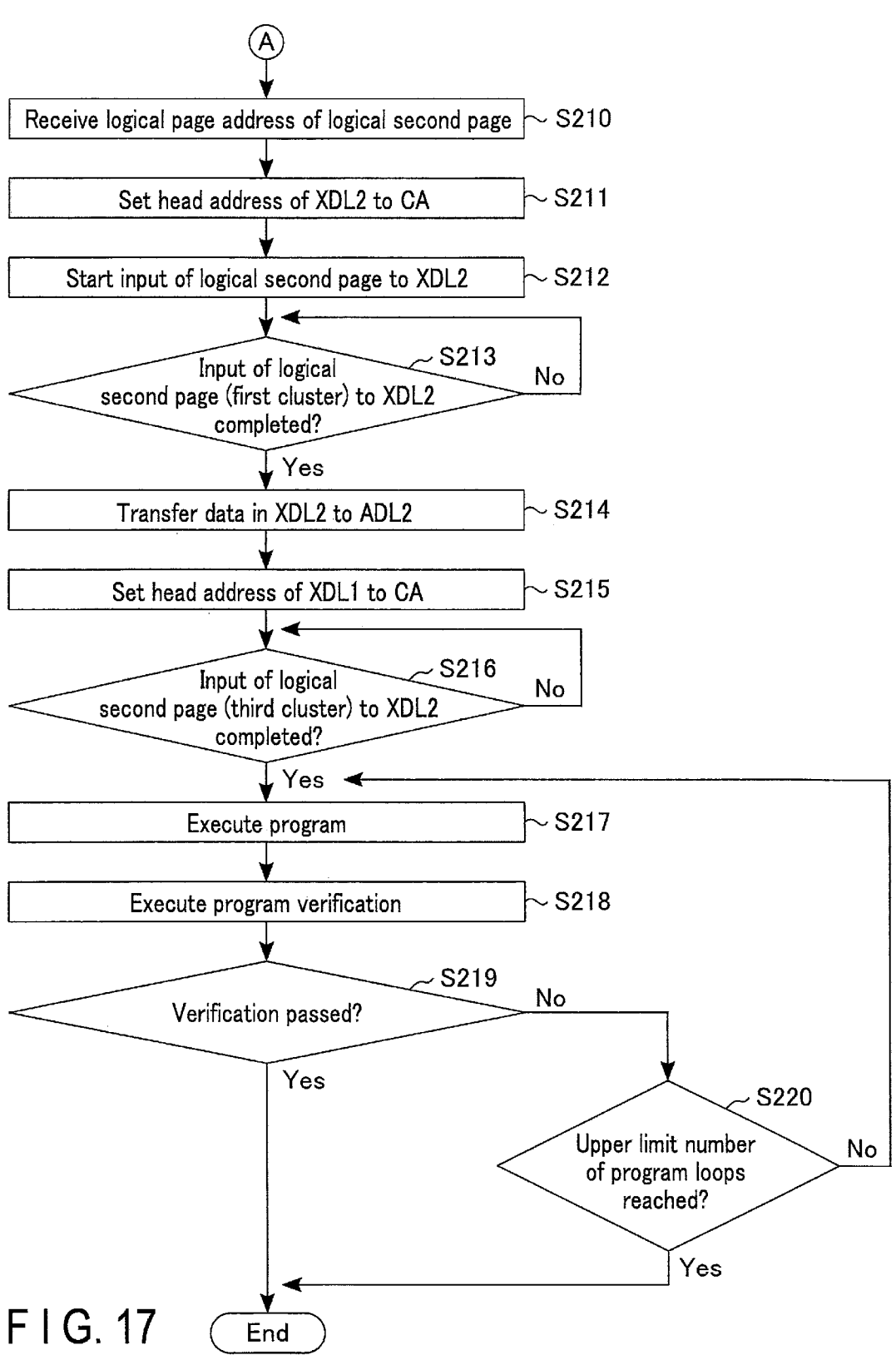

Receive logical page address of logical second page — S210

Set head address of XDL2 to CA — S211

Start input of logical second page to XDL2 — S212

Input of logical second page (first cluster) to XDL2 completed? — S213    No

Yes

Transfer data in XDL2 to ADL2 — S214

Set head address of XDL1 to CA — S215

Input of logical second page (third cluster) to XDL2 completed? — S216    No

Yes

Execute program — S217

Execute program verification — S218

Verification passed? — S219    No

Yes

Upper limit number of program loops reached? — S220    No

Yes

F I G. 17    End

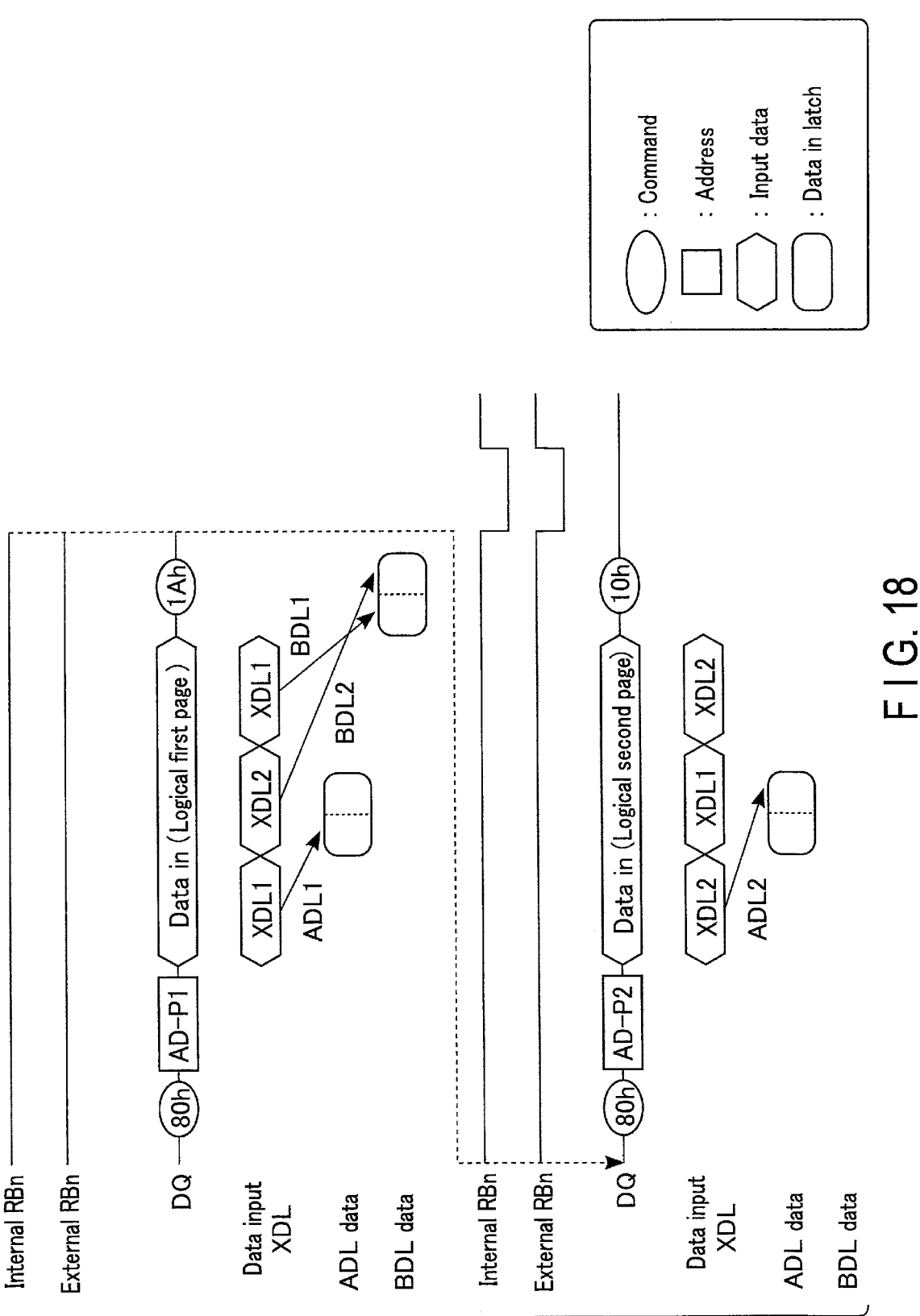
F I G. 18

1-3-3 coding

|        | S0 | S1 | S2 | S3 | S4 | S5 | S6 | S7 |
|--------|----|----|----|----|----|----|----|----|
| Upper  | 1  | 0  | 0  | 1  | 1  | 1  | 0  | 0  |
| Middle | 1  | 1  | 0  | 0  | 0  | 1  | 1  | 0  |
| Lower  | 1  | 1  | 1  | 1  | 0  | 0  | 0  | 0  |

F I G. 19

1-3-3 coding

|        | S0 | S1 | S2 | S3 | S4 | S5 | S6 | S7 |
|--------|----|----|----|----|----|----|----|----|
| Upper  | 1  | 1  | 0  | 0  | 0  | 1  | 1  | 0  |
| Middle | 1  | 0  | 0  | 1  | 1  | 1  | 0  | 0  |
| Lower  | 0  | 0  | 0  | 0  | 1  | 1  | 1  | 1  |

F I G. 20

1-3-3 coding

|        | S0 | S1 | S2 | S3 | S4 | S5 | S6 | S7 |
|--------|----|----|----|----|----|----|----|----|
| Upper  | 1  | 0  | 0  | 1  | 1  | 1  | 0  | 0  |
| Middle | 1  | 1  | 0  | 0  | 0  | 1  | 1  | 0  |
| Lower  | 0  | 0  | 0  | 0  | 1  | 1  | 1  | 1  |

F I G. 21

1-4-2 coding

|        | S0 | S1 | S2 | S3 | S4 | S5 | S6 | S7 |
|--------|----|----|----|----|----|----|----|----|
| Upper  | 1  | 1  | 0  | 0  | 0  | 0  | 1  | 1  |
| Middle | 1  | 0  | 0  | 1  | 1  | 0  | 0  | 1  |
| Lower  | 1  | 1  | 1  | 1  | 0  | 0  | 0  | 0  |

F I G. 22

1-2-4 coding

|        | S0 | S1 | S2 | S3 | S4 | S5 | S6 | S7 |
|--------|----|----|----|----|----|----|----|----|
| Upper  | 1  | 0  | 0  | 1  | 1  | 0  | 0  | 1  |
| Middle | 1  | 1  | 0  | 0  | 0  | 0  | 1  | 1  |
| Lower  | 1  | 1  | 1  | 1  | 0  | 0  | 0  | 0  |

F I G. 23

1-4-2 coding

|        | S0 | S1 | S2 | S3 | S4 | S5 | S6 | S7 |
|--------|----|----|----|----|----|----|----|----|
| Upper  | 1  | 1  | 0  | 0  | 0  | 0  | 1  | 1  |
| Middle | 1  | 0  | 0  | 1  | 1  | 0  | 0  | 1  |
| Lower  | 0  | 0  | 0  | 0  | 1  | 1  | 1  | 1  |

F I G. 24

1-2-4 coding

|        | S0 | S1 | S2 | S3 | S4 | S5 | S6 | S7 |
|--------|----|----|----|----|----|----|----|----|
| Upper  | 1  | 0  | 0  | 1  | 1  | 0  | 0  | 1  |
| Middle | 1  | 1  | 0  | 0  | 0  | 0  | 1  | 1  |
| Lower  | 0  | 0  | 0  | 0  | 1  | 1  | 1  | 1  |

F I G. 25

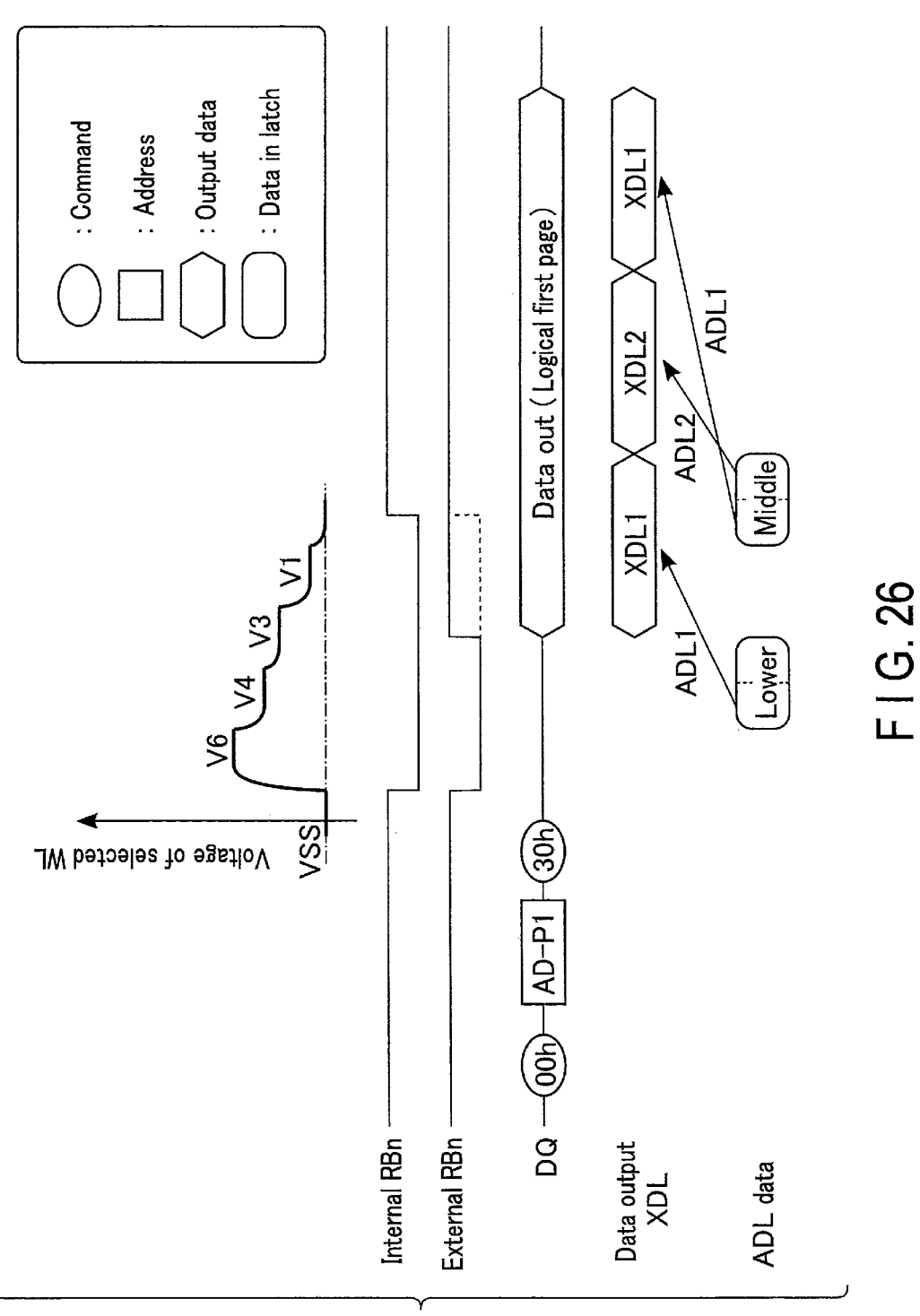
F I G. 26

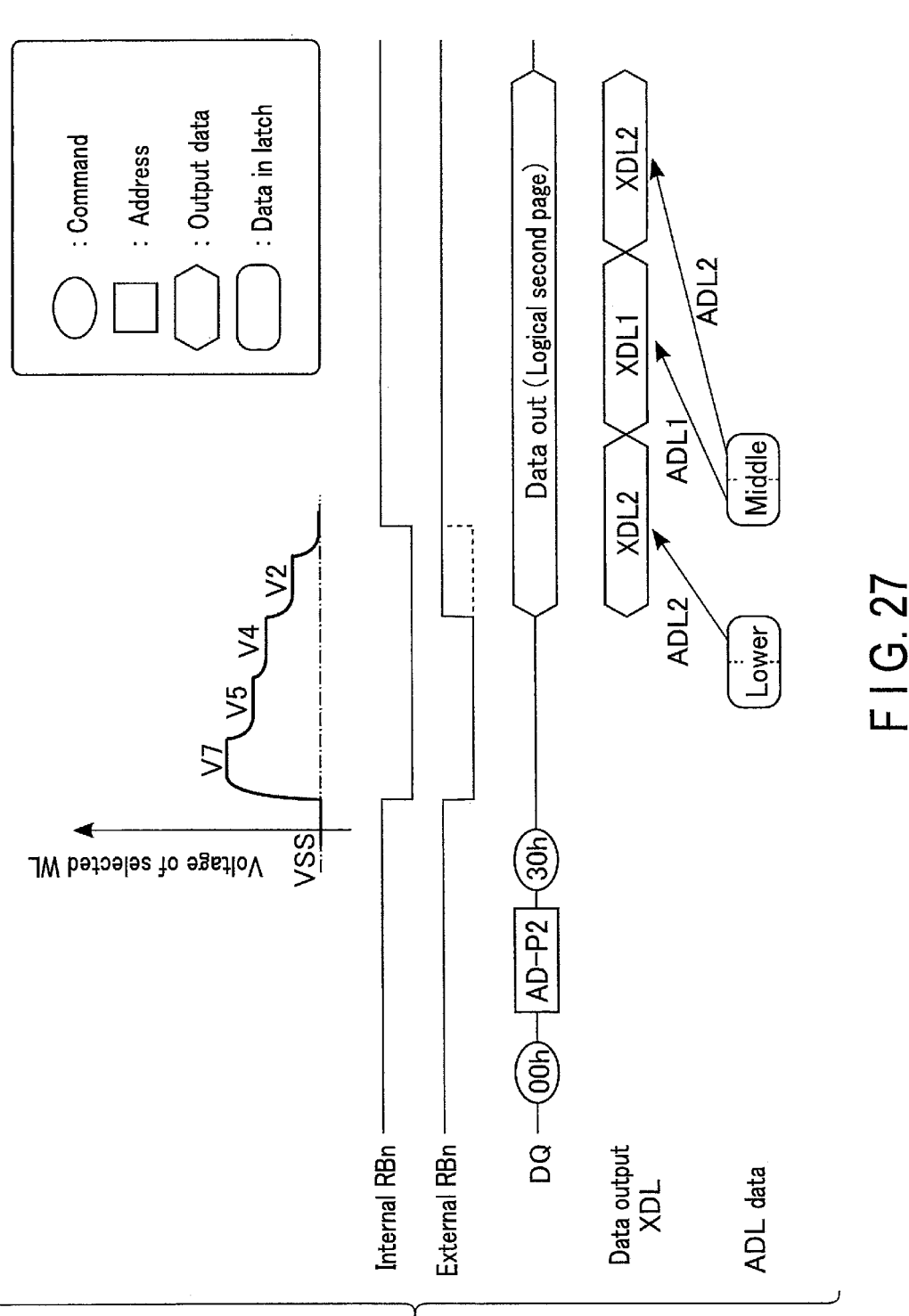
F I G. 27

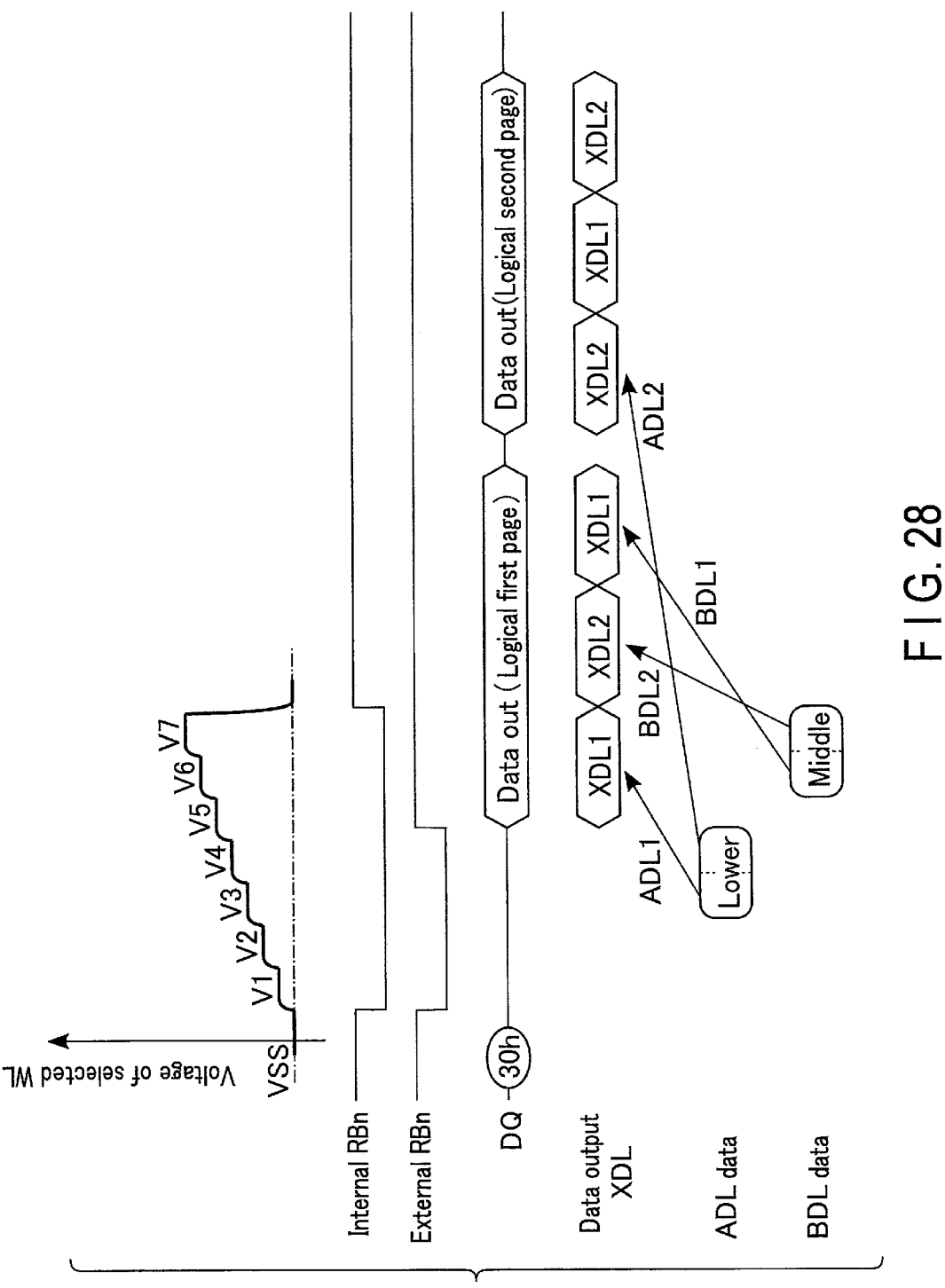
F I G. 28

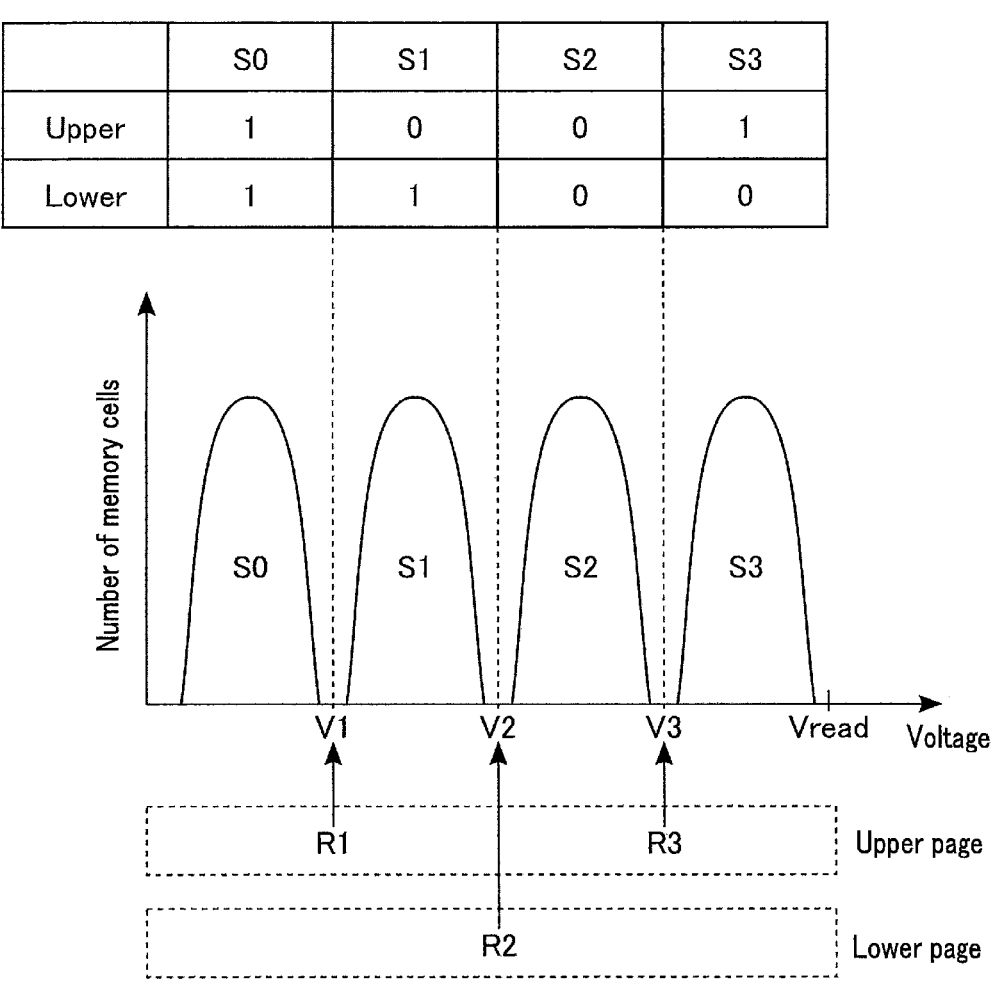
|  | S0 | S1 | S2 | S3 |
|---|---|---|---|---|
| Upper | 1 | 0 | 0 | 1 |
| Lower | 1 | 1 | 0 | 0 |
F I G. 29

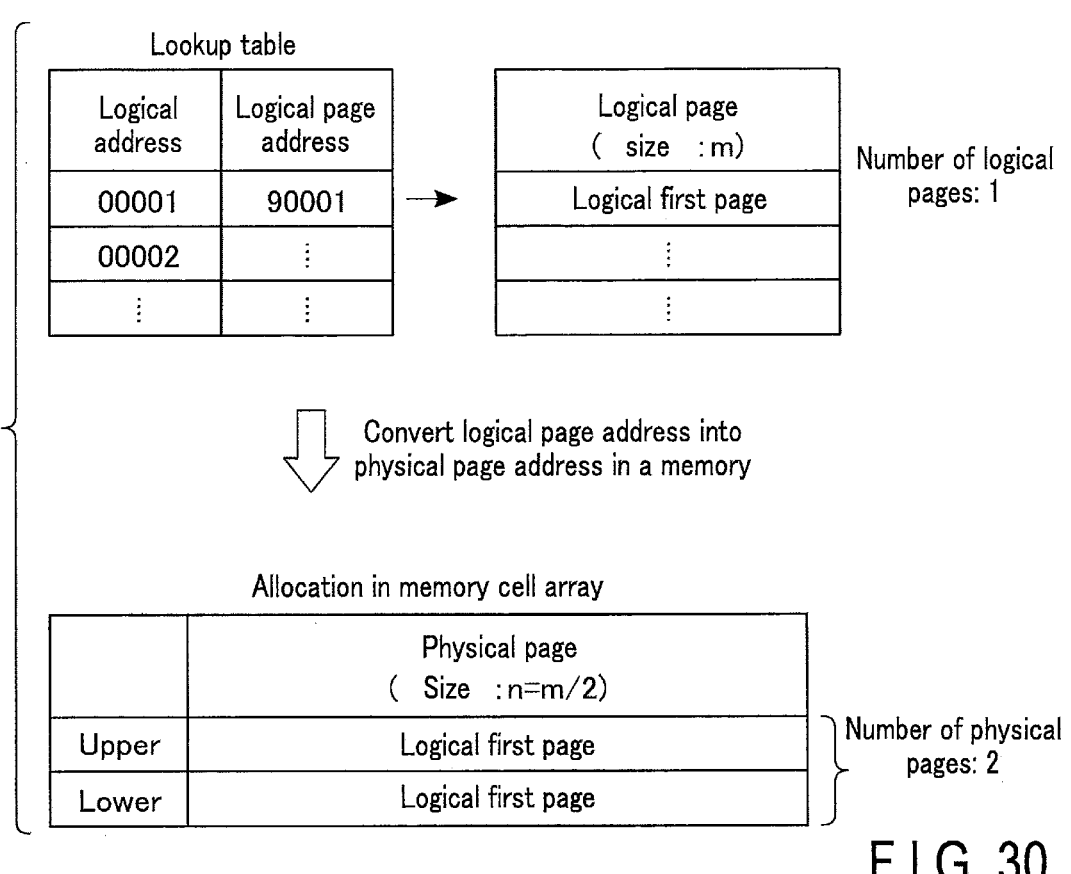

Lookup table

| Logical address | Logical page address |
|---|---|
| 00001 | 90001 |
| 00002 | ⋮ |
| ⋮ | ⋮ |

→

| Logical page ( size : m) |
|---|
| Logical first page |
| ⋮ |

Number of logical pages: 1

Convert logical page address into physical page address in a memory

Allocation in memory cell array

| | Physical page ( Size : n=m/2) |
|---|---|
| Upper | Logical first page |
| Lower | Logical first page |

Number of physical pages: 2

F I G. 30

| Logical first page | First cluster | Second cluster |
|---|---|---|

| Physical page | Cluster allocation | |
|---|---|---|
| | First cell area | Second cell area |
| Upper | Second cluster | |
| Lower | First cluster | |

F I G. 31

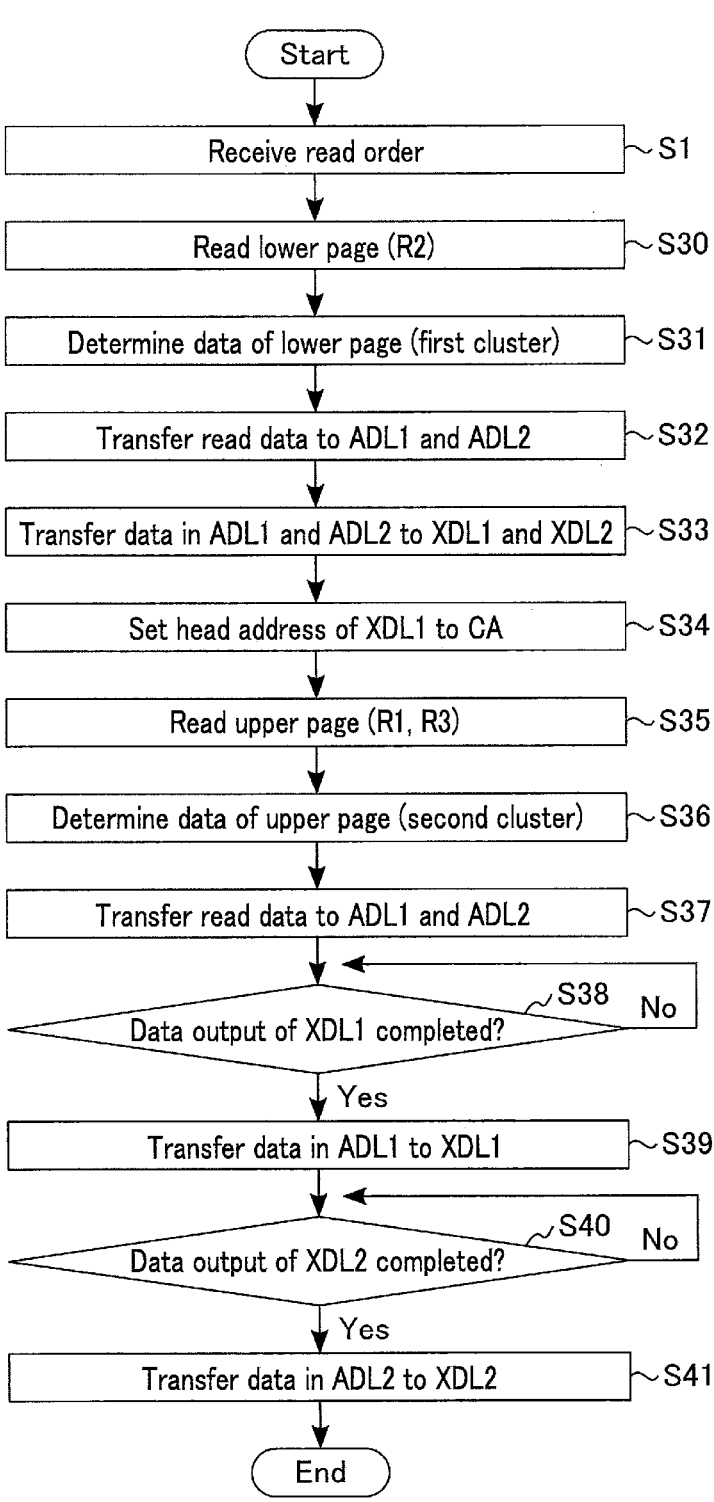
F I G. 32

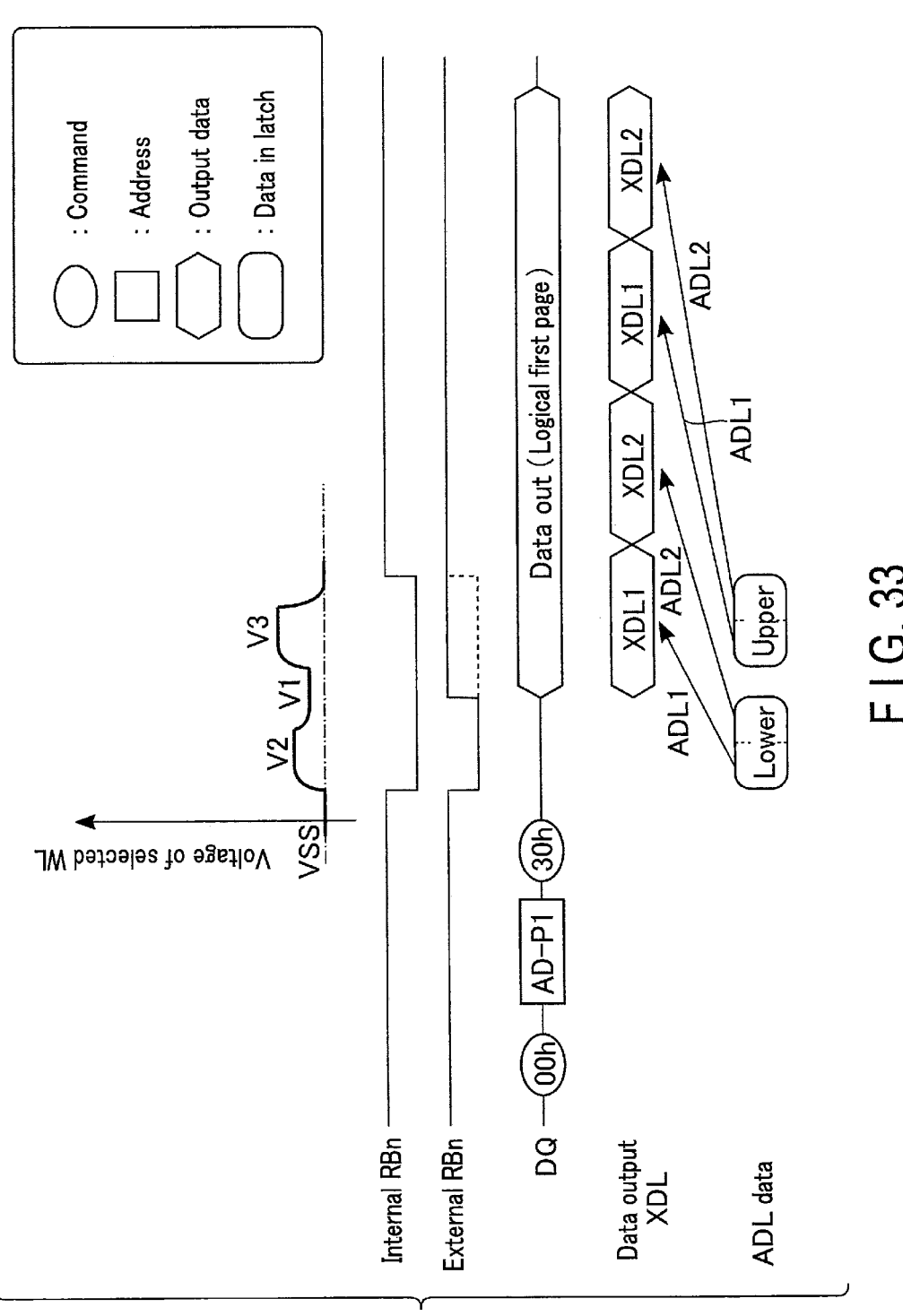
F I G. 33

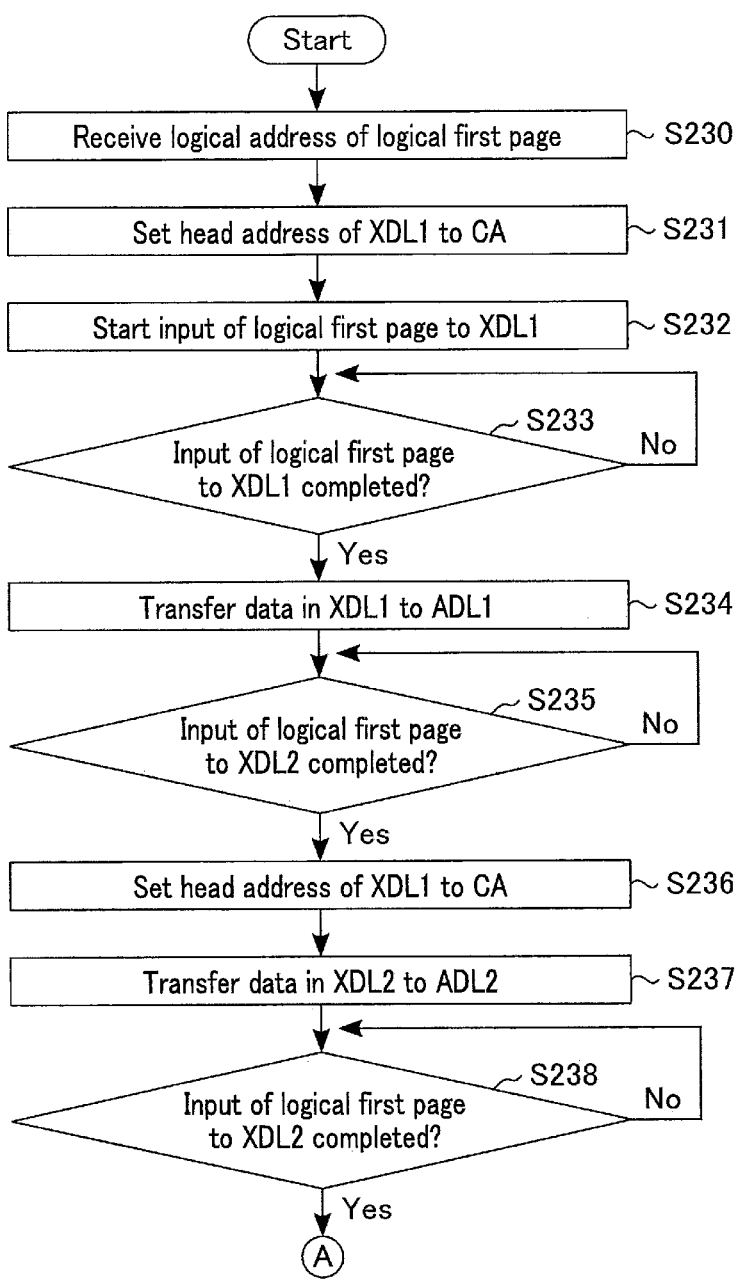
F I G. 34

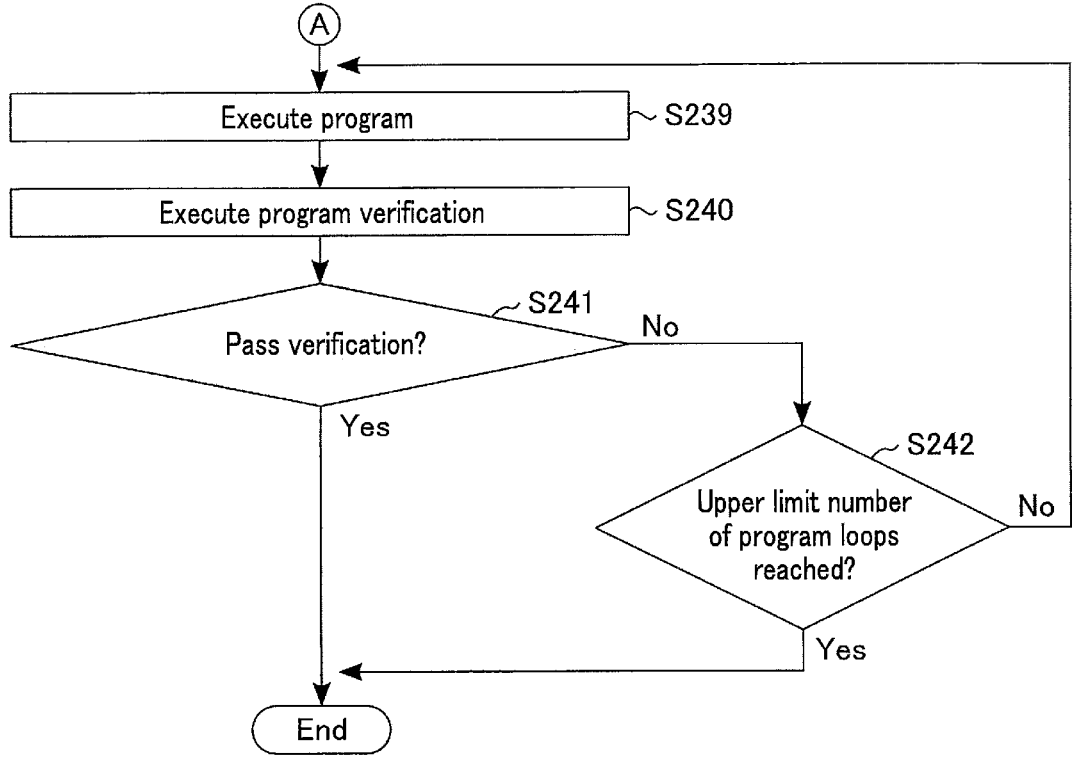
F I G. 35

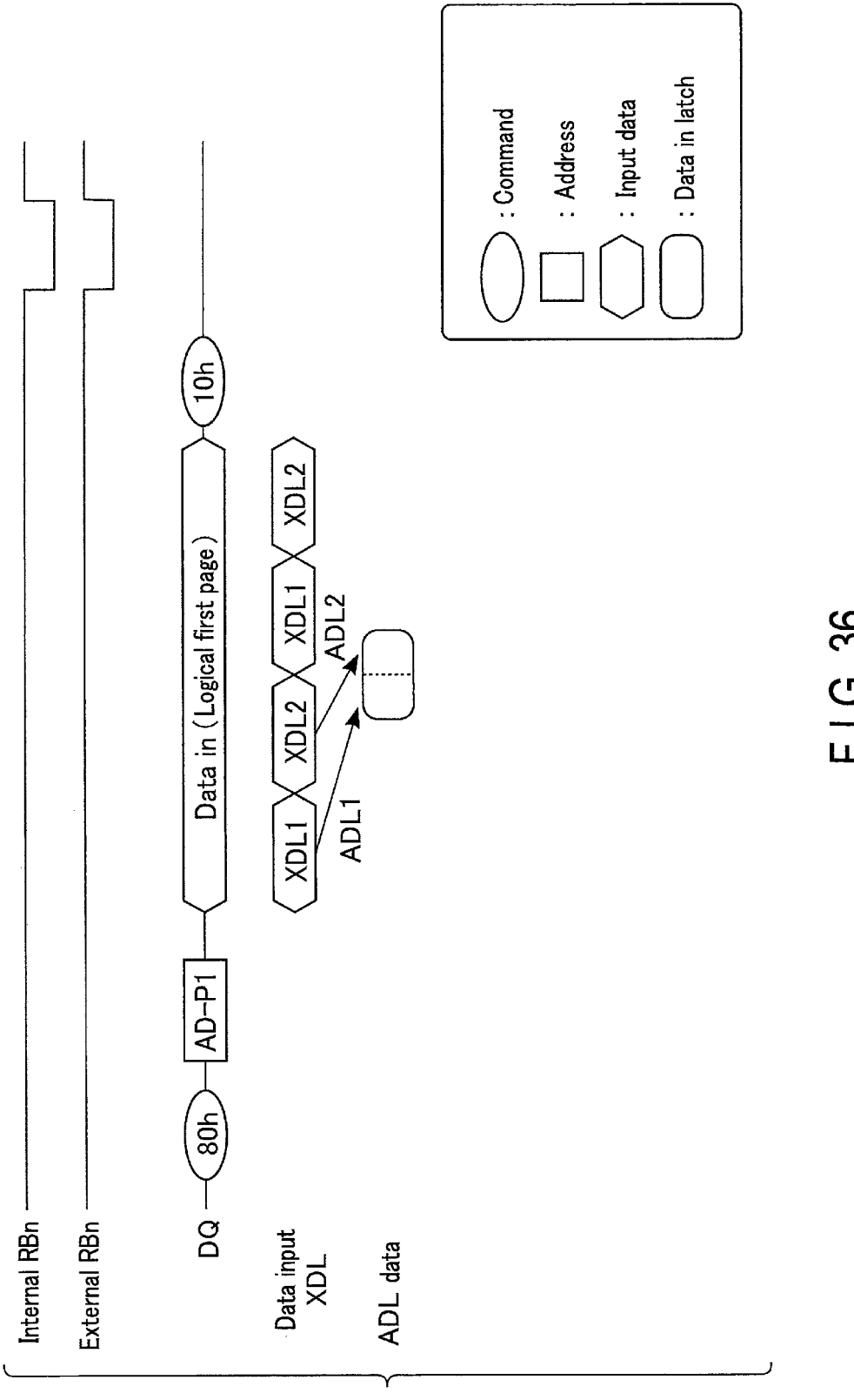
F I G. 36

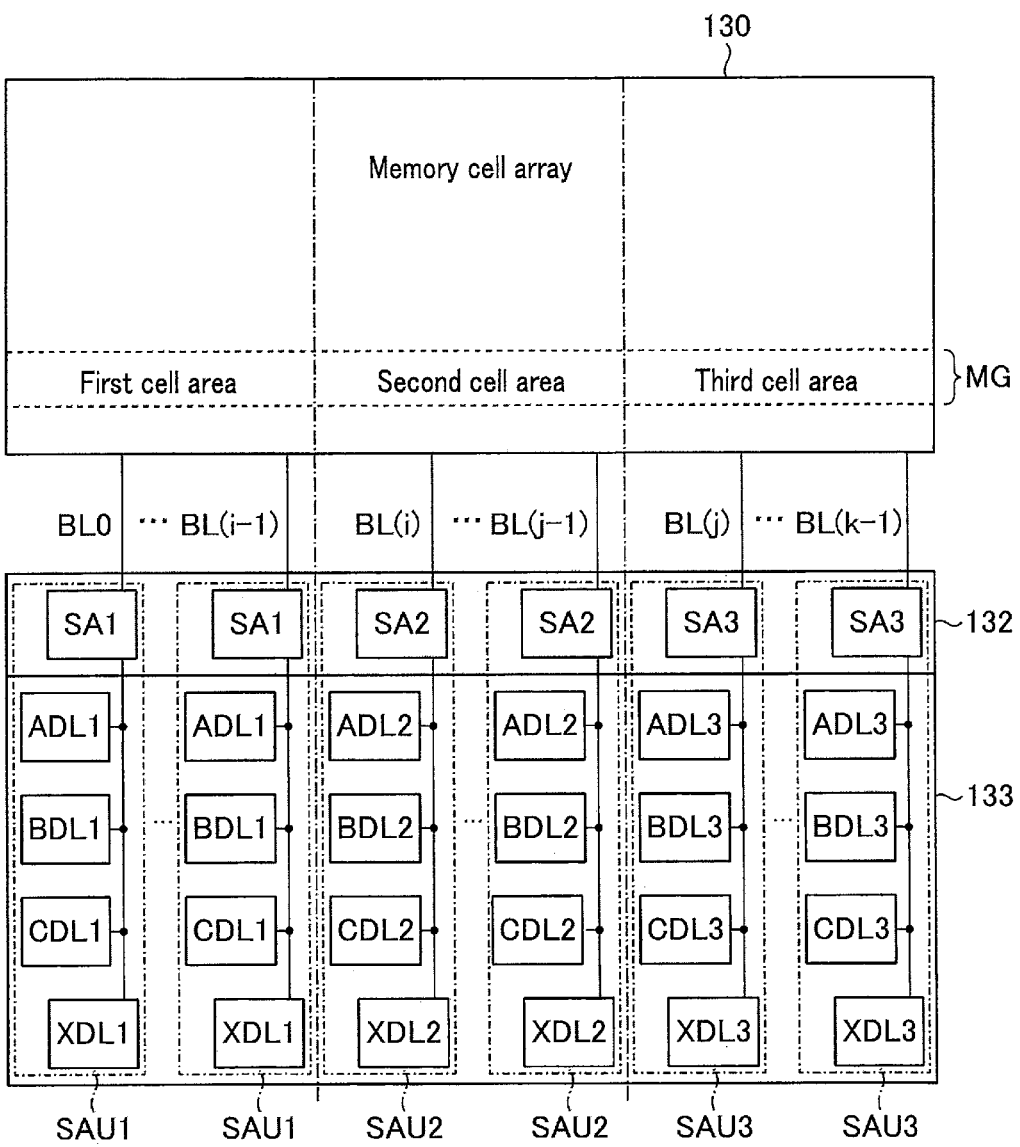
F I G. 37

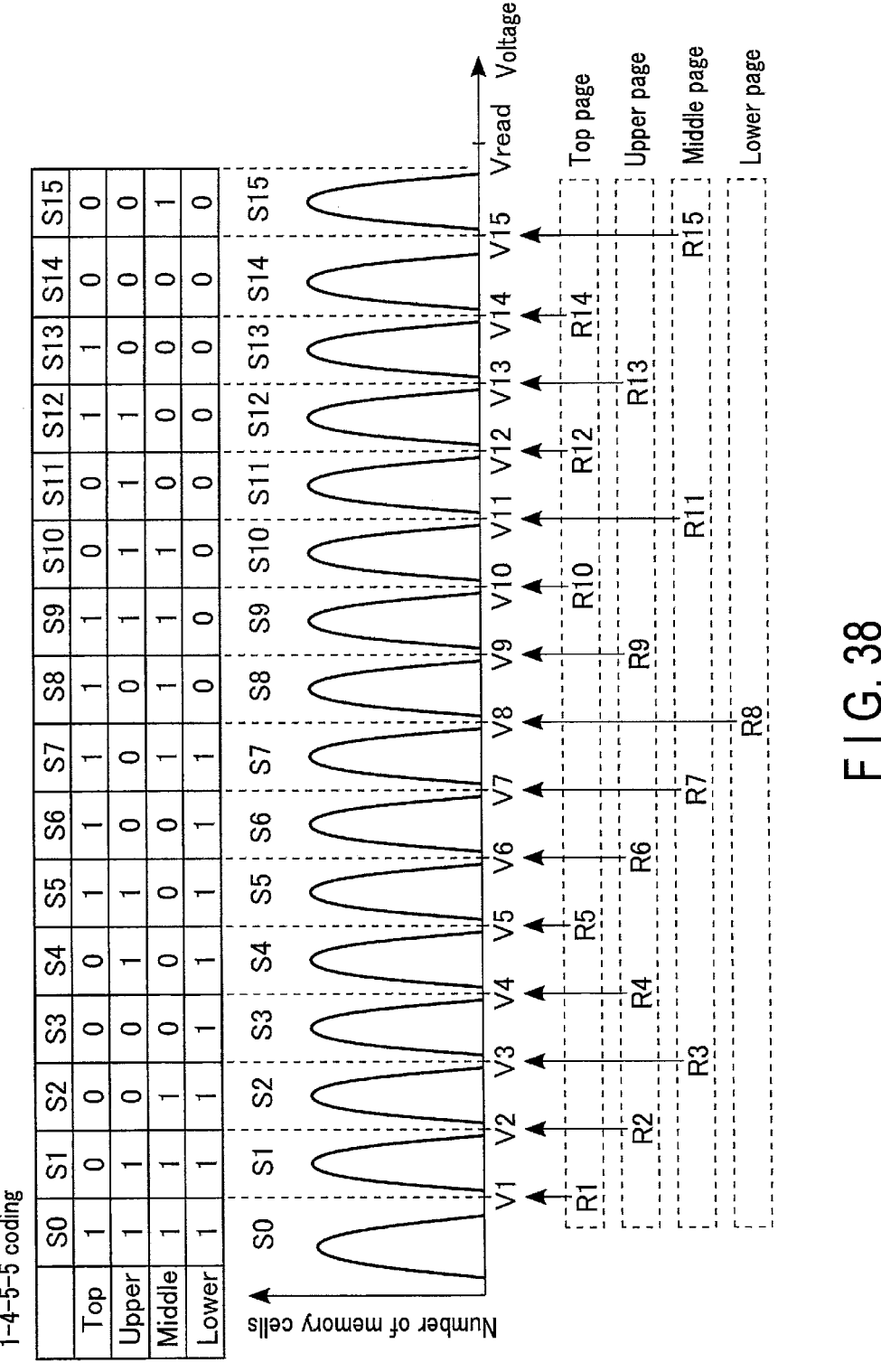
F I G. 38

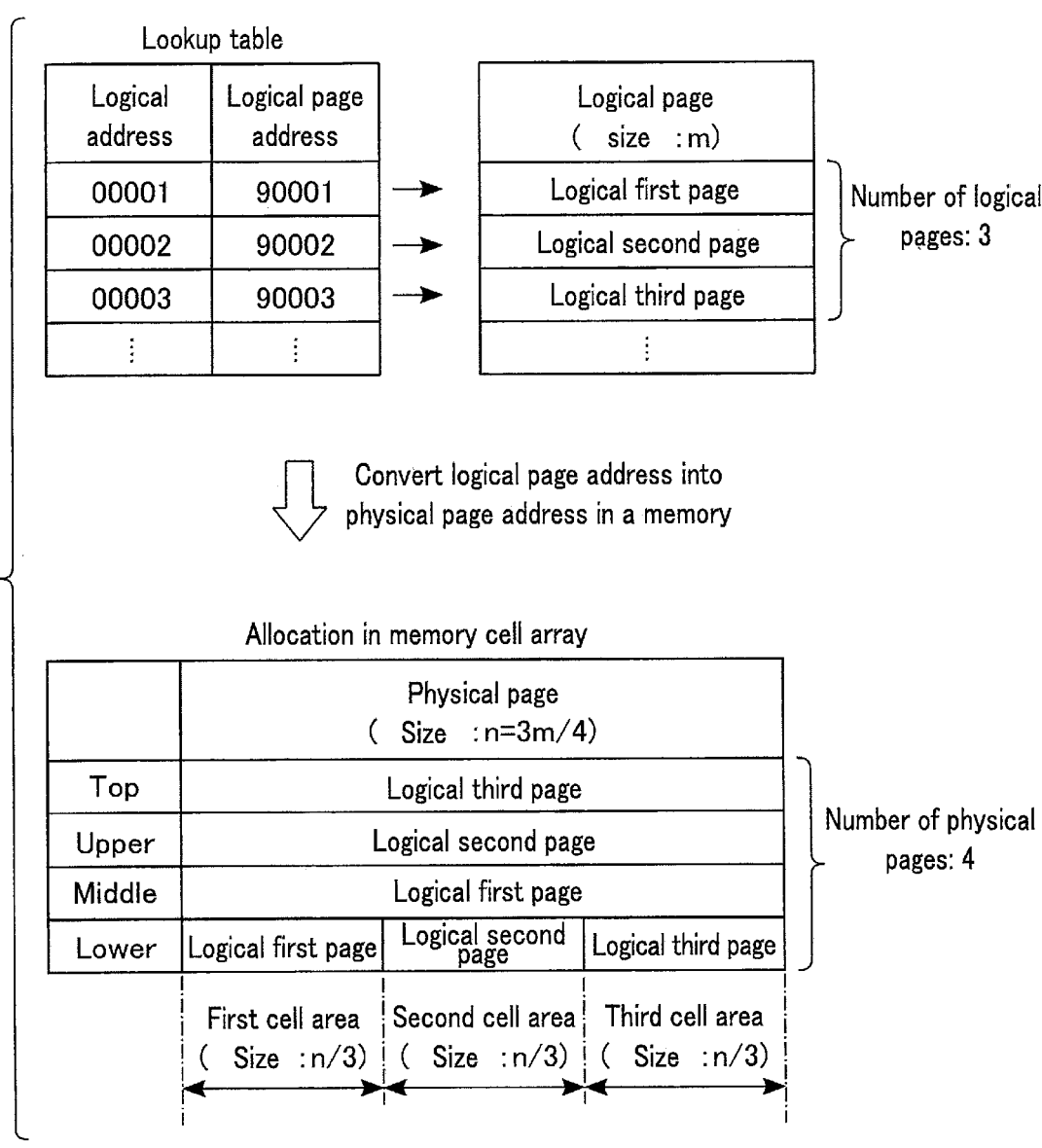
F I G. 39

| Logical first page | First cluster | Second cluster | Third cluster | Fourth cluster |
|---|---|---|---|---|
| Logical second page | First cluster | Second cluster | Third cluster | Fourth cluster |
| Logical third page | First cluster | Second cluster | Third cluster | Fourth cluster |

| Physical page | Cluster allocation | | |
|---|---|---|---|
| | First cell area | Second cell area | Third cell area |
| Top | Logical third page Second cluster | Logical third page Third cluster | Logical third page Fourth cluster |
| Upper | Logical second page Third cluster | Logical second page Fourth cluster | Logical second page Second cluster |
| Middle | Logical first page Fourth cluster | Logical first page Second cluster | Logical first page Third cluster |
| Lower | Logical first page First cluster | Logical second page First cluster | Logical third page First cluster |

F I G. 40

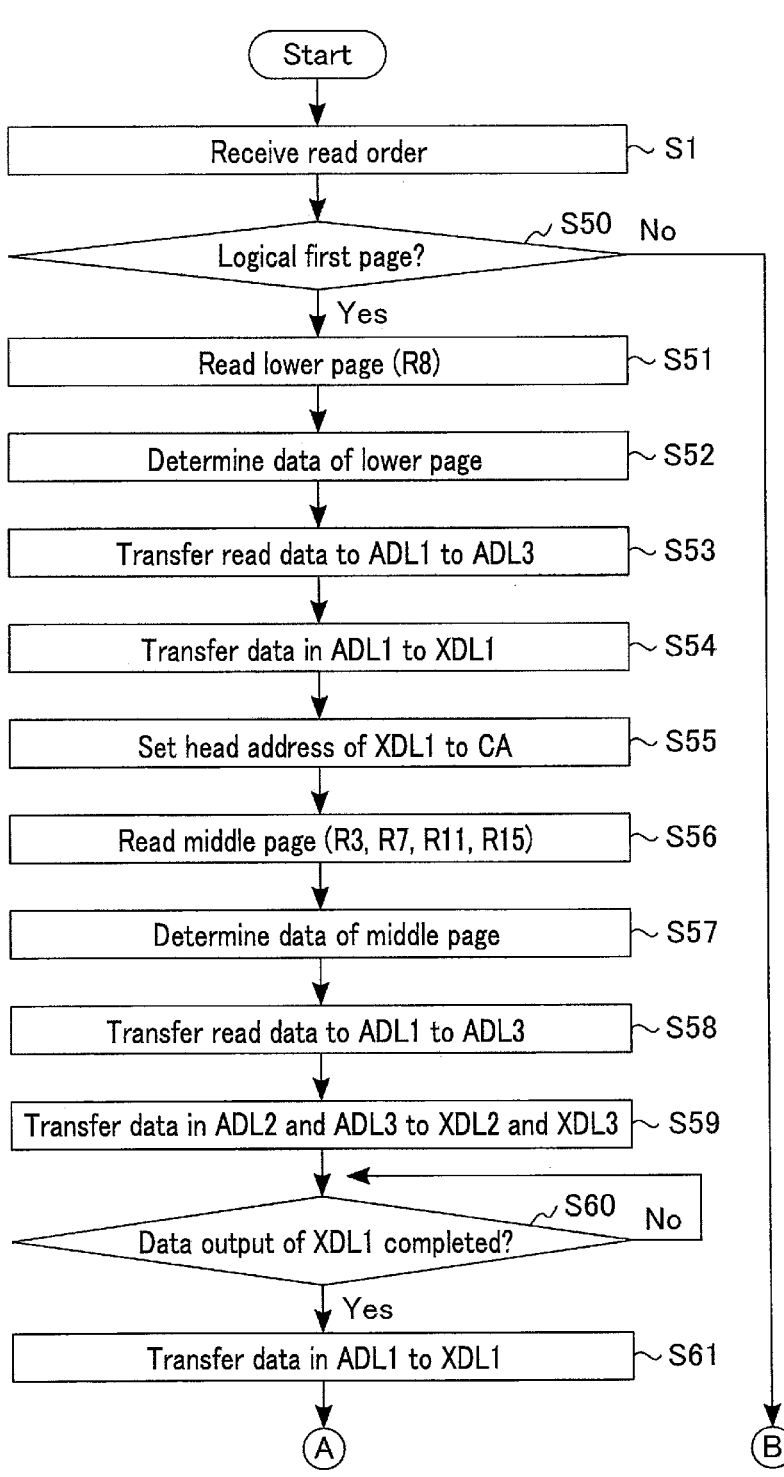
F I G. 41

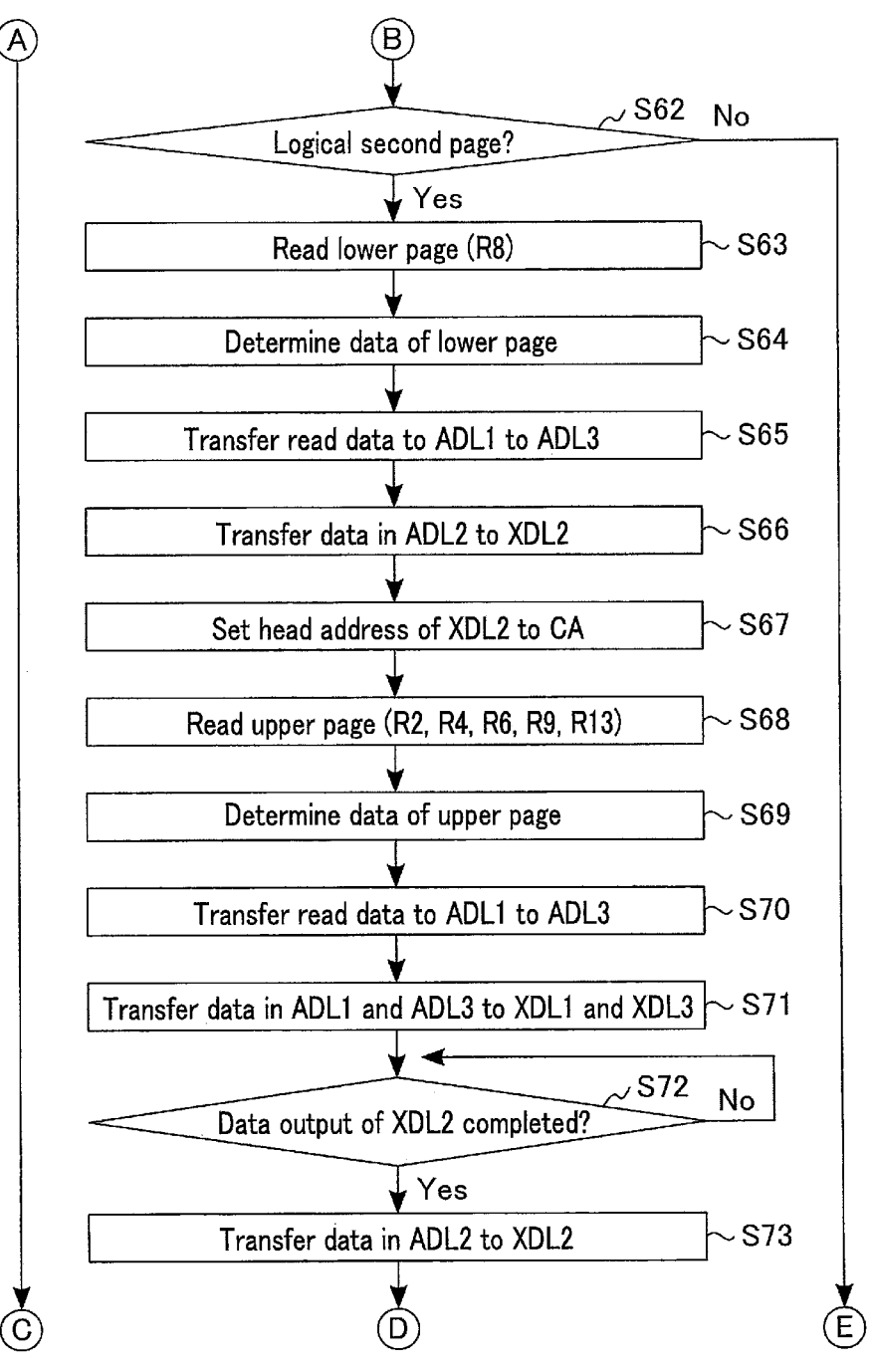
F I G. 42

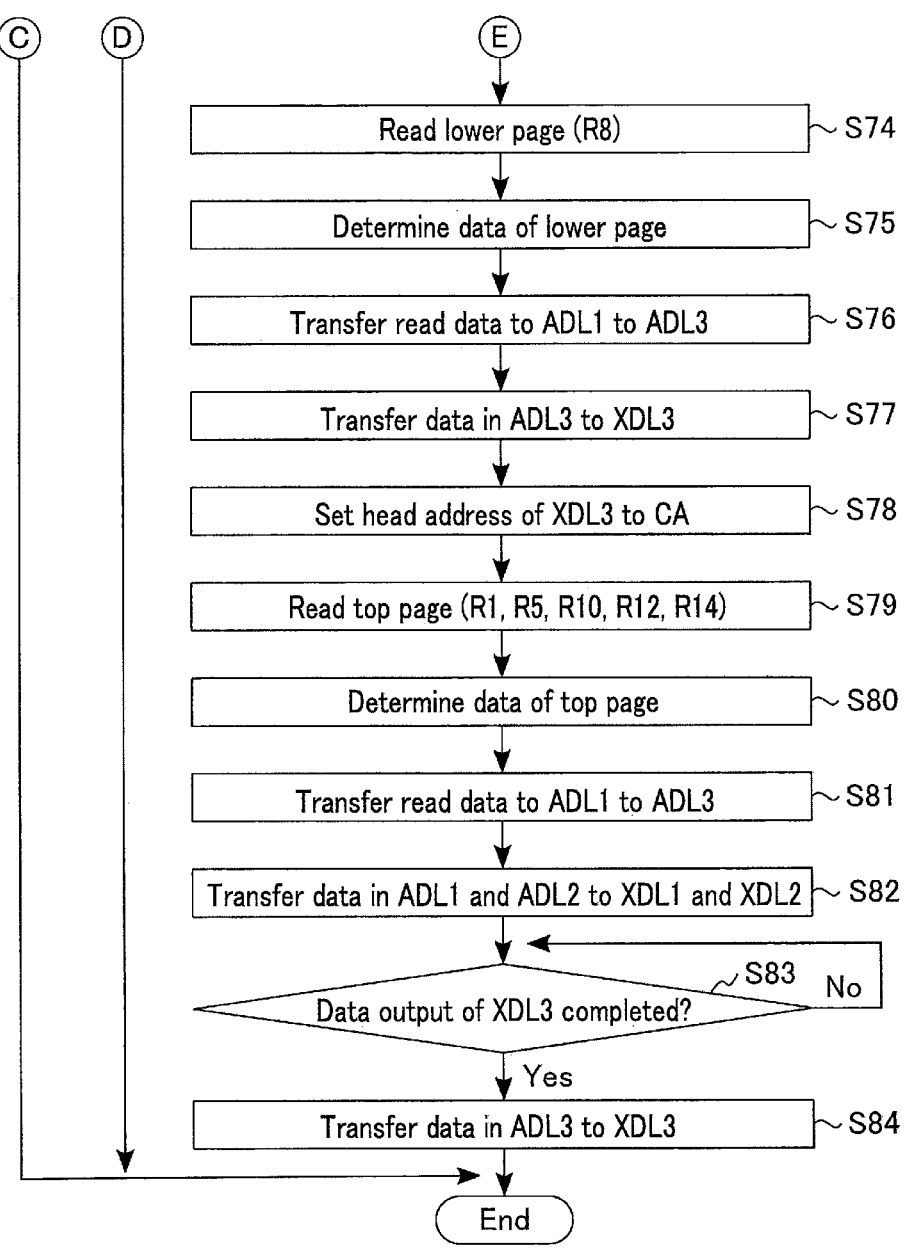
F I G. 43

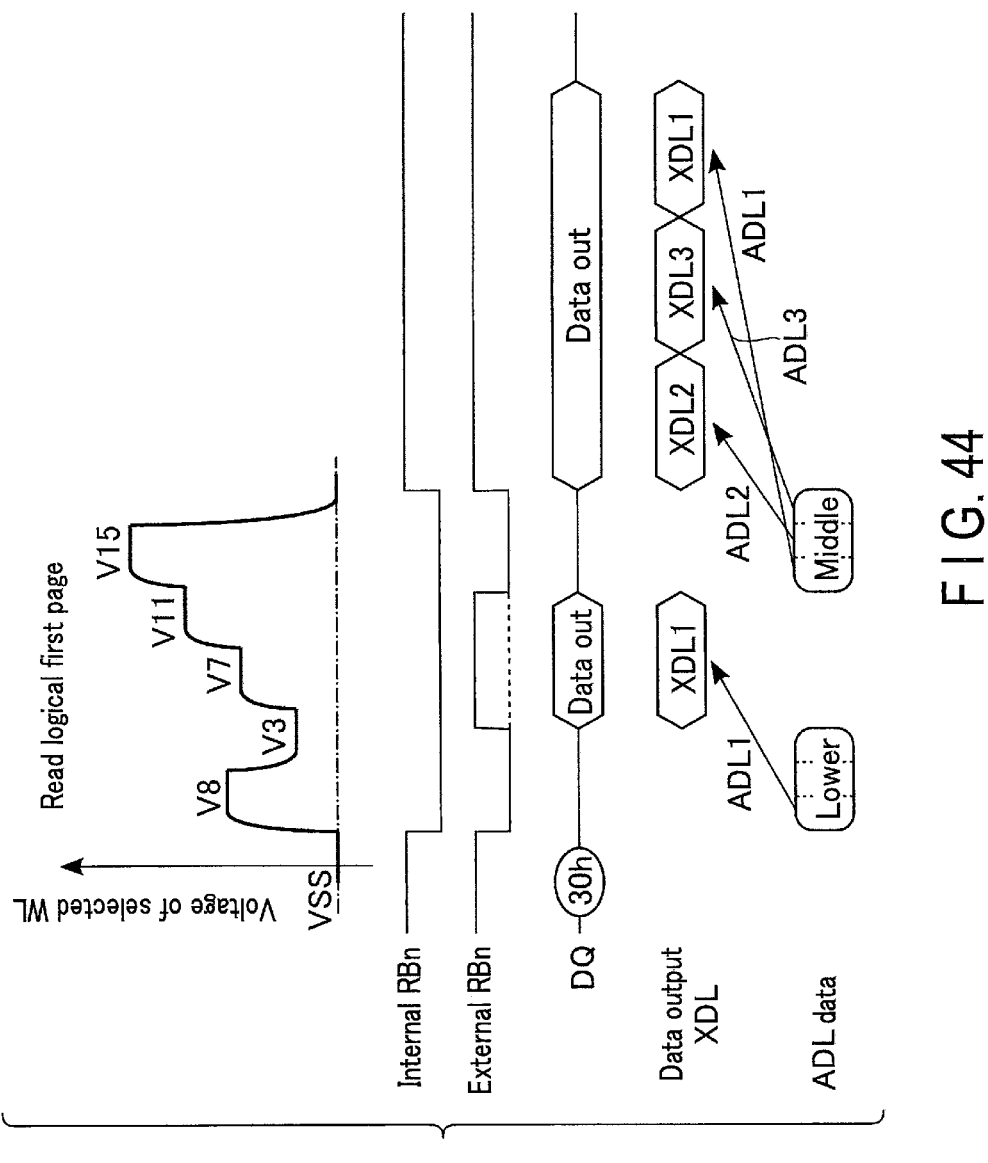
F I G. 44

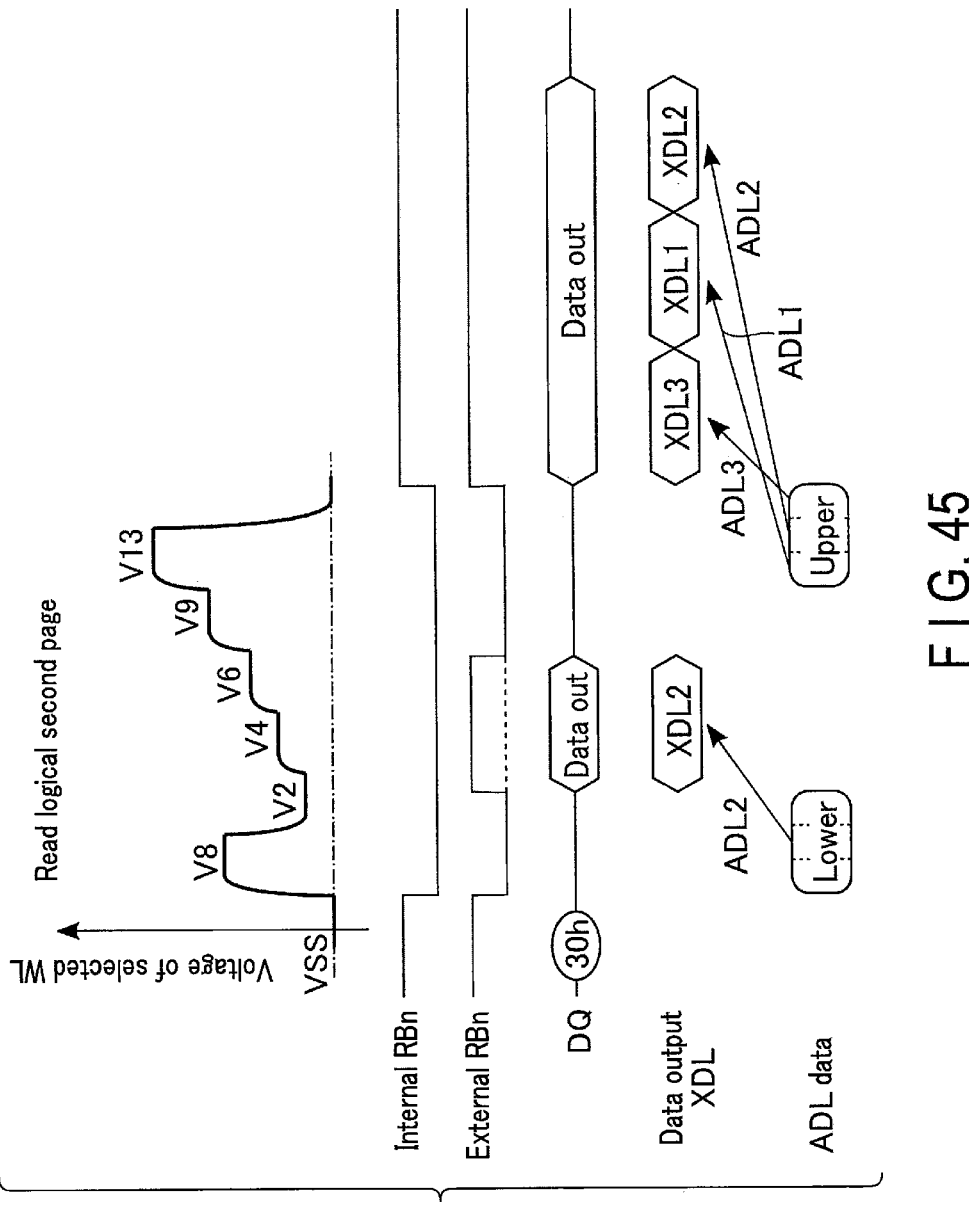
F I G. 45

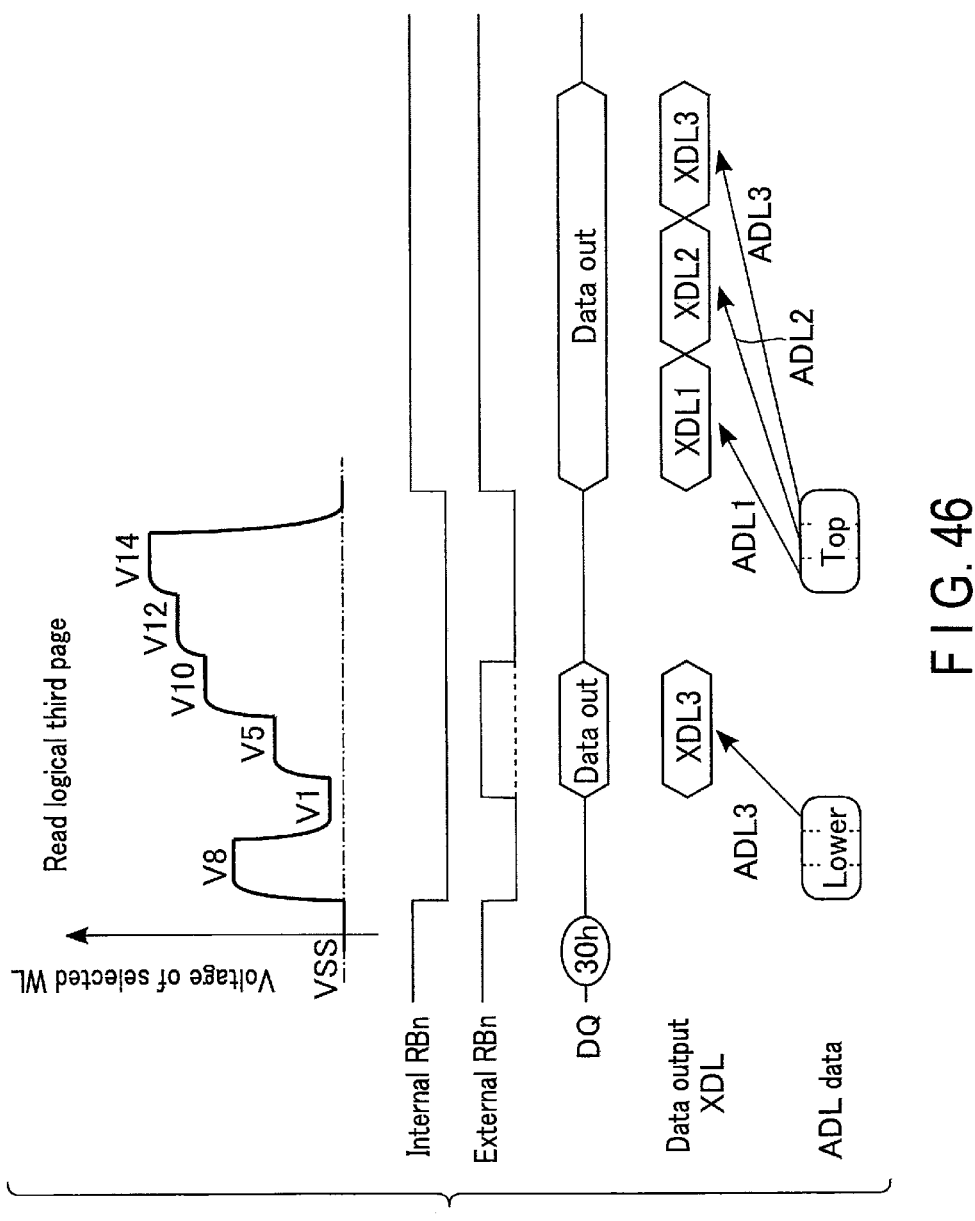
F I G. 46

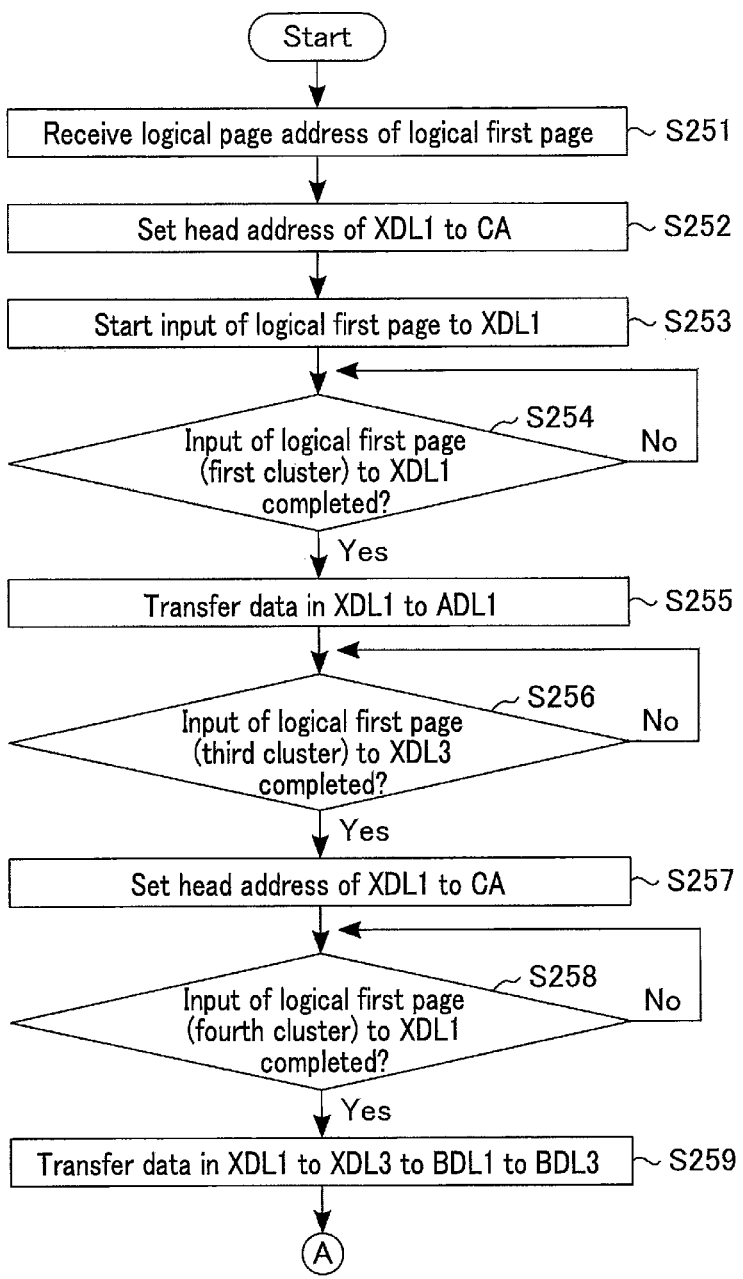

Start

Receive logical page address of logical first page ~ S251

Set head address of XDL1 to CA ~ S252

Start input of logical first page to XDL1 ~ S253

Input of logical first page
(first cluster) to XDL1
completed? — No — S254

Yes

Transfer data in XDL1 to ADL1 ~ S255

Input of logical first page
(third cluster) to XDL3
completed? — No — S256

Yes

Set head address of XDL1 to CA ~ S257

Input of logical first page
(fourth cluster) to XDL1
completed? — No — S258

Yes

Transfer data in XDL1 to XDL3 to BDL1 to BDL3 ~ S259

Ⓐ

F I G. 47

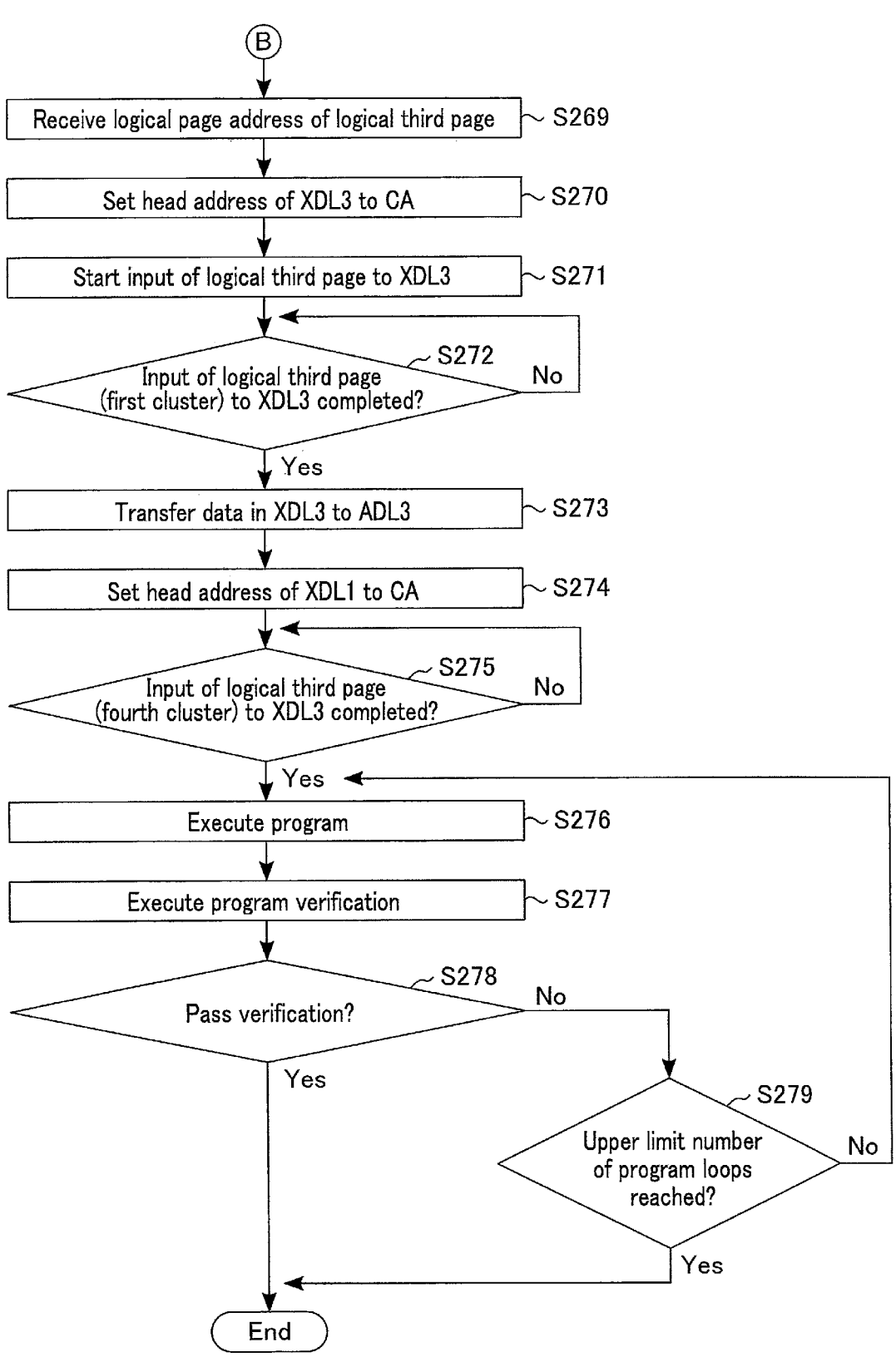

Ⓑ

Receive logical page address of logical third page ~ S269

Set head address of XDL3 to CA ~ S270

Start input of logical third page to XDL3 ~ S271

Input of logical third page (first cluster) to XDL3 completed? ~ S272   No

Yes

Transfer data in XDL3 to ADL3 ~ S273

Set head address of XDL1 to CA ~ S274

Input of logical third page (fourth cluster) to XDL3 completed? ~ S275   No

Yes

Execute program ~ S276

Execute program verification ~ S277

Pass verification? ~ S278   No

Yes

Upper limit number of program loops reached? ~ S279   No

Yes

End

F I G. 49

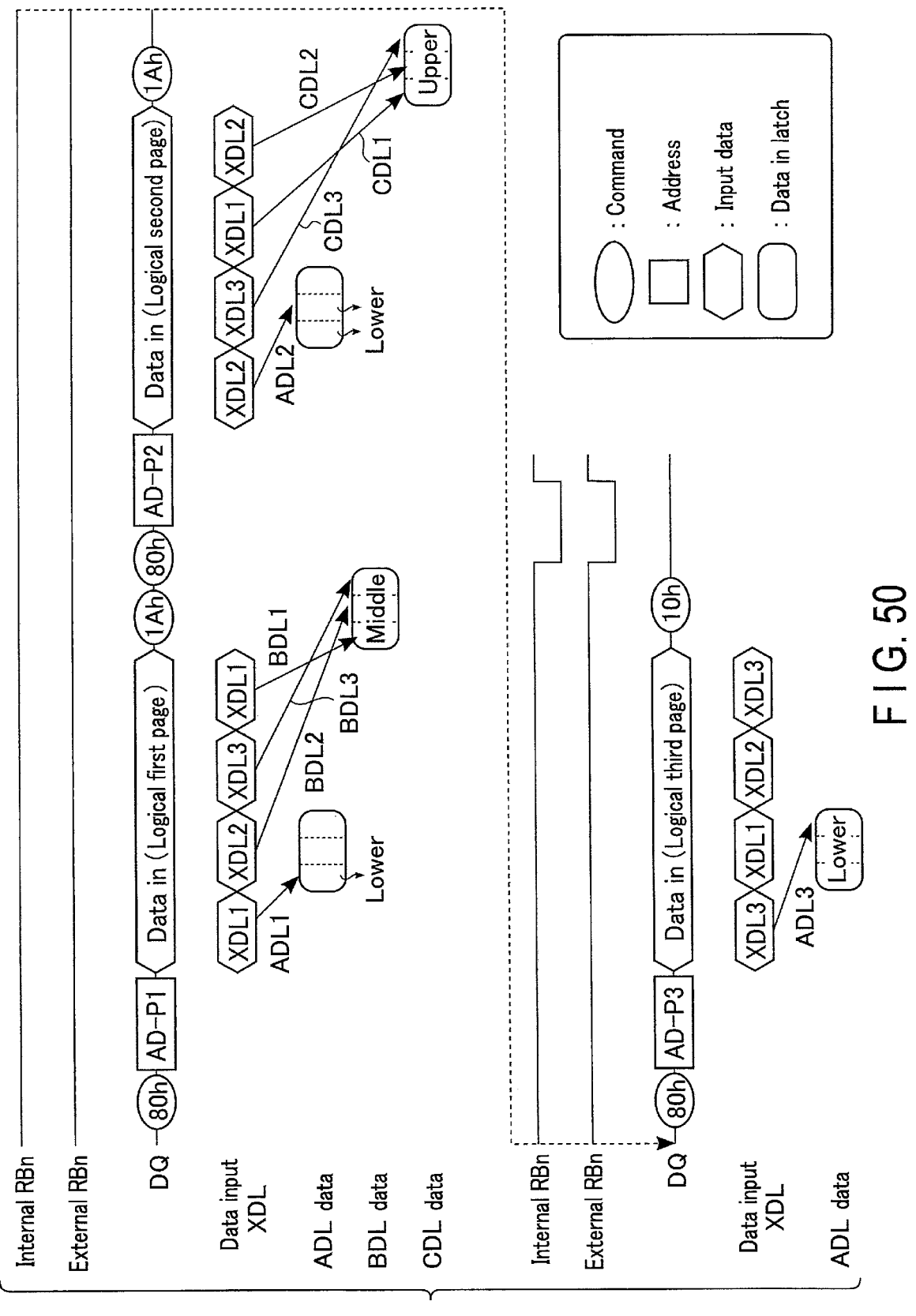
F I G. 50

1-5-4-5 coding

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 1 | 0 | 0 | 0 | 1 | 1 | 0 |
| Upper | 1 | 1 | 0 | 0 | 1 | 1 | 0 | 0 | 0 | 0 | 0 | 0 | 1 | 1 | 1 | 1 |
| Middle | 1 | 1 | 1 | 0 | 0 | 0 | 0 | 1 | 1 | 0 | 0 | 1 | 1 | 1 | 0 | 0 |
| Lower | 1 | 1 | 1 | 1 | 1 | 1 | 1 | 1 | 0 | 0 | 0 | 0 | 0 | 0 | 0 | 0 |

F I G. 51

1-5-5-4 coding

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 1 | 1 | 0 | 0 | 0 | 0 | 1 |
| Upper | 1 | 1 | 0 | 0 | 1 | 1 | 0 | 0 | 0 | 1 | 1 | 1 | 1 | 0 | 0 | 0 |
| Middle | 1 | 1 | 1 | 0 | 0 | 0 | 0 | 1 | 1 | 1 | 0 | 0 | 1 | 1 | 0 | 0 |
| Lower | 1 | 1 | 1 | 1 | 1 | 1 | 1 | 1 | 0 | 0 | 0 | 0 | 0 | 0 | 0 | 0 |

F I G. 52

1-5-5-4 coding

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 0 | 0 | 0 | 0 | 1 | 1 | 1 |
| Upper | 1 | 1 | 0 | 0 | 1 | 1 | 0 | 0 | 0 | 0 | 0 | 1 | 1 | 1 | 1 | 0 |
| Middle | 1 | 1 | 1 | 0 | 0 | 0 | 0 | 1 | 1 | 1 | 0 | 0 | 1 | 1 | 0 | 0 |
| Lower | 1 | 1 | 1 | 1 | 1 | 1 | 1 | 1 | 0 | 0 | 0 | 0 | 0 | 0 | 0 | 0 |

F I G. 53

1-5-5-4 coding

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 0 | 0 | 0 | 1 | 1 | 1 | 1 |
| Upper | 1 | 1 | 0 | 0 | 0 | 1 | 1 | 0 | 0 | 0 | 1 | 1 | 1 | 1 | 0 | 0 |
| Middle | 1 | 1 | 1 | 1 | 0 | 0 | 0 | 0 | 0 | 1 | 1 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

F I G. 54

1-5-4-5 coding

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 0 | 1 | 1 | 1 | 1 | 0 | 0 |
| Upper | 1 | 1 | 0 | 0 | 0 | 1 | 1 | 0 | 0 | 0 | 0 | 0 | 1 | 1 | 1 | 1 |
| Middle | 1 | 1 | 1 | 1 | 0 | 0 | 0 | 0 | 0 | 1 | 1 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

F I G. 55

1-5-4-5 coding

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 1 | 0 | 0 | 0 | 0 | 1 | 1 |
| Middle | 1 | 1 | 1 | 1 | 0 | 0 | 0 | 0 | 0 | 1 | 1 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

F I G. 56

1-4-5-5 coding

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 0 | 0 | 1 | 1 | 1 | 0 | 0 |
| Middle | 1 | 1 | 1 | 1 | 0 | 0 | 0 | 0 | 0 | 0 | 1 | 1 | 1 | 0 | 0 | 1 |
| Lower | 1 | 1 | 1 | 1 | 1 | 1 | 1 | 1 | 0 | 0 | 0 | 0 | 0 | 0 | 0 | 0 |

F I G. 57

1-4-5-5 coding

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 1 | 0 | 0 | 1 | 1 | 0 | 0 |
| Upper | 1 | 1 | 0 | 0 | 1 | 1 | 0 | 0 | 0 | 0 | 0 | 1 | 1 | 1 | 1 | 0 |
| Middle | 1 | 1 | 1 | 0 | 0 | 0 | 0 | 1 | 1 | 0 | 0 | 0 | 0 | 1 | 1 | 1 |
| Lower | 1 | 1 | 1 | 1 | 1 | 1 | 1 | 1 | 0 | 0 | 0 | 0 | 0 | 0 | 0 | 0 |

F I G. 58

1-4-5-5 coding

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 0 | 0 | 1 | 1 | 1 | 1 | 1 | 0 | 0 | 0 | 0 |
| Upper | 1 | 1 | 0 | 0 | 0 | 0 | 1 | 1 | 1 | 1 | 0 | 0 | 0 | 1 | 1 | 0 |
| Middle | 1 | 1 | 1 | 1 | 0 | 0 | 0 | 0 | 0 | 1 | 1 | 0 | 0 | 0 | 1 | 1 |
| Lower | 1 | 1 | 1 | 1 | 1 | 1 | 1 | 1 | 0 | 0 | 0 | 0 | 0 | 0 | 0 | 0 |

F I G. 59

1-5-4-5 coding

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 0 | 0 | 1 | 1 | 1 | 1 | 0 | 0 | 1 | 1 | 1 | 0 | 0 |
| Upper | 1 | 1 | 0 | 0 | 1 | 1 | 0 | 0 | 0 | 0 | 0 | 0 | 1 | 1 | 1 | 1 |
| Middle | 1 | 1 | 1 | 0 | 0 | 0 | 0 | 1 | 1 | 1 | 0 | 0 | 0 | 1 | 1 | 0 |
| Lower | 1 | 1 | 1 | 1 | 1 | 1 | 1 | 1 | 0 | 0 | 0 | 0 | 0 | 0 | 0 | 0 |

F I G. 60

1-4-5-5 coding

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 0 | 0 | 1 | 1 | 1 | 1 | 0 |
| Upper | 1 | 1 | 0 | 0 | 0 | 1 | 1 | 0 | 0 | 1 | 1 | 1 | 1 | 0 | 0 | 0 |
| Middle | 1 | 1 | 1 | 1 | 0 | 0 | 0 | 0 | 0 | 0 | 1 | 1 | 0 | 0 | 1 | 1 |
| Lower | 1 | 1 | 1 | 1 | 1 | 1 | 1 | 1 | 0 | 0 | 0 | 0 | 0 | 0 | 0 | 0 |

F I G. 61

1-4-5-5 coding

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| Top | 1 | 0 | 0 | 1 | 1 | 1 | 0 | 0 | 0 | 1 | 1 | 1 | 1 | 0 | 0 | 0 |
| Upper | 1 | 1 | 0 | 0 | 0 | 1 | 1 | 0 | 0 | 0 | 0 | 1 | 1 | 1 | 1 | 0 |
| Middle | 1 | 1 | 1 | 1 | 0 | 0 | 0 | 0 | 0 | 0 | 1 | 1 | 0 | 0 | 1 | 1 |
| Lower | 1 | 1 | 1 | 1 | 1 | 1 | 1 | 1 | 0 | 0 | 0 | 0 | 0 | 0 | 0 | 0 |

F I G. 62

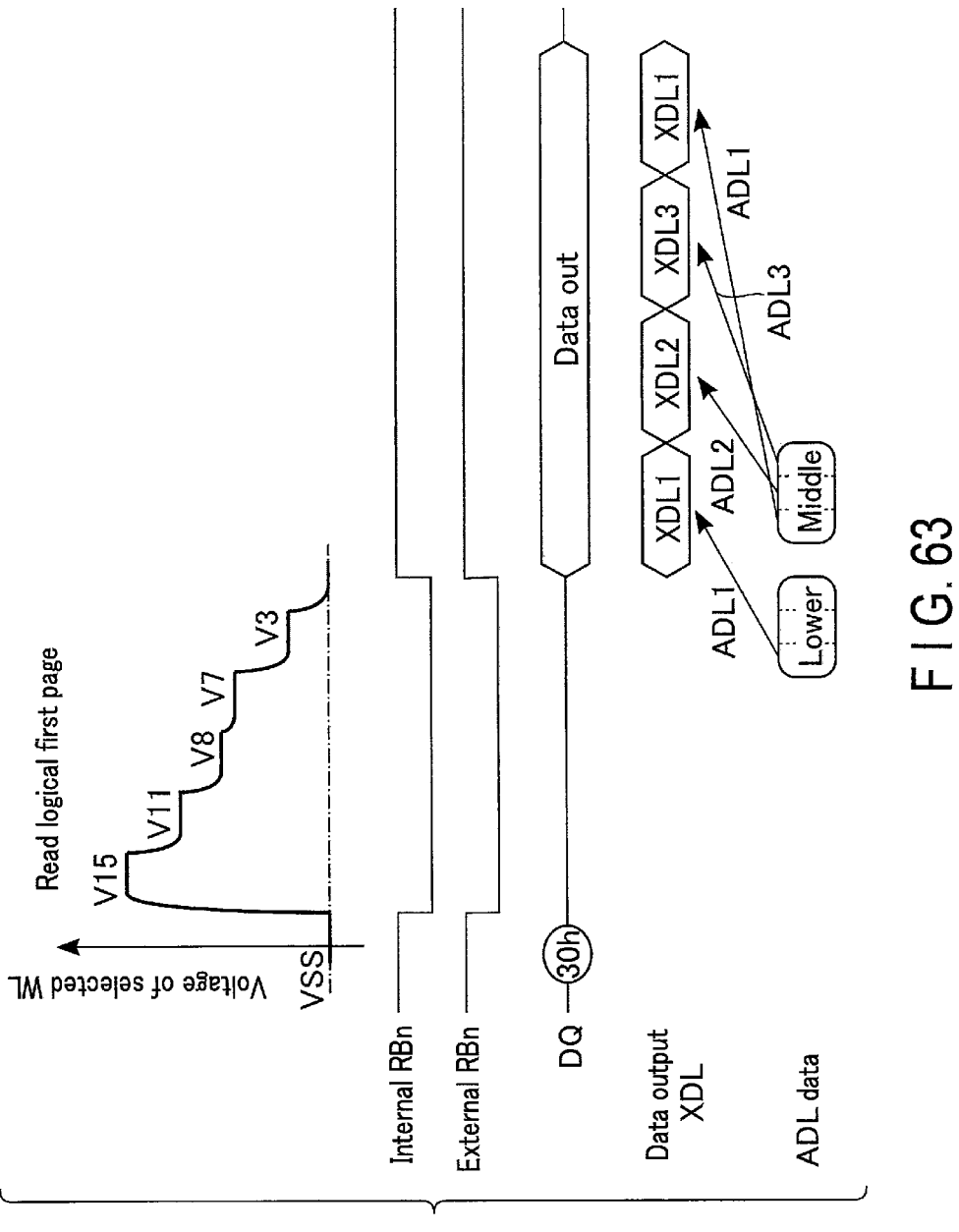
F I G. 63

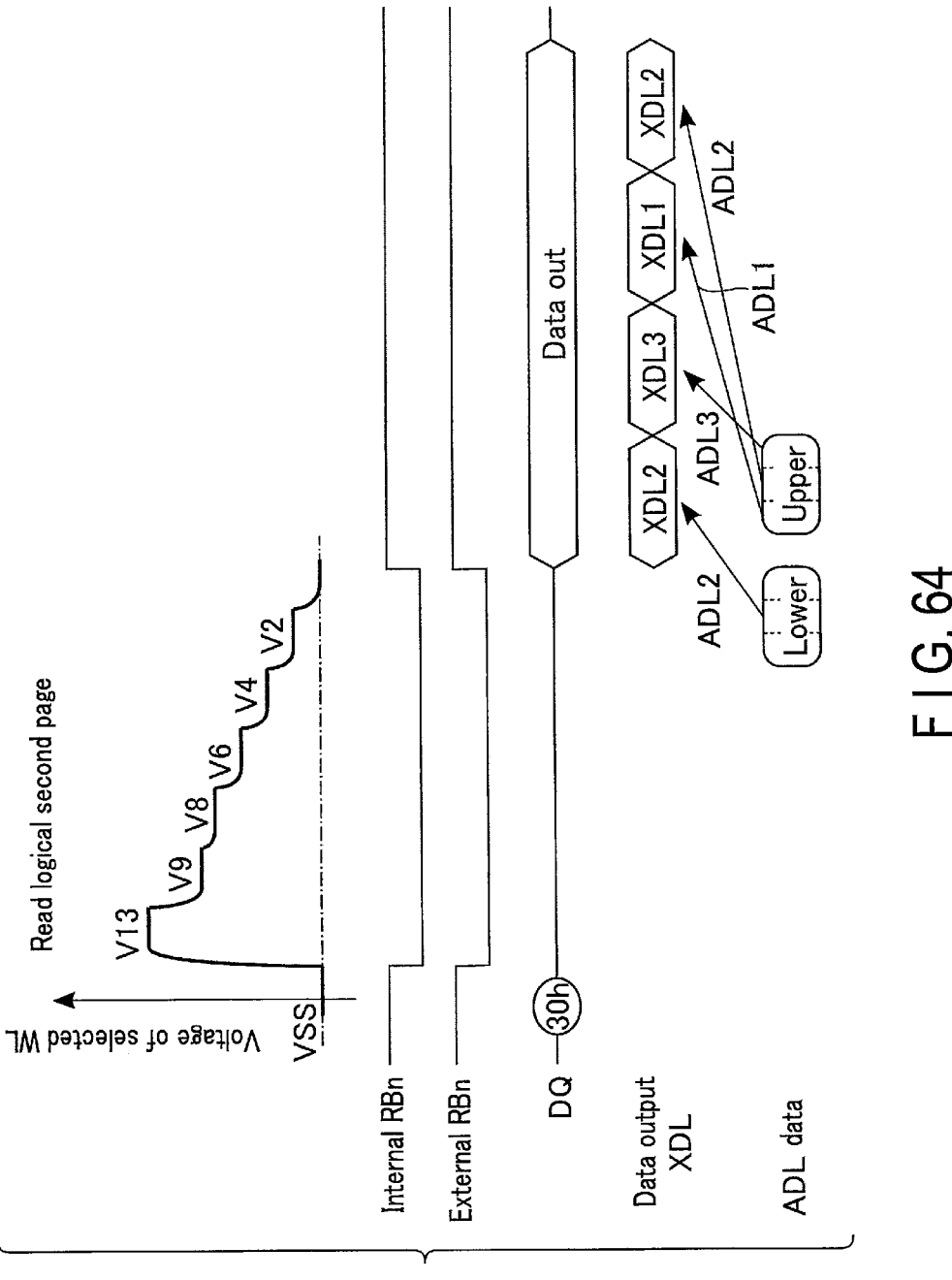
F I G. 64

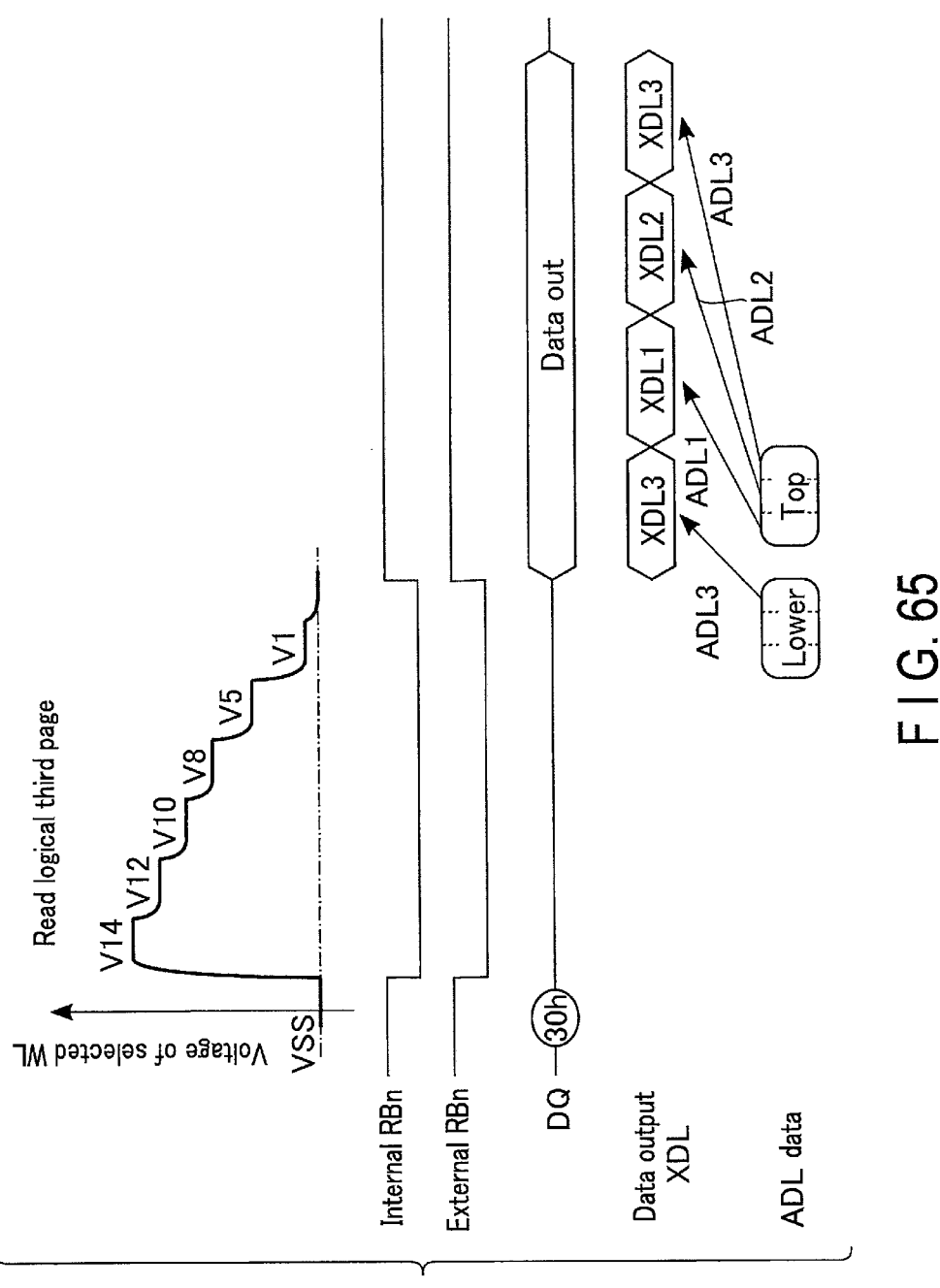
F I G. 65

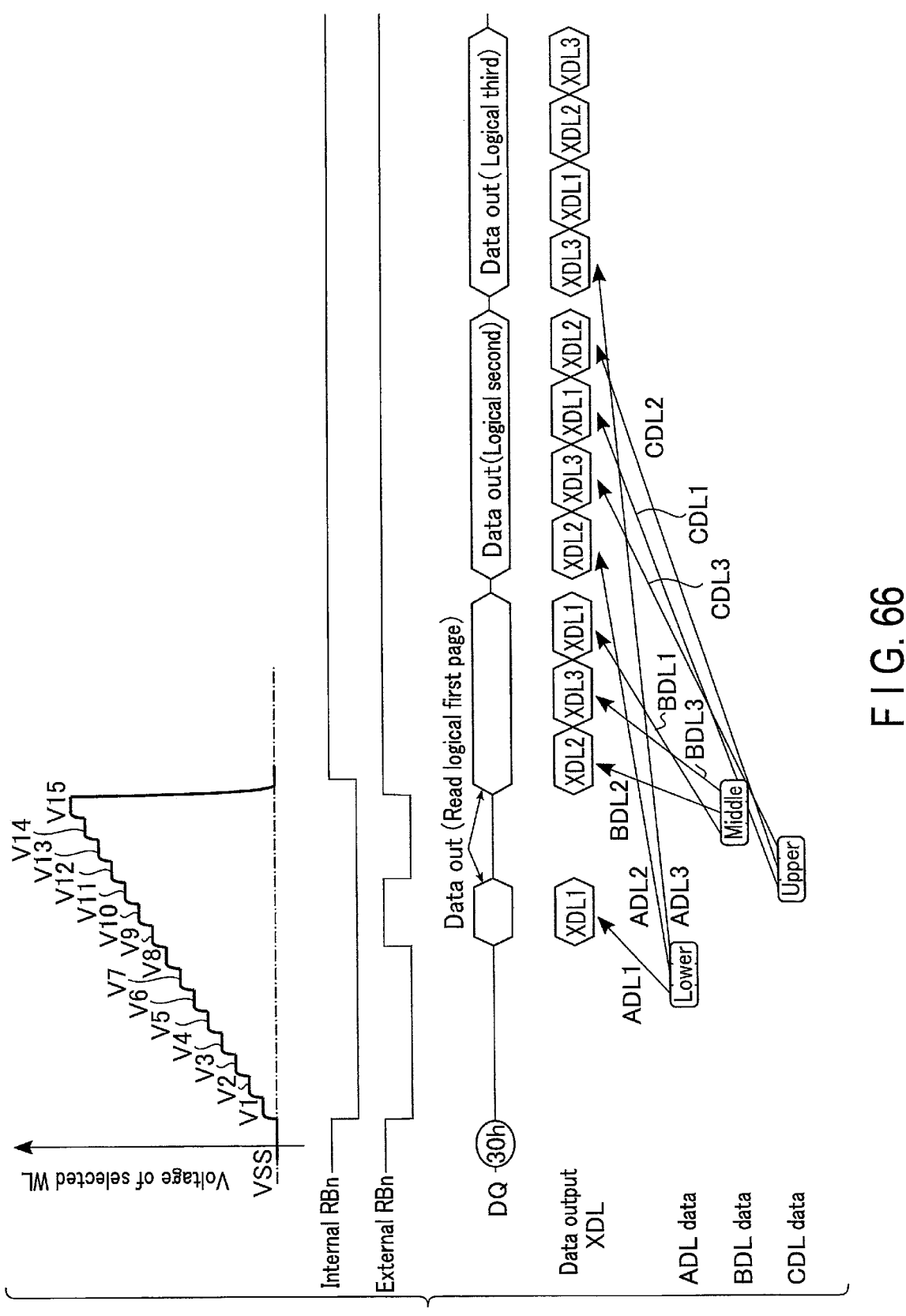
F I G. 66

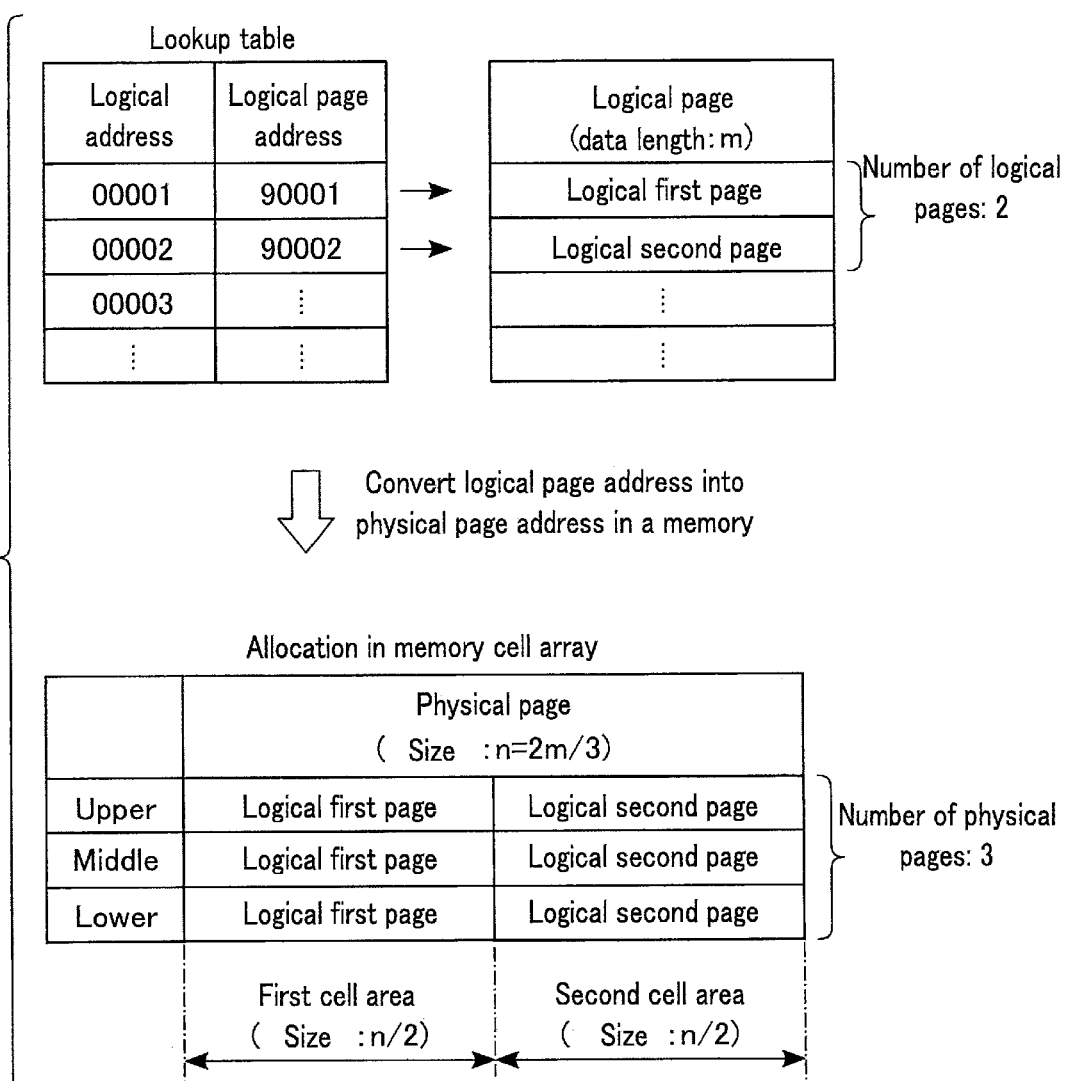
F I G. 67

| Logical first page | First cluster | Second cluster | Third cluster |
|---|---|---|---|
| Logical second page | First cluster | Second cluster | Third cluster |

| Physical page | Cluster allocation | |
|---|---|---|
| | First cell area | Second cell area |
| Upper | Logical first page Third cluster | Logical second page Third cluster |
| Middle | Logical first page Second cluster | Logical second page Second cluster |
| Lower | Logical first page First cluster | Logical second page First cluster |

F I G. 68

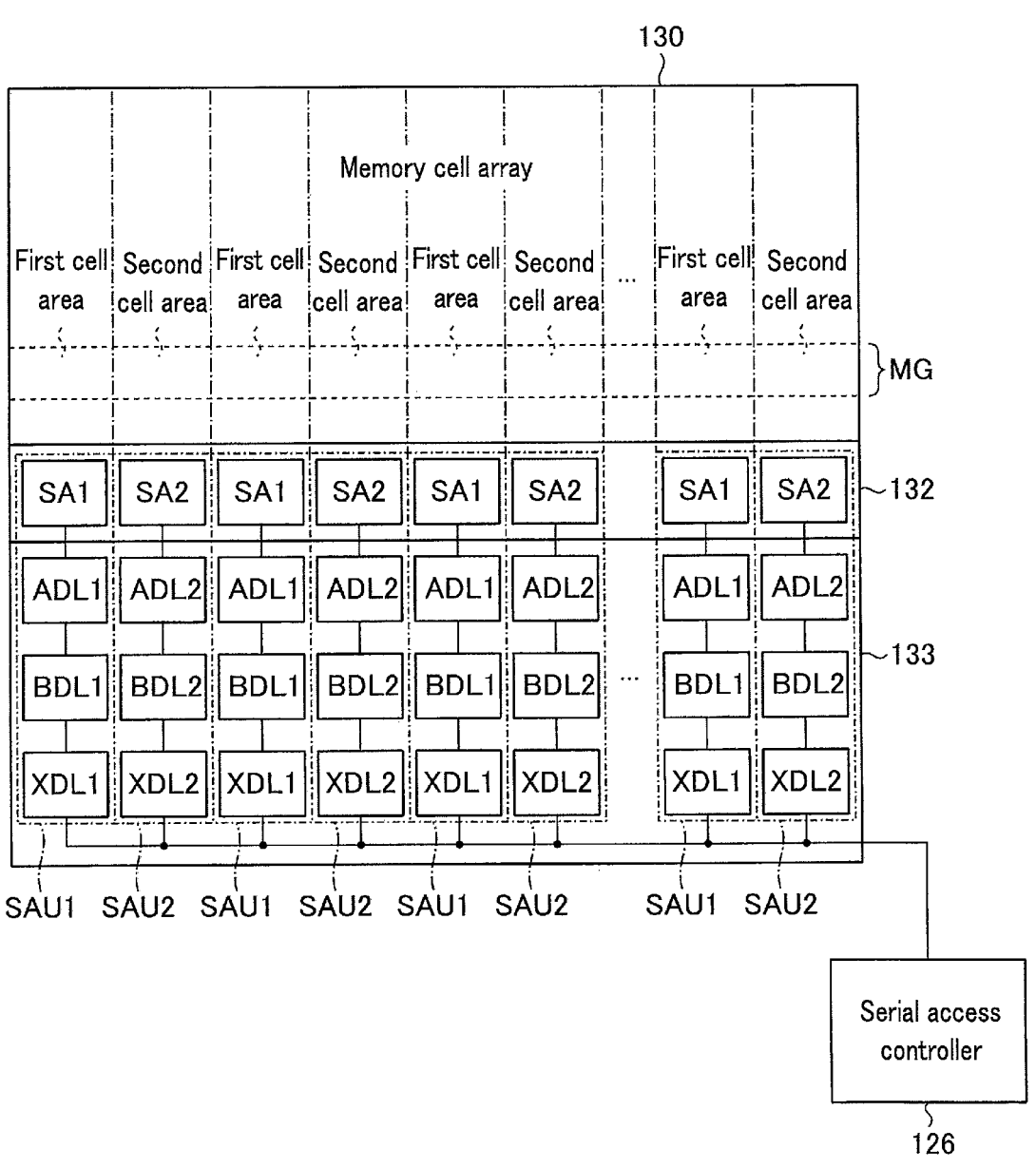
F I G. 69

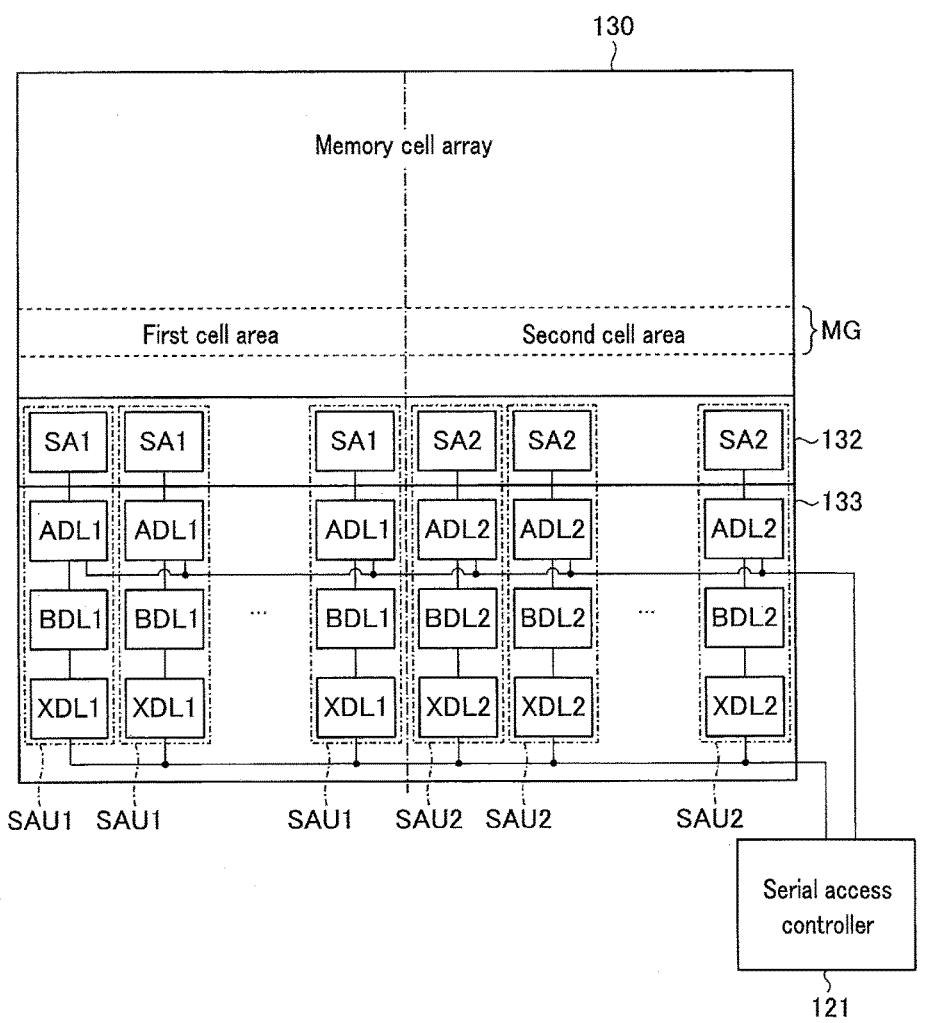
F I G. 70

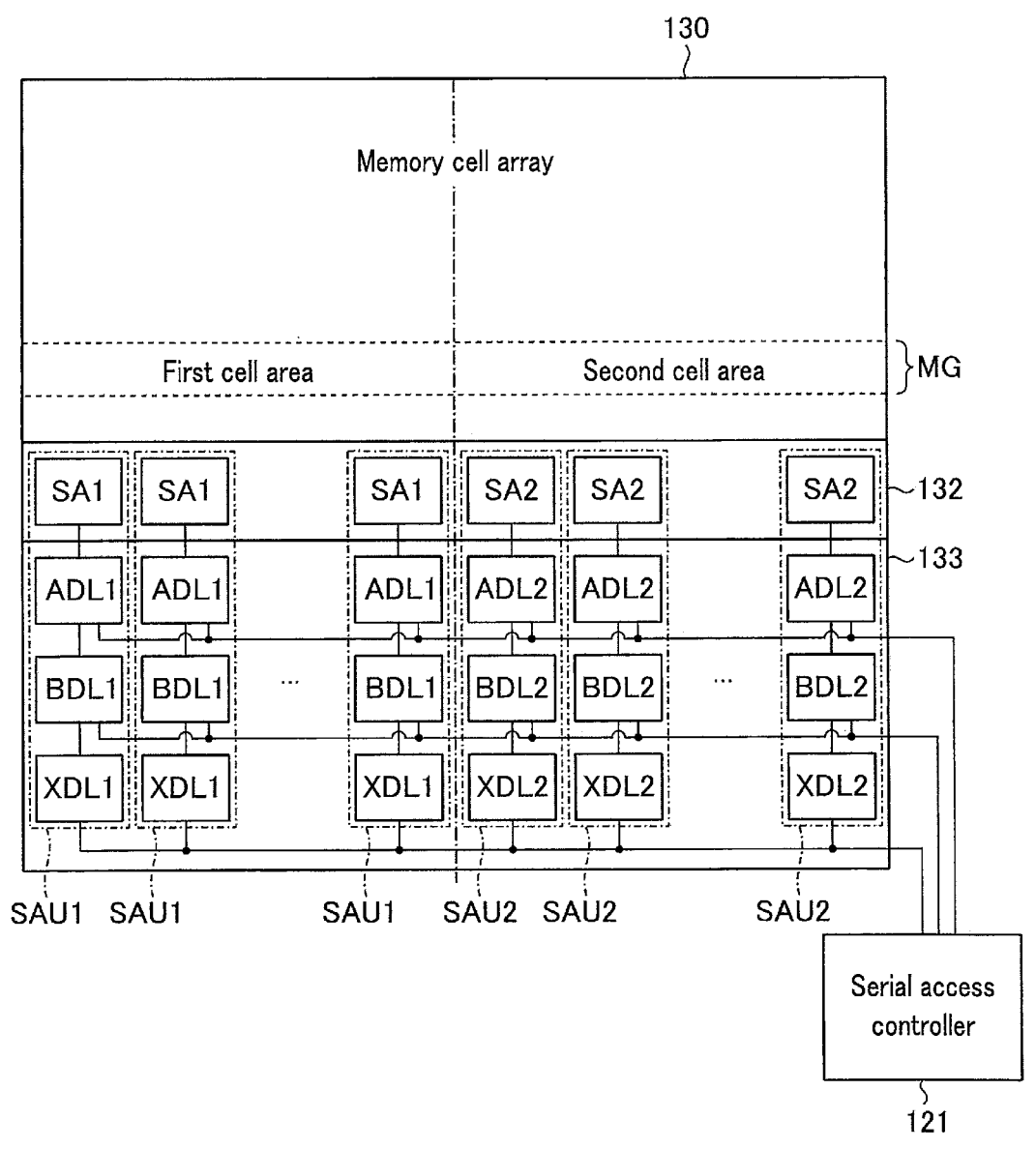
F I G. 71

| Logical first page | First cluster | Second cluster | Third cluster |
|---|---|---|---|
| Logical second page | First cluster | Second cluster | Third cluster |

| Physical page | Cluster allocation | |
|---|---|---|
| | First cell area | Second cell area |
| Upper | Logical second page Second cluster | Logical second page Third cluster |
| Middle | Logical first page Third cluster | Logical second page First cluster |
| Lower | Logical first page First cluster | Logical first page Second cluster |

F I G. 72

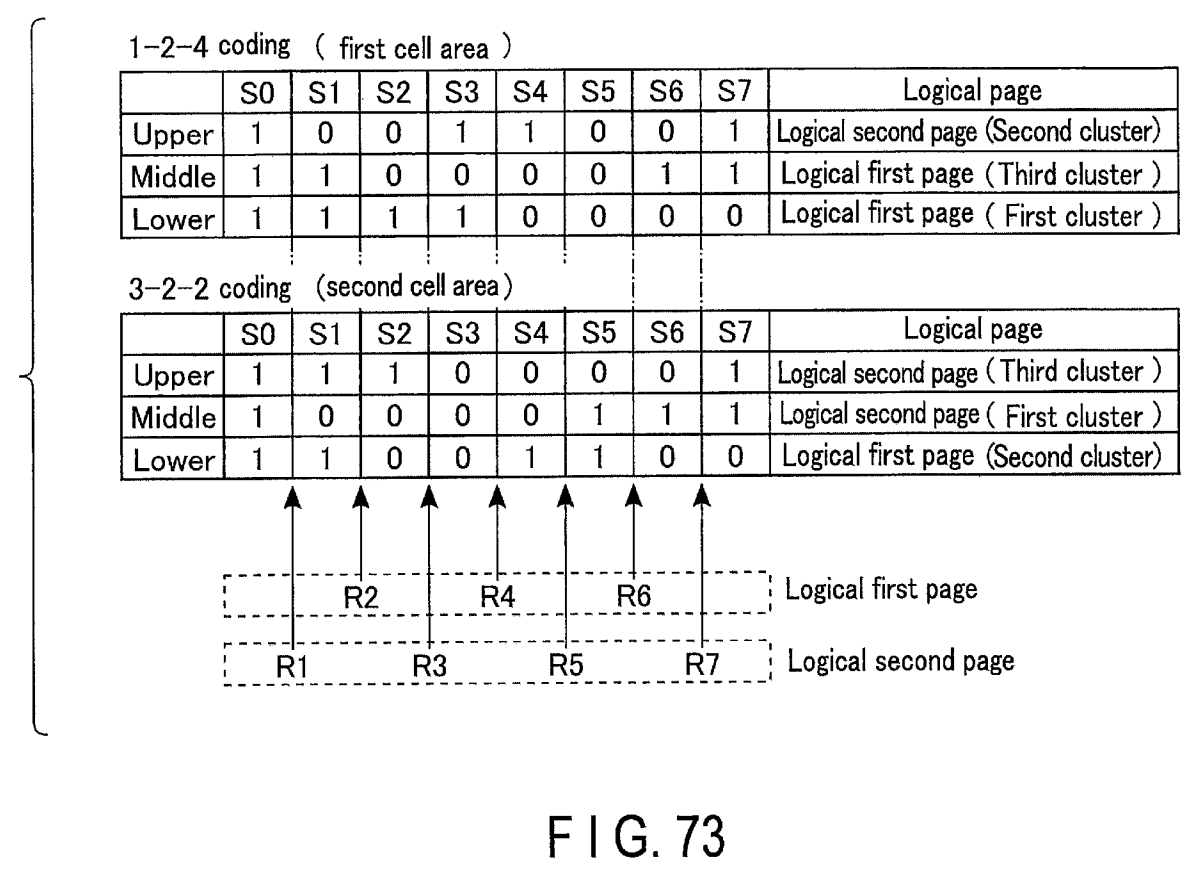

1-2-4 coding ( first cell area )

|  | S0 | S1 | S2 | S3 | S4 | S5 | S6 | S7 | Logical page |
|---|---|---|---|---|---|---|---|---|---|
| Upper | 1 | 0 | 0 | 1 | 1 | 0 | 0 | 1 | Logical second page (Second cluster) |
| Middle | 1 | 1 | 0 | 0 | 0 | 0 | 1 | 1 | Logical first page (Third cluster) |
| Lower | 1 | 1 | 1 | 1 | 0 | 0 | 0 | 0 | Logical first page ( First cluster ) |

3-2-2 coding (second cell area)

|  | S0 | S1 | S2 | S3 | S4 | S5 | S6 | S7 | Logical page |
|---|---|---|---|---|---|---|---|---|---|
| Upper | 1 | 1 | 1 | 0 | 0 | 0 | 0 | 1 | Logical second page (Third cluster ) |
| Middle | 1 | 0 | 0 | 0 | 0 | 1 | 1 | 1 | Logical second page ( First cluster ) |
| Lower | 1 | 1 | 0 | 0 | 1 | 1 | 0 | 0 | Logical first page (Second cluster) |

R1  R2  R3  R4  R5  R6  R7

Logical first page

Logical second page

F I G. 73

| Logical first page | First cluster | Second cluster | Third cluster |
|---|---|---|---|

⇩

| Physical page | Cluster allocation |
|---|---|
| Upper | Third cluster |
| Middle | Second cluster |
| Lower | First cluster |

F I G. 74

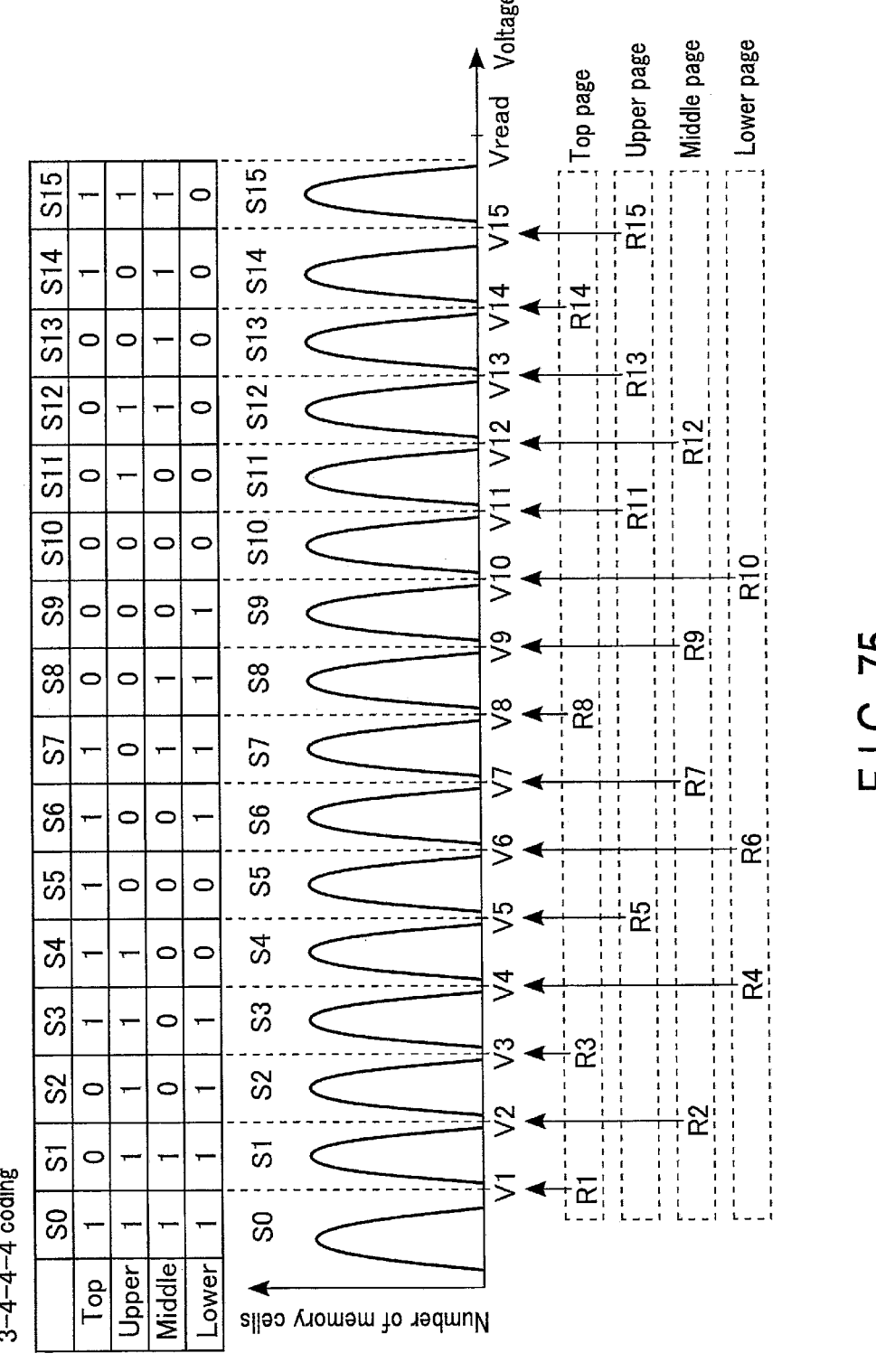
F I G. 75

| Logical first page | First cluster | Second cluster | Third cluster | Fourth cluster |
|---|---|---|---|---|
| Physical page | Cluster allocation |
|---|---|
| Top | Fourth cluster |
| Upper | Third cluster |
| Middle | Second cluster |
| Lower | First cluster |
F I G. 76

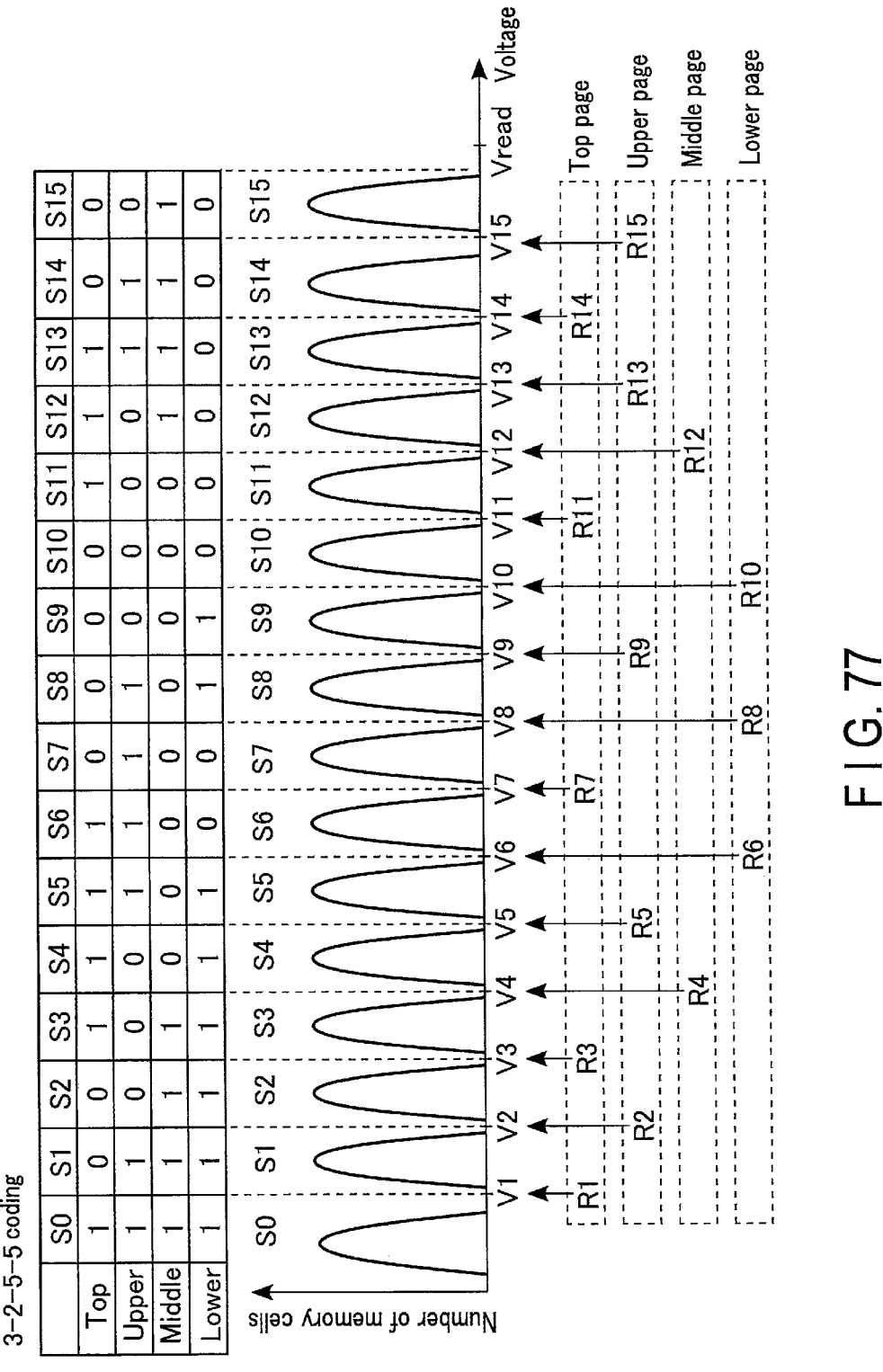
F I G. 77

| Logical first page | First cluster | Second cluster |
|---|---|---|
| Logical second page | First cluster | Second cluster |
| Physical page | Cluster allocation |
|---|---|
| Top | Logical second page/ Second cluster |
| Upper | Logical second page/ First cluster |
| Middle | Logical first page / Second cluster |
| Lower | Logical first page / First cluster |
F I G. 78

| Logical first page | First cluster | Second cluster | Third cluster | Fourth cluster |
|---|---|---|---|---|
| Logical second page | First cluster | Second cluster | Third cluster | Fourth cluster |
| Logical third page | First cluster | Second cluster | Third cluster | Fourth cluster |

| Physical page | Cluster allocation | | |
|---|---|---|---|
| | First cell area | Second cell area | Third cell area |
| Top | Logical third page Second cluster | Logical third page Third cluster | Logical third page Fourth cluster |
| Upper | Logical second page Third cluster | Logical second page Fourth cluster | Logical third page First cluster |
| Middle | Logical first page Fourth cluster | Logical second page First cluster | Logical second page Second cluster |
| Lower | Logical first page First cluster | Logical first page Second cluster | Logical first page Third cluster |

F I G. 79

2-3-5-5 coding  (first cell area)

| | S0 | S1 | S2 | S3 | S4 | S5 | S6 | S7 | S8 | S9 | S10 | S11 | S12 | S13 | S14 | S15 | Logical page |
|---|---|---|---|---|---|---|---|---|---|---|---|---|---|---|---|---|---|
| Top | 1 | 1 | 0 | 0 | 0 | 1 | 1 | 1 | 1 | 0 | 0 | 0 | 0 | 1 | 1 | 0 | Logical third page(Second cluster) |
| Upper | 1 | 1 | 1 | 1 | 0 | 0 | 1 | 1 | 0 | 0 | 1 | 1 | 0 | 0 | 0 | 0 | Logical second page(Third cluster) |
| Middle | 1 | 0 | 0 | 0 | 0 | 0 | 0 | 1 | 1 | 1 | 1 | 1 | 1 | 1 | 0 | 0 | Logical first page(Fourth cluster) |
| Lower | 1 | 1 | 1 | 0 | 0 | 0 | 0 | 0 | 0 | 0 | 1 | 1 | 1 | 1 | 1 | 1 | Logical first page(First cluster) |

5-3-2-5 coding  (second cell area)

| | S0 | S1 | S2 | S3 | S4 | S5 | S6 | S7 | S8 | S9 | S10 | S11 | S12 | S13 | S14 | S15 | Logical page |
|---|---|---|---|---|---|---|---|---|---|---|---|---|---|---|---|---|---|
| Top | 1 | 0 | 0 | 0 | 1 | 1 | 1 | 1 | 0 | 0 | 0 | 0 | 1 | 1 | 1 | 0 | Logical third page(Third cluster) |
| Upper | 1 | 1 | 1 | 1 | 0 | 0 | 0 | 0 | 0 | 0 | 0 | 1 | 1 | 1 | 1 | 1 | Logical second page(Fourth cluster) |
| Middle | 1 | 1 | 1 | 1 | 1 | 0 | 0 | 1 | 1 | 0 | 0 | 0 | 0 | 0 | 0 | 0 | Logical second page(First cluster) |
| Lower | 1 | 0 | 0 | 1 | 1 | 1 | 0 | 0 | 0 | 0 | 1 | 1 | 1 | 1 | 0 | 0 | Logical first page(Second cluster) |

5-5-2-3 coding  (third cell area)

| | S0 | S1 | S2 | S3 | S4 | S5 | S6 | S7 | S8 | S9 | S10 | S11 | S12 | S13 | S14 | S15 | Logical page |
|---|---|---|---|---|---|---|---|---|---|---|---|---|---|---|---|---|---|
| Top | 1 | 1 | 0 | 0 | 0 | 0 | 0 | 0 | 1 | 1 | 1 | 1 | 1 | 1 | 1 | 0 | Logical third page(Fourth cluster) |
| Upper | 1 | 1 | 1 | 1 | 1 | 0 | 0 | 0 | 0 | 0 | 0 | 0 | 1 | 1 | 1 | 1 | Logical third page(First cluster) |
| Middle | 1 | 1 | 1 | 0 | 0 | 0 | 1 | 0 | 0 | 1 | 1 | 1 | 0 | 0 | 0 | 0 | Logical second page(Second cluster) |
| Lower | 1 | 0 | 1 | 1 | 1 | 1 | 1 | 0 | 0 | 0 | 1 | 1 | 1 | 0 | 0 | 0 | Logical first page(Third cluster) |

R1 R2 R3 R4 R5 R6 R7 R8 R9 R10 R11 R12 R13 R14 R15

First page
Second page
Third page

F I G. 80

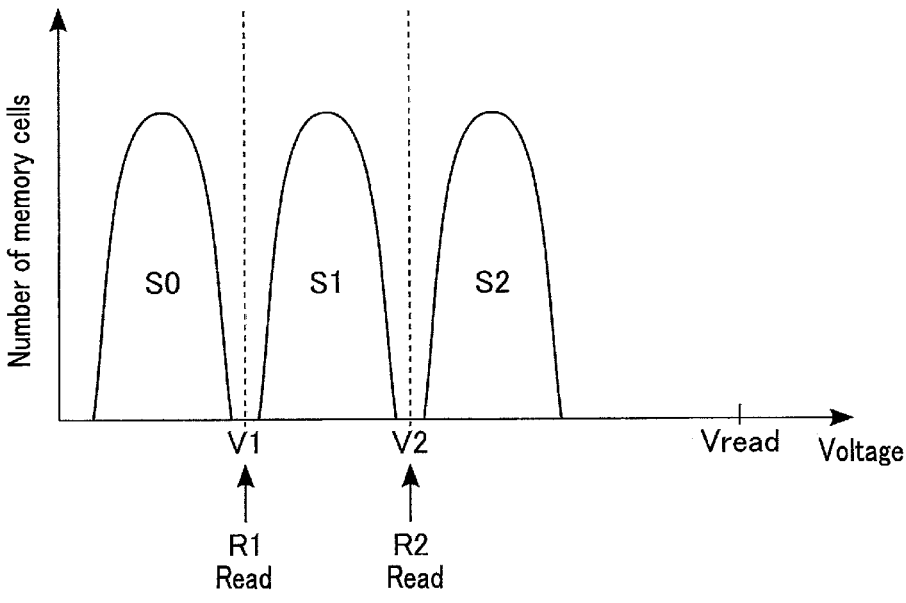
F I G. 81
| | Data | | | | | | | | |
|---|---|---|---|---|---|---|---|---|---|
| A cell (First cell area) | S0 | S0 | S0 | S1 | S1 | S1 | S2 | S2 | S2 |
| B cell (Second cell area) | S0 | S1 | S2 | S0 | S1 | S2 | S0 | S1 | S2 |
| First section | 1 | 1 | 0 | 1 | 1 | 0 | 0 | 0 | 1 |
| Second section | 1 | 0 | 0 | 1 | 0 | 0 | 1 | 1 | 1 |
| Third section | 1 | 0 | 0 | 0 | 1 | 1 | 0 | 1 | 1 |
Not use
F I G. 82

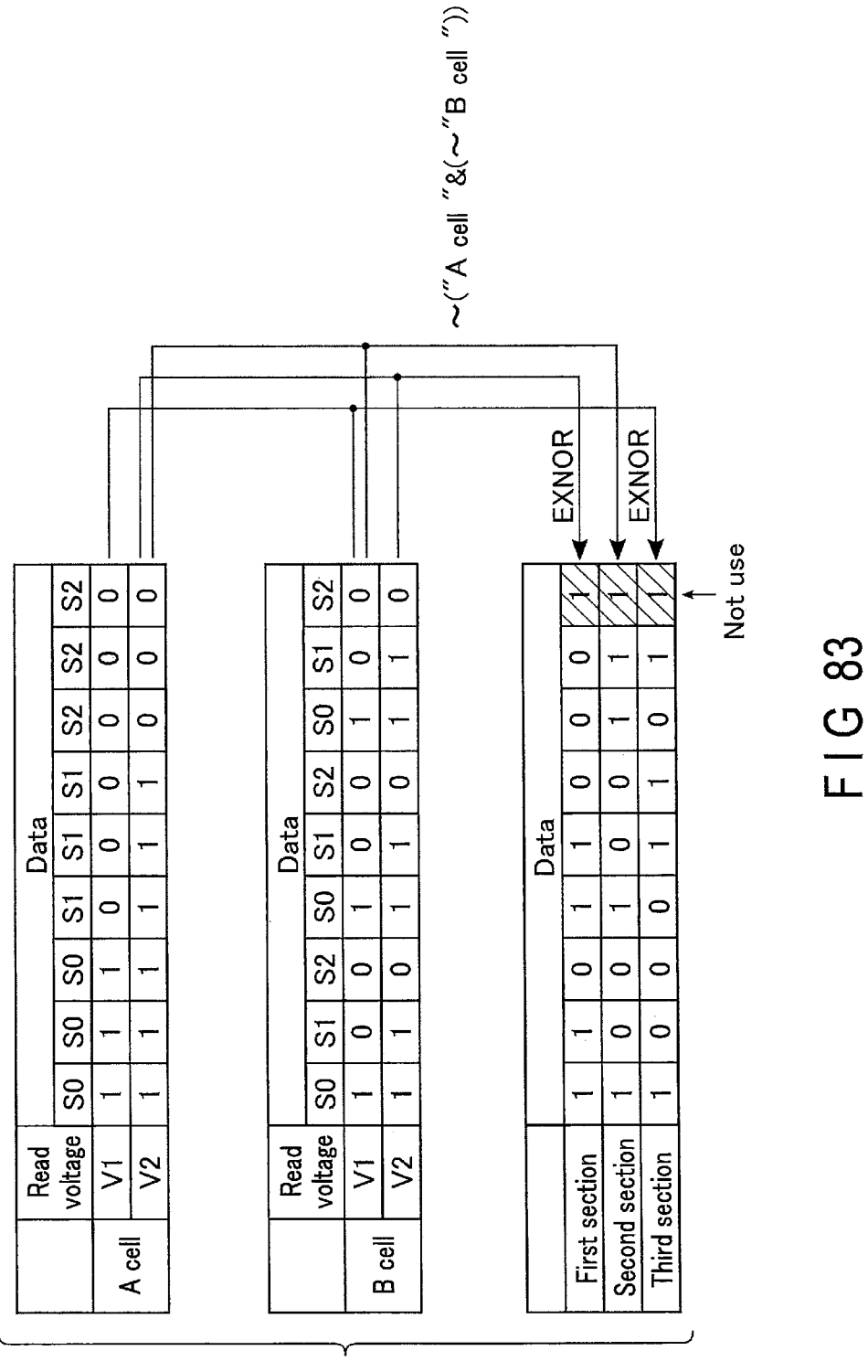
F I G 83

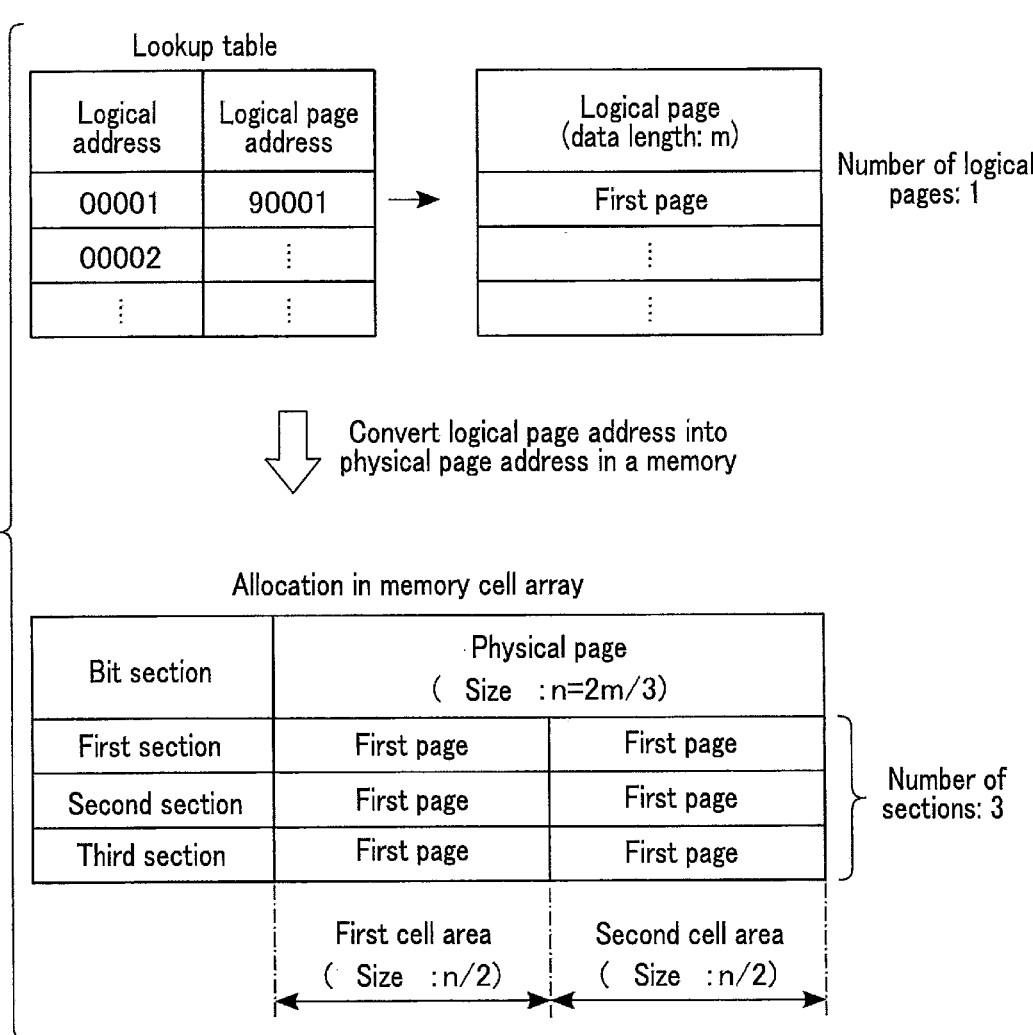
F I G. 84

| Logical first page | First cluster | Second cluster | Third cluster |
| --- | --- | --- | --- |

| Section | Cluster allocation | |
| --- | --- | --- |
| | First cell area (A cell) | Second cell area (B cell) |
| First section | First cluster | First cluster |
| Second section | Second cluster | Second cluster |
| Third section | Third cluster | Third cluster |

F I G. 85

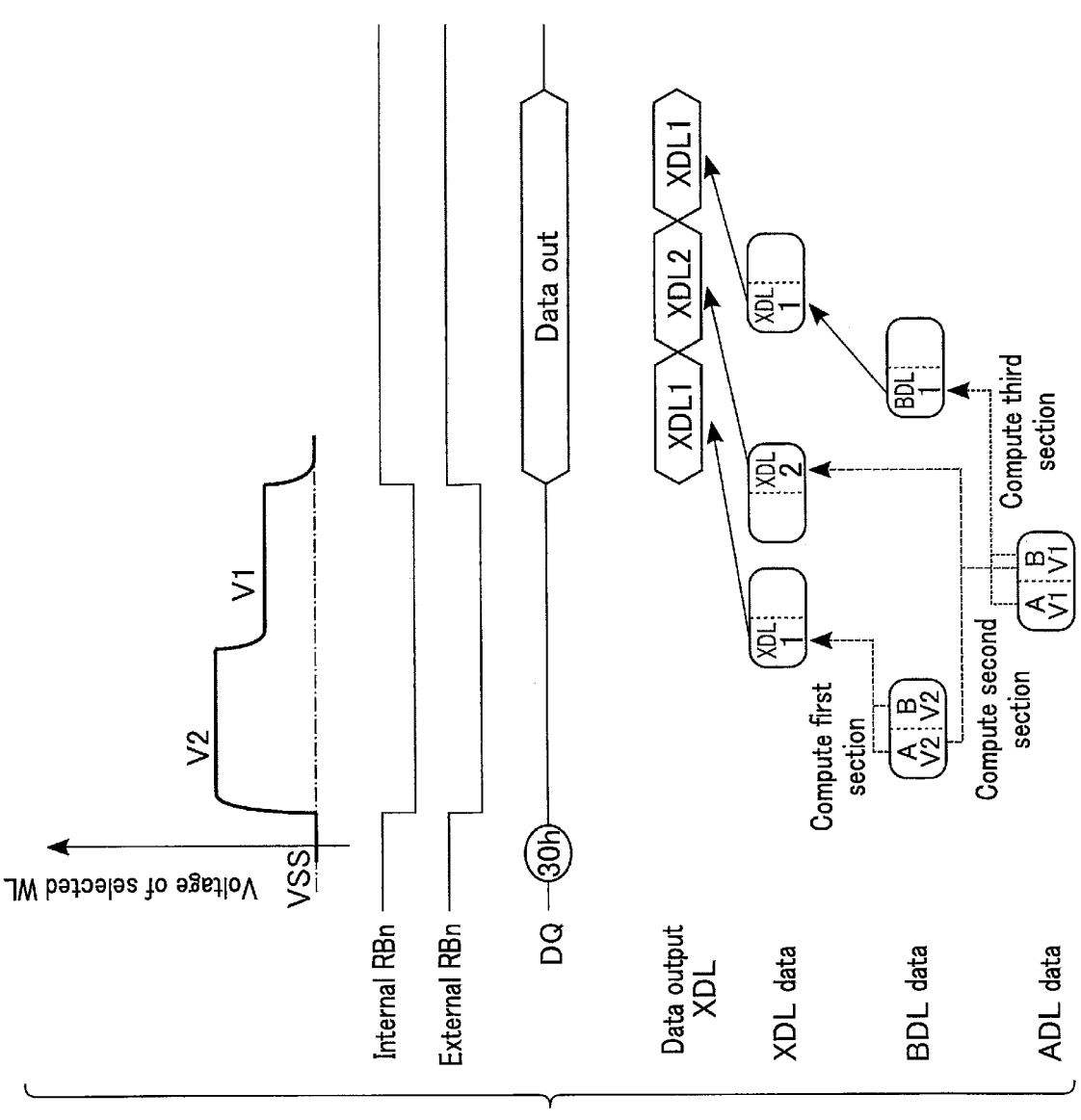
F I G. 88

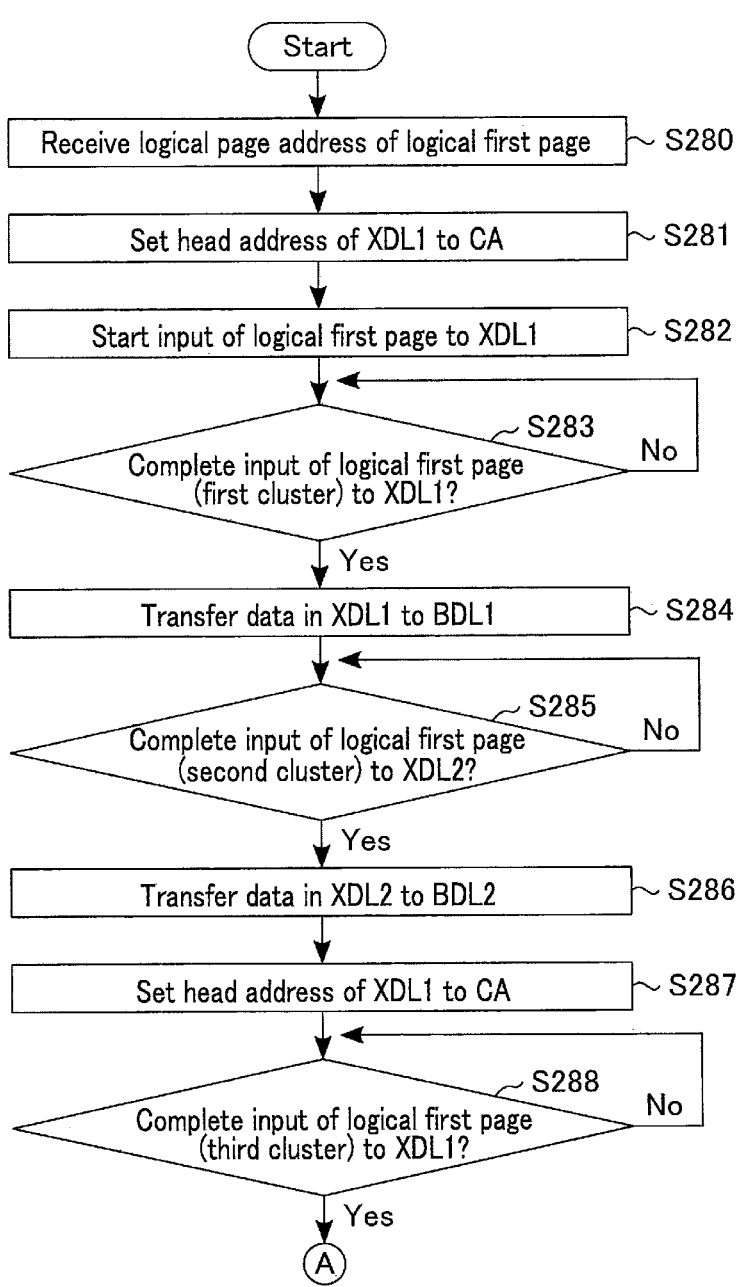
F I G. 89

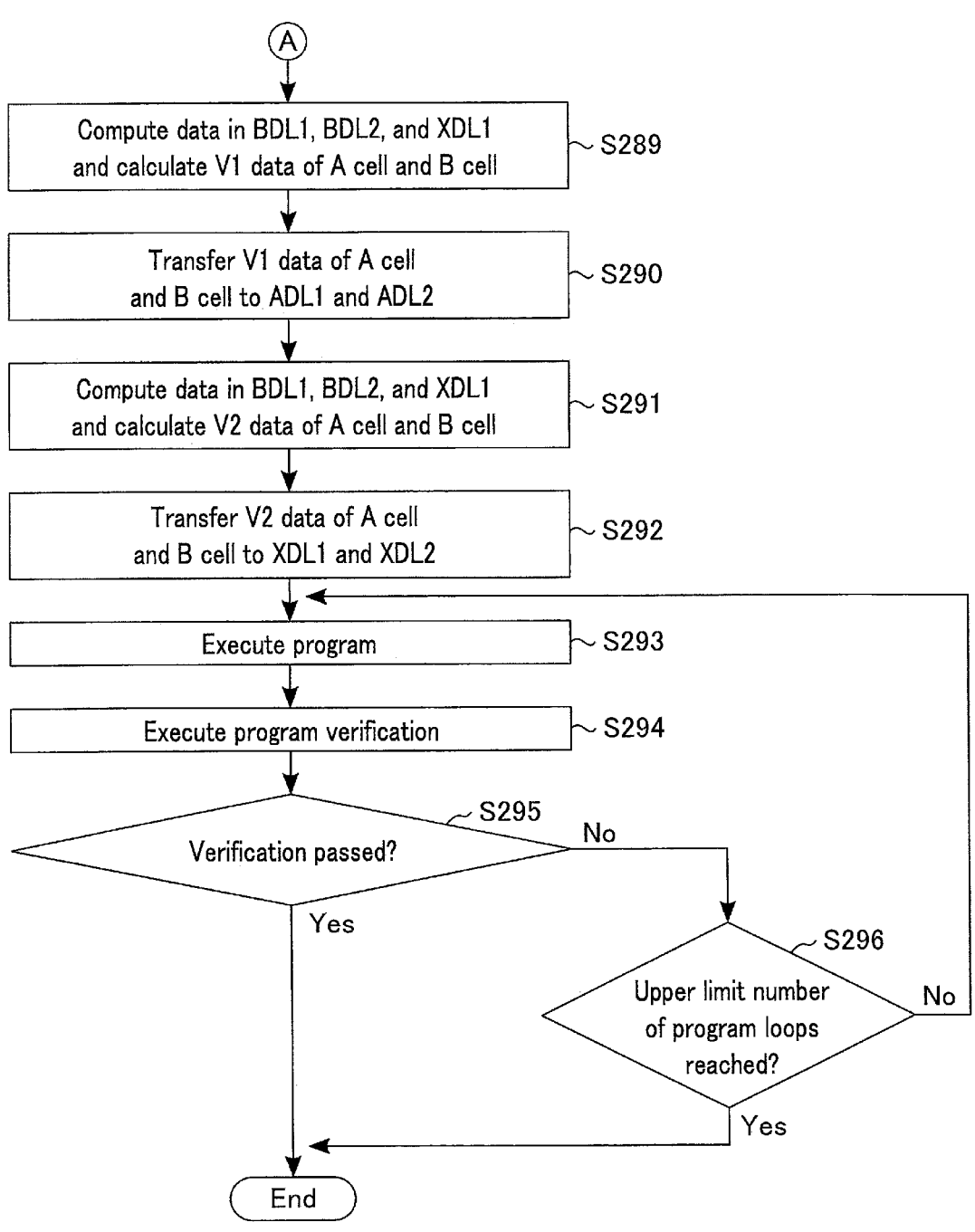
F I G. 90

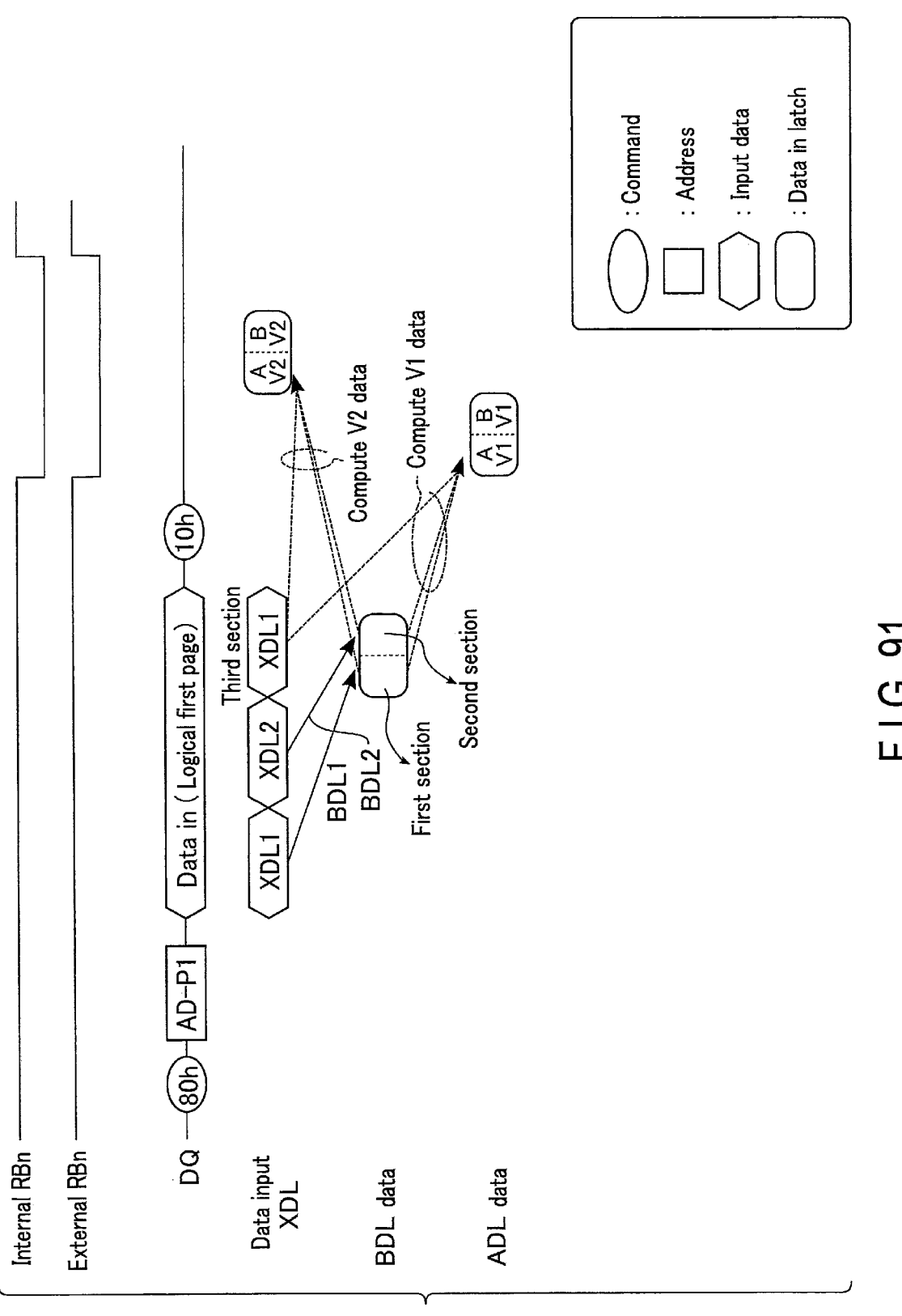
F I G. 91

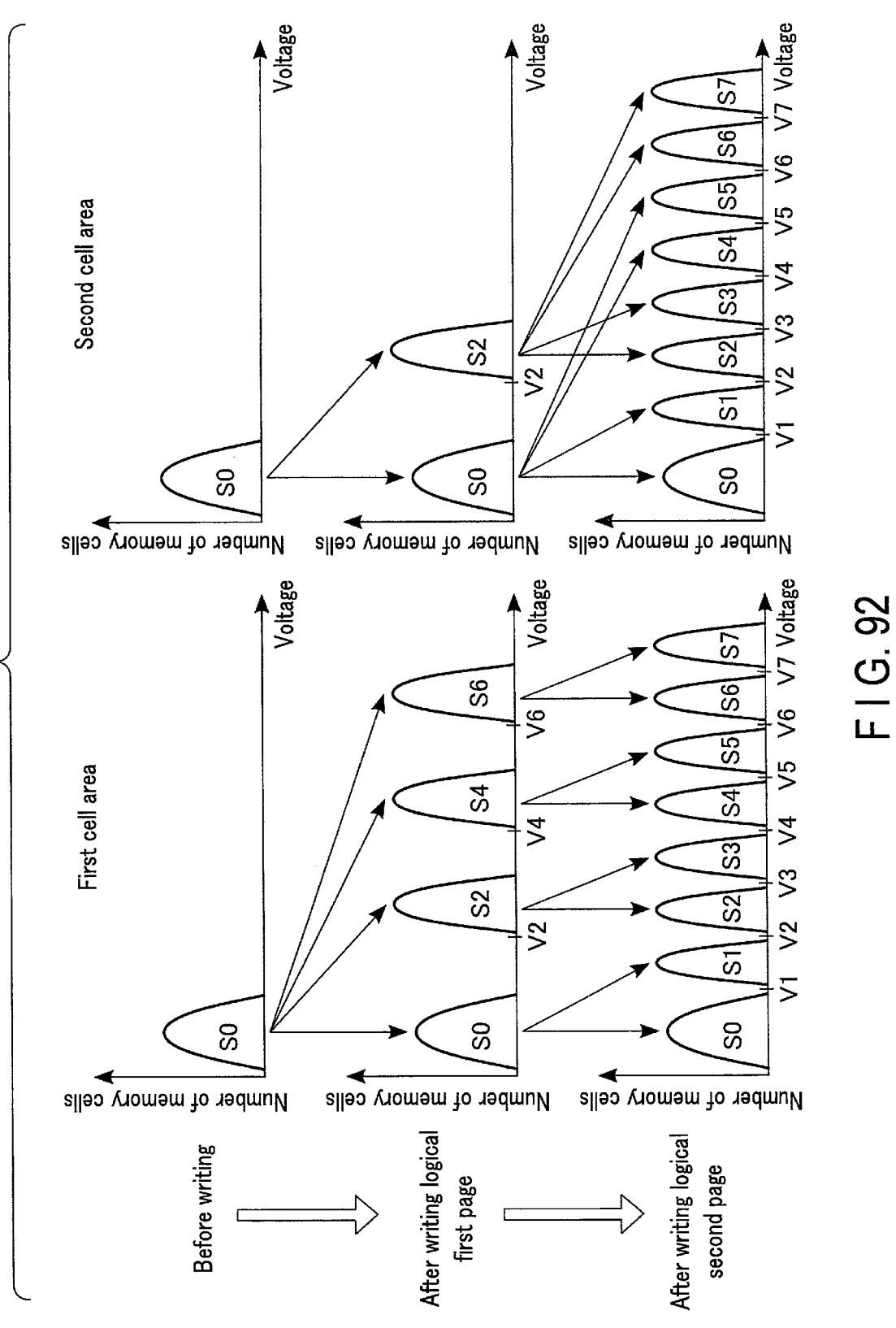
F I G. 92

SEMICONDUCTOR MEMORY AND NONVOLATILE MEMORY

CROSS-REFERENCE TO RELATED APPLICATIONS

This application is a divisional of U.S. application Ser. No. 17/471,810, filed Sep. 10, 2021, which is based upon and claims the benefit of priority from Japanese Patent Application No. 2020-192523, filed Nov. 19, 2020; No. 2020-214800, filed Dec. 24, 2020; and No. 2021-138120, filed Aug. 26, 2021, the entire contents of which are incorporated herein by reference.

FIELD

Embodiments described herein relate generally to a semiconductor memory and a nonvolatile memory.

BACKGROUND

As a memory chip mounted on a memory system, a semiconductor memory using a NAND flash memory is known.

BRIEF DESCRIPTION OF THE DRAWINGS

FIG. 1 is a block diagram of a memory system including a semiconductor memory according to a first embodiment.

FIG. 2 is a block diagram of the semiconductor memory according to the first embodiment.

FIG. 3 is a circuit diagram of a memory cell array included in the semiconductor memory according to the first embodiment.

FIG. 5 is a block diagram of a sense amplifier and a page buffer included in the semiconductor memory according to the first embodiment.

FIG. 6 is a perspective view of the semiconductor memory according to the first embodiment.

FIG. 7 is a diagram showing a relationship between threshold voltage distributions and data allocations of memory cell transistors in the semiconductor memory according to the first embodiment.

FIG. 8 is a diagram explaining a flow of a conversion operation of a logical page address and a physical page address in the semiconductor memory according to the first embodiment.

FIG. 9 is a diagram showing a logical page data allocation with respect to a physical page in the semiconductor memory according to the first embodiment.

FIG. 11 is a flowchart showing a read operation of the semiconductor memory according to the first embodiment.

FIG. 12 is a timing chart showing a voltage of a selected word line in a read operation of a logical first page in the semiconductor memory according to the first embodiment.

FIG. 13 is a timing chart showing a voltage of a selected word line in a read operation of a logical second page in the semiconductor memory according to the first embodiment.

FIG. 14 is a command sequence of a read operation of the logical first page in the semiconductor memory according to the first embodiment.

FIG. 15 is a command sequence of a read operation of the logical second page in the semiconductor memory according to the first embodiment.

FIG. 17 is a flow chart showing a write operation of the semiconductor memory according to the first embodiment.

FIG. 18 is a command sequence of a full sequence write operation in the semiconductor memory according to the first embodiment.

FIG. 19 is a table showing data allocations to each state in a semiconductor memory according to a first example of a second embodiment.

FIG. 20 is a table showing data allocations to each state in a semiconductor memory according to a second example of the second embodiment.

FIG. 21 is a table showing data allocations to each state in a semiconductor memory according to a third example of the second embodiment.

FIG. 22 is a table showing data allocations to each state in a semiconductor memory according to a fourth example of the second embodiment.

FIG. 23 is a table showing data allocations to each state in a semiconductor memory according to a fifth example of the second embodiment.

FIG. 24 is a table showing data allocations to each state in a semiconductor memory according to a sixth example of the second embodiment.

FIG. 25 is a table showing data allocations to each state in a semiconductor memory according to a seventh example of the second embodiment.

FIG. 26 is a command sequence of a read operation of a logical first page in a semiconductor memory according to a first example of a third embodiment.

FIG. 27 is a command sequence of a read operation of a logical second page in the semiconductor memory according to the first example of the third embodiment.

FIG. 28 is a command sequence of a sequential read operation in a semiconductor memory according to a second example of the third embodiment.

FIG. 29 is a diagram showing a relationship between threshold voltage distributions and data allocations of memory cell transistors in a semiconductor memory according to a fourth embodiment.

FIG. 30 is a diagram explaining a flow of a conversion operation of a logical page address and a physical page address in the semiconductor memory according to the fourth embodiment.

FIG. 31 is a diagram showing a logical page data allocation with respect to a physical page in the semiconductor memory according to the fourth embodiment.

FIG. 32 is a flowchart showing a read operation of the semiconductor memory according to the fourth embodiment.

FIG. 33 is a command sequence of a read operation of a logical first page in the semiconductor memory according to the fourth embodiment.

FIG. 34 is a flow chart showing a write operation of the semiconductor memory according to the fourth embodiment.

FIG. 35 is a flow chart showing a write operation of the semiconductor memory according to the fourth embodiment.

FIG. 36 is a command sequence of a full sequence write operation in the semiconductor memory according to the fourth embodiment.

FIG. 37 is a block diagram of a sense amplifier and a page buffer included in a semiconductor memory according to a fifth embodiment.

FIG. 38 is a diagram showing a relationship between threshold voltage distributions and data allocations of memory cell transistors in the semiconductor memory according to the fifth embodiment.

FIG. 39 is a diagram explaining a flow of a conversion operation of a logical page address and a physical page address in the semiconductor memory according to the fifth embodiment.

FIG. 40 is a diagram showing a logical page data allocation with respect to a physical page in the semiconductor memory according to the fifth embodiment.

FIG. 41 is a flowchart showing a read operation of the semiconductor memory according to the fifth embodiment.

FIG. 42 is a flowchart showing a read operation of the semiconductor memory according to the fifth embodiment.

FIG. 43 is a flowchart showing a read operation of the semiconductor memory according to the fifth embodiment.

FIG. 44 is a command sequence of a read operation of a logical first page in the semiconductor memory according to the fifth embodiment.

FIG. 45 is a command sequence of a read operation of a logical second page in the semiconductor memory according to the fifth embodiment.

FIG. 46 is a command sequence of a read operation of a logical third page in the semiconductor memory according to the fifth embodiment.

FIG. 47 is a flow chart showing a write operation of the semiconductor memory according to the fifth embodiment.

FIG. 49 is a flow chart showing a write operation of the semiconductor memory according to the fifth embodiment.

FIG. 50 is a command sequence of a full sequence write operation in the semiconductor memory according to the fifth embodiment.

FIG. 51 is a table showing data allocations to each state in a semiconductor memory according to a first example of a sixth embodiment.

FIG. 52 is a table showing data allocations to each state in a semiconductor memory according to a second example of the sixth embodiment.

FIG. 53 is a table showing data allocations to each state in a semiconductor memory according to a third example of the sixth embodiment.

FIG. 54 is a table showing data allocations to each state in a semiconductor memory according to a fourth example of the sixth embodiment.

FIG. 55 is a table showing data allocations to each state in a semiconductor memory according to a fifth example of the sixth embodiment.

FIG. 56 is a table showing data allocations to each state in a semiconductor memory according to a sixth example of the sixth embodiment.

FIG. 57 is a table showing data allocations to each state in a semiconductor memory according to a seventh example of the sixth embodiment.

FIG. 58 is a table showing data allocations to each state in a semiconductor memory according to an eighth example of the sixth embodiment.

FIG. 59 is a table showing data allocations to each state in a semiconductor memory according to a ninth example of the sixth embodiment.

FIG. 60 is a table showing data allocations to each state in a semiconductor memory according to a tenth example of the sixth embodiment.

FIG. 61 is a table showing data allocations to each state in a semiconductor memory according to an eleventh example of the sixth embodiment.

FIG. 62 is a table showing data allocations to each state in a semiconductor memory according to a twelfth example of the sixth embodiment.

FIG. 63 is a command sequence of a read operation of a logical first page in a semiconductor memory according to a first example of a seventh embodiment.

FIG. 64 is a command sequence of a read operation of a logical second page in the semiconductor memory according to the first example of the seventh embodiment.

FIG. 65 is a command sequence of a read operation of a logical third page in the semiconductor memory according to the first example of the seventh embodiment.

FIG. 66 is a command sequence of a sequential read operation in a semiconductor memory according to a second example of the seventh embodiment.

FIG. 67 is a diagram explaining a flow of a conversion operation of a logical page address and a physical page address in a semiconductor memory according to an eighth embodiment.

FIG. 68 is a diagram showing a logical page data allocation with respect to a physical page in the semiconductor memory according to the eighth embodiment.

FIG. 69 is a block diagram of a sense amplifier and a page buffer included in a semiconductor memory according to a first example of a ninth embodiment.

FIG. 70 is a block diagram of a sense amplifier and a page buffer included in a semiconductor memory according to a second example of the ninth embodiment.

FIG. 71 is a block diagram of a sense amplifier and a page buffer included in a semiconductor memory according to a third example of the ninth embodiment.

FIG. 72 is a diagram showing a logical page data allocation with respect to a physical page in a semiconductor memory according to a tenth embodiment.

FIG. 73 is a table showing data allocations to each state in the semiconductor memory according to the tenth embodiment.

FIG. 74 is a diagram showing a logical page data allocation with respect to a physical page in a semiconductor memory according to a first example of an eleventh embodiment.

FIG. 75 is a diagram showing a relationship between threshold voltage distributions and data allocations of memory cell transistors in a semiconductor memory according to a second example of the eleventh embodiment.

FIG. 76 is a diagram showing a logical page data allocation with respect to a physical page in the semiconductor memory according to the second example of the eleventh embodiment.

FIG. 77 is a diagram showing a relationship between threshold voltage distributions and data allocations of memory cell transistors in a semiconductor memory according to a third example of the eleventh embodiment.

FIG. 78 is a diagram showing a logical page data allocation with respect to a physical page in the semiconductor memory according to the third example of the eleventh embodiment.

FIG. 79 is a diagram showing a logical page data allocation with respect to a physical page in a semiconductor memory according to a twelfth embodiment.

FIG. 80 is a table showing data allocations to each state in the semiconductor memory according to the twelfth embodiment.

FIG. 81 is a diagram showing threshold voltage distributions of memory cell transistors in a semiconductor memory according to a thirteenth embodiment.

FIG. 82 is a table showing data allocations by two memory cell transistors in the semiconductor memory according to the thirteenth embodiment.

FIG. 83 is a diagram showing a relationship between data allocations to an A cell and a B cell and bit values of a section in the semiconductor memory according to the thirteenth embodiment.

FIG. 84 is a diagram explaining a flow of a conversion operation of a logical page address and a physical page address in the semiconductor memory according to the thirteenth embodiment.

FIG. 85 is a diagram showing a logical page data allocation with respect to a physical page in the semiconductor memory according to the thirteenth embodiment.

FIG. 88 is a command sequence of a read operation of a logical first page in the semiconductor memory according to the thirteenth embodiment.

FIG. 89 is a flow chart showing a write operation of the semiconductor memory according to the thirteenth embodiment.

FIG. 90 is a flow chart showing a write operation of the semiconductor memory according to the thirteenth embodiment.

FIG. 91 is a command sequence of a full sequence write operation in the semiconductor memory according to the thirteenth embodiment.

FIG. 92 is a diagram showing a relationship between write operations and threshold voltage distributions of memory cell transistors in a semiconductor memory according to a modification.

DETAILED DESCRIPTION

Figure 4:
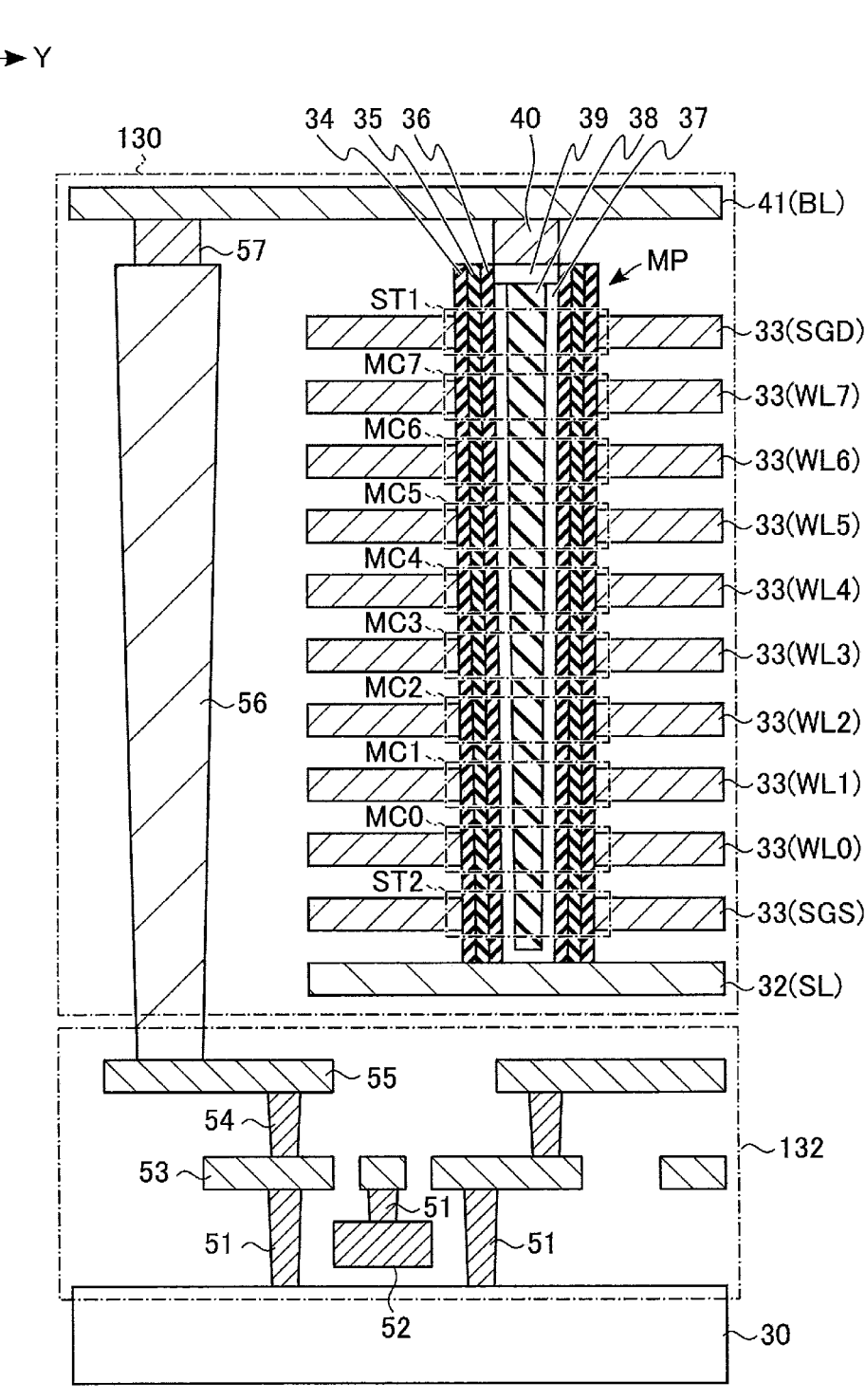
FIG. 4 is a cross-sectional view of the memory cell array included in the semiconductor memory according to the first embodiment.

In general, according to one embodiment, a semiconductor memory includes: a memory group including a plurality of memory cells configured to store a plurality of bits of data in three or more plurality of states; a word line coupled to the plurality of memory cells; and a first circuit configured to convert one external address received from an external controller into a plurality of internal addresses, wherein a first page size of page data of the memory group is smaller than a second page size of input data corresponding to the external address.

Hereinafter, the embodiments will be described with reference to the accompanying drawings. In the descriptions below, constituent elements having similar functions and configurations will be denoted by the same reference symbols. The embodiments to be described below are shown as an example of a device or a method for embodying the technical idea of the embodiments, and are not intended to limit the material, shape, structure, arrangement, etc. of components to those described below. The technical ideas of the embodiments may be variously modified within the scope of the claims.

1. First Embodiment

A memory system according to a first embodiment will be described. In the following, a NAND flash memory will be given as an example of a semiconductor memory included in the memory system.

1.1 Configuration

1.1.1 Overall Configuration of Memory System

First, an overall configuration of a memory system comprising a semiconductor memory according to the present embodiment will be described with reference to FIG. 1. FIG. 1 is a block diagram showing an example of the overall configuration of the memory system. It should be noted that the configuration of a memory controller shown in FIG. 1 is an example, and therefore may take other various forms derived therefrom, such as an inner bus being in a divided structure or a hierarchical structure, or an additional function block being connected thereto. A memory system 1 communicates with a host device 2, and holds data from the host device 2 or outputs data to the host device 2 based on an instruction (order) from the host device 2. The host device 2 is, for example, a server computer or a personal computer, and executes information processing and stores data using the memory system 1. The memory system 1 may function as a storage of the host device 2 that functions as an information processing device. The memory system 1 may be built in the host device 2, or may be coupled to the host device 2 through a cable or a network. Furthermore, an information processing system that comprises the memory system 1 and the host device 2 may also be configured.

As shown in FIG. 1, the memory system 1 includes a NAND flash memory 100 (hereinafter simply referred to as a "memory 100") used as a semiconductor memory and a memory controller (also referred to as an "external controller") 200. The memory controller 200 and the memory 100 in combination, for example, may form a semiconductor storage device, and examples of such a semiconductor storage device include a memory card, such as an SD™ card, and a solid-state drive (SSD), etc.

The memory 100 is a nonvolatile memory that includes a plurality of memory cell transistors (hereinafter referred to as a "memory cell" or, simply, a "cell") and is configured to store data in a nonvolatile manner. The memory 100 may also be configured by a plurality of NAND flash memories. In this case, the plurality of NAND flash memories in the memory 100 may be coupled to the memory controller 200 through a through silicon via (TSV). The NAND flash memory may be a three-dimensionally arranged NAND flash memory, in which memory cell transistors are three-dimensionally stacked above a semiconductor substrate, or may be a planar NAND flash memory, in which memory cell transistors are two-dimensionally arranged above the semiconductor substrate.

The memory 100 is coupled to the memory controller 200 via memory buses and operates based on an order from the memory controller 200. More specifically, the memory 100 transmits and receives, for example, signals DQ [7:0] of eight bits, and clock signals DQS and DQSn to and from the memory controller 200. The signals DQ [7:0] include, for example, data, an address, and a command. The clock signals DQS and DQSn are clock signals used when inputting or outputting signals DQ, and the clock signal DQSn is an inversion signal of the clock signal DQS.

The memory 100 receives from the memory controller 200, for example, a chip enable signal CEn, a command latch enable signal CLE, an address latch enable signal ALE, a write enable signal WEn, and a read enable signal REn. The memory 100 transmits a ready/busy signal RBn to the memory controller 200.

The chip enable signal CEn is a signal for enabling the memory 100, and is asserted, for example, at a low ("L") level. The command latch enable signal CLE is a signal indicating that the signal DQ is a command, and is asserted, for example, at a high ("H") level.

The address latch enable signal ALE is a signal indicating that the signal DQ is an address, and is asserted, for example, at an "H" level.

The write enable signal WEn is a signal for taking a received signal into the memory 100, and is asserted, for example, at an "L" level whenever a command, an address, data, or the like is received from the memory controller 200. Accordingly, whenever the write enable signal WEn is toggled, the signal DQ is taken into the memory 100.

The read enable signal REn is a signal for the memory controller 200 to read data from the memory 100. The read enable signal REn is asserted, for example, at the "L" level.

The ready/busy signal RBn is a signal indicating whether the memory 100 is in a state where the signal DQ can be received from the memory controller 200 or in a state where the signal DQ cannot be received therefrom, and is brought to the "L" level when the memory 100 is in the busy state, for example.

The memory controller 200 instructs the memory 100 to perform a read operation, a write operation, and an erase operation, etc., in response to a request (order) from the host device 2. The memory controller 200 also manages the memory space (memory area) of the memory 100.

The memory controller 200 includes a host interface circuit 210, an embedded memory (Random Access Memory; RAM) 220, a processor 230, a buffer memory 240, a memory interface circuit 250, and an ECC (Error Checking and Correcting) circuit 260. It should be noted that the functions of the memory controller 200 may be implemented by dedicated circuits, or execution of firmware by a processor.

The host interface circuit 210 is coupled to the host device 2 via a host bus and manages communications with the host device 2. The host interface circuit 210 transfers a request and data received from the host device 2 to the processor 230 and the buffer memory 240. Hereinafter, data received from the host device 2 will be referred to as "user data". In response to an order from the processor 230, the host interface circuit 210 transfers the user data in the buffer memory 240 to the host device 2.

The RAM 220 is, for example, a volatile memory, such as a DRAM, and is used as a work area of the processor 230. The RAM 220 holds firmware for managing the memory 100 and various management tables, etc. The RAM 220 also temporarily stores a lookup table described later.

The processor 230 controls the operation of the entire memory controller 200. For example, the processor is a central processing unit (CPU) or a micro processing unit (MPU). In the case of receiving a request from the host device 2, the processor 230 performs control in accordance with the request. For example, upon receipt of a write request (including a command, a logical address, and user data) from the host device 2, the processor 230 causes the memory 100 to execute the write operation via the memory interface circuit 250. In addition, upon receipt of a read request (including a command and the logical address) from the host device 2, the processor 230 causes the memory 100 to execute the read operation via the memory interface circuit 250.

The processor 230 executes various processing, such as wear leveling, for managing the memory 100. The processor 230 also executes various arithmetic operations. For example, the processor 230 executes data encryption processing, randomization processing, and the like.

Furthermore, the processor 230 determines a storage area (memory area) in the memory 100 for the logical address and user data received from the host device 2.

More specifically, for example, in the case where the processor 230 receives a write request from the host device 2, the processor 230 reads data (hereinafter referred to as a "lookup table") associating a logical address and a logical page address (also referred to as an external address) from the memory 100. The logical address is attached to an access request from the host device 2. The logical page is a unit of data (input data to the memory 100) attached to an address transmitted to the memory 100 when the processor 230 controls the write operation and the read operation for the memory 100. The page size (also referred to as a "data length" or a "data amount") of the logical page corresponds to the size of the user data attached to the logical address. Hereinafter, the address to which the logical page is attached will be referred to as a "logical page address" (or, referred to as an "external address" since it is an address input to the memory 100 from outside). In the present embodiment, the logical page is different from the units of pages to be written collectively (hereinafter referred to as a "physical page") in the memory 100. The relationship between the logical page and the physical page will be described later. The logical page address corresponds to a logical page, and designates a certain part in the memory area of the memory 100. For example, the size of a logical memory area configured by a plurality of logical pages is the same as the size of a memory area of the memory 100 configured by a physical page.

When a write request is received from the host device 2, the processor 230 updates the lookup table in the memory controller 200 and allocates a logical page address for a logical address. After newly allocating the logical page address, the processor 230 causes the memory 100 to execute the write operation. Furthermore, the processor 230 updates the lookup table in the memory 100 at a freely selected timing.

Furthermore, when a read request is received from the host device 2, for example, the processor 230 causes the memory 100 to execute the read operation after converting the logical address to the logical page address by using the lookup table.

The buffer memory 240 temporarily stores user data received from the host device 2 and read data received by the memory controller 200 from the memory 100.

The memory interface circuit 250 is coupled to the memory 100 via a memory bus, and manages communications with the memory 100. The memory interface circuit 250 controls the write operation, the read operation, and the erase operation, etc. in the memory 100 based on the control of the processor 230.

The ECC circuit 260 encodes the user data and generates a code word. The user data is stored in the memory 100 as an encoded code word. The ECC circuit 260 also decodes the code word read from the memory 100.

It should be noted that the memory controller 200 does not have to encode the user data. In the case where the memory controller 200 does not perform coding, data to be written in the memory 100 coincides with the user data. Furthermore, the ECC circuit 260 may generate a code word based on the user data corresponding to a logical page, or may generate a code word based on divided data obtained by dividing the user data. Furthermore, the ECC circuit 260 may generate a code word by using the user data corresponding to a plurality of logical pages.

Furthermore, the ECC circuit 260 may be embedded in the memory interface circuit 250, or may be embedded in the memory 100.

1.1.2 Configuration of NAND Flash Memory

The configuration of the memory 100 will be described with reference to FIG. 2. FIG. 2 is a block diagram showing an internal configuration example of the memory 100 of the present embodiment. In FIG. 2, some of the couplings between the blocks are indicated by arrows; however, the couplings between the blocks are not limited to those shown in FIG. 2.

As shown in FIG. 2, the memory 100 includes an input/output circuit 110, a controller 120, a memory cell array 130, a row decoder 131, a sense amplifier 132, and a page buffer 133. The memory 100 is, for example, formed on a semiconductor substrate (a silicon substrate) and provided as a chip.

The input/output circuit 110 controls input/output of signals to or from the memory controller 200. More specifically, the input/output circuit 110 transmits signals DQ (data DAT, logical page address, and command CMD) and various control signals (signals CEn, CLE, ALE, WEn, and REn) received from the memory controller 200 to, for example, the controller 120. The input/output circuit 110 also transmits the data DAT received from the controller 120 to the memory controller 200.

The controller 120 controls the operation of the memory 100 based on a command CMD, etc. received from the memory controller 200 via the input/output circuit 110. Specifically, in the case of receiving a write order, the controller 120 performs control to write the received write data DAT in a physical page of the memory cell array 130. Furthermore, in the case of receiving a read order, the controller 120 performs control to read data DAT from the memory cell array 130 and output the data DAT to the memory controller 200 via the input/output circuit 110.

The controller 120 includes a command user interface circuit 121, an oscillator 122, a sequencer 123, a voltage generating circuit 124, a column counter 125, and a serial access controller 126.

The command user interface circuit 121 receives the command CMD and logical page address from the input/output circuit 110. The command user interface circuit 121 transmits the received command CMD to the sequencer 123. Furthermore, the command user interface circuit 121 converts the received logical page address into the address ADD corresponding to the physical page (hereinafter also referred to as a "physical page address" or an "inner address"), and transmits it to the sequencer 123. In the present embodiment, since the page size of the logical page is larger than the page size of the physical page, a plurality of physical pages are allocated to the logical page data of one page. Therefore, the command user interface circuit 121 converts one logical page address into a plurality of corresponding physical page addresses ADD, and transmits them to the sequencer 123. It should be noted that the logical page address may be converted into the physical page addresses ADD by the sequencer 123.

The oscillator 122 is a circuit for generating a clock signal. The clock signal generated by the oscillator 122 is supplied to each component including the sequencer 123.

The sequencer 123 is a state machine that is driven by the clock signal supplied from the oscillator 122.

The sequencer 123 controls an operation of the entire memory 100. For example, the sequencer 123 controls the command user interface circuit 121, the oscillator 122, the voltage generating circuit 124, the column counter 125, and the serial access controller 126 as well as the row decoder 131, the sense amplifier 132, and the page buffer 133. The sequencer 123 controls access (the write operation, the read operation, and the erase operation) to the memory cell array 130. For example, the sequencer 123 transmits a control signal for controlling an operation timing, etc. to the voltage generating circuit 124 and the column counter 125 in accordance with the command CMD received from the command user interface circuit 121. Furthermore, the sequencer 123 supplies a row address RA included in the physical page address ADD received from the command user interface circuit 121 to the row decoder 131. The row address RA is an address for selecting an interconnect (a word line, etc.) aligned in a row direction in the memory cell array 130. Furthermore, the sequencer 123 supplies a column address CA included in the physical page address ADD received from the command user interface circuit 121 to the column counter 125. The column address CA is an address for selecting an interconnect (bit line, etc.) aligned in a column direction in the memory cell array 130.

The voltage generating circuit 124 generates voltages based on the control of the sequencer 123, and supplies the voltages to the row decoder 131 and the sense amplifier 132, etc.

The column counter 125 transmits the column address CA to the page buffer 133 when performing the write operation or the read operation. Starting with the column address CA supplied from the sequencer 123 at the head, the column counter 125 sequentially increments the column address CA in accordance with a control signal supplied by the serial access controller 126.

The serial access controller 126 controls transmission and reception of the data DAT to and from the page buffer 133. More specifically, the serial access controller 126 is coupled to the page buffer 133 via a data bus. When performing the write operation, the serial access controller 126 transmits the data DAT (for example, eight-bit serial data corresponding to an eight-bit signal DQ) received from the input/output circuit 110 to the page buffer 133. Furthermore, when performing the read operation, the serial access controller 126 transmits the data DAT (serial data) received from the page buffer 133 to the input/output circuit 110.

The memory cell array 130 includes a plurality of blocks BLK (BLK0, BLK1, . . . ) each including nonvolatile memory cell transistors (hereinafter also referred to as "memory cells") associated with rows and columns. Each block BLK includes a plurality of string units SU. In the example of FIG. 2, each block BLK includes four string units SU0, SU1, SU2, and SU3. Each string unit SU includes a plurality of NAND strings NS. The number of blocks BLK in the memory cell array 130 and the number of string units SU in each block BLK may be designed to be any number. The memory cell array 130 will be described in detail later.

The row decoder 131 is coupled to interconnects arranged along a row direction (for example, word lines and select gate lines) in each block BLK. When performing the write operation, the read operation, and the erase operation, the row decoder 131 decodes the row address RA and applies voltages to interconnects of a selected block BLK.

When performing the write operation, the sense amplifier 132 transfers data stored in the page buffer 133 to the memory cell transistors. Furthermore, when performing the read operation, the sense amplifier 132 determines whether the data read from the memory cell array 130 is "0" or "1". The sense amplifier 132 transfers the obtained data to the page buffer 133. The data stored in the page buffer 133 is output to the memory controller 200 via the serial access controller 126 and the input/output circuit 110.

The page buffer 133 is a buffer for temporarily storing data DAT received from the memory controller 200 and temporarily storing data read from the memory cell array 130. The page buffer 133 includes a plurality of latch circuits. When performing the write operation, the page buffer 133 sequentially stores the data DAT received from the serial access controller 126 in the latch circuit corresponding to the column address CA received from the column counter 125. Furthermore, when performing the read operation, the page buffer 133 sequentially transmits data stored in the latch circuit corresponding to the column address CA received from the column counter 125 to the serial access controller 126.

Hereinafter, circuits (the controller 120, the row decoder 131, the sense amplifier 132, and the page buffer 133, etc.) other than the memory cell array 130 will collectively be referred to as "peripheral circuits".

1.1.3 Circuit Configuration of Memory Cell Array

An example of a circuit configuration of the memory cell array 130 will be described with reference to FIG. 3. The example of FIG. 3 shows one block BLK extracted from among a plurality of blocks BLK included in the memory cell array 130.

As shown in FIG. 3, for example, the block BLK includes four string units SU0 to SU3. Each of the string units SU includes a plurality of NAND strings NS.

A plurality of NAND strings NS are respectively associated with bit lines BL0 to BL(k−1) (k is an integer equal to or greater than two). Each NAND string NS includes, for example, memory cell transistors MC0 to MC7 and selection transistors ST1 and ST2. Hereinafter, bit lines BL0 to BL(k−1) will each be simply referred to as a "bit line BL" unless otherwise specified. Memory cell transistors MC0 to MC7 will each be simply referred to as a "memory cell transistor MC" unless otherwise specified.

Each memory cell transistor MC includes a control gate and a charge storage layer, and stores data in a nonvolatile manner. Each selection transistor ST1 and ST2 is used to select a string unit SU at the time of performing various operations.

Each memory cell transistor MC may be of a metal-oxide-nitride-oxide-silicon (MONOS) type that uses an insulating layer as the charge storage layer, or may be of a floating gate (FG) type that uses a conductive layer as the charge storage layer. In the present embodiment, a MONOS-type will be described as an example.

In each NAND string NS, a drain of selection transistor ST1 is coupled to an associated bit line BL, and a source of selection transistor ST1 is coupled to one end of memory cell transistors MC0 to MC7, which are coupled in series. Gates of selection transistors ST1 respectively included in string units SU0 to SU3 in the same block BLK are respectively coupled in common to select gate lines SGD0 to SGD3. Select gate lines SGD0 to SGD3 are coupled to the row decoder 131.

In each NAND string NS, a drain of selection transistor ST2 is coupled to the other end of memory cell transistors MC0 to MC7, which are coupled in series. In the same block BLK, sources of selection transistors ST2 are coupled in common to a source line SL, and gates of selection transistors ST2 are coupled in common to a select gate line SGS. The select gate line SGS is coupled to the row decoder 131.

Each bit line BL commonly couples NAND strings NS that are each included in string units SU0 to SU3 in each block BLK. The source line SL is, for example, coupled in common among a plurality of blocks BLK.

Hereinafter, a group of a plurality of memory cell transistors MC coupled to a common word line WL in a string unit SU will be referred to as a "memory group MG". Each of the memory cell transistors MC included in each memory group MG is associated respectively with bit lines BL0 to BL(k−1). Therefore, the number of memory cell transistors MC included in a single memory group MG is k pieces. For example, the storage capacity of a memory group MG including k pieces of memory cell transistors MC, which individually store 1-bit data, is defined as one-page data (page size) in a physical page. A memory group MG may have a storage capacity of two or more pages of data in the physical page according to the number of bits of data stored in the memory cell transistor MC. Hereinafter, in the present embodiment, a case in which each memory cell transistor MC is capable of storing 3-bit data, that is, a case in which the memory group MG has the storage capacity of three-page data in the physical pages, will be described.

The circuit configuration of the memory cell array 130 is not limited to that described above. For example, the number of the memory cell transistors MC and the number of the selection transistors ST1 and ST2 included in each NAND string NS may be determined as appropriate. The number of string units SU included in each block BLK may be determined as appropriate.

1.1.4 Cross-Sectional Configuration of Memory Cell Array

A cross-sectional configuration of the memory cell array 130 will be described with reference to FIG. 4. The example of FIG. 4 shows a cross section of a single NAND string NS. In order to simplify the description, in the example of FIG. 4, one transistor to be used for the sense amplifier 132 is disposed on a semiconductor substrate 30. Furthermore, in the example of FIG. 4, some of the interlayer insulating films are omitted.

As shown in FIG. 4, a transistor to be used for the sense amplifier 132 is provided on the semiconductor substrate 30. That is, the sense amplifier 132 is provided between the semiconductor substrate 30 and the memory cell array 130. It should be noted that other peripheral circuits, such as the row decoder 131 or the page buffer 133, may also be provided between the semiconductor substrate 30 and memory cell array 130. A configuration in which peripheral circuits are provided below the memory cell array 130 is also referred to as a CMOS under allay (CUA) structure. In the present embodiment, a case in which the sense amplifier 132 and the page buffer 133 are provided between the semiconductor substrate 30 and the memory cell array 130 in a CUA structure will be described. The memory 100 may also have a structure in which an array chip on which the memory cell array 130 is provided and a circuit chip on which a peripheral circuit is provided are bonded.

A configuration of the memory cell array 130 will first be described. An interconnect layer 32 extending in each of an X direction that is approximately parallel to the semiconductor substrate 30 and a Y direction that intersects the X direction, and functioning as a source line SL, is formed. The interconnect layer 32 is configured by a conductive material including, for example, a semiconductor material to which an impurity is added, or a metal material.

For example, ten interconnect layers 33 respectively functioning as the select gate line SGS, word lines WL0 to WL7, and the select gate line SGD, and extending in the X direction are sequentially provided above the interconnect layer 32 in a manner spaced apart almost perpendicular to the semiconductor substrate 30 in a Z direction, with an interlayer insulating film (not shown) interposed therebetween.

The interconnect layers 33 are configured by a conductive material including, for example, a semiconductor material to which an impurity is added, or a metal material. The interconnect layers 33 are configured using, for example, a stacked structure of titanium nitride (TiN)/tungsten (W). TiN functions as a barrier layer for preventing a reaction between W and $SiO_2$ and as an adhesive layer for improving adhesion of W when forming a layer of W by, for example, chemical vapor deposition (CVD).

A memory pillar MP is formed in a manner to penetrate the ten interconnect layers 33 and reach the interconnect layer 32 at its bottom surface. One memory pillar MP corresponds to one NAND string NS. The memory pillar MP includes a block insulating film 34, a charge storage layer 35, a tunnel insulating film 36, a semiconductor layer 37, a core layer 38, and a cap layer 39.

More specifically, a hole corresponding to the memory pillar MP is formed in a manner to penetrate the interconnect layers 33 and reach the interconnect layer 32 at its bottom surface. The block insulating film 34, the charge storage layer 35, and the tunnel insulating film 36 are sequentially stacked on a side surface of the hole. The semiconductor layer 37 is formed in such a manner that its side surface is in contact with the tunnel insulating film 36 and its bottom surface is in contact with the interconnect layer 32. The semiconductor layer 37 is an area in which channels of the memory cell transistors MC and the selection transistors ST1 and ST2 are to be formed. Accordingly, the semiconductor layer 37 functions as a signal line that couples current paths of selection transistor ST2, memory cell transistors MC0 to MC7, and select transistor ST1. A core layer 38 is provided in the semiconductor layer 37. A cap layer 39 is formed on the semiconductor layer 37 and the core layer 38, in such a manner that its side surface is in contact with the tunnel insulating film 36.

For the block insulating film 34, the tunnel insulating film 36, and the core layer 38, $SiO_2$ is used, for example. For the charge storage layer 35, for example, silicon nitride (SiN) is used. For the semiconductor layer 37 and the cap layer 39, for example, polysilicon is used.

A contact plug 40 is formed on the cap layer 39. An interconnect layer 41 that functions as a bit line BL and that extends in the Y direction is formed on the contact plug 40. The contact plug 40 and the interconnect layer 41 are configured by a conductive material including, for example, a stacked structure of titanium (Ti)/TiN/W, or copper (Cu).

In the example of FIG. 4, one interconnect layer 33 functioning as the select gate line SGD and one interconnect layer 33 functioning as the select gate line SGS are provided, but a plurality of them may be provided.

Each of the memory cell transistors MC0 to MC7 is configured by the memory pillar MP and eight interconnect layers 33 that respectively function as word lines WL0 to WL7. Similarly, each of the selection transistors ST1 and ST2 is configured by the memory pillar MP and two interconnect layers 33 that respectively function as select gate lines SGD and SGS.

A transistor included in the sense amplifier 132 will be briefly described.

On the semiconductor substrate 30, for example, a transistor included in the sense amplifier 132 is provided. For example, two interconnect layers 53 and 55 are coupled onto the source and drain of the transistor via contact plugs 51 and 54. The interconnect layer 53 is coupled to a gate electrode 52 of the transistor via the contact plug 51.

A contact plug 56 whose upper surface height is above the highest interconnect layer 33 is formed on the interconnect layer 55 corresponding to either the source or the drain of the transistor. The contact plug 56 is not electrically coupled to the interconnect layers 32 and 33. A contact plug 57 is formed on the contact plug 56. The contact plug 56 is coupled to the interconnect layer 41 via the contact plug 57. The contact plugs 51, 54, 56, and 57, the gate electrode 52, and the interconnect layers 53 and 55 are configured by a conductive material.

1.1.5 Configurations of Sense Amplifier and Page Buffer

An example of configurations of the sense amplifier 132 and the page buffer 133 will be described with reference to FIGS. 5 and 6. FIG. 5 is a block diagram of the sense amplifier 132 and the page buffer 133. FIG. 6 is a perspective view of a CUA structure.

As shown in FIG. 5, in the present embodiment, the sequencer 123 controls a plurality of memory cell transistors MC in one memory group MG by dividing them into two areas of a first cell area and a second cell area. Similarly, the sequencer 123 controls the sense amplifier 132 and the page buffer 133 by dividing them in two in accordance with the first cell area and the second cell area. For example, the memory cell transistors MC included in the first cell area are associated with bit lines BL0 to BL(i−1) (i is an integer equal to or greater than 1 and smaller than k). The memory cell transistors MC included in the second cell area are associated with bit lines BL(i) to BL(k−1). It should be noted that the number of memory cell transistors MC included in the first cell area and the number of memory cell transistors MC included in the second cell area are preferably the same. For example, in the case where the number of memory cell transistors MC included in the first cell area and the number of memory cell transistors MC included in the second cell area are the same, a relationship such as i=k/2 will be established between "i" and "k".

The sense amplifier 132 includes a plurality of sense circuits SA provided for each bit line BL. In the read operation, the sense circuit SA reads data from the memory cell transistor MC coupled to a corresponding bit line BL, and determines whether the data is "0" or "1". In the write operation, the sense circuit SA applies a voltage to the bit line BL based on write data. The sense circuit SA may include a latch circuit for temporarily storing the read data or the write data. Hereinafter, a sense circuit coupled to a bit line BL corresponding to the memory cell transistor MC included in the first cell area will be referred to as "sense circuit SA1". Furthermore, a sense circuit coupled to a bit line BL corresponding to the memory cell transistor MC included in the second cell area will be referred to as "sense circuit SA2".

The page buffer 133 includes latch circuits ADL, BDL, and XDL for each sense circuit SA. The sense circuit SA and the latch circuits ADL, BDL, and XDL are coupled to each other. In other words, the sense circuit SA and the latch circuits ADL, BDL, and XDL are coupled to each other in a manner allowing data to be transmitted and received therebetween. The latch circuits ADL, BDL, and XDL temporarily store data DAT. For example, the read data confirmed by the sense circuit SA in the read operation is transferred to one of the latch circuits ADL, BDL, or XDL from the sense circuit SA.

The latch circuit XDL is coupled to the serial access controller 126 via the data bus, and is used for transmitting and receiving data between the serial access controller 126 and the sense amplifier 132.

The configuration of the page buffer 133 is not limited thereto and may be variously modified. For example, the number of latch circuits included in each page buffer 133 may be designed based on the number of bits of data stored in a single memory cell transistor MC.

Hereinafter, the latch circuits ADL, BDL, and XDL corresponding to sense circuit SA1 will be referred to as "latch circuit ADL1", "latch circuit BDL1", and "latch circuit XDL1". Furthermore, the latch circuits ADL, BDL, and XDL corresponding to sense circuit SA2 will be referred to as "latch circuit ADL2", "latch circuit BDL2", and "latch circuit XDL2". Furthermore, a set of the sense circuit SA and the latch circuits ADL, BDL, and XDL corresponding to a single bit line BL will be referred to as a "sense amplifier unit SAU". A set of sense circuit SA1 and latch circuits ADL1, BDL1, and XDL1 will be referred to as "sense amplifier unit SAU1", and a set of sense circuit SA2 and latch circuits ADL2, BDL2, and XDL2 will be referred to as "sense amplifier unit SAU2".

In the present embodiment, a plurality of sense amplifier units SAU1 corresponding to the first cell area are arranged together in one area, and a plurality of sense amplifier units SAU2 corresponding to the second cell area are arranged together in another area.

The relationship between the memory group MG and the sense amplifier unit SAU will be described in terms of arrangement.

As shown in FIG. 6, in the case of the CUA structure, the memory cell array 130 is arranged above the sense amplifier 132 and the page buffer 133 in the Z direction. For example, in the memory cell array 130, a plurality of memory cell transistors MC included in the memory group MG are aligned in the X direction. Furthermore, a plurality of blocks BLK are aligned in the Y direction. In the sense amplifier 132 and the page buffer 133, the sense circuit SA and the latch circuits ADL, BDL, and XDL are aligned in the Y direction in the sense amplifier unit SAU corresponding to a single memory cell transistor MC. In the case where it is difficult to arrange the sense circuit SA and the latch circuits ADL, BDL, and XDL in one stage, they may be arranged in multiple stages.

1.2 Threshold Voltage Distributions of Memory Cell Transistors

Possible threshold voltage distributions of the memory cell transistors MC will be described with reference to FIG. 7. FIG. 7 is a diagram showing a relationship between threshold voltage distributions and data allocations of memory cell transistors MC. Hereinafter, in the present embodiment, a case will be described in which each memory cell transistor MC is a triple-level cell (TLC) (or referred to as "3 bit/Cell") capable of storing eight values (three bits) of data. However, data that can be stored in the memory cell transistor MC is not limited to eight values.

As shown in FIG. 7, the threshold voltage of each memory cell transistor MC takes a value that falls within, for example, one of eight discrete distributions. Hereinafter, the eight distributions will be respectively referred to as, in ascending order of threshold voltage, an "S0" state (or also referred to as a threshold area), an "S1" state, an "S2" state, an "S3" state, an "S4" state, an "S5" state, an "S6" state, and an "S7" state.

The "S0" state corresponds to, for example, a data erase state. The "S1" to "S7" states correspond to states in which a charge is injected into the charge storage layer and data is written. In a write operation, it is assumed that verify voltages corresponding to the respective threshold voltage distributions are V1 to V7. In this case, the voltage values establish a relationship of $V1<V2<V3<V4<V5<V6<V7<Vread$. In the read operation, the voltages V1 to V7 are voltages to be applied to a word line WL (hereinafter also referred to as "selected word line WL") coupled to a memory cell transistor MC that is to be read. In the read operation, the voltage Vread is a voltage that is applied to a word line WL (hereinafter also referred to as "non-selected word line WL") coupled to a memory cell transistor MC that is not to be read. The memory cell transistor MC is switched to an on state upon application of the voltage Vread to its gate, regardless of data stored therein.

More specifically, a threshold voltage that falls within the "S0" state is less than the voltage V1. A threshold voltage that falls within the "S1" state is equal to or higher than the voltage V1, and less than the voltage V2. A threshold voltage that falls within the "S2" state is equal to or higher than the voltage V2, and less than the voltage V3. A threshold voltage that falls within the "S3" state is equal to or higher than the voltage V3, and less than the voltage V4. A threshold voltage that falls within the "S4" state is equal to or higher than the voltage V4, and less than the voltage V5. A threshold voltage that falls within the "S5" state is equal to or higher than the voltage V5, and less than the voltage V6. A threshold voltage that falls within the "S6" state is equal to or higher than the voltage V6, and less than the voltage V7. A threshold voltage that falls within the "S7" state is equal to or higher than the voltage V7, and less than the voltage Vread.

Setting values for the verify voltages and setting values for the read voltages corresponding to the respective states may be either identical to or different from each other. To simplify the description, a case will be described in which the setting values for the verify voltages and the setting values for the read voltages are the same.

Hereinafter, read operations corresponding to the read operations of the "S1" to "S7" states will be respectively referred to as read operations R1, R2, R3, R4, R5, R6, and R7. In read operation R1, it is determined whether or not the threshold voltage of the memory cell transistor MC is less than the voltage V1. In read operation R2, it is determined whether or not the threshold voltage of the memory cell transistor MC is less than the voltage V2. The same applies to the subsequent read operations. In each of read operations R3 to R7, it is determined whether or not the threshold voltage of the memory cell transistor MC is less than the voltages V3 to V7, respectively.

Each of the memory cell transistors MC belongs to one of the eight threshold voltage distributions, thereby taking one of the eight states. By allocating these states to "000" to "111" in binary notation, each memory cell transistor MC is capable of storing three bits of data. The three bits of data will be respectively referred to as a Lower bit, a Middle bit, and an Upper bit. Furthermore, a group of lower bits that are collectively written into (or read from) the memory group MG is referred to as a "lower page", a group of middle bits that are collectively written into (or read from) the memory group MG is referred to as a "middle page", and a group of upper bits that are collectively written into (or read from) the memory group MG is referred to as an "upper page".

In the example of FIG. 7, data is allocated to the "upper bit/middle bit/lower bit" of each of the memory cell transistors MC that belongs to each of the threshold voltage distributions in the following manner. Data is allocated to each state to become a Gray code in which one bit of data changes between two adjacent states.

"S0" state: "111" data
"S1" state: "101" data
"S2" state: "001" data
"S3" state: "011" data
"S4" state: "010" data
"S5" state: "110" data
"S6" state: "100" data
"S7" state: "000" data In the case of reading data that is allocated in the above manner, the lower page is determined by read operation R4. The middle page is determined by read operations R1, R3, and R6. The upper page is determined by read operations R2, R5, and R7. That is, the values of the lower bit, the middle bit, and the upper bit are determined by one read operation, three read operations, and three read operations, respectively. In other words, the number of voltages which is to be the boundary for determining a bit value (hereinafter referred to as a "boundary number") is one, three, and three for the lower bit, the middle bit, and the upper bit, respectively. Hereinafter, such data allocation will be referred to as "1-3-3 coding" using the boundary number.

In the present embodiment, when allocating data for the upper bit, the middle bit, and the lower bit, one bit whose boundary number is one is included. Furthermore, the boundary number of a bit whose boundary number is not one is coded in a manner such that the maximum value of the boundary number becomes minimum. For example, in the case of a TLC, that is, 3 bit/Cell, since the overall boundary number is seven, when sharing the remaining boundary number, six, with the remaining two bits, the maximum value of the boundary number will become minimum if the boundary number of each bit is set to three.

The data allocation to the "S0" to "S7" states is not limited to the 1-3-3 coding.

1.3 Conversion Operation of Logical Page Address and Physical Page Address

An example of a conversion operation of a logical page address and a physical page address will be explained with reference to FIGS. 8 and 9. FIG. 8 is a diagram explaining a flow of the conversion operation of the logical page address and the physical page address. FIG. 9 is a diagram showing a logical page data allocation with respect to a physical page.

In the present embodiment, a case of allocating input data of two logical pages to three physical pages (that is, one memory group MG capable of storing three-page data) will be described.

As shown in FIG. 8, for example, when the memory controller 200 receives a write request from the host device 2, it allocates two logical page addresses "90001" and "90002" corresponding to two received logical addresses "00001" and "00002". Hereinafter, the two allocated logical pages will be referred to as a "logical first page" and a "logical second page". In the example of FIG. 8, the logical first page corresponds to the logical page address "90001", and the logical second page corresponds to the logical page address "90002".

When the command user interface circuit 121 receives a write order including two pages of the logical page address and the logical page from the memory controller 200, it converts the two pages of the logical page address into three pages of the physical page address in accordance with a preset mapping. In the present embodiment, the command user interface circuit 121 converts the logical page address of the logical first page into the physical page addresses of the first cell area of the lower page and the middle page. In addition, the command user interface circuit 121 converts the logical page address of the logical second page into the physical page addresses of the second cell area of the lower page and the upper page.

The page size of one page of the logical page is larger than the page size of one page of the physical page. However, a data amount (data length) of two pages of the logical page is equal to a data amount (data length) of three pages of the physical page.

In the present embodiment, the page size of one page of the logical page will be referred to as "m" ("m" is a number equal to or greater than one), and the number of logical pages to be written (that is, the number of logical page addresses included in the order) will be referred to as "a" ("a" is an integer equal to or greater than one). Furthermore, the page size of one page of the physical page will be referred to as "n" ("n" is a number smaller than "m"), and the number of physical pages to be written (that is, the number of bits of data that can be stored by the memory cell transistor MC) will be referred to as "b" ("b" is an integer larger than "a"). One page of the physical page, that is, the page size $n$ of one memory group MG, may then be described by $n=m \times a/b$. Furthermore, each of the page size of the first cell area and the second cell area may be described by $n/2$. In the present embodiment, since $a=2$ and $b=3$, the page size of the physical page is $n=m \times \frac{2}{3}$. For example, in the case where the page size of the logical page is 16 [kB], the page size of the physical page is $n=16 \times \frac{2}{3}=10.67$ [kB]. In this case, the number of memory cell transistors MC that can satisfy the equation for the page size $n=10.67$ [kB] of one physical page is an integer equal to or greater than the integer calculated by rounding up digits after the decimal point of $10.67 \times 1024$. In other words, the number of memory cell transistors MC is equal to or greater than the integer calculated by rounding up digits after the decimal point of the page size of one physical page. In the present embodiment, the page size of the physical page is smaller than the page size of the logical page. In such a case, if the number of string units SU inside a logical block BLK configured by the logical page and the number of string units SU inside a physical block BLK (that is, the block BLK of the memory cell array 130) configured by the physical page are the same, the block size (memory capacity) of the physical block BLK is smaller than the block size (memory capacity) of the logical block BLK. Therefore, the number of string units SU inside the physical block BLK may, for example, be increased from four to six so that the memory capacity of the logical block BLK and the memory capacity of the physical block BLK are equal. Alternatively, the number of physical blocks BLK may be increased to exceed the number of logical blocks BLK.

For example, based on the physical page address converted at the command user interface circuit 121, the sequencer 123 writes the data of the logical first page in a first cell area of the lower page and the first and second cell areas of the middle page, and writes the data of the logical second page in the second cell area of the lower page and the first and second cell areas of the upper page of one memory group MG.

The arrangement of the logical page data in one memory group MG will be described in detail.

As shown in FIG. 9, data of the logical first page and data of the logical second page are divided respectively into three pieces of a first cluster to a third cluster from the head. For example, the sequencer 123 writes a first cluster of the logical first page in the first cell area of the lower page, writes a second cluster of the logical first page in the second cell area of the middle page, and writes a third cluster of the logical first page in the first cell area of the middle page. Furthermore, the sequencer 123 writes a first cluster of the logical second page in the second cell area of the lower page, writes a second cluster of the logical second page in the first cell area of the upper page, and writes a third cluster of the logical second page in the second cell area of the upper page.

1.4 Read Operation

The read operation will be explained. In the read operation of the present embodiment, when the memory 100 receives a read order based on the logical page from the memory controller 200, the memory 100 reads data from a plurality of physical pages corresponding thereto, and outputs the combined pieces of read data as data of the logical page.

In the present embodiment, the read operations differ depending on whether the logical page to be read is a logical first page or a logical second page. In the case where the logical page is the logical first page, the physical pages to be read are the lower page (the first cell area) and the middle page (the first cell area and the second cell area). In this case, the memory 100 transmits (outputs) data in the first cell area of the lower page and data in the first cell area and the second cell area of the middle page to the memory controller 200. On the other hand, in the case where the logical page is the logical second page, the physical pages to be read are the lower page (the second cell area) and the upper page (the first cell area and the second cell area). In this case, the memory 100 transmits (outputs) data in the second cell area of the lower page and data in the first cell area and the second cell area of the upper page to the memory controller 200.

1.4.1 Flow of Read Operation

Figure 10:
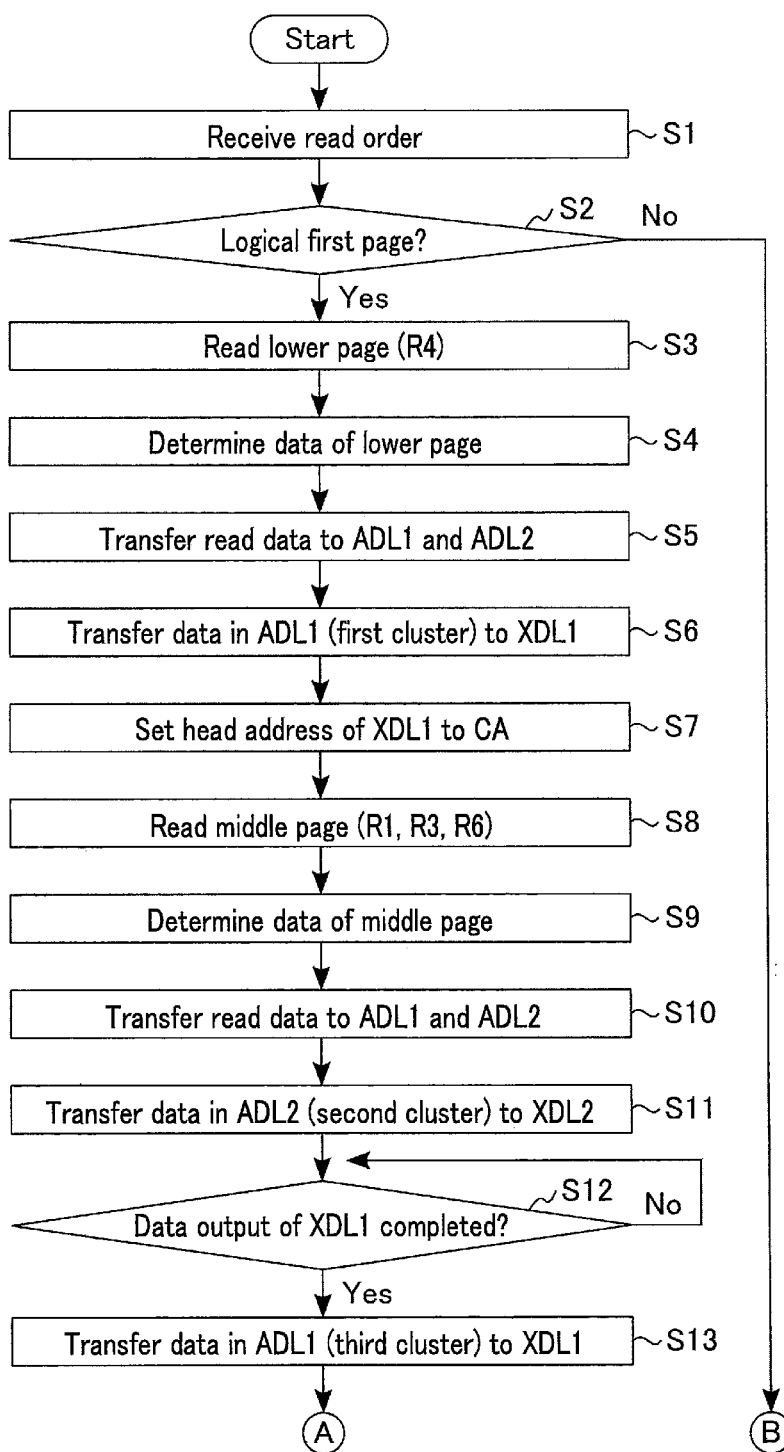
FIG. 10 is a flowchart showing a read operation of the semiconductor memory according to the first embodiment.

The flow of the read operation in the memory 100 will first be described with reference to FIGS. 10 and 11. FIGS. 10 and 11 are flowcharts of the read operation.

As shown in FIGS. 10 and 11, the memory 100 receives a read order of a logical first page or a logical second page from the memory controller 200 (step S1). The command user interface circuit 121 converts the logical page address into the physical page addresses, then, transmits the received command and the converted physical page addresses to the sequencer 123.

In the case where the logical page address is the logical page address of the logical first page (step S2_Yes), the sequencer 123 first executes the read operation of the lower page (step S3). More specifically, the sequencer 123 executes read operation R4 corresponding to read voltage V4.

The sequencer 123 determines the data of the lower page based on the result of read operation R4 (step S4).

The sequencer 123 transfers the data of the lower page read by the sense circuits SA1 and SA2 to the latch circuits ADL1 and the ADL2, respectively (step S5).

The sequencer 123 transfers the data in the latch circuits ADL1 (data of the first cluster of the logical first page) to the latch circuits XDL1 (step S6).

The sequencer 123 sets a head address of the latch circuit XDL1 as the column address CA in the column counter 125

(step S7). Based on the column address CA incremented by the column counter 125, the serial access controller 126 receives data sequentially from the head address of the latch circuit XDL1 and transfers it to the input/output circuit 110. The input/output circuit 110 starts transmitting (outputting) the data in the latch circuits XDL1 to the memory controller 200.

The sequencer 123 executes a read operation of the middle page in parallel with the data output of the latch circuits XDL1 (step S8). More specifically, the sequencer 123 executes read operation R1 corresponding to read voltage V1, read operation R3 corresponding to read voltage V3, and read operation R6 corresponding to read voltage V6. The order of read operations R1, R3, and R6 may be set freely.

The sequencer 123 determines the data of the middle page based on the result of read operations R1, R3, and R6 (step S9).

The sequencer 123 transfers the data of the middle page read by the sense circuits SA1 and SA2 to the latch circuits ADL1 and the ADL2, respectively (step S10).

The sequencer 123 transfers the data in the latch circuits ADL2 (data of the second cluster of the logical first page) to the latch circuits XDL2 (step S11).

In the case where the data output of the latch circuits XDL1 (data of the first cluster of the logical first page) is not ended (step S12_No), the sequencer 123 repeats a confirmation operation of the data output until the output is ended.

When the data output of the latch circuits XDL1 is ended (step S12_Yes), the sequencer 123 transfers the data in the latch circuits ADL1 (data of the third cluster of the logical first page) to the latch circuits XDL1 (step S13). The sequencer 123 ends the read operation of the logical first page when the data output of the latch circuits XDL2 (data of the second cluster of the logical first page) and the data output of the latch circuits XDL1 (data of the third cluster of the logical first page) are ended.

In the case where the logical page address is not the logical page address of the logical first page (step S2_No), that is, in the case where the logical page address is the logical page address of the logical second page, the sequencer 123 first executes the read operation of the lower page (step S14) in the same manner as step S3.

The sequencer 123 determines the data of the lower page based on the result of read operation R4 (step S15).

The sequencer 123 transfers the data of the lower page read by the sense circuits SA1 and SA2 to the latch circuits ADL1 and the ADL2, respectively (step S16).

The sequencer 123 transfers the data in the latch circuits ADL2 (data of the first cluster of the logical second page) to the latch circuits XDL2 (step S17).

The sequencer 123 sets a head address of the latch circuit XDL2 as the column address CA in the column counter 125 (step S18). Based on the column address CA incremented by the column counter 125, the serial access controller 126 receives data sequentially from the head address of the latch circuit XDL2 and transfers it to the input/output circuit 110. The input/output circuit 110 starts transmitting (outputting) the data in the latch circuits XDL2 to the memory controller 200.

The sequencer 123 executes a read operation of the upper page in parallel with the data output of the latch circuits XDL2 (step S19). More specifically, the sequencer 123 executes read operation R2 corresponding to read voltage V2, read operation R5 corresponding to read voltage V5, and read operation R7 corresponding to read voltage V7. The order of read operations R2, R5, and R7 may be set freely.

The sequencer 123 determines the data of the upper page based on the result of read operations R2, R5, and R7 (step S20).

The sequencer 123 transfers the data of the upper page read by the sense circuits SA1 and SA2 to the latch circuits ADL1 and the ADL2, respectively (step S21).

The sequencer 123 transfers the data in the latch circuits ADL1 (data of the second cluster of the logical second page) to the latch circuits XDL1 (step S22).

In the case where the data output of the latch circuits XDL2 (data of the first cluster of the logical second page) is not ended (step S23_No), the sequencer 123 repeats a confirmation operation of the data output until the output is ended.

When the data output of the latch circuits XDL2 is ended (step S23_Yes), the sequencer 123 transfers the data in the latch circuits ADL2 (data of the third cluster of the logical second page) to the latch circuits XDL2 (step S24). In addition, the sequencer 123 sets a head address of the latch circuit XDL1 as the column address CA in the column counter 125. Based on the column address CA incremented by the column counter 125, the serial access controller 126 receives data sequentially from the head address of the latch circuit XDL1 and transfers it to the input/output circuit 110. The input/output circuit 110 starts transmitting (outputting) the data in the latch circuits XDL1 to the memory controller 200. The sequencer 123 ends the read operation of the logical second page when the data output of the latch circuits XDL1 (data of the second cluster of the logical second page) and the data output of the latch circuits XDL2 (data of the third cluster of the logical second page) are ended.

1.4.2 Voltage of Selected Word Line in Read Operation

The voltage of the selected word line in the read operation will be described with reference to FIGS. 12 and 13. FIG. 12 is a timing chart showing the voltage of the selected word line WL in the read operation of the logical first page. FIG. 13 is a timing chart showing the voltage of the selected word line WL in the read operation of the logical second page.

As shown in FIG. 12, in order to read data of the logical first page, the sequencer 123 reads data of the lower page and data of the middle page. That is, the sequencer 123 executes read operation R4 corresponding to the lower page and read operations R1, R3, and R6 corresponding to the middle page in sequence.

More specifically, at time t0, the row decoder 131 applies read voltage V4 corresponding to read operation R4 to the selected word line WL.

At time t1, the row decoder 131 applies read voltage V1 corresponding to read operation R1 to the selected word line WL.

At time t2, the row decoder 131 applies read voltage V3 corresponding to read operation R3 to the selected word line WL.

At time t3, the row decoder 131 applies read voltage V6 corresponding to read operation R6 to the selected word line WL.

At time t4, the row decoder 131 applies a ground voltage VSS to the selected word line WL and ends the read voltage application.

The order in which the row decoder 131 applies the voltages V1, V3, V4, and V6 to the selected word line WL is changeable. For example, the row decoder 131 may apply voltages to the selected word line WL in the order of V4, V6, V3, and V1, or in the order of V1, V3, V4, and V6. The row decoder 131 may also apply voltages in the order of V6, V4, V3, and V1.

As shown in FIG. 13, in order to read data of the logical second page, the sequencer 123 reads data of the lower page and data of the upper page. That is, the sequencer 123 executes read operation R4 corresponding to the lower page and read operations R2, R5, and R7 corresponding to the upper page in sequence.

More specifically, at time t0, the row decoder 131 applies read voltage V4 corresponding to read operation R4 to the selected word line WL.

At time t1, the row decoder 131 applies read voltage V2 corresponding to read operation R2 to the selected word line WL.

At time t2, the row decoder 131 applies read voltage V5 corresponding to read operation R5 to the selected word line WL.

At time t3, the row decoder 131 applies read voltage V7 corresponding to read operation R7 to the selected word line WL.

At time t4, the row decoder 131 applies the ground voltage VSS to the selected word line WL and ends the read voltage application.

The order in which the row decoder 131 applies the voltages V2, V4, V5, and V7 to the selected word line WL is changeable. For example, the row decoder 131 may apply voltages to the selected word line WL in the order of V4, V7, V5, and V2, or in the order of V2, V4, V5, and V7. The row decoder 131 may also apply voltages in the order of V7, V5, V4, and V2.

1.4.3 Command Sequence of Read Operation

An example of a command sequence of the read operation will be described with reference to FIGS. 14 and 15. FIG. 14 shows a command sequence of the read operation of the logical first page. FIG. 15 shows a command sequence of the read operation of the logical second page. In the examples of FIGS. 14 and 15, signals CEn, CLE, ALE, WEn, and REn are omitted to simplify the description. In the following description, a ready/busy signal RBn that is transmitted from the memory 100 to the memory controller 200 will be referred to as an "external RBn signal". Furthermore, an internal signal indicating whether or not the memory 100 is in a busy state inside the memory 100 will be referred to as an "internal RBn signal". In the signal DQ, a command is expressed by a round frame, an address is expressed by a square frame, and data is expressed by a hexagonal frame. Furthermore, in a case where valid date is stored in one of the latch circuits of the page buffer 133, the latch circuit is expressed by a square frame with rounded corners. In addition, the examples of FIGS. 14 and 15 also show voltages of the selected word line WL in a case where the internal RBn signal is in the busy state.

A command sequence in the read operation of the logical first page will first be explained.

As shown in FIG. 14, for example, in a case where a read target is the logical first page, the memory controller 200 transmits a command "00h" to the memory 100 to notify the read operation. The memory controller 200 then transmits a logical page address "AD-P1" of the logical first page. In the memory 100, the command user interface circuit 121 converts the received logical page address "AD-P1" into the physical page addresses. The memory controller 200 then transmits a command "30h" to the memory 100 to order the read operation to be executed. The command user interface circuit 121 sequentially transmits the received command and the converted physical page addresses to the sequencer 123.

The sequencer 123 starts the read operation in response to the command "30h". The sequencer 123 first sets the internal RBn signal and the external RBn signal to the "L" level indicating the busy state. The sequencer 123 then executes the read operation of the lower page (read operation R4). That is, read voltage V4 is applied to the selected word line WL. The read result of the lower page is stored in the latch circuits ADL1 and ADL2. The data in the latch circuits ADL1 is then transferred to the latch circuits XDL1. When the read operation of the lower page is ended, the sequencer 123 sets the external RBn signal to the "H" level indicating a ready state. Furthermore, when the read operation of the lower page is ended, the sequencer 123 starts the read operation of the middle page (read operations R1, R3, and R6). That is, read voltages V1, V3, and V6 are sequentially applied to the selected word line WL.

When the "H" level external RBn signal is received, the memory controller 200 transmits signal REn (not shown) to the memory 100. The input/output circuit 110 starts outputting data in accordance with signal REn. The input/output circuit 110 first outputs the data in the latch circuits XDL1. When the read operation of the middle page is ended while the data in the latch circuits XDL1 is being output, the sequencer 123 sets the internal RBn signal to the "H" level. The read result of the middle page is stored in the latch circuits ADL1 and ADL2. In the case where the output of data in the latch circuits XDL1 is ended before ending the read operation of the middle page, the sequencer 123 may temporarily set the external RBn signal to the "L" level (busy state), and suspend the output of data to the memory controller 200. This allows the data in the second cell area of the middle page to be output successively after the data in the first cell area of the lower page is output.

The data in the latch circuits ADL2 is then transferred to the latch circuits XDL2. When the output of data in the latch circuits XDL1 is ended, the input/output circuit 110 subsequently starts outputting data in the latch circuits XDL2. While the data in the latch circuits XDL2 is being output, the data in the latch circuits ADL1 is transferred to the latch circuits XDL1. When the output of data in the latch circuits XDL2 is ended, the input/output circuit 110 subsequently executes output of data in the latch circuits XDL1. When the output of data in the latch circuits XDL1 is ended, the read operation of the logical first page is ended. It should be noted that the memory 100 may also set the level of the external RBn signal to be identical to that of the internal RBn signal, and, after reading all of the pieces of data in the logical first page, set the external RBn signal (internal RBn signal) to the "H" level and output the data.

A command sequence in the read operation of the logical second page will be explained.

As shown in FIG. 15, for example, in a case where a read target is the logical second page, the memory controller 200 transmits a command "00h" to the memory 100 to notify the read operation. The memory controller 200 then transmits a logical page address "AD-P2" of the logical second page. In the memory 100, the command user interface circuit 121 converts the received logical page address "AD-P2" into the physical page addresses. The memory controller 200 then transmits a command "30h" to the memory 100 to order the read operation to be executed. The command user interface circuit 121 sequentially transmits the received command and the converted physical page addresses to the sequencer 123.

The sequencer 123 starts the read operation in response to the command "30h". The sequencer 123 first sets the internal RBn signal and the external RBn signal to the "L" level indicating the busy state. The sequencer 123 then executes the read operation of the lower page (read operation R4). That is, read voltage V4 is applied to the selected word line WL. The read result of the lower page is stored in the latch circuits ADL1 and ADL2. The data in the latch circuits ADL2 is then transferred to the latch circuits XDL2. When the read operation of the lower page is ended, the sequencer 123 sets the external RBn signal to the "H" level indicating a ready state. Furthermore, when the read operation of the lower page is ended, the sequencer 123 starts the read operation of the upper page (read operations R2, R5, and R7). That is, read voltages V2, V5, and V7 are sequentially applied to the selected word line WL.

When the "H" level external RBn signal is received, the memory controller 200 transmits signal REn (not shown) to the memory 100. The input/output circuit 110 starts outputting data in accordance with signal REn. The input/output circuit 110 first outputs the data in the latch circuits XDL2. When the read operation of the upper page is ended while the data in the latch circuits XDL2 is being output, the sequencer 123 sets the internal RBn signal to the "H" level. The read result of the upper page is stored in the latch circuits ADL1 and ADL2. In the case where the output of data in the latch circuits XDL2 is ended before ending the read operation of the upper page, the sequencer 123 may temporarily set the external RBn signal to the "L" level (busy state), and suspend the output of data to the memory controller 200. This allows the data in the first cell area of the upper page to be output successively after the data in the second cell area of the lower page is output.

The data in the latch circuits ADL1 is then transferred to the latch circuits XDL1. When the output of data in the latch circuits XDL2 is ended, the input/output circuit 110 subsequently starts outputting data in the latch circuits XDL1. While the data in the latch circuits XDL1 is being output, the data in the latch circuits ADL2 is transferred to the latch circuits XDL2. When the output of data in the latch circuits XDL1 is ended, the input/output circuit 110 subsequently executes output of data in the latch circuits XDL2. When the output of data in the latch circuits XDL2 is ended, the read operation of the logical second page is ended. It should be noted that the memory 100 may also set the level of the external RBn signal to be identical to that of the internal RBn signal, and, after reading all of the pieces of data in the logical second page, set the external RBn signal (internal RBn signal) to the "H" level and output the data.

1.5 Write Operation

The write operation will be described below. The write operation includes a program operation and a program verify operation. The program operation refers to an operation of injecting electrons into the charge storage layer to increase a threshold voltage (or maintaining the threshold value by hardly injecting electrons into the charge storage layer). The program verify operation is an operation of reading data after the program operation and determining whether or not a threshold voltage of a memory cell transistor MC has reached a target level. Hereinafter, a case in which the threshold voltage of the memory cell transistor MC has reached the target level will be referred to as "verification passed", and a case in which it has not reached the target level will be referred to as "verification failed." More specifically, for example, a case in which the number of failed bits of the read data is equal to or greater than a preset reference value in the program verify operation will be determined to be "verification failed". By repeating the combination of the program operation and the program verify operation (hereinafter referred to as a "program loop"), the threshold voltage of the memory cell transistor MC is increased to the target level.

In the present embodiment, the data of the logical first page and the data of the logical second page are collectively written in the memory group MG including the lower page, the middle page, and the upper page. That is, three bits of data is collectively written in one memory cell transistor MC. Hereinafter, an operation of collectively writing pieces of data of a plurality of physical pages will be referred to as a "full sequence write operation". In the full sequence write operation of the present embodiment, the "S1" to "S7" states are written. For example, in the full sequence write operation, writing is executed in ascending order of states with lower threshold voltages. For example, in the case where the page size of the logical page and the page size of the physical page are the same, when the "S1" to "S3" states are written in the memory cell array 130, the latch circuits XDL would not be needed for the write operations of the "S1" to "S3" states. Therefore, the latch circuits XDL are used as the cache memory for the next write data. However, in the case of the present embodiment, since the number of physical latch circuits XDL is ⅔ (for example, 10.67 kB) of the page size of the logical page (for example, 16 kB), the latch circuits XDL cannot store all of the pieces of data on the one page data of the logical page. Therefore, after inputting ⅔ of the page data of the logical page to the available latch circuits XDL, signal RBn is temporarily set to the busy state. After the "S1" to "S5" states are written in the memory cell array 130, and the latch circuits ADL or the latch circuits BDL is no longer needed for the write operation, signal RBn may be set to the ready state, and the remaining page data of the logical page may be input to the latch circuits XDL. Alternatively, a latch circuit may be added to each of the sense amplifier units SAU.

In the present embodiment, by transferring the input data alternately to the latch circuits XDL1 and XDL2, the memory 100 controls data input of the logical page to be performed successively.

1.5.1 Flow of Write Operation

Figure 16:
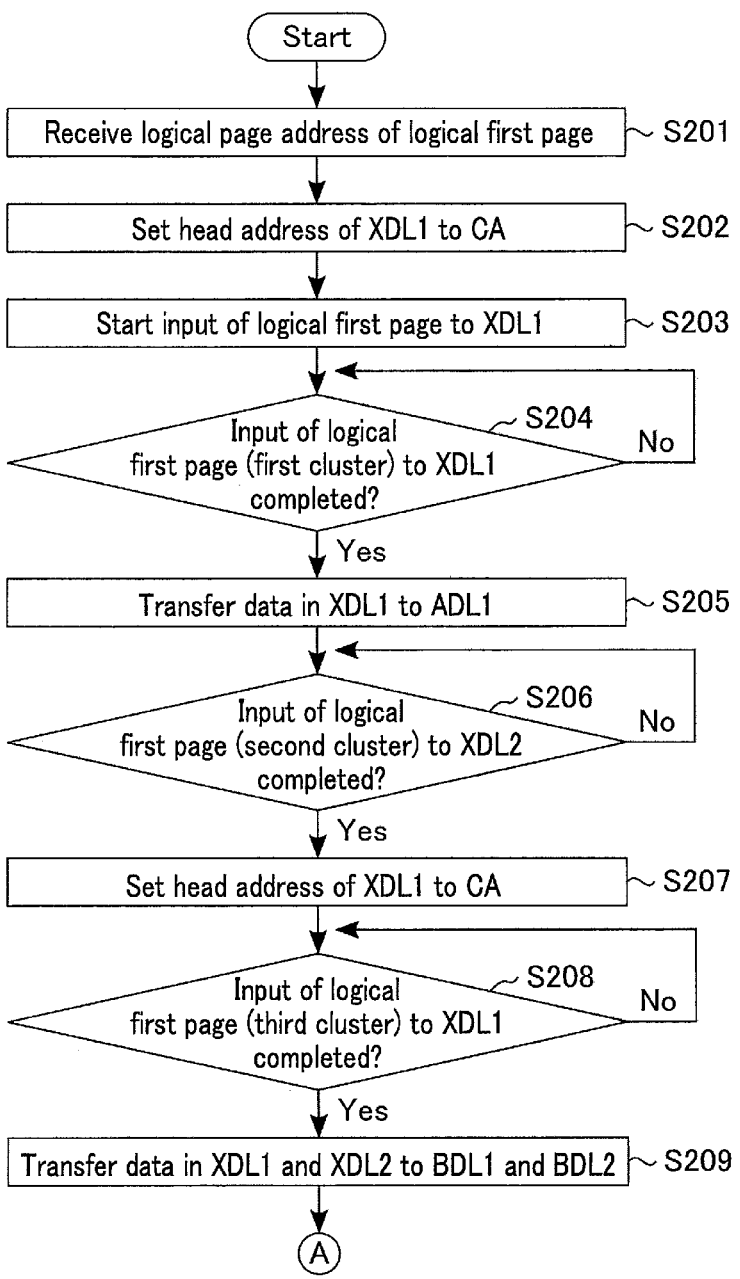
FIG. 16 is a flow chart showing a write operation of the semiconductor memory according to the first embodiment.

The flow of the write operation in the memory 100 will be described with reference to FIGS. 16 and 17. FIGS. 16 and 17 are flowcharts of the write operation.

As shown in FIGS. 16 and 17, when receiving the write order, the memory 100 receives a logical page address of the logical first page from the memory controller 200 (step S201). The command user interface circuit 121 converts the logical page address of the logical first page into the physical page addresses.

The sequencer 123 sets a head address of the latch circuit XDL1 as the column address CA in the column counter 125 (step S202).

In the page buffer 133, data input of the first cluster of the logical first page to the latch circuits XDL1 is started based on the column address CA received from the column counter 125 (step S203).

In the case where the data input of the first cluster of the logical first page to the latch circuits XDL1 is not ended (step S204_No), the sequencer 123 repeats a confirmation operation of the data input until the input is ended.

When the data input to the latch circuits XDL1 is ended (step S204_Yes), the sequencer 123 transfers the data in the latch circuits XDL1 to the latch circuits ADL1 (step S205). Furthermore, when the data input to the latch circuits XDL1 is ended, data input of the second cluster of the logical first page to the latch circuits XDL2 is started subsequently. It should be noted that step S205 may be executed during the data input of the second cluster of the logical first page to the latch circuits XDL2.

In the case where the data input of the second cluster of the logical first page to the latch circuits XDL2 is not ended (step S206_No), the sequencer 123 repeats a confirmation operation of the data input until the input is ended.

When the data input to the latch circuits XDL2 is ended (step S206_Yes), the sequencer 123 sets a head address of the latch circuit XDL1 as the column address CA in the column counter 125 (step S207).

In the page buffer 133, data input of the third cluster of the logical first page to the latch circuits XDL1 is started based on the column address CA received from the column counter 125.

In the case where the data input of the third cluster of the logical first page to the latch circuits XDL1 is not ended (step S208_No), the sequencer 123 repeats a confirmation operation of the data input until the input is ended.

When the data input to the latch circuits XDL1 is ended (step S208_Yes), data input of the logical first page to the latch circuits XDL1 and XDL2 is ended.

The sequencer 123 transfers the data in the latch circuits XDL1 and XDL2 to the latch circuits BDL1 and BDL2, respectively (step S209).

The memory 100 then receives a logical page address of the logical second page from the memory controller 200 (step S210). The command user interface circuit 121 converts the logical page address of the logical second page into the physical page addresses. It should be noted that the sequencer 123 may also transfer the data in the latch circuits XDL2 to the latch circuits BDL2 during the data input of the third cluster of the logical first page to the latch circuits XDL1.

The sequencer 123 sets a head address of the latch circuit XDL2 as the column address CA in the column counter 125 (step S211).

In the page buffer 133, data input of the first cluster of the logical second page to the latch circuits XDL2 is started based on the column address CA received from the column counter 125 (step S212). It should be noted that the sequencer 123 may also transfer the data in the latch circuits XDL1 to the latch circuits BDL1 during the data input of the first cluster of the logical second page to the latch circuits XDL2.

In the case where the data input of the first cluster of the logical second page to the latch circuits XDL2 is not ended (step S213_No), the sequencer 123 repeats a confirmation operation of the data input until the input is ended.

When the data input to the latch circuits XDL2 is ended (step S213_Yes), the sequencer 123 transfers the data in the latch circuits XDL2 to the latch circuits ADL2 (step S214). Furthermore, the sequencer 123 sets a head address of the latch circuit XDL1 as the column address CA in the column counter 125 (step S215). In the page buffer 133, data input of the second cluster of the logical second page to the latch circuits XDL1 and data input of the third cluster of the logical second page to the latch circuits XDL2 are sequentially executed based on the column address CA received from the column counter 125. It should be noted that, in the case of step S213_Yes, the data input of the second cluster of the logical second page to the latch circuits XDL1 may be started subsequently, and the sequencer 123 may execute step S214 in the meantime.

In the case where the data input of the third cluster of the logical second page to the latch circuits XDL2 is not ended (step S216_No), the sequencer 123 repeats a confirmation operation of the data input until the input is ended.

When the data input to the latch circuits XDL2 is ended (step S216_Yes), the data input of the logical second page to the latch circuits XDL1 and XDL2 is ended. The sequencer 123 sets the external RBn signal and the internal RBn signal to the "L" level. The sequencer 123 then determines the state of each of the memory cell transistors MC based on the input data of the logical first page and the input data of the logical second page, that is, the combination of data in the lower page, the middle page, and the upper page.

The sequencer 123 executes the program operation based on the determined states (step S217).

After ending the program operation, the sequencer 123 performs the program verify operation (step S218).

In the case where the verification is not passed (step S219_No), the sequencer 123 confirms whether or not the number of program loops has reached the preset upper limit number (step S220).

In the case where the number of program loops has not reached the upper limit number (step S220_No), the sequencer 123 executes the program operation (step S217). That is, the sequencer 123 repeats the program loop.

In the case where the number of program loops has reached the upper limit number (step S220_Yes), the sequencer 123 ends the write operation and reports to the memory controller 200 that the write operation did not end successfully.

In the case of passing the verification (step S219_Yes), that is, ending writing of the "S1" to "S7" states, the sequencer 123 sets the external RBn signal to the "H" level and ends the full sequence write operation.

1.5.2 Command Sequence of Write Operation

An example of a command sequence of the write operation will be described with reference to FIG. 18. FIG. 18 is a command sequence of a full sequence write operation. In the example of FIG. 18, signals CEn, CLE, ALE, WEn, and REn are omitted to simplify the description.

As shown in FIG. 18, the memory controller 200 first transmits a command "80h" to the memory 100 to notify the write operation. The memory controller 200 then transmits a logical page address "AD-P1" of the logical first page. In the memory 100, the command user interface circuit 121 converts the received logical page address "AD-P1" into physical page addresses. The memory controller 200 then transmits data of the logical first page to the memory 100. The first cluster of the logical first page is stored in the latch circuits XDL1, and is then transferred to the latch circuits ADL1. The second cluster of the logical first page is stored in the latch circuits XDL2, and is then transferred to the latch circuits BDL2. The third cluster of the logical first page is stored in the latch circuits XDL1, and is then transferred to the latch circuits BDL1.

The memory controller 200 then transmits a command "1Ah" to the memory 100 to notify data input of the next logical page. The memory controller 200 then transmits the command "80h" and a logical page address "AD-P2" of the logical second page to the memory 100. In the memory 100, the command user interface circuit 121 converts the received logical page address "AD-P2" into the physical page addresses. The memory controller 200 then transmits data of the logical second page to the memory 100. The first cluster of the logical second page is stored in the latch circuits XDL2, and is then transferred to the latch circuits ADL2. The second cluster of the logical second page is stored in the latch circuits XDL1. The third cluster of the logical second page is stored in the latch circuits XDL2. The memory controller 200 then transmits a command "10h" to the memory 100 to instruct execution of the write operation.

When the command "10h" is received, the sequencer 123 sets the internal RBn signal and the external RBn signal to the "L" level. The sequencer 123 then determines the state of each of the memory cell transistors MC based on the data stored in the latch circuits ADL1, ADL2, BDL1, BDL2, XDL1, and XDL2, and then executes the write operation. After ending the write operation, the sequencer 123 sets the internal RBn signal and the external RBn signal to the "H" level. It should be noted that the first cluster of the logical first page is stored in the latch circuits XDL1, and is then transferred to the latch circuits ADL1 while the data of the second cluster of the logical first page is being stored in the latch circuits XDL2. The second cluster of the logical first page is stored in the latch circuits XDL2, and is then transferred to the latch circuits BDL2 while the data of the third cluster of the logical first page is being stored in the latch circuits XDL1. The third cluster of the logical first page is stored in the latch circuits XDL1, and is then transferred to the latch circuits BDL1 while the data of the first cluster of the logical second page is being stored in the latch circuits XDL2. The first cluster of the logical second page is stored in the latch circuits XDL2, and is then transferred to the latch circuits ADL2 while the data of the second cluster of the logical second page is being stored in the latch circuits XDL1. The second cluster of the logical second page is stored in the latch circuits XDL1. The third cluster of the logical second page is stored in the latch circuits XDL2. This allows the time of transferring data from the latch circuits XDL1 to the the latch circuits ADL1 or the latch circuits BDL1 and the time of transferring data from the latch circuits XDL2 to the latch circuits ADL2 or the latch circuits BDL2, to be invisible from the outside (the memory controller 200). Furthermore, when data input of the logical first page starts from the second cluster or the third cluster of the logical first page, data is input to the latch circuits XDL2 and XDL1 or the latch circuits XDL1, and is then transferred to the latch circuits BDL1 and BDL2 or the latch circuits BDL1. Furthermore, when data input of the logical second page starts from the second cluster or the third cluster of the logical second page, data is input to the latch circuits XDL1 and XDL2 or the latch circuits XDL2, and the write operation is started subsequently. In this case, the latch circuits XDL to which no data is input is set to "1" (non-write data).

1.6 Advantageous Effects of First Embodiment

According to the configuration of the present embodiment, it is possible to suppress increasing a chip area of the semiconductor memory. The effects will be explained in detail.

In order to increase a storage capacity of a flash memory, memory cell transistor has been miniaturized. By miniaturizing peripheral circuits such as sense amplifiers and page buffers with the miniaturization of the memory cell transistor, the chip area can be reduced, thereby increasing capacitance density per chip area. However, the miniaturization rate of the peripheral circuits is milder than the miniaturization rate of the memory cell transistor. This is because a leak current may increase or a memory life may deteriorate if the transistor size of the peripheral circuit is reduced before the operation voltage can be lowered.

In order to increase the capacitance density per chip area, a configuration in which a peripheral circuit is provided below the memory cell array, that is, between the memory cell array and a semiconductor substrate, or a configuration in which a peripheral circuit is formed on another semiconductor substrate and is bonded together with the memory cell array, etc. is proposed. In the case of such a configuration, even if the memory cell array becomes miniaturized and highly integrated (highly laminated) and the area of the memory cell array is reduced, the area of the peripheral circuit would not be largely reduced, which may cause the area of the peripheral circuit to become larger than the area of the memory cell array. As a result, since the chip size is determined by the size of the peripheral circuit, in some cases, the miniaturization and high lamination of the memory cell array may be difficult to cause the chip area to be reduced.

In contrast, according to the configuration of the present embodiment, the page size of the physical page can be made smaller than the page size of the logical page. More specifically, write data in the page size of the logical page can be divided and written on a plurality of physical pages. Furthermore, pieces of data read from a plurality of physical pages can be combined and output as data of the logical page. Since the page size of the physical page can be reduced, the number of sense amplifier units SAU corresponding to the physical page can be reduced. That is, the number of sense circuits inside the sense amplifier 132 and the number of latch circuits inside the page buffer 133 can be reduced. Therefore, the chip area of the semiconductor memory can be suppressed from increasing.

Furthermore, according to the configuration of the present embodiment, the page size of the physical page can be made smaller than the page size of the logical page, which allows the areas of the sense amplifier 132 and the page buffer 133 (the number of sense circuits and the number of latch circuits) to be reduced. Therefore, the area of the peripheral circuit can be reduced even in the case where the area of the memory cell array 130 is reduced by the miniaturization and high lamination of the memory cell array 130. That is, a mismatch between the area of the memory cell array 130 and the area of the peripheral circuit provided below the memory cell array 130 can be reduced. Therefore, the miniaturization and high lamination of the memory cell array 130 would be easily reflected in the chip area reduction.

Furthermore, according to the configuration of the present embodiment, pieces of data read from a plurality of physical pages can be combined and output as data of the logical page. Therefore, the semiconductor memory of the present embodiment can be applied without changing the specification of the memory controller 200. That is, the system can be easily designed since the data management method in a memory system on which the semiconductor memory of the present embodiment is mounted can be used as it is.

Furthermore, according to the configuration of the present embodiment, the page size of the physical page can be made small. That is, the number of memory cell transistors MC included in one memory group MG coupled to a word line WL can be reduced. It is thereby possible to reduce the interconnect length of the word lines WL. Accordingly, the interconnect resistance and the interconnect capacitance of the word lines WL can be reduced. Therefore, a charge-and-discharge time of a voltage to be applied to the word lines WL can be shortened in the read operation and the write operation. Accordingly, a processing time required for the read operation and the write operation can be suppressed from increasing.

Furthermore, in the configuration according to the present embodiment, one bit with the boundary number of one is included in the data coding applied to the physical page. Furthermore, the boundary number of a bit whose boundary number is not one is coded in a manner such that the maximum value of the boundary number becomes minimum. It is thereby possible to suppress the increase in the read time caused by the increase in the boundary numbers (the number of read operations) in the case of reading a plurality of physical pages corresponding to one logical page.

2. Second Embodiment

A second embodiment will be explained. In the second embodiment, seven examples will be given for a TLC coding that is different from the first embodiment. Hereinafter, the description will focus mainly on matters different from those of the first embodiment.

2.1 First Example

A first example of the coding will first be described with reference to FIG. 19. FIG. 19 is a table showing data allocations to each state.

As shown in FIG. 19, in the present embodiment, in the same manner as the first embodiment, data is allocated to each state to become a Gray code in which one bit of data changes between two adjacent states.

"S0" state: "111" data
"S1" state: "011" data
"S2" state: "001" data
"S3" state: "101" data
"S4" state: "100" data
"S5" state: "110" data
"S6" state: "010" data
"S7" state: "000" data In the case of reading data that is allocated in the above manner, the lower page is determined by read operation R4. The middle page is determined by read operations R2, R5, and R7. The upper page is determined by read operations R1, R3, and R6. Therefore, the data allocation of the present example is a 1-3-3 coding as in the first embodiment.

In the present example, in the same manner as the first embodiment, when allocating data for the upper bit, the middle bit, and the lower bit, one bit whose boundary number is one is included. Furthermore, the boundary number of a bit whose boundary number is not one is coded in a manner such that the maximum value of the boundary number becomes minimum.

2.2 Second Example

A second example of the coding will be described with reference to FIG. 20. FIG. 20 is a table showing data allocations to each state.

As shown in FIG. 20, in the present embodiment, in the same manner as the first embodiment, data is allocated to each state to become a gray code in which one bit of data changes between two adjacent states.

"S0" state: "110" data
"S1" state: "100" data
"S2" state: "000" data
"S3" state: "010" data
"S4" state: "011" data
"S5" state: "111" data
"S6" state: "101" data
"S7" state: "001" data In the case of reading data that is allocated in the above manner, the lower page is determined by read operation R4. The middle page is determined by read operations R1, R3, and R6. The upper page is determined by read operations R2, R5, and R7. Therefore, the data allocation of the present example is a 1-3-3 coding as in the first embodiment.

In the present example, in the same manner as the first embodiment, when allocating data for the upper bit, the middle bit, and the lower bit, one bit whose boundary number is one is included. Furthermore, the boundary number of a bit whose boundary number is not one is coded in a manner such that the maximum value of the boundary number becomes minimum.

2.3 Third Example

A third example of the coding will be described with reference to FIG. 21. FIG. 21 is a table showing data allocations to each state.

As shown in FIG. 21, in the present embodiment, in the same manner as the first embodiment, data is allocated to each state to become a Gray code in which one bit of data changes between two adjacent states.

"S0" state: "110" data
"S1" state: "010" data
"S2" state: "000" data
"S3" state: "100" data
"S4" state: "101" data
"S5" state: "111" data
"S6" state: "011" data
"S7" state: "001" data In the case of reading data that is allocated in the above manner, the lower page is determined by read operation R4. The middle page is determined by read operations R2, R5, and R7. The upper page is determined by read operations R1, R3, and R6. Therefore, the data allocation of the present example is a 1-3-3 coding as in the first embodiment.

In the present example, in the same manner as the first embodiment, when allocating data for the upper bit, the middle bit, and the lower bit, one bit whose boundary number is one is included. Furthermore, the boundary number of a bit whose boundary number is not one is coded in a manner such that the maximum value of the boundary number becomes minimum.

2.4 Fourth Example

A fourth example of the coding will be described with reference to FIG. 22. FIG. 22 is a table showing data allocations to each state.

As shown in FIG. 22, in the present embodiment, in the same manner as the first embodiment, data is allocated to each state to become a Gray code in which one bit of data changes between two adjacent states.

"S0" state: "111" data
"S1" state: "101" data
"S2" state: "001" data
"S3" state: "011" data
"S4" state: "010" data
"S5" state: "000" data
"S6" state: "100" data
"S7" state: "110" data In the case of reading data that is allocated in the above manner, the lower page is determined by read operation R4. The middle page is determined by read operations R1, R3, R5, and R7. The upper page is determined by read operations R2 and R6. Therefore, the data allocation of the present example is a 1-4-2 coding.

In the present example, in the same manner as the first embodiment, when allocating data for the upper bit, the middle bit, and the lower bit, one bit whose boundary number is one is included. However, in the present example, the boundary number of a bit whose boundary number is not one is coded in a manner such that the maximum value of the boundary number becomes minimum.

2.5 Fifth Example

A fifth example of the coding will be described with reference to FIG. 23. FIG. 23 is a table showing data allocations to each state.

As shown in FIG. 23, in the present embodiment, in the same manner as the first embodiment, data is allocated to each state to become a Gray code in which one bit of data changes between two adjacent states.

"S0" state: "111" data
"S1" state: "011" data
"S2" state: "001" data
"S3" state: "101" data
"S4" state: "100" data
"S5" state: "000" data
"S6" state: "010" data
"S7" state: "110" data In the case of reading data that is allocated in the above manner, the lower page is determined by read operation R4. The middle page is determined by read operations R2 and R6. The upper page is determined by read operations R1, R3, R5, and R7. Therefore, the data allocation of the present example is a 1-2-4 coding.

In the present example, in the same manner as the first embodiment, when allocating data for the upper bit, the middle bit, and the lower bit, one bit whose boundary number is one is included. However, in the present example, the boundary number of a bit whose boundary number is not one is not coded in a manner such that the maximum value of the boundary number becomes minimum.

2.6 Sixth Example

A sixth example of the coding will be described with reference to FIG. 24. FIG. 24 is a table showing data allocations to each state.

As shown in FIG. 24, in the present embodiment, in the same manner as the first embodiment, data is allocated to each state to become a Gray code in which one bit of data changes between two adjacent states.

"S0" state: "110" data
"S1" state: "100" data
"S2" state: "000" data
"S3" state: "010" data
"S4" state: "011" data
"S5" state: "001" data
"S6" state: "101" data
"S7" state: "111" data In the case of reading data that is allocated in the above manner, the lower page is determined by read operation R4. The middle page is determined by read operations R1, R3, R5, and R7. The upper page is determined by read operations R2 and R6. Therefore, the data allocation of the present example is a 1-4-2 coding.

In the present example, in the same manner as the first embodiment, when allocating data for the upper bit, the middle bit, and the lower bit, one bit whose boundary number is one is included. However, in the present example, the boundary number of a bit whose boundary number is not one is not coded in a manner such that the maximum value of the boundary number becomes minimum.

2.7 Seventh Example

A seventh example of the coding will be described with reference to FIG. 25. FIG. 25 is a table showing data allocations to each state.

As shown in FIG. 25, in the present embodiment, in the same manner as the first embodiment, data is allocated to each state to become a Gray code in which one bit of data changes between two adjacent states.

"S0" state: "110" data
"S1" state: "010" data
"S2" state: "000" data
"S3" state: "100" data
"S4" state: "101" data
"S5" state: "001" data
"S6" state: "011" data
"S7" state: "111" data In the case of reading data that is allocated in the above manner, the lower page is determined by read operation R4. The middle page is determined by read operations R2 and R6. The upper page is determined by read operations R1, R3, R5, and R7. Therefore, the data allocation of the present example is a 1-2-4 coding.

In the present example, in the same manner as the first embodiment, when allocating data for the upper bit, the middle bit, and the lower bit, one bit whose boundary number is one is included. However, in the present example, the boundary number of a bit whose boundary number is not one is not coded in a manner such that the maximum value of the boundary number becomes minimum.

2.8 Advantageous Effects of Second Embodiment

The coding of the present embodiment is applicable to the first embodiment.

The configuration of the present embodiment can attain the same effect as the first embodiment.

3. Third Embodiment

A third embodiment will be explained. In the third embodiment, two examples will be given to explain the read operation that is different from that of the first embodiment. Hereinafter, the description will focus mainly on matters different from those of the first embodiment.

3.1 First Example

A read operation of a first example will first be explained. In the first example, a case in which the order of the read voltages to be applied to the selected word line WL is different from that of the first embodiment in read operations of the logical first page and the logical second page will be explained with reference to FIGS. 26 and 27. FIG. 26 shows a command sequence of the read operation of the logical first page. FIG. 27 shows a command sequence of the read operation of the logical second page. In the examples of FIGS. 26 and 27, signals CEn, CLE, ALE, WEn, and REn are omitted to simplify the description. In addition, the examples of FIGS. 26 and 27 also show voltages of the selected word line WL in a case where the internal RBn signal is in the busy state.

The command sequence in the read operation of the logical first page will first be explained.

As shown in FIG. 26, in the read operation of the lower page (read operation R4) and the read operation of the middle page (read operations R1, R3, and R6) corresponding to the logical first page, the sequencer 123 executes the read operations in the order of R6, R4, R3, and R1. That is, read voltages V6, V4, V3, and V1 are sequentially applied to the selected word line WL. In this case, in the same manner as the first embodiment, after read operation R4 corresponding to the lower page is ended, the external RBn signal is set to the "H" level. The read result of the lower page is then stored in latch circuits ADL1 and ADL2. It should be noted that the memory 100 may also set the level of the external RBn signal identical to that of the internal RBn signal, and, after reading all of the pieces of data in the logical first page, set the external RBn signal (internal RBn signal) to the "H" level and output the data.

It should be noted that the sequencer 123 may also execute the read operation in the order of R1, R3, R4, and R6. That is, read voltages V1, V3, V4, and V6 may be sequentially applied to the selected word line WL.

The command sequence in the read operation of the logical second page will be explained.

As shown in FIG. 27, in the read operation of the lower page (read operation R4) and the read operation of the upper page (read operations R2, R5, and R7) corresponding to the logical second page, the sequencer 123 executes the read operations in the order of R7, R5, R4, and R2. That is, read voltages V7, V5, V4, and V2 are sequentially applied to the selected word line WL. In this case, in the same manner as the first embodiment, after read operation R4 corresponding to the lower page is ended, the external RBn signal is set to the "H" level. The read result of the lower page is then stored in latch circuits ADL1 and ADL2. It should be noted that the memory 100 may also set the level of the external RBn signal to be identical to that of the internal RBn signal, and, after reading all of the pieces of data in the logical second page, set the external RBn signal (internal RBn signal) to the "H" level and output the data.

It should be noted that the sequencer 123 may also execute the read operation in the order of R2, R4, R5, and R7. That is, read voltages V2, V4, V5, and V7 may be sequentially applied to the selected word line WL.

3.2 Second Example

A read operation of a second example will be explained. In the present example, a case in which pieces of data of the lower page, the middle page, and the upper page are collectively read will be explained with reference to FIG. 28. Hereinafter, such the read operation will be referred to as a "sequential read operation". In the sequential read operation of the present example, the "S0" state to "S7" state are collectively read. FIG. 28 shows a command sequence of the sequential read operation. In the example of FIG. 28, signals CEn, CLE, ALE, WEn, and REn are omitted to simplify the description. In the example of FIG. 28, some of the commands and addresses are omitted. In addition, the example of FIG. 28 also shows voltages of the selected word line WL in a case where the internal RBn signal is in the busy state.

As shown in FIG. 28, when the sequencer 123 receives a command "30h", the sequencer 123 starts the read operation in response to the command. The sequencer 123 first sets the internal RBn signal and the external RBn signal to the "L" level, indicating the busy state. The sequencer 123 then executes the sequential read operation. More specifically, the sequencer 123 sequentially executes read operations R1 to R7. At this time, read voltages V1 to V7 are sequentially applied to the selected word line WL. When read operation R4 is ended, the sequencer 123 determines the data of the lower page and sets the external RBn signal to the "H" level. The data of the lower page is stored in the latch circuits ADL1 and ADL2. Then, the data in the latch circuits ADL1 (data of the first cluster of the logical first page) is transferred to the latch circuits XDL1. When the "H" level external RBn signal is received, the memory controller 200 transmits signal REn (not shown) to the memory 100. The input/output circuit 110 starts outputting data in accordance with signal REn. The input/output circuit 110 first outputs the data in the latch circuits XDL1 (the data of the first cluster of the logical first page).

When read operation R6 is ended, the sequencer 123 then determines data of the middle page. The data of the middle page is stored in the latch circuits BDL1 and BDL2. The data in the latch circuits BDL2 (data of the second cluster of the logical first page) is transferred to the latch circuits XDL2. The data in the latch circuits BDL1 (data of the third cluster of the logical first page) is transferred to the latch circuits XDL1 after ending output of the data of the lower page (the data of the first cluster of the logical first page) stored in the latch circuits XDL1.

When the sequential read operation is ended while the data in the latch circuits XDL1 or XDL2 is being output, the sequencer 123 sets the internal RBn signal to the "H" level.

When output of the data of the middle page stored in the latch circuits XDL2 (the data of the second cluster of the logical first page) is ended, the data in the latch circuits ADL2 (data of the first cluster in the logical second page) is transferred to the latch circuits XDL2.

When output of the data of the middle page stored in the latch circuits XDL1 (the data of the third cluster of the logical first page) is ended, the data output of the logical first page is ended, and data output of the logical second page is started subsequently. The data of the lower page stored in the latch circuits XDL2 (the data of the first cluster of the logical second page) is output. Furthermore, when output of the data of the middle page stored in the latch circuits XDL1 (the data of the third cluster of the logical first page) is ended, the data of the upper page (the data of the second cluster of the logical second page) is transferred to the latch circuits XDL1 from the sense circuits SA1.

When output of the data of the upper page stored in the latch circuits XDL2 (the data of the first cluster of the logical second page) is ended, data of the sense circuits SA2 (data of the third cluster of the logical second page) is transferred to the latch circuits XDL2. When output of the data in the latch circuits XDL2 (the data of the third cluster of the logical second page) is ended, the sequential read operation is ended.

It should be noted that the sequencer 123 may also execute the read operation in the order of R7 to R1. That is, voltages may be applied to the selected word line WL in the order of voltages V7 to V1. It should be noted that the memory 100 may also set the level of the external RBn signal to be identical to that of the internal RBn signal, and, after reading all of the pieces of data, set the external RBn signal (internal RBn signal) to the "H" level and output the data.

3.3 Advantageous Effects of Third Embodiment

The coding of the present embodiment is applicable to the first embodiment.

The configuration of the present embodiment can attain the same effect as the first embodiment.

Furthermore, according to the configuration of the present embodiment, when performing the read operation, the read voltage can be applied in ascending order or in descending order. It is thus possible to suppress the increase in the variation range of voltages to be applied to the selected word line WL. Thus, the transition time required for the voltages applied to the selected word line WL can be shortened, thereby reducing the processing time of the read operation.

4. Fourth Embodiment

A fourth embodiment will be described. In the fourth embodiment, a case of allocating data of one logical page to two physical pages (that is, one memory group MG capable of storing two-page data) will be described. Hereinafter, the description will focus mainly on matters different from those of the first to third embodiments.

4.1 Threshold Voltage Distributions of Memory Cell Transistors

Possible threshold voltage distributions of memory cell transistors MC will first be described with reference to FIG. 29. FIG. 29 is a diagram showing a relationship between threshold voltage distributions and data allocations of memory cell transistors MC. Hereinafter, in the present embodiment, a case will be described in which each memory cell transistor MC is a multi-level cell (MLC) (or referred to as "2 bit/Cell") capable of storing four values (two bits) of data.

As shown in FIG. 29, the threshold voltage of each memory cell transistor MC takes a value that falls within, for example, one of four discrete distributions. Hereinafter, the four distributions will be respectively referred to as, in ascending order of threshold voltage, an "S0" state, an "S1" state, an "S2" state, and an "S3" state.

The "S0" state corresponds to, for example, a data erase state. The "S1" to "S3" states correspond to states in which a charge is injected into a charge storage layer and data is written. In the write operation, it is assumed that verify voltages corresponding to the respective threshold voltage distributions are V1 to V3. In this case, the voltage values establish a relationship of V1<V2<V3<Vread.

Setting values for the verify voltages and setting values for read voltages corresponding to the respective states may be either identical to or different from each other. To simplify the description, a case will be described in which the setting values for the verify voltages and the setting values for the read voltages are the same.

Hereinafter, read operations corresponding to the read operations of the "S1" to "S3" states will be respectively referred to as read operations R1, R2, and R3. In read operation R1, it is determined whether or not the threshold voltage of the memory cell transistor MC is less than the voltage V1. In read operation R2, it is determined whether or not the threshold voltage of the memory cell transistor MC is less than the voltage V2. In read operation R3, it is determined whether or not the threshold voltage of the memory cell transistor MC is less than the voltage V3.

As described above, each memory cell transistor MC belongs to one of the four threshold voltage distributions, thereby taking one of the four states. By allocating these states to "00" to "11" in binary notation, each memory cell transistor MC is capable of storing two bits of data. The two bits of data will be respectively referred to as a lower bit and an upper bit. Furthermore, a group of lower bits that are collectively written into (or read from) the memory group MG is referred to as a lower page, and a group of upper bits that are collectively written into (or read from) the memory group MG is referred to as an upper page.

In the example of FIG. 29, data is allocated to the upper bit and the lower bit of each of the memory cell transistors MC that belongs to each of the threshold voltage distributions in the following manner. Data is allocated to each state to become a Gray code in which one bit of data changes between two adjacent states.

"S0" state: "11" data
"S1" state: "01" data
"S2" state: "00" data
"S3" state: "10" data In the case of reading data that is allocated in the above manner, the lower page is determined by read operation R2. The upper page is determined by read operations R1 and R3. That is, the values of the lower bit and the upper bit are determined by one read operation and two read operations, respectively. Therefore, the data allocation of the present example is a 1-2 coding.

The data allocation to the "S0" to "S3" states is not limited to the 1-2 coding.

4.2 Conversion Operation of Logical Page Address and Physical Page Address

An example of a conversion operation of the logical page address and the physical page address will be explained with reference to FIGS. 30 and 31. FIG. 30 is a diagram explaining a flow of the conversion operation of the logical page address and the physical page address. FIG. 31 is a diagram showing a logical page data allocation with respect to a physical page.

As shown in FIG. 30, for example, when the memory controller 200 receives a write request from the host device 2, it allocates one logical page address "90001" corresponding to one received logical address "00001". Hereinafter, an allocated logical page will be referred to as a "logical first page". In the example of FIG. 30, the logical first page corresponds to the logical page address "90001".

When the command user interface circuit 121 receives a write order including one page of the logical page address and the logical page from the memory controller 200, the command user interface circuit 121 converts the one page of the logical page address into two pages of the physical page address. In the present embodiment, the command user interface circuit 121 converts the logical page address of the logical first page into physical page addresses of the lower page and the upper page.

Here, a data length of one page of the logical page and a data length of two pages of the physical page are the same. In the present embodiment, since the number of logical pages to be written is a="1", and the number of physical pages to be written is b="2", one page of the physical page, that is, a page size n of one memory group MG, can be described by n=m/2. For example, in the case where the page size of the logical page is 16 [kB], the page size of the physical page is n=16/2=8 [kB].

For example, based on the physical page addresses converted at the command user interface circuit 121, the sequencer 123 writes the data of the logical first page in the lower page and the upper page of one memory group MG.

The arrangement of the logical page data in one memory group MG will be described in detail.

As shown in FIG. 31, in the present embodiment, data of the logical first page is divided into two pieces of data to become a first cluster and a second cluster from the head data. For example, the memory 100 writes the first half of data of the first cluster of the logical first page in a first cell area of the lower page, and writes the second half of data of the first cluster of the logical first page in a second cell area of the lower page. Furthermore, the memory 100 writes the first half of data of the second cluster of the logical first page in the first cell area of the upper page, and writes the second half of data of the second cluster of the logical first page in the second cell area of the upper page.

4.3 Read Operation

The read operation will be explained. In the present embodiment, the physical pages to be read with respect to the logical first page are the lower page (the first cell area and the second cell area) and the upper page (the first cell area and the second cell area). In this case, the memory 100 transmits (outputs) data in the lower page (the first cell area and the second cell area) and data in the upper page (the first cell area and the second cell area) to the memory controller 200.

4.3.1 Flow of Read Operation

The flow of the read operation in the memory 100 will first be described with reference to FIG. 32. FIG. 32 is a flowchart of the read operation.

As shown in FIG. 32, the memory 100 receives a read order from the memory controller 200 (step S1). The command user interface circuit 121 converts the logical page address into the physical page addresses, then, transmits the received command and the converted physical page addresses to the sequencer 123.

The sequencer 123 first executes the read operation of the lower page (step S30). More specifically, the sequencer 123 executes the read operation R2 corresponding to the read voltage V2.

The sequencer 123 determines data of the lower page (data of the first cluster of the logical first page) based on the result of read operation R2 (step S31).

The sequencer 123 transfers the data of the lower page read by the sense circuits SA1 and SA2 to the latch circuits ADL1 and the ADL2, respectively (step S32).

The sequencer 123 transfers the data in the latch circuits ADL1 and ADL2 (data of the first cluster of the logical first page) to the latch circuits XDL1 and XDL2, respectively (step S33). The sequencer 123 may also transfer the data of the lower page read by the sense circuits SA1 and SA2 directly to the latch circuits XDL1 and XDL2, respectively.

The sequencer 123 sets a head address of the latch circuit XDL1 as a column address CA in the column counter 125 (step S34). Based on the column address CA incremented by the column counter 125, the serial access controller 126 receives data sequentially from the head address of the latch circuit XDL1 and transfers it to the input/output circuit 110. The input/output circuit 110 starts transmitting (outputting) the data in the latch circuits XDL1 and XDL2 to the memory controller 200.

The sequencer 123 executes the read operation of the upper page in parallel with the data output of the latch circuits XDL1 and XDL2 (step S35). More specifically, the sequencer 123 executes read operation R1 corresponding to read voltage V1, and read operation R3 corresponding to read voltage V3. The order of read operations R1 and R3 may be set freely.

The sequencer 123 determines data of the upper page (data of the second cluster of the logical first page) based on the result of read operations R1 and R3 (step S36).

The sequencer 123 transfers the data of the upper page read by the sense circuits SA1 and SA2 to the latch circuits ADL1 and ADL2, respectively (step S37).

In the case where the data output of the latch circuits XDL1 is not ended (step S38_No), the sequencer 123 repeats a confirmation operation of the data output until the output is ended.

When the data output of the latch circuits XDL1 is ended (step S38_Yes), the sequencer 123 transfers the data in the latch circuits ADL1 to the latch circuits XDL1 (step S39). It should be noted that, in the case of step S38_Yes, the data output of the latch circuits XDL2 may be started subsequently, and the sequencer 123 may execute step S39 during the data output of the latch circuits XDL2.

In the case where the data output of the latch circuits XDL2 is not ended (step S40_No), the sequencer 123 repeats a confirmation operation of the data output until the output is ended.

When the data output of the latch circuits XDL2 is ended (step S40_Yes), the sequencer 123 transfers the data in the latch circuits ADL2 to the latch circuits XDL2 (step S41). The sequencer 123 ends the read operation of the logical first page when the data outputs of the latch circuits XDL1 and XDL2 (data of the second cluster of the logical first page) are ended. It should be noted that, in the case of step S40_Yes, the data output of the latch circuits XDL1 may be started subsequently, and the sequencer 123 may execute step S41 during the data output of the latch circuits XDL1.

4.3.2 Command Sequence of Read Operation

An example of a command sequence of the read operation will be described with reference to FIG. 33. FIG. 33 is a command sequence of the read operation of the logical first page. In the example of FIG. 33, signals CEn, CLE, ALE, WEn, and REn are omitted to simplify the description. In addition, the example of FIG. 33 also shows voltages of the selected word line WL in a case where an internal RBn signal is in the busy state.

As shown in FIG. 33, first, the memory controller 200 transmits command "00h". The memory controller 200 then transmits a logical page address "AD-P1" of the logical first page. In the memory 100, the command user interface circuit 121 converts the received logical page address "AD-P1" into the physical page addresses. The memory controller 200 then transmits a command "30h" to the memory 100. The command user interface circuit 121 sequentially transmits the received command and the converted physical page addresses to the sequencer 123.

The sequencer 123 starts the read operation in response to the command "30h". The sequencer 123 first sets the internal RBn signal and the external RBn signal to the "L" level indicating the busy state. The sequencer 123 then executes the read operation of the lower page (read operation R2). That is, read voltage V2 is applied to the selected word line WL. The read result of the lower page is stored in the latch circuits ADL1 and ADL2. The data in the latch circuits ADL1 is then transferred to the latch circuits XDL1. The data in the latch circuits ADL2 is then transferred to the latch circuits XDL2. When the read operation of the lower page is ended, the sequencer 123 sets the external RBn signal to the "H" level. Furthermore, when the read operation of the lower page is ended, the sequencer 123 starts the read operation of the upper page (read operations R1 and R3). That is, read voltages V1 and V3 are sequentially applied to the selected word line WL.

When the "H" level external RBn signal is received, the memory controller 200 transmits signal REn (not shown) to the memory 100. The input/output circuit 110 starts outputting data in accordance with signal REn. The input/output circuit 110 first outputs the data in the latch circuits XDL1. When the read operation of the upper page is ended while the data in the latch circuits XDL1 is being output, the sequencer 123 sets the internal RBn signal to the "H" level. The read result of the upper page is stored in the latch circuits ADL1 and ADL2. In the case where the data output of the latch circuits XDL1 and XDL2 is ended before ending the read operation of the upper page, the sequencer 123 may temporarily set the external RBn signal to the "L" level (busy state), and suspend the output of data to the memory controller 200. This allows the data of the upper page to be output successively after the data of the lower page is output.

When the data output of the latch circuits XDL1 is ended, the input/output circuit 110 subsequently starts data output of the latch circuits XDL2. While the data in the latch circuits XDL2 is being output, the data in the latch circuits ADL1 is transferred to the latch circuits XDL1. When the data output of the latch circuits XDL2 is ended, the input/output circuit 110 subsequently executes output of data in the latch circuits XDL1. While the data in the latch circuits XDL1 is being output, the data in the latch circuits ADL2 is transferred to the latch circuits XDL2. When the data output of the latch circuits XDL2 is ended, the read operation of the logical first page is ended. It should be noted that the memory 100 may also set the level of the external RBn signal to be identical to that of the internal RBn signal, and, after reading all of the pieces of data, set the external RBn signal (internal RBn signal) to the "H" level and output the data.

4.4 Write Operation

The write operation will be described below. In the present embodiment, the full sequence write operation is executed, in which the data of the logical first page is collectively written in the memory group MG including the lower page and the upper page. That is, two bits of data is collectively written in one memory cell transistor MC.

In the full sequence write operation of the present embodiment, the "S1" to "S3" states are written.

4.4.1 Flow of Write Operation

The flow of the write operation in the memory 100 will be described with reference to FIGS. 34 and 35. FIGS. 34 and 35 are flowcharts of the write operation.

As shown in FIGS. 34 and 35, the memory 100 receives a write order of the logical first page from the memory controller 200 (step S230). At this time, the command user interface circuit 121 converts the logical page address of the logical first page into the physical page addresses.

The sequencer 123 sets a head address of the latch circuit XDL1 as a column address CA in the column counter 125 (step S231).

In the page buffer 133, data input of the first half of a first cluster of the logical first page to the latch circuits XDL1 is started based on the column address CA received from the column counter 125 (step S232).

In the case where the data input of the first half of the first cluster of the logical first page to the latch circuits XDL1 is not ended (step S233_No), the sequencer 123 repeats a confirmation operation of the data input until the input is ended.

When the data input of the first half of the first cluster of the logical first page to the latch circuits XDL1 is ended (step S233_Yes), the sequencer 123 transfers the data in the latch circuits XDL1 to the latch circuits ADL1 (step S234). Furthermore, when the data input of the first half of the first cluster of the logical first page to the latch circuits XDL1 is ended, data input of a second half of the first cluster of the logical first page to the latch circuits XDL2 is started subsequently. It should be noted that, in the case of step S233_Yes, the sequencer 123 may execute step S234 while the data input of the second half of the first cluster of the logical first page to the latch circuits XDL2 is subsequently started, and the data input of the latch circuits XDL2 is being executed.

In the case where the data input of the second half of the first cluster of the logical first page to the latch circuits XDL2 is not ended (step S235_No), the sequencer 123 repeats a confirmation operation of the data input until the input is ended.

When the data input of the second half of the first cluster of the logical first page to the latch circuits XDL2 is ended (step S235_Yes), the sequencer 123 sets a head address of the latch circuit XDL1 as the column address CA in the column counter 125 (step S236). In the page buffer 133, data input of a first half of a second cluster of the logical first page to the latch circuits XDL1 is started based on the column address CA received from the column counter 125.

The sequencer 123 transfers the data of the second half of the first cluster of the logical first page in the latch circuits XDL2 to the latch circuits ADL2 while the data input of the first half of the second cluster of the logical first page to the latch circuits XDL1 is being executed (step S237).

After the data input of the first half of the second cluster of the logical first page to the latch circuits XDL1 is ended, data input of a second half of the second cluster of the logical first page to the latch circuits XDL2 is started. In the case where the data input of the second half of the second cluster of the logical first page to the latch circuits XDL2 is not ended (step S238_No), the sequencer 123 repeats a confirmation operation of the data input until the input is ended.

After the data input of the second half of the second cluster of the logical first page to the latch circuits XDL2 is ended (step S238_Yes), the data input of the logical first page to the latch circuits XDL1 and XDL2 is ended. The sequencer 123 sets the external RBn signal and the internal RBn signal to the "L" level. The sequencer 123 determines the state of each of the memory cell transistors MC based on the combination of data in the lower page and the upper page.

The sequencer 123 executes a program operation based on the determined state (step S239).

After ending the program operation, the sequencer 123 executes a program verify operation (step S240).

In the case where the verification is not passed (step S241_No), the sequencer 123 confirms whether or not the number of program loops has reached the preset upper limit number (step S242).

In the case where the number of program loops has not reached the upper limit number (step S242_No), the sequencer 123 executes the program operation (step S239). That is, the sequencer 123 repeats the program loop.

In the case where the number of program loops has reached the upper limit number (step S242_Yes), the sequencer 123 ends the write operation and reports to the memory controller 200 that the write operation did not end successfully.

In the case of passing the verification (step S241_Yes), that is, ending writing of the "S1" to "S3" states, the sequencer 123 sets the external RBn signal to the "H" level and ends the full sequence write operation.

4.4.2 Command Sequence of Write Operation

An example of a command sequence of the write operation will be described with reference to FIG. 36. FIG. 36 is a command sequence of the full sequence write operation. In the example of FIG. 36, signals CEn, CLE, ALE, WEn, and REn are omitted to simplify the description.

As shown in FIG. 36, the memory controller 200 first transmits a command "80h" to the memory 100. The memory controller 200 then transmits a logical page address "AD-P1" of the logical first page. In the memory 100, the command user interface circuit 121 converts the received logical page address "AD-P1" into the physical page addresses. The memory controller 200 then transmits data of the logical first page to the memory 100. When data input of the first half of the first cluster of the logical first page to the latch circuits XDL1 is ended, data input of the second half of the first cluster of the logical first page to the latch circuits XDL2 is started subsequently. The data stored in the latch circuits XDL1 is transferred to the latch circuits ADL1 while the data of the second half of the first cluster of the logical first page is being input to the latch circuits XDL2. When the data input of the second half of the first cluster of the logical first page to the latch circuits XDL2 is ended, data input of the first half of the second cluster of the logical first page to the latch circuits XDL1 is started subsequently. The data stored in the latch circuits XDL2 is transferred to the latch circuits ADL2 while the data of the first half of the second cluster of the logical first page is being input to the latch circuits XDL1. When the data input of the first half of the second cluster of the logical first page to the latch circuits XDL1 is ended, data input of the second half of the second cluster of the logical first page to the latch circuits XDL2 is started subsequently. The second cluster of the logical first page is stored in the latch circuits XDL1 and XDL2.

The memory controller 200 then transmits a command "10h" to the memory 100 to instruct execution of the write operation.

When the command "10h" is received, the sequencer 123 sets the internal RBn signal and the external RBn signal to the "L" level. The sequencer 123 then determines the state of each of the memory cell transistors MC based on the data stored in the latch circuits ADL1, ADL2, XDL1, and XDL2, and then executes the write operation. After ending the write operation, the sequencer 123 sets the internal RBn signal and the external RBn signal to the "H" level.

4.5 Advantageous Effects of Fourth Embodiment

The configuration of the present embodiment can attain the same effect as the first embodiment.

5. Fifth Embodiment

A fifth embodiment will be described. In the fifth embodiment, a case of allocating data of three logical pages to four physical pages (that is, one memory group MG capable of storing four-page data) will be described. Hereinafter, the description will focus mainly on matters different from those of the first to fourth embodiments.

5.1 Configurations of Sense Amplifier and Page Buffer

An example of configurations of the sense amplifier 132 and the page buffer 133 will be described with reference to FIG. 37. FIG. 37 is a block diagram of the sense amplifier 132 and the page buffer 133.

As shown in FIG. 37, in the present embodiment, the sequencer 123 controls a plurality of memory cell transistors MC in one memory group MG by dividing them into three areas of a first cell area, a second cell area, and a third cell area. Similarly, the sequencer 123 controls the sense amplifier 132 and the page buffer 133 by dividing them in three in accordance with the first to third cell areas. For example, the memory cell transistors MC included in the first cell area are associated with bit lines BL0 to BL(i–1). The memory cell transistors MC included in the second cell area are associated with bit lines BL(i) to BL(j–1) (j is larger than i and smaller than k). The memory cell transistors MC included in the third cell area are associated with bit lines BL(j) to BL(k–1). It should be noted that the number of memory cell transistors MC included in the first cell area, the number of memory cell transistors MC included in the second cell area, and the number of memory cell transistors MC included in the third cell area are preferably the same. For example, in the case where the number of memory cell transistors MC included in the first cell area, the number of memory cell transistors MC included in the second cell area, and the number of memory cell transistors MC included in the third cell area are the same, a relationship such as i=j/2=k/3 will be established for "i", "j", and "k".

The page buffer 133 of the present embodiment includes latch circuits ADL, BDL, CDL, and XDL for each sense circuit SA. The sense circuit SA and the latch circuits ADL, BDL, CDL, and XDL are coupled to each other. In other words, the sense circuit SA and the latch circuits ADL, BDL, CDL, and XDL are coupled to each other in a manner allowing data to be transmitted and received therebetween. The latch circuits ADL, BDL, CDL, and XDL temporarily store data DAT. For example, the read data confirmed by the sense circuit SA in the read operation is transferred to one of the latch circuits ADL, BDL, CDL, and XDL from the sense circuit SA. Hereinafter, a sense circuit coupled to a bit line BL corresponding to the memory cell transistor MC included in the third cell area will be referred to as "sense circuit SA3". The latch circuit CDL corresponding to a sense circuit SA1 will be referred to as a "latch circuit CDL1". The latch circuit CDL corresponding to a sense circuit SA2 will be referred to as a "latch circuit CDL2". The latch circuits ADL, BDL, CDL, and XDL corresponding to a sense circuit SA3 will be referred to as a "latch circuit ADL3", a "latch circuit BDL3", a "latch circuit CDL3", and a "latch circuit XDL3". Furthermore, in the present embodiment, a set of the sense circuit SA1 and latch circuits ADL1, BDL1, CDL1, and XDL1 will be referred to as a "sense amplifier unit SAU1". A set of the sense circuit SA2 and latch circuits ADL2, BDL2, CDL2, and XDL2 will be referred to as a "sense amplifier unit SAU2". A set of the sense circuit SA3 and latch circuits ADL3, BDL3, CDL3, and XDL3 will be referred to as a "sense amplifier unit SAU3".

In the present embodiment, in the same manner as the plurality of sense amplifier units SAU1 and the plurality of sense amplifier units SAU2, the plurality of sense amplifier units SAU3 are arranged together in one area.

5.2 Threshold Voltage Distributions of Memory Cell Transistors

Possible threshold voltage distributions of the memory cell transistors MC will be described with reference to FIG. 38. FIG. 38 is a diagram showing a relationship between threshold voltage distributions and data allocations of memory cell transistors MC. Hereinafter, in the present embodiment, a case will be described in which each memory cell transistor MC is a quad-level cell (QLC) (or referred to as "4 bit/Cell") capable of storing 16 values (four bits) of data.

As shown in FIG. 38, the threshold voltage of each memory cell transistor MC takes a value that falls within, for example, 16 discrete distributions. Hereinafter, the 16 distributions will be referred to as an "S0" state, an "S1" state, an "S2" state, an "S3" state, an "S4" state, an "S5" state, an "S6" state, an "S7" state, an "S8" state, an "S9" state, an "S10" state, an "S11" state, an "S12" state, an "S13" state, an "S14" state, and an and "S15" state, from lower to higher threshold voltages.

The "S0" state corresponds to, for example, a data erase state. The "S1" to "S15" states correspond to states in which a charge is injected into a charge storage layer and data is written. In a write operation, it is assumed that verify voltages corresponding to the respective threshold voltage distributions are V1 to V15. In this case, the values of these voltages satisfy the relation of V1<V2<V3<V4<V5<V6<V7<V8<V9<V10<V11<V12<V13<V14<V15<Vread. In a read operation, the voltages V1 to V15 are voltages to be applied to the selected word line WL coupled to a memory cell transistor MC that is to be read.

More specifically, a threshold voltage that falls within the "S0" state is less than the voltage V1. A threshold voltage that falls within the "S1" state is equal to or higher than the voltage V1, and less than the voltage V2. A threshold voltage that falls within the "S2" state is equal to or higher than the voltage V2, and less than the voltage V3. A threshold voltage that falls within the "S3" state is equal to or higher than the voltage V3, and less than the voltage V4. A threshold voltage that falls within the "S4" state is equal to or higher than the voltage V4, and less than the voltage V5. A threshold voltage that falls within the "S5" state is equal to or higher than the voltage V5, and less than the voltage V6. A threshold voltage that falls within the "S6" state is equal to or higher than the voltage V6, and less than the voltage V7. A threshold voltage that falls within the "S7" state is equal to or higher than the voltage V7, and less than the voltage V8. A threshold voltage that falls within the "S8" state is equal to or higher than the voltage V8, and less than the voltage V9. A threshold voltage that falls within the "S9" state is equal to or higher than the voltage V9, and less than the voltage V10. A threshold voltage that falls within the "S10" state is equal to or higher than the voltage V10, and less than the voltage V11. A threshold voltage that falls within the "S11" state is equal to or higher than the voltage V11, and less than the voltage V12. A threshold voltage that falls within the "S12" state is equal to or higher than the voltage V12, and less than the voltage V13. A threshold voltage that falls within the "S13" state is equal to or higher than the voltage V13, and less than the voltage V14. A threshold voltage that falls within the "S14" state is equal to or higher than the voltage V14, and less than the voltage V15. A threshold voltage that falls within the "S15" state is equal to or higher than the voltage V15, and less than the voltage Vread.

It should be noted that setting values for the verify voltages and setting values for read voltages corresponding to the respective states may be either identical to or different from each other. To simplify the description, a case will be described in which the setting values for the verify voltages and the setting values for the read voltages are the same.

Hereinafter, read operations corresponding to the read operations of the "S1" to "S15" states will be respectively referred to as read operations R1 to R15. In read operation R1, it is determined whether or not the threshold voltage of the memory cell transistor MC is less than the voltage V1. In read operation R2, it is determined whether or not the threshold voltage of the memory cell transistor MC is less than the voltage V2. The same applies to the subsequent read operations. In each of the read operations R3 to R15, it is determined whether or not the threshold voltage of the memory cell transistor MC is less than voltages V3 to V15, respectively.

As described above, each memory cell transistor MC belongs to one of the 16 threshold voltage distributions, thereby taking one of the 16 states. By allocating these states from "0000" to "1111" in binary notation, each memory cell transistor MC is capable of storing four bits of data. Hereinafter, the four bits of data will be respectively referred to as a "lower bit", a "middle bit", an "upper bit", and a "top bit". A group of lower bits that are collectively written into (or read from) a memory group MG is referred to as a "lower page", a group of middle bits that are collectively written into (or read from) a memory group MG will be referred to as a "middle page", a group of upper bits that are collectively written into (or read from) a memory group MG will be referred to as an "upper page", and a group of top bits that are collectively written into (or read from) a memory group MG will be referred to as a "top page".

In the example of FIG. 38, data is allocated to the "top bit/upper bit/middle bit/lower bit" of each of the memory cell transistors MC that belongs to each of the threshold voltage distributions in the following manner. Data is allocated to each state to become a Gray code in which one bit of data changes between two adjacent states.

"S0" state: "1111" data
"S1" state: "0111" data
"S2" state: "0011" data
"S3" state: "0001" data
"S4" state: "0101" data
"S5" state: "1101" data
"S6" state: "1001" data
"S7" state: "1011" data
"S8" state: "1010" data
"S9" state: "1110" data
"S10" state: "0110" data
"S11" state: "0100" data
"S12" state: "1100" data
"S13" state: "1000" data
"S14" state: "0000" data
"S15" state: "0010" data In the case of reading data that is allocated in the above manner, the lower page is determined by read operation R8. The middle page is determined by read operations R3, R7, R11, and R15. The upper page is determined by read operations R2, R4, R6, R9, and R13. The top page is determined by read operations R1, R5, R10, R12, and R14. That is, the values of the lower bit, the middle bit, the upper bit, and the top bit are determined by one read operation, four read operations, five read operations, and five read operations, respectively. That is, the number of boundaries (hereinafter referred to as a "boundary number") is one, four, five, and five for the lower bit, the middle bit, the upper bit, and the top bit, respectively. Therefore, the data allocation of the present example is a 1-4-5-5 coding.

In the present embodiment, when allocating data for the top bit, the upper bit, the middle bit, and the lower bit, one bit whose boundary number is one is included. Furthermore, the boundary number of a bit whose boundary number is not one is coded in a manner such that the maximum value of the boundary number becomes minimum. For example, in the case of a QLC, that is, 4 bit/Cell, since the overall boundary number is 15, when sharing the remaining boundary number 14, with the remaining three bits, the maximum value of the boundary number will become minimum if the boundary number of each bit is set to four, five, and five.

The data allocation to the "S0" to "S15" states is not limited to the 1-4-5-5 coding.

5.3 Conversion Operation of Logical Page Address and Physical Page Address

An example of a conversion operation of the logical page address and the physical page address will be explained with reference to FIG. 39 and FIG. 40. FIG. 39 is a diagram explaining a flow of the conversion operation of the logical page address and the physical page address. FIG. 40 is a diagram showing the logical page data allocation with respect to the physical page.

As shown in FIG. 39, for example, when the memory controller 200 receives a write request from the host device 2, the memory controller 200 allocates three logical page addresses "90001", "90002", and "90003" corresponding to three received logical addresses "00001", "00002", and "00003". Hereinafter, the three allocated logical pages will be referred to as a "logical first page", a "logical second page", and a "logical third page". In the example of FIG. 39, the logical first page corresponds to the logical page address "90001", the logical second page corresponds to the logical page address "90002", and the logical third page corresponds to the logical page address "90003".

When the command user interface circuit 121 receives a write order including three pages of the logical page address and the logical page from the memory controller 200, the command user interface circuit 121 converts the three pages of the logical page address into four pages of the physical page address. In the present embodiment, the command user interface circuit 121 converts the logical page address of the logical first page into a first cell area of the lower page and a physical page address of the middle page. The command user interface circuit 121 converts the logical page address of the logical second page into the physical page addresses of the second cell area of the lower page and the upper page. Furthermore, the command user interface circuit 121 converts the logical page address of the logical third page into the physical page addresses of the third cell area of the lower page and the top page.

At this time, a data length of three pages of the logical page and a data length of four pages of the physical page are the same. In the present embodiment, since the number of logical pages to be written is a="3", and the number of physical pages to be written is b="4", one page of the physical page, that is, a page size n of one memory group MG, can be described by $n=m \times \frac{3}{4}$. Furthermore, each of the page size of the first to the third cell areas may be described by n/3. For example, in the case where the page size of the logical page is 16 [kB], the page size of the physical page is $n=16 \times \frac{3}{4}=12$ [kB].

For example, based on the physical page address converted at the command user interface circuit 121, the sequencer 123 writes the data of the logical first page in the first cell area of the lower page and the first to the third cell areas of the middle page of one memory group MG. The sequencer 123 writes data of the logical second page in the second cell area of the lower page and the first to the third cell areas of the upper page. The sequencer 123 writes data of the logical third page in the third cell area of the lower page and the first to the third cell areas of the top page.

The arrangement of the logical page data in one memory group MG will be described in detail.

As shown in FIG. 40, in the present embodiment, data of the logical first page, data of the logical second page, and data of the logical third page are divided respectively into four pieces of a first cluster to a fourth cluster from the head. For example, the memory 100 writes the first cluster of the logical first page in the first cell area of the lower page, writes the second cluster of the logical first page in the second cell area of the middle page, writes the third cluster of the logical first page in the third cell area of the middle page, and writes the fourth cluster of the logical first page in the first cell area of the middle page. The memory 100 writes the first cluster of the logical second page in the second cell area of the lower page, writes the second cluster of the logical second page in the third cell area of the upper page, writes the third cluster of the logical second page in the first cell area of the upper page, and writes the fourth cluster of the logical second page in the second cell area of the upper page. The memory 100 writes the first cluster of the logical third page in the third cell area of the lower page, writes the second cluster of the logical third page in the first cell area of the top page, writes the third cluster of the logical third page in the second cell area of the top page, and writes the fourth cluster of the logical third page in the third cell area of the top page.

5.4 Read Operation

The read operation will be explained. In the present embodiment, the read operations differ depending on whether the logical page to be read is a logical first page, a logical second page, or a logical third page. In the case where the logical page is the logical first page, the physical pages to be read are the lower page (the first cell area) and the middle page (the first cell area to the third cell area). In this case, the memory 100 transmits (outputs) data in the first cell area of the lower page and data in the first cell area to the third cell area of the middle page to the memory controller 200. In the case where the logical page is the logical second page, the physical pages to be read are the lower page (the second cell area) and the upper page (the first cell area to the third cell area). In this case, the memory 100 transmits (outputs) data in the second cell area of the lower page and data in the first cell area to the third cell area of the upper page to the memory controller 200. Furthermore, in the case where the logical page is the logical third page, the physical pages to be read are the lower page (the third cell area) and the top page (the first cell area to the third cell area). In this case, the memory 100 transmits (outputs) data in the third cell area of the lower page and data in the first cell area to the third cell area of the top page to the memory controller 200.

5.4.1 Flow of Read Operation

The flow of the read operation in the memory 100 will first be described with reference to FIGS. 41 to 43. FIGS. 41 to 43 are flowcharts of the read operation.

As shown in FIGS. 41 to 43, the memory 100 receives a read order of the logical first page, the logical second page, or the logical third page from the memory controller 200 (step S1). The command user interface circuit 121 converts the logical page address into the physical page addresses, then transmits the received command and the converted physical page addresses to the sequencer 123.

In the case where the logical page address is the logical page address of the logical first page (step S50_Yes), the sequencer 123 first executes the read operation of the lower page (step S51). More specifically, the sequencer 123 executes read operation R8 corresponding to read voltage V8.

The sequencer 123 determines the data of the lower page based on the result of read operation R8 (step S52).

The sequencer 123 transfers the data of the lower page read by the sense circuits SA1 to SA3 to the latch circuits ADL1 to ADL3, respectively (step S53).

The sequencer 123 transfers the data in the latch circuits ADL1 (data of the first cluster of the logical first page) to the latch circuits XDL1 (step S54).

The sequencer 123 sets a head address of the latch circuit XDL1 as a column address CA in the column counter 125 (step S55). Based on the column address CA incremented by the column counter 125, the serial access controller 126 receives data sequentially from the head address of the latch circuit XDL1 and transfers it to the input/output circuit 110. The input/output circuit 110 starts transmitting (outputting) the data in the latch circuits XDL1 to the memory controller 200. Here, although the data in the latch circuits ADL1 is transferred to the latch circuits XDL1 after the data of the lower page read by the sense circuits SA1 to SA3 is transferred to the latch circuits ADL1 to ADL3, the sequencer 123 may also transfer the data in the sense circuits SA1 directly to the latch circuits XDL1.

The sequencer 123 executes the read operation of the middle page in parallel with the data output of the latch circuits XDL1 (step S56). More specifically, the sequencer 123 executes read operation R3 corresponding to read voltage V3, read operation R7 corresponding to read voltage V7, read operation R11 corresponding to read voltage V11, and read operation R15 corresponding to read voltage V15. The order of read operations R3, R7, R11, and R15 may be set freely.

The sequencer 123 determines the data of the middle page based on the results of read operations R3, R7, R11, and R15 (step S57).

The sequencer 123 transfers the data of the middle page read by the sense circuits SA1 to SA3 to the latch circuits ADL1 to ADL3, respectively (step S58).

The sequencer 123 transfers the data in the latch circuits ADL2 and ADL3 (data of the second and third clusters of the logical first page) to the latch circuits XDL2 and XDL3, respectively (step S59).

In the case where the data output of the latch circuits XDL1 (data of the first cluster of the logical first page) is not ended (step S60_No), the sequencer 123 repeats a confirmation operation of the data output until the output is ended.

When the data output of the latch circuits XDL1 is ended (step S60_Yes), the sequencer 123 transfers the data in the latch circuits ADL1 (data of the fourth cluster of the logical first page) to the latch circuits XDL1 (step S61). When the data output of the latch circuits XDL2 and XDL3 is ended, the sequencer 123 sets a head address of the latch circuit XDL1 as the column address CA in the column counter 125. When the data output of the latch circuits XDL1 is ended, the sequencer 123 ends the read operation of the logical first page.

In the case where the logical page address is the logical page address of the logical second page (step S50_No and step S62_Yes), the sequencer 123 executes the read operation of the lower page (step S63) in the same manner as step S51.

The sequencer 123 determines the data of the lower page based on the result of read operation R8 (step S64).

The sequencer 123 transfers the data of the lower page read by the sense circuits SA1 to SA3 to the latch circuits ADL1 to ADL3, respectively (step S65).

The sequencer 123 transfers the data in the latch circuits ADL2 (data of the first cluster of the logical second page) to the latch circuits XDL2 (step S66). Here, although the data in the latch circuits ADL2 is transferred to the latch circuits XDL2 after the data of the lower page read by the sense circuits SA1 to SA3 is transferred to the latch circuits ADL1 to ADL3, the sequencer 123 may also transfer the data in the sense circuits SA2 directly to the latch circuits XDL2.

The sequencer 123 sets a head address of the latch circuit XDL2 as a column address CA in the column counter 125 (step S67). Based on the column address CA incremented by the column counter 125, the serial access controller 126 receives data sequentially from the head address of the latch circuit XDL2 and transfers it to the input/output circuit 110. The input/output circuit 110 starts transmitting (outputting) the data in the latch circuits XDL2 to the memory controller 200.

The sequencer 123 executes the read operation of the upper page in parallel with the data output of the latch circuits XDL2 (step S68). More specifically, the sequencer 123 executes read operation R2 corresponding to read voltage V2, read operation R4 corresponding to read voltage V4, read operation R6 corresponding to read voltage V6, read operation R9 corresponding to read voltage V9, and read operation R13 corresponding to read voltage V13. The order of read operations R2, R4, R6, R9, and R13 may be set freely.

The sequencer 123 determines the data of the upper page based on the result of read operations R2, R4, R6, R9, and R13 (step S69).

The sequencer 123 transfers the data of the upper page read by the sense circuits SA1 to SA3 to the latch circuits ADL1 to ADL3, respectively (step S70).

The sequencer 123 transfers the data in the latch circuits ADL1 and ADL3 (data of the second and third clusters of the logical second page) to the latch circuits XDL1 and XDL3, respectively (step S71).

In the case where the data output of the latch circuits XDL2 (data of the first cluster of the logical second page) is not ended (step S72_No), the sequencer 123 repeats a confirmation operation of the data output until the output is ended.

When the data output of the latch circuits XDL2 is ended (step S72_Yes), the sequencer 123 transfers the data in the latch circuits ADL2 (data of the fourth cluster of the logical second page) to the latch circuits XDL2 (step S73). When the data output of the latch circuits XDL3 (data of the second cluster of the logical second page) is ended, the sequencer 123 sets a head address of the latch circuit XDL1 as the column address CA in the column counter 125. The sequencer 123 then ends the read operation of the logical second page when the data output of the latch circuits XDL1 (data of the third cluster of the logical second page) and the data output of the latch circuits XDL2 (data of the fourth cluster of the logical second page) are ended.

In the case where the logical page address is the logical page address of the logical third page (step S50_No and step S62_No), the sequencer 123 executes the read operation of the lower page (step S74) in the same manner as step S51.

The sequencer 123 determines the data of the lower page based on the result of read operation R8 (step S74).

The sequencer 123 transfers the data of the lower page read by the sense circuits SA1 to SA3 to the latch circuits ADL1 to ADL3, respectively (step S76).

The sequencer 123 transfers the data in the latch circuits ADL3 (data of the first cluster of the logical third page) to the latch circuits XDL3 (step S77). Here, although the data in the latch circuits ADL3 is transferred to the latch circuits XDL3 after the data of the lower page read by the sense circuits SA1 to SA3 is transferred to the latch circuits ADL1 to ADL3, the sequencer 123 may also transfer the data in the sense circuits SA3 directly to the latch circuits XDL3.

The sequencer 123 sets a head address of the latch circuit XDL3 as a column address CA in the column counter 125 (step S78). Based on the column address CA incremented by the column counter 125, the serial access controller 126 receives data sequentially from the head address of the latch circuit XDL3 and transfers it to the input/output circuit 110. The input/output circuit 110 starts transmitting (outputting) the data in the latch circuits XDL3 to the memory controller 200.

The sequencer 123 executes the read operation of the top page in parallel with the data output of the latch circuits XDL3 (step S79). More specifically, the sequencer 123 executes read operation R1 corresponding to read voltage V1, read operation R5 corresponding to read voltage V5, read operation R10 corresponding to read voltage V10, read operation R12 corresponding to read voltage V12, and read operation R14 corresponding to read voltage V14. The order of read operations R1, R5, R10, R12, and R14 may be set freely.

The sequencer 123 determines the data of the top page based on the result of read operations R1, R5, R10, R12, and R14 (step S80).

The sequencer 123 transfers the data of the top page read by the sense circuits SA1 to SA3 to the latch circuits ADL1 to ADL3, respectively (step S81).

The sequencer 123 transfers the data in the latch circuits ADL1 and ADL2 (data of the second and third clusters of the logical third page) to the latch circuits XDL1 and XDL2, respectively (step S82).

In the case where the data output of the latch circuits XDL3 (data of the first cluster of the logical third page) is not ended (step S83_No), the sequencer 123 repeats a confirmation operation of the data output until the output is ended.

When the data output of the latch circuits XDL3 is ended (step S83_Yes), the sequencer 123 transfers the data in the latch circuits ADL3 (data of the fourth cluster of the logical second page) to the latch circuits XDL3 (step S84). Furthermore, when the data output of the latch circuits XDL3 (data of the first cluster of the logical third page) is ended, the sequencer 123 sets a head address of the latch circuit XDL1 as the column address CA in the column counter 125. The sequencer 123 then ends the read operation of the logical third page when the data output of the latch circuits XDL1 (data of the second cluster of the logical third page), the data output of the latch circuits XDL2 (data of the third cluster of the logical third page), and the data output of the latch circuits XDL3 (data of the fourth cluster of the logical third page) are ended.

5.4.2 Command Sequence of Read Operation

An example of a command sequence of the read operation will be described with reference to in FIGS. 44 to 46. FIG. 44 is a command sequence of the read operation of the logical first page. FIG. 45 is a command sequence of the read operation of the logical second page. FIG. 46 is a command sequence of the read operation of the logical third page. In the examples of FIGS. 44 to 46, signals CEn, CLE, ALE, WEn, and REn are omitted to simplify the description. In the examples of FIGS. 44 to 46, some of the commands and addresses are omitted. In addition, the examples of FIGS. 44 to 46 also show voltages of the selected word line WL in a case where an internal RBn signal is in the busy state.

The command sequence in the read operation of the logical first page will first be explained.

As shown in FIG. 44, the sequencer 123 starts the read operation in response to a command "30h". The sequencer 123 first sets the internal RBn signal and the external RBn signal to the "L" level indicating the busy state. The sequencer 123 then executes the read operation of the lower page (read operation R8). That is, read voltage V8 is applied to the selected word line WL. The read result of the lower page is stored in the latch circuits ADL1 to ADL3. The data in the latch circuits ADL1 is then transferred to the latch circuits XDL1. When the read operation of the lower page is ended, the sequencer 123 sets the external RBn signal to the "H" level indicating the ready state. Furthermore, when the read operation of the lower page is ended, the sequencer 123 starts the read operation of the middle page (read operations R3, R7, R11, and R15). That is, read voltages V3, V7, V11, and V15 are sequentially applied to the selected word line WL.

When the "H" level external RBn signal is received, the memory controller 200 transmits signal REn (not shown) to the memory 100. The input/output circuit 110 starts outputting data in accordance with signal REn. The input/output circuit 110 first outputs the data in the latch circuits XDL1. When the data output of the latch circuits XDL1 is ended while the read operation of the middle page is executed, the sequencer 123 temporarily sets the external RBn signal to the "L" level until the read operation of the middle page is ended.

The read result of the middle page is stored in the latch circuits ADL1 to ADL3. The data in the latch circuits ADL1 to ADL3 is then transferred to the latch circuits XDL1 to XDL3. When the read operation of the middle page is ended, the sequencer 123 sets the external RBn signal and the internal RBn signal to the "H" level.

When the "H" level external RBn signal is received, the memory controller 200 resumes transmission of signal REn (not shown). The input/output circuit 110 outputs data in the order of the latch circuits XDL2, XDL3, and XDL1 in accordance with signal REn. When the data output of the latch circuits XDL1 is ended, the read operation of the logical first page is ended. It should be noted that the memory 100 may also set the level of the external RBn signal to be identical to that of the internal RBn signal, and, after reading all of the pieces of data, set the external RBn signal (internal RBn signal) to the "H" level and output the data.

A command sequence in the read operation of the logical second page will be explained.

As shown in FIG. 45, the sequencer 123 starts the read operation in response to a command "30h". The sequencer 123 first sets the internal RBn signal and the external RBn signal to the "L" level indicating the busy state. The sequencer 123 then executes the read operation of the lower page (read operation R8). That is, the read voltage V8 is applied to the selected word line WL. The read result of the lower page is stored in the latch circuits ADL1 to ADL3. The data in the latch circuits ADL2 is then transferred to the latch circuits XDL2. When the read operation of the lower page is ended, the sequencer 123 sets the external RBn signal to the "H" level indicating the ready state. Furthermore, when the read operation of the lower page is ended, the sequencer 123 starts the read operation of the upper page (read operations R2, R4, R6, R9, and R13). That is, read voltages V2, V4, V6, V9, and V13 are sequentially applied to the selected word line WL.

When the "H" level external RBn signal is received, the memory controller 200 transmits signal REn (not shown) to the memory 100. The input/output circuit 110 starts outputting data in accordance with signal REn. The input/output circuit 110 first outputs the data in the latch circuits XDL2. When the data output of the latch circuits XDL2 is ended while the read operation of the upper page is executed, the sequencer 123 temporarily sets the external RBn signal to the "L" level until the read operation of the upper page is ended.

The read result of the upper page is stored in the latch circuits ADL1 to ADL3. The data in the latch circuits ADL1 to ADL3 is then transferred to the latch circuits XDL1 to XDL3. When the read operation of the upper page is ended, the sequencer 123 sets the external RBn signal and the internal RBn signal to the "H" level.

When the "H" level external RBn signal is received, the memory controller 200 resumes transmission of signal REn (not shown). The input/output circuit 110 outputs data in the order of the latch circuits XDL3, XDL1, and XDL2 in accordance with signal REn. When data output of the latch circuits XDL2 is ended, the read operation of the logical second page is ended. It should be noted that the memory 100 may also set the level of the external RBn signal to be identical to that of the internal RBn signal, and, after reading all of the pieces of data, set the external RBn signal (internal RBn signal) to the "H" level and output the data.

A command sequence in the read operation of the logical third page will be explained.

As shown in FIG. 46, the sequencer 123 starts the read operation in response to a command "30h". The sequencer 123 first sets the internal RBn signal and the external RBn signal to the "L" level, indicating the busy state. The sequencer 123 then executes the read operation of the lower page (read operation R8). That is, the read voltage V8 is applied to the selected word line WL. The read result of the lower page is stored in the latch circuits ADL1 to ADL3. The data in the latch circuits ADL3 is then transferred to the latch circuits XDL3. When the read operation of the lower page is ended, the sequencer 123 sets the external RBn signal to the "H" level indicating the ready state. Furthermore, when the read operation of the lower page is ended, the sequencer 123 starts the read operation of the top page (read operations R1, R5, R10, R12, and R14). That is, read voltages V1, V5, V10, V12, and V14 are sequentially applied to the selected word line WL.

When the "H" level external RBn signal is received, the memory controller 200 transmits signal REn (not shown) to the memory 100. The input/output circuit 110 starts outputting data in accordance with signal REn. The input/output circuit 110 first outputs the data in the latch circuits XDL3. When the data output of the latch circuits XDL3 is ended while the read operation of the top page is executed, the sequencer 123 temporarily sets the external RBn signal to the "L" level until the read operation of the top page is ended.

The read result of the top page is stored in the latch circuits ADL1 to ADL3. The data in the latch circuits ADL1 to ADL3 is then transferred to the latch circuits XDL1 to XDL3. When the read operation of the top page is ended, the sequencer 123 sets the external RBn signal and the internal RBn signal to the "H" level.

When the "H" level external RBn signal is received, the memory controller 200 resumes transmission of signal REn (not shown). The input/output circuit 110 outputs data in the order of the latch circuits XDL1, XDL2, and XDL 3 in accordance with signal REn. When the data output of the latch circuits XDL3 is ended, the read operation of the logical third page is ended. It should be noted that the memory 100 may also set the level of the external RBn signal to be identical to that of the internal RBn signal, and, after reading all of the pieces of data, set the external RBn signal (internal RBn signal) to the "H" level and output the data.

5.5 Write Operation

The write operation will be described below. In the present embodiment, the full sequence write operation is executed, in which the data of the logical first page to the logical third page is collectively written in the memory group MG including the lower page, the middle page, the upper page, and the top page. That is, four bits of data is collectively written in one memory cell transistor MC. In the full sequence write operation of the present embodiment, the "S1" to "S15" states are written.

5.5.1 Flow of Write Operation

Figure 48:
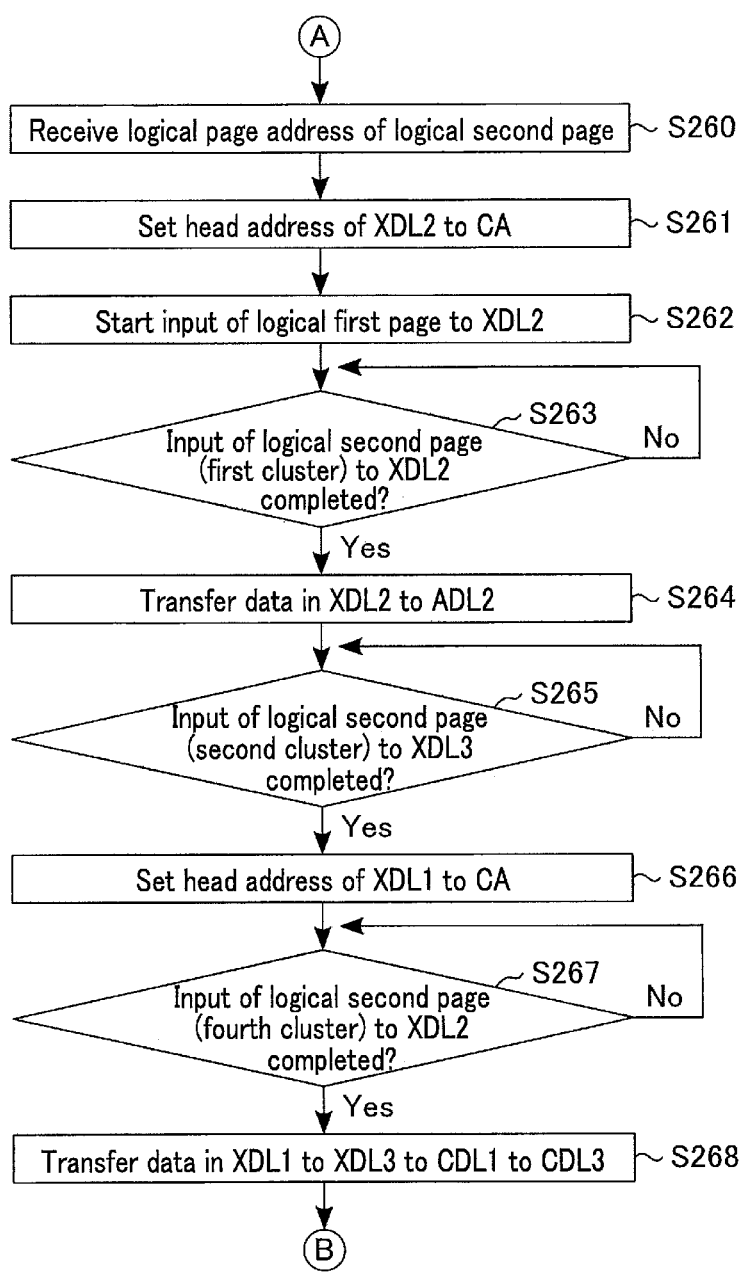
FIG. 48 is a flow chart showing a write operation of the semiconductor memory according to the fifth embodiment.

The flow of the write operation in the memory 100 will be described with reference to FIGS. 47 to 49. FIGS. 47 to 49 are flowcharts of the write operation.

As shown in FIGS. 47 to 49, when receiving the write order, the memory 100 receives the logical page address of the logical first page from the memory controller 200 (step S251). The command user interface circuit 121 converts the logical page address of the logical first page into the physical page addresses.

The sequencer 123 sets a head address of the latch circuit XDL1 as a column address CA in the column counter 125 (step S252).

In the page buffer 133, data input of the first cluster of the logical first page to the latch circuits XDL1 is started based on the column address CA received from the column counter 125 (step S253).

In the case where the data input of the first cluster of the logical first page to the latch circuits XDL1 is not ended (step S254_No), the sequencer 123 repeats a confirmation operation of the data input until the input is ended.

When the data input to the latch circuits XDL1 is ended (step S254_Yes), the sequencer 123 transfers the data in the latch circuits XDL1 to the latch circuits ADL1 (step S255). Furthermore, when the data input to the latch circuits XDL1 is ended, data input of the second cluster of the logical first page to the latch circuits XDL2 and data input of the third cluster of the logical first page to the latch circuits XDL3 are executed in sequence.

In the case where the data input of the third cluster of the logical first page to the latch circuits XDL3 is not ended (step S256_No), the sequencer 123 repeats a confirmation operation of the data input until the input is ended.

When the data input to the latch circuits XDL3 is ended (step S256_Yes), the sequencer 123 sets a head address of the latch circuit XDL1 as the column address CA in the column counter 125 (step S257).

In the page buffer 133, data input of the fourth cluster of the logical first page to the latch circuits XDL1 is started based on the column address CA received from the column counter 125.

In the case where the data input of the fourth cluster of the logical first page to the latch circuits XDL1 is not ended (step S258_No), the sequencer 123 repeats a confirmation operation of the data input until the input is ended.

When the data input to the latch circuits XDL1 is ended (step S258_Yes), the data input of the logical first page to the latch circuits XDL1 to XDL3 is ended.

The sequencer 123 transfers the data in the latch circuits XDL1 to XDL3 to the latch circuits BDL1 to BDL3, respectively (step S259). The data input of the logical first page is thus ended. It should be noted that the sequencer 123 may also transfer the data from the latch circuits XDL1 to the latch circuits ADL1 during the data input to the latch circuits XDL2, transfer the data from the latch circuits XDL2 to the latch circuits BDL2 during the data input to the latch circuits XDL3, transfer the data from the latch circuits XDL3 to the latch circuits BDL3 during the data input to the latch circuits XDL1, and transfer the data from the latch circuits XDL1 to the latch circuits BDL1 during the data input to the latch circuit XDL2.

The memory 100 then receives the logical page address of the logical second page from the memory controller 200 (step S260). At this time, the command user interface circuit 121 converts the logical page address of the logical second page into the physical page addresses.

The sequencer 123 sets a head address of the latch circuit XDL2 as a column address CA in the column counter 125 (step S261).

In the page buffer 133, data input of the first cluster of the logical second page to the latch circuits XDL2 is started based on the column address CA received from the column counter 125 (step S262).

In the case where the data input of the first cluster of the logical second page to the latch circuits XDL2 is not ended (step S263_No), the sequencer 123 repeats a confirmation operation of the data input until the input is ended.

When the data input of the first cluster of the logical second page to the latch circuits XDL2 is ended (step S263_Yes), the sequencer 123 transfers the data in the latch circuits XDL2 to the latch circuits ADL2 (step S264). Furthermore, when the data input to the latch circuits XDL2 is ended, data input of the second cluster of the logical second page to the latch circuits XDL3 is executed subsequently.

In the case where the data input of the second cluster of the logical second page to the latch circuits XDL3 is not ended (step S265_No), the sequencer 123 repeats a confirmation operation of the data input until the input is ended.

When the data input of the second cluster of the logical second page to the latch circuits XDL3 is ended (step S265_Yes), the sequencer 123 sets a head address of the latch circuit XDL1 as the column address CA in the column counter 125 (step S266). In the page buffer 133, data input of the third cluster of the logical second page to the latch circuits XDL1 and data input of the fourth cluster of the logical second page to the latch circuits XDL2 are sequentially executed based on the column address CA received from the column counter 125.

In the case where the data input of the fourth cluster of the logical second page to the latch circuits XDL2 is not ended (step S267_No), the sequencer 123 repeats a confirmation operation of the data input until the input is ended.

When the data input of the fourth cluster of the logical second page to the latch circuits XDL2 is ended (step S267_Yes), the data input of the logical second page to the latch circuits XDL1 to XDL3 is ended.

The sequencer 123 transfers the data in the latch circuits XDL1 to XDL3 to the latch circuits CDL1 to CDL3, respectively (step S268). It should be noted that the sequencer 123 may also transfer the data from the latch circuits XDL2 to the latch circuits ADL2 during the data input to the latch circuits XDL3, transfer the data from the latch circuits XDL3 to the latch circuits BDL3 during the data input to the latch circuits XDL1, transfer the data from the latch circuits XDL1 to the latch circuits BDL1 during the data input to the latch circuits XDL2, and transfer the data from the latch circuits XDL2 to the latch circuit BDL2 during the data input to the latch circuit XDL3.

The memory 100 then receives the logical page address of the logical third page from the memory controller 200 (step S269). At this time, the command user interface circuit 121 converts the logical page address of the logical third page into the physical page addresses.

The sequencer 123 sets a head address of the latch circuit XDL3 as a column address CA in the column counter 125 (step S270).

In the page buffer 133, data input of the first cluster of the logical third page to the latch circuits XDL3 is started based on the column address CA received from the column counter 125 (step S271).

In the case where the data input of the first cluster of the logical third page to the latch circuits XDL3 is not ended (step S272_No), the sequencer 123 repeats a confirmation operation of the data input until the input is ended.

When the data input of the first cluster of the logical third page to the latch circuits XDL3 is ended (step S272_Yes), the sequencer 123 transfers the data in the latch circuits XDL3 to the latch circuits ADL3 (step S273).

The sequencer 123 sets a head address of the latch circuit XDL1 as a column address CA in the column counter 125 (step S274). In the page buffer 133, data input of the second cluster of the logical third page to the latch circuits XDL1, data input of the third cluster of the logical third page to the latch circuits XDL2, and data input of the fourth cluster of the logical third page to the latch circuits XDL3 are sequentially executed based on the column address CA received from the column counter 125.

In the case where the data input of the fourth cluster of the logical third page to the latch circuits XDL3 is not ended (step S275_No), the sequencer 123 repeats a confirmation operation of the data input until the input is ended.

When the data input of the fourth cluster of the logical third page to the latch circuits XDL3 is ended (step S275_Yes), the data input of the logical third page to the latch circuits XDL1 to XDL3 is ended. The sequencer 123 sets the external RBn signal to the "L" level. The sequencer 123 then determines the state of each of the memory cell transistors MC based on the input data of the logical first page to the logical third page, that is, the combination of data in the lower page, the middle page, the upper page, and the top page. It should be noted that the sequencer 123 may also transfer data from the latch circuits XDL3 to the latch circuits ADL3 during the data input to the latch circuits XDL1.

The sequencer 123 executes the program operation based on the determined state (step S276).

After ending the program operation, the sequencer 123 executes a program verify operation (step S277).

In the case where the verification is not passed (step S278_No), the sequencer 123 confirms whether or not the number of program loops has reached a preset upper limit number (step S279).

In the case where the number of program loops has not reached the upper limit number (step S279_No), the sequencer 123 executes the program operation (step S276). That is, the sequencer 123 repeats the program loop.

In the case where the number of program loops has reached the upper limit number (step S279_Yes), the sequencer 123 ends the write operation and reports to the memory controller 200 that the write operation did not end successfully.

In the case of passing the verification (step S278_Yes), that is, ending writing of the "S1" to "S15" states, the sequencer 123 sets the external RBn signal to the "H" level and ends the full sequence write operation.

5.5.2 Command Sequence of Write Operation

An example of a command sequence of the write operation will be described with reference to FIG. 50. FIG. 50 is a command sequence of the full sequence write operation. In the example of FIG. 50, signals CEn, CLE, ALE, WEn, and REn are omitted to simplify the description.

As shown in FIG. 50, the memory controller 200 first transmits a command "80h" to the memory 100. The memory controller 200 then transmits a logical page address "AD-P1" of the logical first page. In the memory 100, the command user interface circuit 121 converts the received logical page address "AD-P1" into the physical page addresses.

The memory controller 200 then transmits data of the logical first page to the memory 100. The first cluster of the logical first page is stored in the latch circuits XDL1, and is then transferred to the latch circuits ADL1. The second cluster and the third cluster of the logical first page are stored in the latch circuits XDL2 and XDL3, and are then transferred to the latch circuits BDL2 and BDL3. The fourth cluster of the logical first page is stored in the latch circuits XDL1, and is then transferred to the latch circuits BDL1.

The memory controller 200 then transmits a command "1Ah" to the memory 100 to notify data input of the next logical page. The memory controller 200 then transmits the command "80h" and a logical page address "AD-P2" of the logical second page to the memory 100. In the memory 100, the command user interface circuit 121 converts the received logical page address "AD-P2" into the physical page addresses.

The memory controller 200 then transmits data of the logical second page to the memory 100. The first cluster of the logical second page is stored in the latch circuits XDL2, and is then transferred to the latch circuits ADL2. The second cluster of the logical second page is stored in the latch circuits XDL3, and is then transferred to the latch circuits CDL3. The third cluster of the logical second page is stored in the latch circuits XDL1, and is then transferred to the latch circuits CDL1. The fourth cluster of the logical second page is stored in the latch circuits XDL2, and is then transferred to the latch circuits CDL2.

The memory controller 200 then transmits the command "1Ah" to the memory 100 to notify data input of the next logical page. The memory controller 200 then transmits the command "80h" and a logical page address "AD-P3" of the logical third page to the memory 100. In the memory 100, the command user interface circuit 121 converts the received logical page address "AD-P3" into the physical page addresses.

The memory controller 200 then transmits data of the logical third page to the memory 100. The first cluster of the logical third page is stored in the latch circuits XDL3, and is then transferred to the latch circuits ADL3. The second cluster of the logical third page is stored in the latch circuits XDL1. The third cluster of the logical third page is stored in the latch circuits XDL2. The fourth cluster of the logical third page is stored in the latch circuits XDL3.

The memory controller 200 then transmits a command "10h" to the memory 100 to instruct execution of the write operation.

When the command "10h" is received, the sequencer 123 sets the internal RBn signal and the external RBn signal to the "L" level. The sequencer 123 then determines the state of each of the memory cell transistors MC based on the data stored in the latch circuits ADL1 to ADL3, BDL1 to BDL3, CDL1 to CDL3, and XDL1 to XDL3, and then executes the write operation. After ending the write operation, the sequencer 123 sets the internal RBn signal and the external RBn signal to the "H" level.

5.6 Advantageous Effects of Fifth Embodiment

The configuration of the present embodiment can attain the same effect as the first embodiment.

6. Sixth Embodiment

A sixth embodiment will be described. In the sixth embodiment, twelve examples will be given for a QLC coding that is different from the fifth embodiment. In each example, when allocating data for the top bit, the upper bit, the middle bit, and the lower bit, one bit whose boundary number is one is included. Furthermore, the boundary number of a bit whose boundary number is not one is coded in a manner such that the maximum value of the boundary number becomes minimum. Hereinafter, the description will focus mainly on matters different from those of the fifth embodiment.

6.1 First Example

A first example of the coding will first be described with reference to FIG. 51. FIG. 51 is a table showing data allocations to each state.

As shown in FIG. 51, in the present embodiment, in the same manner as the fifth embodiment, data is allocated to each state to become a Gray code in which one bit of data changes between two adjacent states.

"S0" state: "1111" data
"S1" state: "0111" data
"S2" state: "0011" data
"S3" state: "0001" data
"S4" state: "0101" data
"S5" state: "1101" data
"S6" state: "1001" data
"S7" state: "1011" data
"S8" state: "1010" data
"S9" state: "1000" data
"S10" state: "0000" data
"S11" state: "0010" data
"S12" state: "0110" data
"S13" state: "1110" data
"S14" state: "1100" data
"S15" state: "0100" data In the case of reading data that is allocated in the above manner, the lower page is determined by read operation R8. The middle page is determined by read operations R3, R7, R9, R11, and R14. The upper page is determined by read operations R2, R4, R6, and R12. A top page is determined by read operations R1, R5, R10, R13, and R15. Therefore, the data allocation of the present example is a 1-5-4-5 coding.

6.2 Second Example

A second example of the coding will be described with reference to FIG. 52. FIG. 52 is a table showing data allocations to each state.

As shown in FIG. 52, in the present embodiment, in the same manner as the fifth embodiment, data is allocated to each state to become a Gray code in which one bit of data changes between two adjacent states.

"S0" state: "1111" data
"S1" state: "0111" data

"S2" state: "0011" data
"S3" state: "0001" data
"S4" state: "0101" data
"S5" state: "1101" data
"S6" state: "1001" data
"S7" state: "1011" data
"S8" state: "1010" data
"S9" state: "1110" data
"S10" state: "1100" data
"S11" state: "0100" data
"S12" state: "0110" data
"S13" state: "0010" data
"S14" state: "0000" data
"S15" state: "1000" data In the case of reading data that is allocated in the above manner, the lower page is determined by read operation R8. The middle page is determined by read operations R3, R7, R10, R12, and R14. The upper page is determined by read operations R2, R4, R6, R9, and R13. The top page is determined by read operations R1, R5, R11, and R15. Therefore, the data allocation of the present example is a 1-5-5-4 coding.

6.3 Third Example

A third example of the coding will be described with reference to FIG. 53. FIG. 53 is a table showing data allocations to each state.

As shown in FIG. 53, in the present embodiment, in the same manner as the fifth embodiment, data is allocated to each state to become a Gray code in which one bit of data changes between two adjacent states.

"S0" state: "1111" data
"S1" state: "0111" data
"S2" state: "0011" data
"S3" state: "0001" data
"S4" state: "0101" data
"S5" state: "1101" data
"S6" state: "1001" data
"S7" state: "1011" data
"S8" state: "1010" data
"S9" state: "0010" data
"S10" state: "0000" data
"S11" state: "0100" data
"S12" state: "0110" data
"S13" state: "1110" data
"S14" state: "1100" data
"S15" state: "1000" data In the case of reading data that is allocated in the above manner, the lower page is determined by read operation R8. The middle page is determined by read operations R3, R7, R10, R12, and R14. The upper page is determined by read operations R2, R4, R6, R11, and R15. The top page is determined by read operations R1, R5, R9, and R13. Therefore, the data allocation of the present example is a 1-5-5-4 coding.

6.4 Fourth Example

A fourth example of the coding will be described with reference to FIG. 54. FIG. 54 is a table showing data allocations to each state.

As shown in FIG. 54, in the present embodiment, in the same manner as the fifth embodiment, data is allocated to each state to become a Gray code in which one bit of data changes between two adjacent states.

"S0" state: "1111" data
"S1" state: "0111" data

"S2" state: "0011" data
"S3" state: "1011" data
"S4" state: "1001" data
"S5" state: "1101" data
"S6" state: "0101" data
"S7" state: "0001" data
"S8" state: "0000" data
"S9" state: "0010" data
"S10" state: "0110" data
"S11" state: "0100" data
"S12" state: "1100" data
"S13" state: "1110" data
"S14" state: "1010" data
"S15" state: "1000" data In the case of reading data that is allocated in the above manner, the lower page is determined by read operation R8. The middle page is determined by read operations R4, R9, R11, R13, and R15. The upper page is determined by read operations R2, R5, R7, R10, and R14. The top page is determined by read operations R1, R3, R6, and R12. Therefore, the data allocation of the present example is a 1-5-5-4 coding.

6.5 Fifth Example

A fifth example of the coding will be described with reference to FIG. 55. FIG. 55 is a table showing data allocations to each state.

As shown in FIG. 55, in the present embodiment, in the same manner as the fifth embodiment, data is allocated to each state to become a Gray code in which one bit of data changes between two adjacent states.

"S0" state: "1111" data
"S1" state: "0111" data
"S2" state: "0011" data
"S3" state: "1011" data
"S4" state: "1001" data
"S5" state: "1101" data
"S6" state: "0101" data
"S7" state: "0001" data
"S8" state: "0000" data
"S9" state: "0010" data
"S10" state: "1010" data
"S11" state: "1000" data
"S12" state: "1100" data
"S13" state: "1110" data
"S14" state: "0110" data
"S15" state: "0100" data In the case of reading data that is allocated in the above manner, the lower page is determined by read operation R8. The middle page is determined by read operations R4, R9, R11, R13, and R15. The upper page is determined by read operations R2, R5, R7, and R12. The top page is determined by read operations R1, R3, R6, R10, and R14. Therefore, the data allocation of the present example is a 1-5-4-5 coding.

6.6 Sixth Example

A sixth example of the coding will be described with reference to FIG. 56. FIG. 56 is a table showing data allocations to each state.

As shown in FIG. 56, in the present embodiment, in the same manner as the fifth embodiment, data is allocated to each state to become a Gray code in which one bit of data changes between two adjacent states.

"S0" state: "1111" data
"S1" state: "0111" data

"S2" state: "0011" data
"S3" state: "1011" data
"S4" state: "1001" data
"S5" state: "0001" data
"S6" state: "0101" data
"S7" state: "1101" data
"S8" state: "1100" data
"S9" state: "1110" data
"S10" state: "1010" data
"S11" state: "1000" data
"S12" state: "0000" data
"S13" state: "0010" data
"S14" state: "0110" data
"S15" state: "0100" data In the case of reading data that is allocated in the above manner, the lower page is determined by read operation R8. The middle page is determined by read operations R4, R9, R11, R13, and R15. The upper page is determined by read operations R2, R6, R10, and R14. The top page is determined by read operations R1, R3, R5, R7, and R12. Therefore, the data allocation of the present example is a 1-5-4-5 coding.

6.7 Seventh Example

A seventh example of the coding will be described with reference to FIG. 57. FIG. 57 is a table showing data allocations to each state.

As shown in FIG. 57, in the present embodiment, in the same manner as the fifth embodiment, data is allocated to each state to become a Gray code in which one bit of data changes between two adjacent states.

"S0" state: "1111" data
"S1" state: "0111" data
"S2" state: "0011" data
"S3" state: "1011" data
"S4" state: "1001" data
"S5" state: "0001" data
"S6" state: "0101" data
"S7" state: "1101" data
"S8" state: "1100" data
"S9" state: "1000" data
"S10" state: "1010" data
"S11" state: "1110" data
"S12" state: "0110" data
"S13" state: "0100" data
"S14" state: "0000" data
"S15" state: "0010" data In the case of reading data that is allocated in the above manner, the lower page is determined by read operation R8. The middle page is determined by read operations R4, R10, R13, and R15. The upper page is determined by read operations R2, R6, R9, R11, and R14. The top page is determined by read operations R1, R3, R5, R7, and R12. Therefore, the data allocation of the present example is a 1-4-5-5 coding.

6.8 Eighth Example

An eighth example of the coding will be described with reference to FIG. 58. FIG. 58 is a table showing data allocations to each state.

As shown in FIG. 58, in the present embodiment, in the same manner as the fifth embodiment, data is allocated to each state to become a Gray code in which one bit of data changes between two adjacent states.

"S0" state: "1111" data
"S1" state: "0111" data
"S2" state: "0011" data
"S3" state: "0001" data
"S4" state: "0101" data
"S5" state: "1101" data
"S6" state: "1001" data
"S7" state: "1011" data
"S8" state: "1010" data
"S9" state: "1000" data
"S10" state: "0000" data
"S11" state: "0100" data
"S12" state: "1100" data
"S13" state: "1110" data
"S14" state: "0110" data
"S15" state: "0010" data In the case of reading data that is allocated in the above manner, the lower page is determined by read operation R8. The middle page is determined by read operations R3, R7, R9, and R13. The upper page is determined by read operations R2, R4, R6, R11, and R14. The top page is determined by read operations R1, R5, R10, R12, and R14. Therefore, the data allocation of the present example is a 1-4-5-5 coding.

6.9 Ninth Example

A ninth example of the coding will be described with reference to FIG. 59. FIG. 59 is a table showing data allocations to each state.

As shown in FIG. 59, in the present embodiment, in the same manner as the fifth embodiment, data is allocated to each state to become a Gray code in which one bit of data changes between two adjacent states.

"S0" state: "1111" data
"S1" state: "0111" data
"S2" state: "0011" data
"S3" state: "1011" data
"S4" state: "1001" data
"S5" state: "0001" data
"S6" state: "0101" data
"S7" state: "1101" data
"S8" state: "1100" data
"S9" state: "1110" data
"S10" state: "1010" data
"S11" state: "1000" data
"S12" state: "0000" data
"S13" state: "0100" data
"S14" state: "0110" data
"S15" state: "0010" data In the case of reading data that is allocated in the above manner, the lower page is determined by read operation R8. The middle page is determined by read operations R4, R9, R11, and R14. The upper page is determined by read operations R2, R6, R10, R13, and R15. The top page is determined by read operations R1, R3, R5, R7, and R12. Therefore, the data allocation of the present example is a 1-4-5-5 coding.

6.10 Tenth Example

A tenth example of the coding will be described with reference to FIG. 60. FIG. 60 is a table showing data allocations to each state.

As shown in FIG. 60, in the present embodiment, in the same manner as the fifth embodiment, data is allocated to each state to become a Gray code in which one bit of data changes between two adjacent states.

"S0" state: "1111" data
"S1" state: "0111" data
"S2" state: "0011" data
"S3" state: "0001" data
"S4" state: "0101" data
"S5" state: "1101" data
"S6" state: "1001" data
"S7" state: "1011" data
"S8" state: "1010" data
"S9" state: "0010" data
"S10" state: "0000" data
"S11" state: "1000" data
"S12" state: "1100" data
"S13" state: "1110" data
"S14" state: "0110" data
"S15" state: "0100" data In the case of reading data that is allocated in the above manner, the lower page is determined by read operation R8. The middle page is determined by read operations R3, R7, R10, R13, and R15. The upper page is determined by read operations R2, R4, R6, and R12. The top page is determined by read operations R1, R5, R9, R11, and R14. Therefore, the data allocation of the present example is a 1-5-4-5 coding.

6.11 Eleventh Example

An eleventh example of the coding will be described with reference to FIG. 61. FIG. 61 is a table showing data allocations to each state.

As shown in FIG. 61, in the present embodiment, in the same manner as the fifth embodiment, data is allocated to each state to become a Gray code in which one bit of data changes between two adjacent states.

"S0" state: "1111" data
"S1" state: "0111" data
"S2" state: "0011" data
"S3" state: "1011" data
"S4" state: "1001" data
"S5" state: "1101" data
"S6" state: "0101" data
"S7" state: "0001" data
"S8" state: "0000" data
"S9" state: "0100" data
"S10" state: "0110" data
"S11" state: "1110" data
"S12" state: "1100" data
"S13" state: "1000" data
"S14" state: "1010" data
"S15" state: "0010" data In the case of reading data that is allocated in the above manner, the lower page is determined by read operation R8. The middle page is determined by read operations R4, R10, R12, and R14. The upper page is determined by read operations R2, R5, R7, R9, and R13. The top page is determined by read operations R1, R3, R6, R11, and R15. Therefore, the data allocation of the present example is a 1-4-5-5 coding.

6.12 Twelfth Example

A twelfth example of the coding will be described with reference to FIG. 62. FIG. 62 is a table showing data allocations to each state.

As shown in FIG. 62, in the present embodiment, in the same manner as the fifth embodiment, data is allocated to each state to become a Gray code in which one bit of data changes between two adjacent states.

"S0" state: "1111" data

"S1" state: "0111" data

"S2" state: "0011" data

"S3" state: "1011" data

"S4" state: "1001" data

"S5" state: "1101" data

"S6" state: "0101" data

"S7" state: "0001" data

"S8" state: "0000" data

"S9" state: "1000" data

"S10" state: "1010" data

"S11" state: "1110" data

"S12" state: "1100" data

"S13" state: "0100" data

"S14" state: "0110" data

"S15" state: "0010" data

In the case of reading data that is allocated in the above manner, the lower page is determined by read operation R8. The middle page is determined by read operations R4, R10, R12, and R14. The upper page is determined by read operations R2, R5, R7, R11, and R15. The top page is determined by read operations R1, R3, R6, R9, and R13. Therefore, the data allocation of the present example is a 1-4-5-5 coding.

6.13 Advantageous Effects of Sixth Embodiment

The coding of the present embodiment is applicable to the fifth embodiment.

The configuration of the present embodiment can attain the same effect as the first embodiment.

7. Seventh Embodiment

A seventh embodiment will be described. In the seventh embodiment, two examples will be given to explain the QLC read operation that is different from that of the fifth embodiment. Hereinafter, the description will focus mainly on matters different from those of the fifth embodiment.

7.1 First Example

The read operation of a first example will first be explained. In the first example, a case in which the order of the read voltages to be applied to the selected word line WL is different from that of the fifth embodiment in read operations of the logical first page to the logical third page will be explained with reference to FIGS. 63 to 65. FIG. 63 is a command sequence of the read operation of the logical first page. FIG. 64 is a command sequence of the read operation of the logical second page. FIG. 65 is a command sequence of the read operation of the logical third page. In the examples of FIGS. 63 to 65, signals CEn, CLE, ALE, WEn, and REn are omitted to simplify the description. In the examples of FIGS. 63 to 65, some of the commands and addresses are omitted. In addition, the examples of FIGS. 63 to 65 also show voltages of the selected word line WL in a case where an internal RBn signal is in the busy state.

The command sequence in the read operation of the logical first page will first be explained.

As shown in FIG. 63, in the read operation of the lower page (read operation R8) and the read operation of the middle page (read operations R3, R7, R11, and R15) corresponding to the logical first page, the sequencer 123 executes the read operations in the order of R15, R11, R8, R7, and R3. That is, read voltages V15, V11, V8, V7, and V3 are sequentially applied to the selected word line WL. After ending read operation R3, the sequencer 123 sets an external RBn signal and the internal RBn signal to the "H" level. Therefore, after the read operation of the middle page is ended, output of the read data is started.

It should be noted that the sequencer 123 may also execute the read operation in the order of R3, R7, R8, R11, and R15. That is, read voltages V3, V7, V8, V11, and V15 may be sequentially applied to the selected word line WL. When read operation R8 is executed, data of the lower page is determined. Therefore, the sequencer 123 may set the external RBn signal to the "H" level and output the data.

The command sequence in the read operation of the logical second page will be explained.

As shown in FIG. 64, in the read operation of the lower page (read operation R8) and the read operation of the upper page (read operations R2, R4, R6, R9, and R13) correspond-ing to the logical second page, the sequencer 123 executes the read operations in the order of R13, R9, R8, R6, R4, and R2. That is, read voltages V13, V9, V8, V6, V4, and V2 are sequentially applied to the selected word line WL. After ending the write operation R2, the sequencer 123 sets the external RBn signal and the internal RBn signal to the "H" level. Therefore, after the read operation of the upper page is ended, output of the read data is started.

It should be noted that the sequencer 123 may also execute the read operation in the order of R2, R4, R6, R8, R9, and R13. That is, read voltages V2, V4, V6, V8, V9, and V13 may be sequentially applied to the selected word line WL. When read operation R8 is executed, data of the lower page is determined. Therefore, the sequencer 123 may set the external RBn signal to the "H" level and output the data.

The command sequence in the read operation of the logical third page will be explained.

As shown in FIG. 65, in the read operation of the lower page (read operation R8) and the read operation of the top page (read operations R1, R5, R10, R12, and R14) corre-sponding to the logical third page, the sequencer 123 executes the read operations in the order of R14, R12, R10, R8, R5, and R1. That is, read voltages V14, V12, V10, V8, V5, and V1 are sequentially applied to the selected word line WL. After ending the write operation R1, the sequencer 123 sets the external RBn signal and the internal RBn signal to the "H" level. Therefore, after the read operation of the top page is ended, output of the read data is started.

It should be noted that the sequencer 123 may also execute the read operation in the order of R1, R5, R8, R10, R12, and R14. That is, read voltages V1, V5, V8, V10, V12, and V14 may be sequentially applied to the selected word line WL. When read operation R8 is executed, data of the lower page is determined. Therefore, the sequencer 123 may set the external RBn signal to the "H" level and output the data.

7.2 Second Example

The read operation of a second example will be explained. In the second example, a case in which pieces of data of the lower page, the middle page, the upper page, and the top page are collectively read in the sequential read operation will be explained with reference to FIG. 66. In the sequential read operation of the present example, "S0" to "S15" states are collectively read. FIG. 66 is a command sequence of the sequential read operation. In the example of FIG. 66, signals CEn, CLE, ALE, WEn, and REn are omitted to simplify the description. In the example of FIG. 66, some of the commands and addresses are omitted. In addition, the example of FIG. 66 also shows voltages of the selected word line WL in a case where an internal RBn signal is in the busy state.

As shown in FIG. 66, when the sequencer 123 receives a command "30h", it starts the read operation in response to the command. The sequencer 123 first sets the internal RBn signal and the external RBn signal to the "L" level indicating the busy state. The sequencer 123 then executes the sequential read operation. More specifically, the sequencer 123 sequentially executes read operations R1 to R15. At this time, read voltages V1 to V15 are sequentially applied to the selected word line WL. When read operation R8 is ended, the sequencer 123 determines the data of the lower page and sets the external RBn signal to the "H" level. The data of the lower page is stored in latch circuits ADL1 to ADL3. The data in the latch circuits ADL1 (data of the first cluster of the logical first page) is transferred to the latch circuits XDL1. When the "H" level external RBn signal is received, the memory controller 200 transmits signal REn (not shown) to the memory 100. The input/output circuit 110 starts outputting the data in the latch circuit XDL1 (the data of the first cluster of the logical first page) in accordance with the signal REn.

When the data output of the latch circuits XDL1 is ended while the sequential read operation is executed, the sequencer 123 temporarily sets the external RBn signal to the "L" level until the sequential read is ended.

When read operation R13 is ended, the sequencer 123 determines data of the upper page. The data of the upper page is stored in latch circuits CDL1 to CDL3. When read operation R15 is ended, the sequencer 123 determines data of the middle page. The data of the middle page is stored in latch circuits BDL1 to BDL3. The data in the latch circuits BDL2 (data of the second cluster of the logical first page) is transferred to the latch circuits XDL2. The data in the latch circuits BDL3 (data of the third cluster of the logical first page) is transferred to the latch circuits XDL3. The data in the latch circuits BDL1 (data of the fourth cluster of the logical first page) is transferred to the latch circuits XDL1.

When the sequential read operation is ended, the sequencer 123 sets the external RBn signal and the internal RBn signal to the "H" level.

When the "H" level external RBn signal is received, the memory controller 200 resumes transmission of signal REn (not shown). The input/output circuit 110 outputs data in the order of the latch circuits XDL2, XDL3, and XDL1 in accordance with the signal REn. When data output of the latch circuits XDL1 (the data of the fourth cluster of the logical first page) is ended, the data output of the logical first page is ended.

Subsequently, data output of the logical second page is started. The data in the latch circuits ADL2 (data of the first cluster of the logical second page) is transferred to the latch circuits XDL2. The data in the latch circuits CDL3 (data of the second cluster of the logical second page) is transferred to the latch circuits XDL3. The data in the latch circuits CDL1 (data of the third cluster of the logical second page) is transferred to the latch circuits XDL1. The data is output in the order of the latch circuits XDL2, XDL3, and XDL1. When the data output of the latch circuits XDL2 (the data of the first cluster of the logical second page) is ended, data in the latch circuits CDL2 (data of the fourth cluster of the logical second page) is transferred to the latch circuits XDL2. When data output of the latch circuits XDL1 (the data of the third cluster of the logical second page) is ended, the data in the latch circuits XDL2 (the data of the fourth cluster of the logical second page) is output. When data output of the latch circuits XDL2 is ended, the data output of the logical second page is ended.

Subsequently, data output of the logical third page is started. The data in the latch circuits ADL3 (data of the first cluster of the logical third page) is transferred to the latch circuits XDL3. Data in the sense circuits SA1 (data of the second cluster of the logical third page) is transferred to the latch circuit the XDL1. Data in the sense circuits SA2 (data of the third cluster of the logical third page) is transferred to the latch circuits XDL2. The data is output in the order of the latch circuits XDL3, XDL1, and XDL2. When the data output of the latch circuits XDL3 (the data of the first cluster of the logical third page) is ended, data in the sense circuits SA3 is transferred to the latch circuits XDL3. When the data output of the latch circuits XDL2 (the data of the third cluster of the logical third page) is ended, the data in the latch circuits XDL3 (data of the fourth cluster of the logical third page) is output. When the data output of the latch circuits XDL3 is ended, the data output of the logical third page is ended. It should be noted that, in the sequential read operation, the states may also be read collectively in the order of the "S15" state to the "S0" state.

7.3 Advantageous Effects of Seventh Embodiment

The configuration of the present embodiment can attain the same effect as the first embodiment.

8. Eighth Embodiment

An eighth embodiment will be described. The eighth embodiment explains a case in which the logical page data allocation in the physical page is different from the first embodiment. Hereinafter, the description will focus mainly on matters different from those of the first embodiment.

8.1 Conversion Operation of Logical Page Address and Physical Page Address

An example of the conversion operation of the logical page address and the physical page address will be explained with reference to FIGS. 67 and 68. FIG. 67 is a diagram explaining a flow of the conversion operation of the logical page address and the physical page address. FIG. 68 is a diagram showing the logical page data allocation with respect to the physical page.

In the present embodiment, in the same manner as the first embodiment, a case of allocating data of two logical pages to three physical pages (that is, one memory group MG capable of storing three-page data) will be described.

As shown in FIG. 67, when the command user interface circuit 121 receives a write order including two pages of the logical page address and the logical page from the memory controller 200, it converts the two pages of the logical page address into three pages of the physical page address. In the present embodiment, the command user interface circuit 121 converts the logical page address of the logical first page into the physical page addresses of the first cell area of the lower page, the first cell area of the middle page, and the first cell area of the upper page. In addition, the command user interface circuit 121 converts the logical page address of the logical second page into the physical page addresses of the second cell area of the lower page, the second cell area of the middle page, and the second cell area of the upper page.

For example, based on the physical page address converted in the command user interface circuit 121, the sequencer 123 writes data of the logical first page in the first cell area of the lower page, the first cell area of the middle page, and the first cell area of the upper page, and writes data of the logical second page in the second cell area of the lower page, the second cell area of the middle page, and the second cell area of the upper page of the memory group MG.

The arrangement of the logical page data in one memory group MG will be described in detail.

As shown in FIG. 68, for example, the memory 100 writes the first cluster of the logical first page in the first cell area of the lower page, writes the second cluster of the logical first page in the first cell area of the middle page, and writes the third cluster of the logical first page in the first cell area of the upper page. Furthermore, the memory 100 writes the first cluster of the logical second page in the second cell area of the lower page, writes the second cluster of the logical second page in the second cell area of the middle page, and writes the third cluster of the logical second page in the second cell area of the upper page.

8.2 Advantageous Effects of Eighth Embodiment

The configuration of the present embodiment can attain the same effect as the first embodiment.

9. Ninth Embodiment

A ninth embodiment will be described. In the ninth embodiment, three configuration examples of the sense amplifier 132 and the page buffer 133 differing from the first embodiment will be described. Hereinafter, the description will focus mainly on matters different from those of the first embodiment.

9.1 First Example

A first example of configurations of the sense amplifier 132 and the page buffer 133 will first be described with reference to FIG. 69. FIG. 69 is a block diagram of the sense amplifier 132 and the page buffer 133. In the example of FIG. 69, bit lines BL are omitted to simplify the description.

As shown in FIG. 69, in the present example, the first cell area and the sense amplifier unit SAU1 corresponding to the first cell area, and the second cell area and the sense amplifier unit SAU2 corresponding to the second cell area are arranged alternately. Accordingly, in a memory group MG, for example, memory cell transistors MC coupled to even-numbered bit lines BL are included in the first cell area, and memory cell transistors MC coupled to odd-numbered bit lines BL are included in the second cell area. Latch circuits XDL (XDL1 and XDL2) are coupled to the serial access controller 126 via a data bus, and are used for transmitting/receiving data between the serial access controller 126 and the sense amplifier 132.

9.2 Second Example

A second example of configurations of the sense amplifier 132 and the page buffer 133 will be described with reference to FIG. 70. FIG. 70 is a block diagram of the sense amplifier 132 and the page buffer 133. In the example of FIG. 70, bit lines BL are omitted to simplify the description.

As shown in FIG. 70, in the present example, latch circuits ADL (ADL1 and ADL2) and latch circuits XDL (XDL1 and XDL2) are coupled to the serial access control-ler 126 via the data bus, and are used for transmitting/receiving data between the serial access controller 126 and the sense amplifier 132.

It should be noted that latch circuits BDL (BDL1 and BDL2) and latch circuits XDL (XDL1 and XDL2) may also be coupled to the serial access controller 126 via the data bus.

9.3 Third Example

A third example of configurations of the sense amplifier 132 and the page buffer 133 will be described with reference to FIG. 71. FIG. 71 is a block diagram of the sense amplifier 132 and the page buffer 133. In the example of FIG. 71, bit lines BL are omitted to simplify the description.

As shown in FIG. 71, in the present example, latch circuits ADL (ADL1 and ADL2), latch circuits BDL (BDL1 and BDL2), and latch circuits XDL (XDL1 and XDL2) are coupled to the serial access controller 126 via the data bus, and are used for transmitting/receiving data between the serial access controller 126 and the sense amplifier 132.

9.4 Advantageous Effects of Ninth Embodiment

The configuration of the present embodiment can attain the same effect as the first embodiment.

Furthermore, according to the configuration of the first example of the present embodiment, the sense amplifier unit SAU1 and the sense amplifier unit SAU2 can be arranged alternately. This allows data to be transferred between the sense amplifier unit SAU1 and the sense amplifier unit SAU2. Such a physically divided arrangement is performed for various reasons such as to improve a response speed of a circuit, facilitate an interconnect layout between circuits, and facilitate calculations between latch circuits.

Furthermore, according to the configurations of the second example and the third example of the present embodiment, the latch circuits ADL and/or the latch circuits BDL are coupled to the serial access controller 126 via the data bus. Therefore, the latch circuits ADL and/or the latch circuits BDL can transmit/receive data to/from the serial access controller 126 without using the latch circuits XDL. Therefore, the operation speed can be improved. Furthermore, since a frequency of transferring data can be reduced, power consumption can be reduced. It should be noted that, in the case of the QLC, the page buffer 133 may include the latch circuit CDL in addition to the latch circuits ADL, BDL, and XDL.

The first example and the second example or the third example of the present embodiment may also be combined.

10. Tenth Embodiment

A tenth embodiment will be described. In the tenth embodiment, a case of applying different codings between the first cell area and the second cell area will be described. Hereinafter, the description will focus mainly on matters different from those of the first embodiment.

10.1 Conversion Operation of Logical Page Address and Physical Page Address

An example of a conversion operation of the logical page address and the physical page address will first be explained with reference to FIG. 72. FIG. 72 is a diagram showing the logical page data allocation with respect to the physical page.

In the present embodiment, a case of allocating data of two logical pages to three physical pages (that is, one memory group MG capable of storing three-page data) will be described.

As shown in FIG. 72, data of the logical first page and data of the logical second page are divided respectively into three pieces of the first cluster to the third cluster from the head. For example, the memory 100 writes the first cluster of the logical first page in the first cell area of the lower page, writes the second cluster of the logical first page in the second cell area of the lower page, and writes the third cluster of the logical first page in the first cell area of the middle page. The memory 100 also writes the first cluster of the logical second page in the second cell area of the middle page, writes the second cluster of the logical second page in the first cell area of the upper page, and writes the third cluster of the logical second page in the second cell area of the upper page.

10.2 Coding of Memory Cell Transistors

Coding of memory cell transistors MC will be described with reference to FIG. 73. FIG. 73 is a table showing data allocations to each state.

As shown in FIG. 73, in the present embodiment, different codings are applied between the first cell area and the second cell area. In this case, each of the codings is selected so that positions of boundaries determining data of the logical page become the same between the first cell area and the second cell area in the read operation of the logical page.

More specifically, in the case of the read operation of the logical first page, positions of the boundary for determining data of the lower page and the middle page in the first cell area and positions of the boundary for determining data of the lower page in the second cell area are the same. Furthermore, in the case of the read operation of the logical second page, positions of the boundary for determining data of the upper page in the first cell area and positions of the boundary for determining data of the middle page and the upper page in the second cell area are the same.

For example, in the first cell area, data is allocated to the "upper bit/middle bit/lower bit" of the memory cell transistor MC in the following manner.

"S0" state: "111" data
"S1" state: "011" data
"S2" state: "001" data
"S3" state: "101" data
"S4" state: "100" data
"S5" state: "000" data
"S6" state: "010" data
"S7" state: "110" data In the case of reading data that is allocated in the above manner, the lower page is determined by read operation R4. The middle page is determined by read operations R2 and R6. The upper page is determined by read operations R1, R3, R5, and R7. Therefore, the data allocation of the first cell area is a 1-2-4 coding.

Furthermore, in the second cell area, data is allocated to the "upper bit/middle bit/lower bit" of the memory cell transistor MC in the following manner.

"S0" state: "111" data
"S1" state: "101" data
"S2" state: "100" data
"S3" state: "000" data
"S4" state: "001" data
"S5" state: "011" data "S6" state: "010" data
"S7" state: "110" data In the case of reading data that is allocated in the above manner, the lower page is determined by read operations R2, R4, and R6. The middle page is determined by read operations R1 and R5. The upper page is determined by read operations R3 and R7. Therefore, the data allocation of the second cell area is a 3-2-2 coding.

In the case of performing the read operation of the logical first page, the target of the read operation is the first and second cell areas of the lower page and the first cell area of the middle page. In the first area, data of the lower page is determined by read operation R4. Data of the middle page is determined by read operations R2 and R6. Furthermore, in the second cell area, data of the lower page is determined by read operations R2, R4, and R6. Therefore, in both the first cell area and the second cell area, data of the logical first page is determined by read operations R2, R4, and R6. In the read operation of the logical first page, read voltages may be applied to the selected word line WL in the order of voltages V2, V4, and V6, or in the order of voltages V6, V4, and V2. Furthermore, when read operation R4 is ended, data of the first cluster of the logical first page is determined. Therefore, the memory 100 may output this data to the outside by transferring the data to the latch circuits XDL.

In the case of performing the read operation of the logical second page, the target of the read operation is the second cell area of the middle page and the first and second cell areas of the upper page. In the first cell area, data of the upper page is determined by read operations R1, R3, R5, and R7. In the second cell area, data of the middle page is determined by read operations R1 and R5. Data of the upper page is determined by read operations R3 and R7. Therefore, in both the first cell area and the second cell area, data of the logical second page is determined by read operations R1, R3, R5, and R7. It should be noted that, in the read operation of the logical second page, read voltages may be applied to the selected word line WL in the order of voltages V1, V3, V5, and V7, or in the order of voltages V7, V5, V3, and V1. For example, in the case of applying the read voltages to the selected word line WL in the order of voltages V1, V3, V5, and V7, data of the first cluster of the logical second page is determined when read operations R1 and R5 are ended. Therefore, the memory 100 may output this data to the outside by transferring the data to the latch circuits XDL. For example, in the case of applying the read voltages to the selected word line WL in the order of voltages V7, V5, V3, and V1, data of the third cluster of the logical second page is determined when read operations R7 and R3 are ended. Therefore, the memory 100 may output this data to the outside by transferring the data to the latch circuits XDL. In this case, for example, in the memory 100, the allocation of the first cluster of the logical second page and the allocation of the third cluster of the logical second page explained with reference to FIG. 72 may be switched. By switching the allocations, the memory 100 can output to the outside data of the first cluster of the logical second page earlier than before switching the allocations.

10.3 Advantageous Effects of Tenth Embodiment

The configuration of the present embodiment can attain the same effect as the first embodiment.

Furthermore, according to the configuration of the present embodiment, different codings can be applied for each cell area. Furthermore, in the read operation of the logical page, codings can be selected so that positions of boundaries determining the data of the logical page become the same in each cell area. This allows the number of boundaries to be minimized in the case of reading data of a plurality of physical pages in the read operation of the logical page. Therefore, processing ability can be improved since the increase in the number of read operations can be suppressed. For example, in the case of the present embodiment, data of the logical first page can be determined by performing the read operation three times, and data of the logical second page can be determined by performing the read operation four times.

11. Eleventh Embodiment

An eleventh embodiment will be described. In the eleventh embodiment, a case of allocating data of one logical page to a plurality of physical pages will be described by three examples. Hereinafter, the description will focus mainly on matters different from those of the first to tenth embodiments.

11.1 First Example

A first example of a conversion operation of the logical page address and the physical page address will first be explained with reference to FIG. 74. FIG. 74 is a diagram showing the logical page data allocation with respect to the physical page.

In the present example, a case of allocating data of one logical page to three physical pages (that is, one memory group MG capable of storing three-page data) will be described.

As shown in FIG. 74, data of the logical first page is divided respectively into three pieces of the first cluster to the third cluster from the head. For example, the memory 100 writes the first cluster of the logical first page to the lower page, writes the second cluster of the logical first page to the middle page, and writes the third cluster of the logical first page to the upper page.

11.2 Second Example

A second example of the conversion operation of the logical page address and the physical page address will be explained.

In the present example, a case of allocating data of one logical page to four physical pages (that is, one memory group MG capable of storing four-page data) will be described.

An example of possible threshold voltage distributions of memory cell transistors MC of the present example will first be described with reference to FIG. 75. FIG. 75 is a diagram showing a relationship between threshold voltage distributions and data allocations of the memory cell transistors MC.

As shown in FIG. 75, in the present example, data is allocated to the "top bit/upper bit/middle bit/lower bit" of each of the memory cell transistors MC that belongs to each of the threshold voltage distributions in the following manner. Data is allocated to each state to become a Gray code in which one bit of data changes between two adjacent states.

"S0" state: "1111" data
"S1" state: "0111" data
"S2" state: "0101" data
"S3" state: "1101" data
"S4" state: "1100" data
"S5" state: "1000" data
"S6" state: "1001" data
"S7" state: "1011" data "S8" state: "0011" data
"S9" state: "0001" data
"S10" state: "0000" data
"S11" state: "0100" data
"S12" state: "0110" data
"S13" state: "0010" data
"S14" state: "1010" data
"S15" state: "1110" data In the case of reading data that is allocated in the above manner, the lower page is determined by read operations R4, R6, and R10. The middle page is determined by read operations R2, R7, R9, and R12. The upper page is determined by read operations R5, R11, R13, and R15. The top page is determined by read operations R1, R3, R8, and R14. Therefore, the data allocation of the present example is a 3-4-4-4 coding.

It should be noted that the data allocation to the "S0" to "S15" states is not limited to the 3-4-4-4 coding. For example, one of the codings described in the fifth and the sixth embodiments may also be applied.

A conversion operation of the logical page address and the physical page address will be explained with reference to FIG. 76. FIG. 76 is a diagram showing the logical page data allocation with respect to the physical page.

As shown in FIG. 76, data of the logical first page is divided respectively into four pieces of the first cluster to the fourth cluster from the head. For example, the memory 100 writes the first cluster of the logical first page to the lower page, writes the second cluster of the logical first page to the middle page, writes the third cluster of the logical first page to the upper page, and writes the fourth cluster of the logical first page to the top page.

11.3 Third Example

A third example of the conversion operation of the logical page address and the physical page address will be explained.

In the present example, a case of allocating data of two logical pages to four physical pages (that is, one memory group MG capable of storing four-page data) will be described.

An example of possible threshold voltage distributions of memory cell transistors MC of the present example will first be described with reference to FIG. 77. FIG. 77 is a diagram showing a relationship between threshold voltage distributions and data allocations of the memory cell transistors MC.

As shown in FIG. 77, in the present example, data is allocated to the "top bit/upper bit/middle bit/lower bit" of each of the memory cell transistors MC that belongs to each of the threshold voltage distributions in the following manner. Data is allocated to each state to become a Gray code in which one bit of data changes between two adjacent states.

"S0" state: "1111" data
"S1" state: "0111" data
"S2" state: "0011" data
"S3" state: "1011" data
"S4" state: "1001" data
"S5" state: "1101" data
"S6" state: "1100" data
"S7" state: "0100" data
"S8" state: "0101" data
"S9" state: "0001" data
"S10" state: "0000" data
"S11" state: "1000" data
"S12" state: "1010" data
"S13" state: "1110" data "S14" state: "0110" data "S15" state: "0010" data In the case of reading data that is allocated in the above manner, the lower page is determined by read operations R6, R8, and R10. The middle page is determined by read operations R4 and R12. The upper page is determined by read operations R2, R5, R9, R13, and R15. The top page is determined by read operations R1, R3, R7, R11, and R14. Therefore, the data allocation of the present example is a 3-2-5-5 coding.

The data allocation to the "S0" to "S15" states is not limited to the 3-2-5-5 coding. For example, one of the codings described in the fifth and the sixth embodiments may also be applied. Alternatively, the 3-4-4-4 coding described in the second example of the eleventh embodiments may be applied.

The conversion operation of the logical page address and the physical page address will be explained with reference to FIG. 78. FIG. 78 is a diagram showing a logical page data allocation with respect to a physical page.

As shown in FIG. 78, data of the logical first page and the logical second page is divided respectively into two pieces of the first cluster and the second cluster from the head. For example, the memory 100 writes the first cluster of the logical first page in the lower page, writes the second cluster of the logical first page in the middle page, writes the first cluster of the logical second page in the upper page, and writes the second cluster of the logical second page in the top page.

11.4 Advantageous Effects of Eleventh Embodiment

The configuration of the present embodiment can attain the same effect as the first embodiment.

12. Twelfth Embodiment

A twelfth embodiment will be described. In the twelfth embodiment, a case of applying different codings to first to third cell areas will be described. Hereinafter, the description will focus mainly on matters different from those of the first to eleventh embodiments.

12.1 Conversion Operation of Logical Page Address and Physical Page Address

An example of a conversion operation of the logical page address and the physical page address will first be explained with reference to FIG. 79. FIG. 79 is a diagram showing the logical page data allocation with respect to the physical page.

In the present embodiment, a case of allocating data of three logical pages to four physical pages (that is, one memory group MG capable of storing four-page data) will be described.

As shown in FIG. 79, data of the logical first page to the logical third page is divided respectively into four pieces of the first cluster to the fourth cluster from the head. For example, the memory 100 writes the first cluster of the logical first page in the first cell area of the lower page, writes the second cluster of the logical first page in the second cell area of the lower page, and writes the third cluster of the logical first page in the third cell area of the lower page. The memory 100 writes the fourth cluster of the logical first page in the first cell area of the middle page, writes the first cluster of the logical second page in the second cell area of the middle page, and writes the second cluster of the logical second page in the third cell area of the middle page. The memory 100 writes the third cluster of the logical second page in the first cell area of the upper page, writes the fourth cluster of the logical second page in the second cell area of the upper page, and writes the first cluster of the logical third page in the third cell area of the upper page. The memory 100 writes the second cluster of the logical third page in the first cell area of the top page, writes the third cluster of the logical third page in the second cell area of the top page, and writes the fourth cluster of the logical third page in the third cell area of the top page.

12.2 Coding of Memory Cell Transistors

Coding of memory cell transistors MC will be described with reference to FIG. 80. FIG. 80 is a table showing data allocations to each state.

As shown in FIG. 80, in the present embodiment, different codings are applied in the first to third cell areas. In this case, each of the codings is selected so that positions of boundaries determining data of the logical page become the same among the first cell area, the second cell area, and the third cell area in a read operation of the logical page.

More specifically, in the case of the read operation of the logical first page, positions of the boundary for determining data of the lower page and the middle page in the first cell area, positions of the boundary for determining data of the lower page in the second cell area, and positions of the boundary for determining data of the lower page in the third cell area are the same. Furthermore, in the case of the read operation of the logical second page, positions of the boundary for determining data of the upper page in the first cell area, positions of the boundary for determining data of the middle page and the upper page in the second cell area, and positions of the boundary for determining data of the middle page in the third cell area are the same. Furthermore, in the case of the read operation of the logical third page, positions of the boundary for determining data of the top page in the first cell area, positions of the boundary for determining data of the top page in the second cell area, and positions of the boundary for determining data of the upper page and the top page in the third cell area are the same.

For example, in the first cell area, data is allocated to the "top bit/upper bit/middle bit/lower bit" of the memory cell transistor MC in the following manner.

"S0" state: "1111" data

"S1" state: "1101" data

"S2" state: "0101" data

"S3" state: "0100" data

"S4" state: "0000" data

"S5" state: "1000" data

"S6" state: "1100" data

"S7" state: "1110" data

"S8" state: "1010" data

"S9" state: "0010" data

"S10" state: "0110" data

"S11" state: "0111" data

"S12" state: "0011" data

"S13" state: "1011" data

"S14" state: "1001" data

"S15" state: "0001" data

In the case of reading data that is allocated in the above manner, the lower page is determined by read operations R3 and R11. The middle page is determined by read operations R1, R7, and R14. The upper page is determined by read operations R4, R6, R8, R10, and R12. The top page is determined by read operations R2, R5, R9, R13, and R15. Therefore, the data allocation of the first cell area is a 2-3-5-5 coding.

In the second cell area, data is allocated to the "top bit/upper bit/middle bit/lower bit" of the memory cell transistor MC in the following manner.

"S0" state: "1111" data
"S1" state: "1110" data
"S2" state: "0110" data
"S3" state: "0111" data
"S4" state: "0011" data
"S5" state: "1011" data
"S6" state: "1001" data
"S7" state: "1000" data
"S8" state: "1010" data
"S9" state: "0010" data
"S10" state: "0000" data
"S11" state: "0001" data
"S12" state: "0101" data
"S13" state: "1101" data
"S14" state: "1100" data
"S15" state: "0100" data In the case of reading data that is allocated in the above manner, the lower page is determined by read operations R1, R3, R7, R11, and R14. The middle page is determined by read operations R6, R8, and R10. The upper page is determined by read operations R4 and R12. The top page is determined by read operations R2, R5, R9, R13, and R15. Therefore, the data allocation of the second cell area is a 5-3-2-5 coding.

In the third cell area, data is allocated to the "top bit/upper bit/middle bit/lower bit" of the memory cell transistor MC in the following manner.

"S0" state: "1111" data
"S1" state: "1110" data
"S2" state: "0110" data
"S3" state: "0111" data
"S4" state: "0101" data
"S5" state: "0001" data
"S6" state: "0011" data
"S7" state: "0010" data
"S8" state: "0000" data
"S9" state: "1000" data
"S10" state: "1010" data
"S11" state: "1011" data
"S12" state: "1001" data
"S13" state: "1101" data
"S14" state: "1100" data
"S15" state: "0100" data In the case of reading data that is allocated in the above manner, the lower page is determined by read operations R1, R3, R7, R11, and R14. The middle page is determined by read operations R4, R6, R8, R10, and R12. The upper page is determined by read operations R5 and R13. The top page is determined by read operations R2, R9, and R15. Therefore, the data allocation of the third cell area is a 5-5-2-3 coding.

In the case of performing the read operation of the logical first page, the target of the read operation is the first to third cell areas of the lower page and the first cell area of the middle page. In the first area, data of the lower page is determined by read operations R3 and R11. Data of the middle page is determined by read operations R1, R7, and R14. In the second cell area, data of the lower page is determined by R1, R3, R7, R11, and R14. In the third cell area, data of the lower page is determined by R1, R3, R7, R11, and R14. Therefore, in all of the first cell area, the second cell area, and the third cell area, data of the logical first page is determined by read operations R1, R3, R7, R11, and R14. It should be noted that, in the read operation of the logical first page, read voltages may be applied to the selected word line WL in the order of voltages V1, V3, V7, V11, and V14 or in the order of voltages V14, V11, V7, V3, and V1. Furthermore, when read operations R11 and R3 are ended, data of the first cluster of the logical first page is determined. Therefore, the memory 100 may output this data to the outside by transferring the data to the latch circuits XDL.

In the case of performing the read operation of the logical second page, the target of the read operation is the second and third cell areas of the middle page and the first and second cell areas of the upper page. In the first cell area, data of the upper page is determined by read operations R4, R6, R8, R10, and R12. In the second cell area, data of the middle page is determined by read operations R6, R8, and R10. Data of the upper page is determined by read operations R4 and R12. In the third cell area, data of the middle page is determined by read operations R4, R6, R8, R10, and R12. Therefore, in all of the first cell area, the second cell area, and the third cell area, data of the logical second page is determined by read operations R4, R6, R8, R10, and R12. It should be noted that, in the read operation of the logical second page, read voltages may be applied to the selected word line WL in the order of voltages V4, V6, V8, V10, and V12, or in the order of voltages V12, V10, V8, V6, and V4. Furthermore, when read operations R6, R8, and R10 are ended, data of the first cluster of the logical second page is determined. Therefore, the memory 100 may output this data to the outside by transferring the data to the XDL. Furthermore, when read operations R4 and R12 are ended, data of the fourth cluster of the logical second page is determined. Therefore, the memory 100 may output this data to the outside by transferring the data to the latch circuits XDL. In this case, for example, in the memory 100, the allocation of the first cluster of the logical second page and the allocation of the fourth cluster of the logical second page explained with reference to FIG. 79 may be switched. By switching the allocations, the memory 100 can output to the outside data of the first cluster of the logical second page earlier than before switching the allocations.

In the case of performing the read operation of the logical third page, the target of the read operation is the third cell area of the upper page and the first to third cell areas of the top page. In the first cell area, data of the top page is determined by read operations R2, R5, R9, R13, and R15. In the second cell area, data of the top page is determined by read operations R2, R5, R9, R13, and R15. In the third cell area, data of the upper page is determined by read operations R5 and R13. Data of the top page is determined by read operations R2, R9, and R15. Therefore, in all of the first cell area, the second cell area, and the third cell area, data of the logical third page is determined by read operations R2, R5, R9, R13, and R15. It should be noted that, in the read operation of the logical third page, read voltages may be applied to the selected word line WL in the order of voltages V2, V5, V9, V13, and V15, or in the order of voltages V15, V13, V9, V5, and V2. When read operations R13 and R5 are ended, data of the first cluster of the logical third page is determined. Therefore, the memory 100 may output this data to the outside by transferring the data to the latch circuits XDL.

12.3 Advantageous Effects of Twelfth Embodiment

According to the configurations of the present embodiment, it is possible to obtain effects similar to those of the first and tenth embodiments. For example, in the case of the present embodiment, data of the logical first page, data of the logical second page, and data of the logical third page can be determined by performing the read operation five times, respectively.

13. Thirteenth Embodiment

A thirteenth embodiment will be described. In the thirteenth embodiment, an example in which two memory cell transistors MC are used to store 3-bit data will be explained. Hereinafter, the description will focus mainly on matters different from those of the first to twelfth embodiments.

13.1 Threshold Voltage Distributions of Memory Cell Transistors

Possible threshold voltage distributions of memory cell transistors MC will first be described with reference to FIG. 81. FIG. 81 is a diagram showing threshold voltage distributions of the memory cell transistors MC.

As shown in FIG. 81, the threshold voltage of each memory cell transistor MC takes a value that falls within, for example, three discrete distributions. That is, the memory cell transistor MC of the present embodiment is a 1.5 bit/Cell that can hold three values of data. Hereinafter, the three distributions will be respectively referred to as, in ascending order of threshold voltage, an "S0" state, an "S1" state, and an "S2" state.

The "S0" state corresponds to, for example, a data erase state. The "S1" and "S2" states correspond to states in which a charge is injected into the charge storage layer and data is written. In the write operation, it is assumed that verify voltages corresponding to the respective threshold voltage distributions are V1 and V2. In this case, the voltage values establish a relationship of V1<V2<Vread.

It should be noted that setting values for the verify voltages and setting values for read voltages corresponding to the respective states may be either identical to or different from each other. To simplify the description, a case will be described in which the setting values for the verify voltages and the setting values for the read voltages are the same.

Hereinafter, read operations corresponding to the read operations of the "S1" and "S2" states will be respectively referred to as read operations R1 and R2. In read operation R1, it is determined whether or not the threshold voltage of the memory cell transistor MC is less than the voltage V1. In read operation R2, it is determined whether or not the threshold voltage of the memory cell transistor MC is less than the voltage V2.

Hereinafter, data corresponding to read operation R1 (read voltage V1) will be referred to as "V1 data", and data corresponding to read operation R2 (read voltage V2) will be referred to as "V2 data".

As described above, each memory cell transistor MC belongs to one of the three threshold voltage distributions, thereby taking one of the three states.

13.2 Coding

Coding will be described with reference to FIG. 82. FIG. 82 is a table showing data allocations by two memory cell transistors MC.

In the present embodiment, a set of two memory cell transistors MC (hereinafter also referred to as a "cell unit") holds eight values (three bits) of data. Accordingly, the memory cell array 130 is configured by 3 bit/2 Cell (hereinafter also referred to as "D1.5 (three values)"). Hereinafter, the two memory cell transistors MC configuring a cell unit will be referred to as an "A cell" and a "B cell", respectively. In the present embodiment, the memory cell transistor MC included in the first cell area functions as the "A cell", and the memory cell transistor MC included in the second cell area functions as the "B cell". Furthermore, a unit of data collectively written with respect to a plurality of cell units will be referred to as a "section". For example, in a case of writing data of one section, the size (data length) of the section is ½ of the number of memory cell transistors MC included in one memory group MG. That is, the size of the section is ½ of a page size of a physical page.

By allocating states of eight values of the cell unit to "000" to "111" in binary notation, the cell unit is capable of storing three bits of data. Hereinafter, the three bits of data stored by the cell unit will be referred to respectively as a "first bit of a cell unit", a "second bit of a cell unit", and a "third bit of a cell unit". Furthermore, a group of the first bit of a cell unit, a group of the second bit of a cell unit, and a group of the third bit of a cell unit to be collectively written in (or read from) the memory group MG will be referred to as a "first section", a "second section", and a "third section", respectively.

In the example of FIG. 82, with respect to the combinations of the states of the "A cell/B cell", data is allocated to the "first section (first bit of a cell unit)/second section (second bit of a cell unit)/third section (third bit of a cell unit)" in the following manner.

"S0/S0" state: "111" data
"S0/S1" state: "100" data
"S1/S2" state: "000" data
"S1/S0" state: "110" data
"S1/S1" state: "101" data
"S1/S2" state: "001" data
"S2/S0" state: "010" data
"S2/S1" state: "011" data The states of the three bits are described in the manner above by the combination of the states of the A cell and B cell. It should be noted that a case of A cell/B cell="S2/S2" is defined as not to be used.

A bit value of the first section (first bit of the cell unit) is determined by read operation R2 (read voltage V2) in the A cell (first cell area) and read operation R2 (read voltage V2) in the B cell (second cell area). In the case where the A cell or the B cell is in the "S2" state, "0" is allocated to the bit value of the first section.

A bit value of the second section (second bit of the cell unit) is determined by read operation R2 (read voltage V2) in the A cell (first cell area) and read operation R1 (read voltage V1) in the B cell (second cell area). In the case where the A cell is in the "S0" or "S1" state, and the B cell is in the "S1" or "S2" state, "0" is allocated to the bit value of the second section.

A bit value of the third section (third bit of the cell unit) is determined by read operation R1 (read voltage V1) in the A cell (first cell area) and read operation R1 (read voltage V1) in the B cell (second cell area). In the case where the A cell is in the "S0" state and the B cell is in the "S1" or "S2" state, or in the case where the A cell is in the "S1" or "S2" state and the B cell is the "S0" state, "0" is allocated to the bit value of the third section.

13.3 Calculations of Bit Values of Sections

Calculations of the bit values of the sections will be described with reference to FIG. 83. FIG. 83 is a diagram showing the relationship between data allocations to the A cell and the B cell and bit values of the sections. In the example of FIG. 83, "&" indicates an AND operation, and "~" indicates negation of data.

As shown in FIG. 83, in read operation R1 of the A cell or the B cell, in a case where the threshold voltage is equal to or larger than read voltage V1, "0" data is allocated as the V1 data, and, in a case where the threshold voltage is less than read voltage V1, "1" data is allocated as the V1 data. Furthermore, in read operation R2 of the A cell or the B cell, in a case where the threshold voltage is equal to or larger than read voltage V2, "0" data is allocated as the V2 data, and, in a case where the threshold voltage is less than read voltage V2, "1" data is allocated as the V2 data. The bit value of each section may then be calculated by the following operations.

The bit value of the first section is calculated by an exclusive NOR (EXNOR) operation of a read result (V2 data) of the A cell using read voltage V2 and a read result (V2 data) of the B cell using read voltage V2.

The bit value of the second section is calculated by a NAND operation of a read result (V2 data) of the A cell using read voltage V2 and a negative of a read result (V1 data) of the B cell using read voltage V1.

The bit value of the third section is calculated by an EXNOR operation of a read result (V1 data) of the A cell using read voltage V1 and a read result (V1 data) of the B cell using read voltage V1.

13.4 Conversion Operation of Logical Page Address and Physical Page Address

An example of a conversion operation of the logical page address and the physical page address will be explained with reference to FIGS. 84 and 85. FIG. 84 is a diagram explaining a flow of the conversion operation of the logical page address and the physical page address. FIG. 85 is a diagram showing the logical page data allocation with respect to the physical page.

In the present embodiment, a case in which data of one logical page is allocated to three sections in one memory group MG will be explained.

As shown in FIG. 84, for example, when the memory controller 200 receives a write request from the host device 2, it allocates one logical page address "90001" (logical first page) corresponding to one received logical address "00001".

When the command user interface circuit 121 receives a write order including one page of the logical page address and the logical page from the memory controller 200, the command user interface circuit 121 converts the one page of the logical page address into three sections of the physical page address in accordance with a preset mapping. At this time, a data length of one page of the logical page and a data length of the three sections are the same.

The page size of one logical page will be referred to as "m" ("m" is a number equal to or greater than one), and the number of logical pages to be written (that is, the number of logical page addresses included in the order) will be referred to as "a" ("a" is an integer equal to or greater than one). Furthermore, the page size of the physical page of one memory group MG will be referred to as "n" ("n" is a number smaller than "m") and the number of sections (that is, the number of bits of data that is being stored in the set of A cell and B cell) will be referred to as "c" ("c" is an integer larger than "a"). Since the page size n of one physical page doubles the size of the section (the number of cell units), n may be described by $n=m\times 2a/c$. In the present embodiment, since a=1 and c=3, the page size of the physical page is $n=m\times\frac{2}{3}$. For example, in the case where the page size of the logical page is 16 [kB], the page size of the physical page is $n=16\times\frac{2}{3}=10.67$ [kB]. In this case, the number of memory cell transistors MC that can satisfy the equation for the page size n=10.67 [kB] of one physical page is an integer equal to or greater than the integer calculated by rounding up digits after the decimal point of $10.67\times1024$. In other words, the number of memory cell transistors MC is equal to or greater than the integer calculated by rounding up digits after the decimal point of the page size of one physical page.

The arrangement of the logical page data in one memory group MG will be described in detail.

As shown in FIG. 85, data of the logical first page is divided into three pieces of the first cluster to the third cluster from the head. For example, the memory 100 writes data of the first cluster in the first section, writes data of the second cluster in the second section, and writes data of the third cluster in the third section. In the present embodiment, the data of the first section corresponds to the data of the first cluster of the logical first page, the data of the second section corresponds to the data of the second cluster of the logical first page, and the data of the third section corresponds to the data of the third cluster of the logical first page.

13.5 Configurations of Sense Amplifier and Page Buffer

Configurations of the sense amplifier 132 and the page buffer 133 will be briefly described. The memory cell array 130 of the present embodiment is configured by the 3 bit/2 Cell that is a set of the A cell of the first cell area and the B cell of the second cell area. Accordingly, as explained in the first example of the ninth embodiment with reference to FIG. 69, the preferred configuration of the sense amplifier 132 and the page buffer 133 is a configuration in which the sense amplifier units SAU1 and SAU2 are arranged alternately. This is because, when computing the data of the A cell and the B cell, it is easier to design the corresponding sense circuits SA and latch circuits XDL, ADL, and BDL, etc. in a physically close arrangement.

13.6 Read Operation

The read operation will be explained. In the read operation of the present embodiment, when the memory 100 receives a read order based on the logical page from the memory controller 200, the memory 100 reads data from a plurality of physical pages corresponding thereto, computes the read data to calculate sections, then combines the sections to output them as data of the logical page.

13.6.1 Flow of Read Operation

Figure 86:
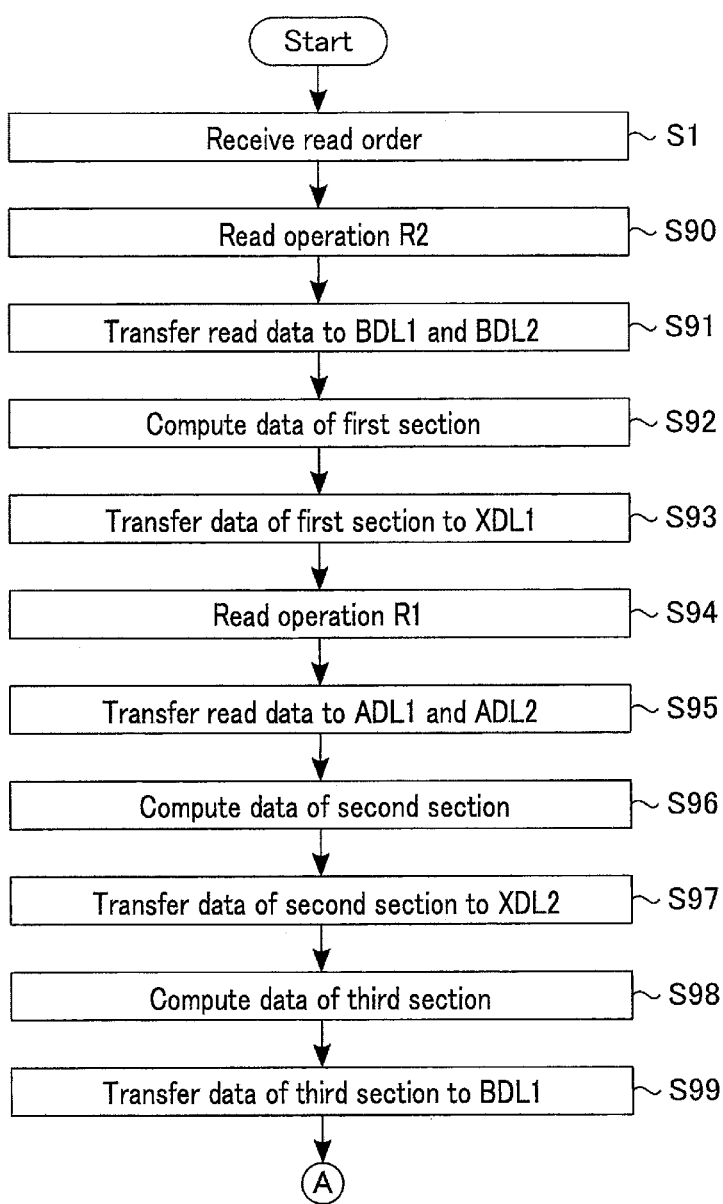
FIG. 86 is a flowchart showing a read operation of the semiconductor memory according to the thirteenth embodiment.
Figure 87:
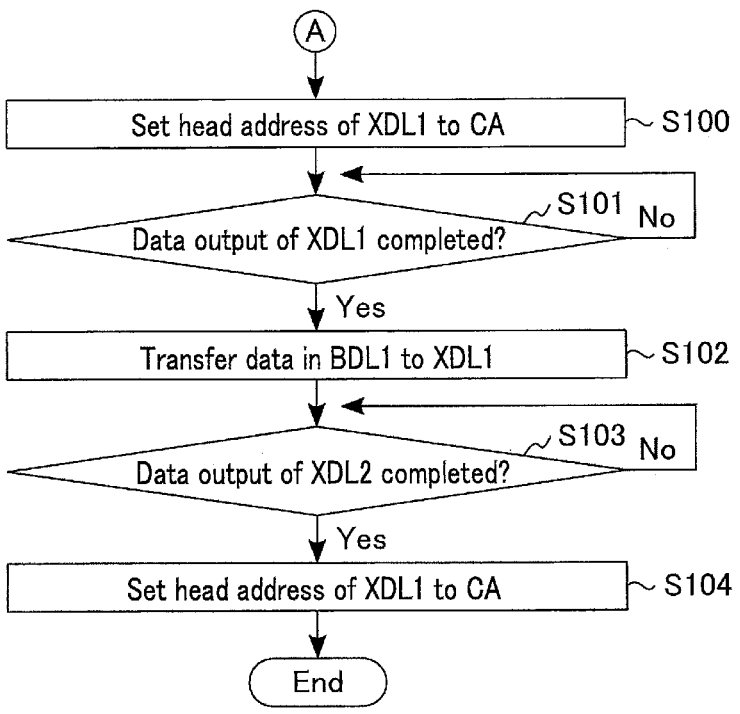
FIG. 87 is a flowchart showing a read operation of the semiconductor memory according to the thirteenth embodiment.

The flow of the read operation in the memory 100 will first be described with reference to FIGS. 86 and 87. FIGS. 86 and 87 are flowcharts of the read operation.

As shown in FIGS. 86 and 87, the memory 100 receives a read order of the logical first page from the memory controller 200 (step S1). The command user interface circuit 121 converts the logical page address into the physical page addresses, then transmits the received command and the converted physical page addresses to the sequencer 123.

The sequencer 123 first executes read operation R2 corresponding to read voltage V2 (step S90).

The sequencer 123 transfers the data (V2 data) read by sense circuits SA1 and SA2 to latch circuits BDL1 and BDL2, respectively (step S91).

The sequencer 123 performs arithmetic processing using data in the latch circuits BDL1 (V2 data of the A cell) and data in the latch circuits BDL2 (V2 data of the B cell), and calculates data of the first section (data of the first cluster of the logical first page) (step S92).

The sequencer 123 transfers the calculated data of the first section to the latch circuits XDL1 (step S93).

The sequencer 123 executes read operation R1 corresponding to read voltage V1 (step S94).

The sequencer 123 transfers the data (V1 data) read by the sense circuits SA1 and SA2 to latch circuits ADL1 and ADL2, respectively (step S95).

The sequencer 123 performs arithmetic processing using data in the latch circuits BDL1 (V2 data of the A cell) and data in the latch circuits ADL2 (V1 data of the B cell), and calculates data of the second section (data of the second cluster of the logical first page) (step S96).

The sequencer 123 transfers the calculated data of the second section to the latch circuits XDL2 (step S97).

The sequencer 123 performs arithmetic processing using data in the latch circuits ADL1 (V1 data of the A cell) and data in the latch circuits ADL2 (V1 data of the B cell), and calculates data of the third section (data of the third cluster of the logical first page) (step S98).

The sequencer 123 transfers the calculated data of the third section to the latch circuits BDL1 (step S99).

The sequencer 123 sets a head address of the latch circuit XDL1 as a column address CA in a column counter 125 (step S100). Based on the column address CA incremented by the column counter 125, the serial access controller 126 receives data sequentially from the head address of the latch circuit XDL1 and transfers it to an input/output circuit 110. The input/output circuit 110 starts transmitting (outputting) the data in the latch circuits XDL1 (data of the first cluster of the logical first page) to the memory controller 200.

In the case where the data output of the latch circuits XDL1 is not ended (step S101_No), the sequencer 123 repeats a confirmation operation of the data output until the output is ended.

When the data output of the latch circuits XDL1 is ended (step S101_Yes), the sequencer 123 transfers the data in the latch circuits BDL1 to the latch circuits XDL1 (step S102). Furthermore, when the data output of circuits XDL1 is ended, data output of the latch circuits XDL2 (data of the second cluster of the logical first page) is started subsequently.

In the case where the data output of the latch circuits XDL2 is not ended (step S103_No), the sequencer 123 repeats a confirmation operation of the data output until the output is ended.

When the data output of the latch circuits XDL2 is ended (step S103_Yes), a head address of the latch circuit XDL1 is set as a column address CA in the column counter 125 (step S104). Based on the column address CA incremented by the column counter 125, the serial access controller 126 receives data sequentially from the head address of the latch circuit XDL1 and transfers it to an input/output circuit 110. The input/output circuit 110 starts transmitting (outputting) the data in the latch circuits XDL1 (data of the third cluster of the logical first page) to the memory controller 200. When the data output of the latch circuits XDL1 is ended, the sequencer 123 ends the read operation of the logical first page. It should be noted that, the data of the first section is determined while executing read operation R1 after read operation R2 is ended. Therefore, the memory 100 may set the external RBn signal to the "H" level and output the data.

13.6.2 Command Sequence of Read Operation

An example of a command sequence of the read operation will be described with reference to FIG. 88. FIG. 88 is a command sequence of the read operation of the logical first page. In the example of FIG. 88, signals CEn, CLE, ALE, WEn, and REn are omitted to simplify the description. In the example of FIG. 88, some of the commands and addresses are omitted. In addition, the example of FIG. 88 also shows voltages of the selected word line WL in a case where the internal RBn signal is in the busy state.

As shown in FIG. 88, when the sequencer 123 receives a command "30h", it starts the read operation in response to the command. The sequencer 123 first sets the internal RBn signal and the external RBn signal to the "L" level indicating the busy state. The sequencer 123 then executes read operation R2. That is, read voltage V2 is applied to the selected word line WL. The result of reading data (V2 data) is stored in the latch circuits BDL1 (corresponding to the A cell) and BDL2 (corresponding to the B cell).

After read operation R2 is ended, the sequencer 123 executes read operation R1. That is, read voltage V1 is applied to the selected word line WL. The result of reading data (V1 data) is stored in the latch circuits ADL1 (corresponding to the A cell) and ADL2 (corresponding to the B cell).

While read operation R1 is being executed, the sequencer 123 performs arithmetic processing using data in the latch circuits BDL1 and data in the latch circuits BDL2, and calculates data of the first section. The calculated data is stored in the latch circuits XDL1.

When read operation R1 is ended, the sequencer 123 sets the internal RBn signal and the external RBn signal to the "H" level indicating the ready state. Furthermore, the sequencer 123 performs arithmetic processing using data in the latch circuits BDL1 and data in the latch circuits ADL2, and calculates data of the second section. The calculated data is stored in the latch circuits XDL2.

When the "H" level external RBn signal is received, the memory controller 200 transmits signal REn (not shown) to the memory 100. The input/output circuit 110 starts outputting data in accordance with signal REn. The input/output circuit 110 first outputs data in the latch circuits XDL1 (data of the first cluster of the logical first page).

While the data in the latch circuits XDL1 is being output, the sequencer 123 performs arithmetic processing using data in the latch circuits ADL1 and data in the latch circuits ADL2, and calculates data of the third section. The calculated data is stored in the latch circuits BDL1.

When data output of the latch circuits XDL1 is ended, data in the latch circuits BDL1 is transferred to the latch circuits XDL1. In succession to the latch circuits XDL1, the input/output circuit 110 outputs data in the latch circuits XDL2 (data of the second cluster of the logical first page). Furthermore, in succession to the latch circuits XDL2, the input/output circuit 110 outputs data in the latch circuits XDL1 (data of the third cluster of the logical first page). When data output of the latch circuits XDL1 is ended, the read operation of the logical first page is ended.

It should be noted that the order in which read voltages V1 and V2 are applied may be switched. Furthermore, in the case where the data output of the latch circuits XDL2 is ended before storing the data of the third section in the latch circuits BDL1, the sequencer 123 may temporarily set the external RBn signal to the "L" level and suspend the data output. It should be noted that, the data of the first section is determined while executing read operation R1 after read operation R2 is ended. Therefore, the memory 100 may set the external RBn signal to the "H" level and output the data.

13.7 Write Operation

The write operation will be described. In the present embodiment, the full sequence write operation is executed in which the data of the first to the third sections is collectively written in the memory group MG. In other words, in the full sequence write operation of the present embodiment, the "S1" and "S2" states are written.

13.7.1 Flow of Write Operation

The flow of the write operation in the memory 100 will be described with reference to FIGS. 89 and 90. FIGS. 89 and 90 are flowcharts of the write operation.

As shown in FIGS. 89 and 90, when receiving a write order, the memory 100 receives the logical page address of the logical first page from the memory controller 200 (step S280). The command user interface circuit 121 converts the logical page address of the logical first page into the physical page addresses.

The sequencer 123 sets a head address of the latch circuit XDL1 as a column address CA in the column counter 125 (step S281).

In the page buffer 133, data input of the first cluster of the logical first page to the latch circuits XDL1 is started based on the column address CA received from the column counter 125 (step S282).

In the case where the data input of the latch circuits XDL1 is not ended (step S283_No), the sequencer 123 repeats a confirmation operation of the data input until the input is ended.

When the data input to the latch circuits XDL1 is ended (step S283_Yes), the sequencer 123 transfers the data in the latch circuits XDL1 to the latch circuits BDL1 (step S284). Furthermore, when the data input to the latch circuits XDL1 is ended, data input of a second cluster of the logical first page to the latch circuits XDL2 is started subsequently. It should be noted that, in the case of step S283_Yes, the data input of the second cluster of the logical first page to the latch circuits XDL2 may be started subsequently, and the sequencer 123 may execute step S284 during the data input.

In the case where the data input of the latch circuits XDL2 is not ended (step S285_No), the sequencer 123 repeats a confirmation operation of the data input until the input is ended.

When the data input to the latch circuits XDL2 is ended (step S285_Yes), the sequencer 123 transfers the data in the latch circuits XDL2 to the latch circuits BDL2 (step S286).

The sequencer 123 sets a head address of the latch circuit XDL1 as a column address CA in the column counter 125 (step S287). In the page buffer 133, data input of a third cluster of the logical first page to the latch circuits XDL1 is started based on the column address CA received from the column counter 125. It should be noted that, in the case of step S285_Yes, the data input of the third cluster of the logical first page to the latch circuits XDL1 may be started subsequently, and the sequencer 123 may execute step S286 during the data input.

In the case where the data input of the latch circuits XDL1 is not ended (step S288_No), the sequencer 123 repeats a confirmation operation of the data input until the input is ended.

When the data input to the latch circuits XDL1 is ended (step S288_Yes), the data input of the logical first page to the latch circuits XDL1 and XDL2 is ended. The sequencer 123 sets the external RBn signal and the internal RBn signal to the "L" level.

The sequencer 123 computes the data in the latch circuits BDL1, BDL2, and XDL1, that is, the data of the first section, the second section, and the third section, and calculates V1 data of the A cell and the B cell (step S289). The calculated V1 data of the A cell and the B cell is transferred to the latch circuits ADL1 and ADL2, respectively (step S290).

The sequencer 123 computes the data in the latch circuits BDL1, BDL2, and XDL1, that is, the data of the first section, the second section, and the third section, and calculates V2 data of the A cell and the B cell (step S291). The calculated V2 data of the A cell and the B cell is transferred to the latch circuits XDL1 and XDL2, respectively (step S292). At this time, the data of the third section is stored in the latch circuit XDL1; however, this may be overwritten with V2 data of the A cell. The sequencer 123 determines the state of each of the memory cell transistors MC based on the combination of data in the latch circuits ADL1, ADL2, XDL1, and XDL2.

The sequencer 123 executes the program operation based on the determined states (step S293).

After ending the program operation, the sequencer 123 executes the program verify operation (step S294).

In the case where the verification is not passed (step S295_No), the sequencer 123 confirms whether or not the number of program loops has reached a preset upper limit number (step S296).

In the case where the number of program loops has not reached the upper limit number (step S296_No), the sequencer 123 executes the program operation (step S293). That is, the sequencer 123 repeats the program loop.

In the case where the number of program loops has reached the upper limit number (step S296_Yes), the sequencer 123 ends the write operation and reports to the memory controller 200 that the write operation did not end successfully.

In the case of passing the verification (step S295_Yes), that is, ending writing of the "S1" and "S2" states, the sequencer 123 sets the external RBn signal to the "H" level and ends the full sequence write operation.

13.7.2 Command Sequence of Write Operation

An example of a command sequence of the write operation will be described with reference to FIG. 91. FIG. 91 is a command sequence of the full sequence write operation. In the example of FIG. 91, signals CEn, CLE, ALE, WEn, and REn are omitted to simplify the description.

As shown in FIG. 91, the memory controller 200 first transmits a command "80h" to the memory 100. The memory controller 200 then transmits a logical page address "AD-P1" of the logical first page. In the memory 100, the command user interface circuit 121 converts the received logical page address "AD-P1" into the physical page addresses. The memory controller 200 then transmits data of the logical first page to the memory 100. The first cluster of the logical first page is stored in the latch circuits XDL1, and is then transferred to the latch circuits BDL1. The second cluster of the logical first page is then stored in the latch circuits XDL2, and is then transferred to the latch circuits BDL2. The third cluster of the logical first page is stored in the latch circuits XDL1.

The memory controller 200 then transmits a command "10h" to the memory 100.

When the command "10h" is received, the sequencer 123 sets the internal RBn signal and the external RBn signal to the "L" level.

The sequencer 123 calculates V1 data based on the data stored in the latch circuits BDL1, BDL2, and XDL1, and stores the result in the latch circuits ADL1 and ADL2. In addition, the sequencer 123 calculates V2 data based on the data stored in the latch circuits BDL1, BDL2, and XDL1, and stores the result in the latch circuits XDL1 and XDL2. The sequencer 123 determines the state of each of the memory cell transistors MC based on the combination of the data in the latch circuits ADL1, ADL2, XDL1, and XDL2, and executes the write operation. After ending the write operation, the sequencer 123 sets the internal RBn signal and the external RBn signal to the "H" level.

13.8 Advantageous Effects of Thirteenth Embodiment

The configurations of the present embodiment can attain the same effect as the first embodiment.

For example, in some cases, the memory 100 may include a multivalued (2 to 4 bit/Cell) memory area and a high-speed and high-reliability memory area. For example, the high-speed and high-reliability memory area is used for speeding up access or enhancing reliability of data, and stores data as a binary value (1 bit/Cell). The high-speed and high-reliability memory area of the first to twelfth embodiments can be in a binary value (1 bit/Cell). However, since the page size of a physical page of the multivalued memory area is smaller than that of a logical page, the logical page of the high-speed and high-reliability memory area would become small. In such a case, the first to twelfth embodiments may be applied to the multivalued memory area, and the present embodiment may be applied to the high-speed and high-reliability memory area. This allows the page size of the logical page of the multivalued memory area and the page size of the logical page of the high-speed and high-reliability memory area to become the same.

It should be noted that an allocation of data storing three bits in 2 cell 3 value is described in, for example, U.S. patent application Ser. No. 16/123,162 filed on Sep. 6, 2018, entitled "SEMICONDUCTOR MEMORY". The entire contents of this patent application are incorporated herein by reference.

Furthermore, in the present embodiment, a case in which the memory cell transistor MC holds data of three bits in 3 value 2 cell (1.5 bit/Cell) is described; however, the present embodiment is not limited thereto. For example, the memory cell transistor MC may hold five bits of data in 6 value 2 cell (2.5 bit/Cell), may hold seven bits of data in 12 value 2 cell (3.5 bit/Cell), or may hold nine bits of data in 23 value or 24 value 2 cell (4.5 bit/Cell).

14. Modifications, Etc.

The semiconductor memory according to the above embodiments includes: a memory group (MG) including a plurality of memory cells (MC) configured to store a plurality of bits of data in three or more plurality of states; a word line (WL) coupled to the plurality of memory cells; and a first circuit (121) configured to convert one external address (logical page address) received from an external controller (200) into a plurality of internal addresses (physical page addresses), wherein a first page size of page data (data of the physical page) of the memory group is smaller than a second page size of input data (data of the logical page) corresponding to the external address.

By applying the above embodiments, it is possible to provide a semiconductor memory that can suppress an increase in a chip area.

It should be noted that the embodiments are not limited to the above-described aspects, and various modifications may be adopted therein.

For example, in each coding, "0" data and "1" data may be inverted.

For example, in the first to twelfth embodiments, an example of the memory cell transistor MC being 2 to 4 bit/Cell has been described; however the memory cell transistor MC is not limited to this. For example, the memory cell transistor MC may be 5 bit/Cell. Furthermore, the memory cell transistor MC may hold five bits of data in 6 value 2 cell (2.5 bit/Cell), may hold seven bits of data in 12 value 2 cell (3.5 bit/Cell), or may hold nine bits of data in 23 value or 24 value 2 cell (4.5 bit/Cell).

For example, the memory 100 is not limited to a NAND flash memory. The memory 100 should be a non-volatile memory that performs a read operation or a write operation by selecting only addresses of some word lines within an address space of the memory cell array. For example, the memory 100 may be a phase change memory (PCM), a magnetoresistive random access memory (MRAMV), or a ferroelectric random access memory (FeRAM).

Furthermore, in the first to twelfth embodiments, data is written in states of eight values or 16 values in one write operation; however, in order to suppress influence from adjacent memory cell transistors, the writing operation may be performed in, for example, two writing steps. In this case, if the influence from adjacent memory cell transistors is significant, after a write operation of a first page of a first word line (WLn) is performed, a write operation of a first page of an adjacent second word line (WLn+1) is executed, and a write operation of a second page of the first word line (WLn) is performed thereafter. For example, in the case of the tenth embodiment, as shown in FIG. 92, when the write operation of the logical first page is performed, the memory cell transistor MC of the first cell area is written in the state S0, S2, S4, or S6 when data of the first cluster of the logical first page is written in the lower page and data of the third cluster of the logical first page is written in the middle page. On the other hand, the memory cell transistor MC of the second cell area is written in the state S0 or S2 when data of the second cluster of the logical first page is written in the lower page. It should be noted that the state of the write operation of the logical first page may be lower than the state of the write operation of the logical second page. Furthermore, a step-up voltage amount of the write operation of the logical first page may be greater than that of the write operation of the logical second page. Subsequently, when performing the write operation of the logical second page, data written by the write operation of the logical first page is read by an internal read operation. Then, when data of the second cluster of the logical second page is written in the upper page, the memory cell transistor MC of the first cell area is written in the state S0 or S1 in the case where data is written in the state S0, is written in the state S2 or S3 in the case where data is written in the state S2, is written in the state S4 or S5 in the case where data is written in the state S4, and is written in the state S6 or S7 in the case where data is written in the state S6. When data of the first cluster of the logical second page is written in the middle page and data of the third cluster of the logical second page is written in the upper page, the memory cell transistor MC of the second cell area is written in the state S0, S1, S4, or S5 in the case where data is written in the state S0, and is written in the state S2, S3, S6, or S7 in the case where data is written in the state S2. It should be noted that if a read operation is performed after the write operation of the logical first page prior to the write operation of the logical second page, data will be incorrect since data is not written in the Vth distribution after the write operation of the logical second page. Therefore, a read command for this may be provided separately, or a flag cell may be prepared for each page to change the read level.

For example, the above-described embodiments may be combined wherever possible.

Furthermore, the term "couple" in the above-described embodiments includes indirect coupling via a transistor or a resistor, etc.

The embodiments are only examples, and therefore do not limit the scope of the invention.

What is claimed is:

1. A nonvolatile memory comprising:
a plurality of memory cells configured to store three bits of data described by first to third bits and allocated to eight threshold areas that include a first threshold area indicating an erase area and second to eighth threshold areas each indicating write areas, threshold voltages of the second to eighth threshold areas being higher than a threshold voltage of the first threshold area, a g-th threshold area (g is a natural number from two to eight) indicating one of the second to eighth threshold areas having a higher threshold voltage than a (g−1)-th threshold area;
a word line coupled to the plurality of memory cells; and
a controller configured to execute a read operation with respect to the plurality of memory cells in response to a read command from an external controller, wherein
among first to seventh voltages existing between adjacent threshold areas of the first to eighth threshold areas, a number of voltages used for determining a value of data of the first bit is one, a number of voltages used for determining a value of data of the second bit is p (p is a natural number from two to four), and a number of voltages used for determining a value of data of the third bit is (6−p),
an address specified by the read command corresponds to one of a first page address and a second page address,
in a case where the specified address corresponds to the first page address, the controller is configured to read data from the plurality of memory cells by using a voltage used for determining the value of data of the first bit and the p voltages used for determining the value of data of the second bit among the first to seventh voltages, and
in a case where the specified address corresponds to the second page address, the controller is configured to read data from the plurality of memory cells by using a voltage used for determining the value of data of the first bit and the (6−p) voltages used for determining the value of data of the third bit among the first to seventh voltages.

2. The nonvolatile memory according to claim 1, wherein an h-th voltage (h is a natural number from two to seven) is higher than an (h−1)-th voltage, and the fourth voltage is used for determining the value of data of the first bit.

3. The nonvolatile memory according to claim 2, wherein the p is three.

4. The nonvolatile memory according to claim 3, wherein the first voltage, the third voltage, and the sixth voltage are used for determining the value of data of the second bit, and the second voltage, the fifth voltage, and the seventh voltage are used for determining the value of data of the third bit.

5. The nonvolatile memory according to claim 2, wherein the p is four.

6. The nonvolatile memory according to claim 5, wherein the first voltage, the third voltage, the fifth voltage, and the seventh voltage are used for determining the value of data of the second bit, and
the second voltage and the sixth voltage are used for determining the value of data of the third bit.

7. The nonvolatile memory according to claim 2, wherein the p is two.

8. The nonvolatile memory according to claim 7, wherein the second voltage and the sixth voltage are used for determining the value of data of the second bit, and
the first voltage, the third voltage, the fifth voltage, and the seventh voltage are used for determining the value of data of the third bit.

9. The nonvolatile memory according to claim 1, wherein the data read from the plurality of memory cells by using the voltage used for determining the value of data of the first bit and the p voltages used for determining the value of data of the second bit includes first data and second data,
the first data is read from the plurality of memory cells by using the voltage used for determining the value of data of the first bit,
the second data is read from the plurality of memory cells by using the p voltages used for determining the value of data of the second bit includes first data and second data, and
the controller is configured to send the first data and the second data in response to the read command specifying the first page address.

10. The nonvolatile memory according to claim 9, wherein the data read from the plurality of memory cells by using the voltage used for determining the value of data of the first bit and the (6−p) voltages used for determining the value of data of the third bit includes third data and fourth data,
the third data is read from the plurality of memory cells by using the voltage used for determining the value of data of the first bit,
the fourth data is read from the plurality of memory cells by using the (6−p) voltages used for determining the value of data of the third bit, and
the controller is configured to send the third data and the fourth data in response to the read command specifying the second page address.

11. The nonvolatile memory according to claim 10, wherein a size of the first data is smaller than a size of the second data, and
a size of the third data is smaller than a size of the fourth data.

12. The nonvolatile memory according to claim 11, wherein the size of the second data is equal to the size of the fourth data.

13. The nonvolatile memory according to claim 11, wherein a sum of the size of the first data and the size of the third data is equal to the size of the second data.

14. The nonvolatile memory according to claim 11, wherein a sum of the size of the first data and the size of the third data is equal to the size of the fourth data.

15. The nonvolatile memory according to claim 10, further comprising:

a plurality of first latch circuits;

a plurality of second latch circuits; and a plurality of third latch circuits, wherein in response to the read command specifying the first page address, the data read from the plurality of memory cells by using the voltage used for determining the value of data of the first bit is stored into the plurality of first latch circuits and the plurality of second latch circuits, the data stored in the plurality of first latch circuits is stored into the plurality of third latch circuits, and the controller is configured to send the data stored in the plurality of third latch circuits as the first data.

16. The nonvolatile memory according to claim 15, wherein, in response to the read command specifying the second page address, the data read from the plurality of memory cells by using the voltage used for determining the value of data of the first bit is stored into the plurality of first latch circuits and the plurality of second latch circuits, the data stored in the plurality of second latch circuits is stored into the plurality of third latch circuits, and the controller is configured to send the data stored in the plurality of third latch circuits as the third data.

17. The nonvolatile memory according to claim 16, wherein, in response to the read command specifying the first page address, the data read from the plurality of memory cells by using the $p$ voltages used for determining the value of data of the second bit is stored into the plurality of first latch circuits and the plurality of second latch circuits, the data stored in the plurality of first latch circuits and the plurality of second latch circuits is stored into the plurality of third latch circuits, and the controller is configured to send the data stored in the plurality of third latch circuits as the second data.

18. The nonvolatile memory according to claim 16, wherein, in response to the read command specifying the second page address, the data read from the plurality of memory cells by using the $(6-p)$ voltages used for determining the value of data of the third bit is stored into the plurality of first latch circuits and the plurality of second latch circuits, the data stored in the plurality of first latch circuits and the plurality of second latch circuits is stored into the plurality of third latch circuits, and the controller is configured to send the data stored in the plurality of third latch circuits as the fourth data.

* * * * *